US010490569B2

(12) United States Patent
Mushiga et al.

(10) Patent No.: US 10,490,569 B2
(45) Date of Patent: Nov. 26, 2019

(54) THREE-DIMENSIONAL MEMORY DEVICE AND METHOD OF MAKING THE SAME USING CONCURRENT FORMATION OF MEMORY OPENINGS AND CONTACT OPENINGS

(71) Applicant: SANDISK TECHNOLOGIES LLC, Addison, TX (US)

(72) Inventors: Mitsuteru Mushiga, Yokkaichi (JP); Hisakazu Otoi, Yokkaichi (JP); Kensuke Yamaguchi, Yokkaichi (JP); James Kai, Santa Clara, CA (US); Zhixin Cui, Yokkaichi (JP); Murshed Chowdhury, Fremont, CA (US); Johann Alsmeier, San Jose, CA (US); Tong Zhang, Palo Alto, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/020,817

(22) Filed: Jun. 27, 2018

(65) Prior Publication Data

US 2019/0280003 A1 Sep. 12, 2019

Related U.S. Application Data

(60) Provisional application No. 62/640,196, filed on Mar. 8, 2018.

(51) Int. Cl.
*H01L 27/115* (2017.01)
*H01L 27/11582* (2017.01)
(Continued)

(52) U.S. Cl.
CPC ...... *H01L 27/11582* (2013.01); *H01L 21/022* (2013.01); *H01L 21/76805* (2013.01);
(Continued)

(58) Field of Classification Search
CPC .................... H01L 27/11551–27/11556; H01L 27/11578–27/11582; H01L 27/11519;
(Continued)

(56) References Cited

U.S. PATENT DOCUMENTS

| | | | |
|---|---|---|---|
| 5,915,167 | A | 6/1999 | Leedy |
| 8,809,938 | B2 | 8/2014 | Hwang et al. |

(Continued)

OTHER PUBLICATIONS

International Search Report and Written Opinion of the International Searching Authority for International Patent Application No. PCT/US2018/062435, dated Mar. 14, 2019, 16 pages.

(Continued)

*Primary Examiner* — Eric A. Ward
(74) *Attorney, Agent, or Firm* — The Marbury Law Group, PLLC

(57) ABSTRACT

Multiple tier structures are stacked over a substrate. Each tier structure includes an alternating stack of insulating layers and sacrificial material layers and a retro-stepped dielectric material portion overlying the alternating stack. Multiple types of openings are formed concurrently during formation of each tier structure. Openings concurrently formed through each tier structure can include at least two types of openings that may be selected from through-tier memory openings, through-tier support openings, and through-tier staircase-region openings. Each through-tier opening is filled with a respective through-tier sacrificial opening fill structure. Stacks of through-tier sacrificial opening fill structures can be removed in stages to form various device components, which include memory stack structures, support pillar structures, and staircase-region contact via structures. The sacrificial material layers are replaced with electrically conductive layers, which are laterally electrically isolated from the staircase-region contact via structures by annular insulating spacers.

17 Claims, 118 Drawing Sheets

(51) Int. Cl.

| | |
|---|---|
| ***H01L 27/11573*** | (2017.01) |
| ***H01L 27/1157*** | (2017.01) |
| ***H01L 27/11565*** | (2017.01) |
| ***H01L 27/11556*** | (2017.01) |
| ***H01L 27/11524*** | (2017.01) |
| ***H01L 23/522*** | (2006.01) |
| ***H01L 27/11526*** | (2017.01) |
| ***H01L 21/768*** | (2006.01) |
| ***H01L 21/02*** | (2006.01) |
| ***H01L 23/532*** | (2006.01) |
| ***H01L 27/11519*** | (2017.01) |

(52) U.S. Cl.
CPC .... *H01L 21/76832* (2013.01); *H01L 23/5226* (2013.01); *H01L 23/53295* (2013.01); *H01L 27/1157* (2013.01); *H01L 27/11519* (2013.01); *H01L 27/11524* (2013.01); *H01L 27/11526* (2013.01); *H01L 27/11556* (2013.01); *H01L 27/11565* (2013.01); *H01L 27/11573* (2013.01)

(58) Field of Classification Search
CPC ......... H01L 27/11524; H01L 27/11565; H01L 27/1157; H01L 27/11573; H01L 21/022; H01L 21/76805; H01L 21/76832; H01L 23/5226; H01L 23/53295
See application file for complete search history.

(56) References Cited

U.S. PATENT DOCUMENTS

| | | | |
|---|---|---|---|
| 8,901,745 B2 | 12/2014 | Hwang et al. | |
| 9,786,681 B1 | 10/2017 | Ariyoshi | |
| 2011/0031546 A1 | 2/2011 | Uenaka et al. | |
| 2011/0065272 A1 | 3/2011 | Mizukami et al. | |
| 2015/0236038 A1* | 8/2015 | Pachamuthu | H01L 27/11582 257/326 |
| 2016/0322381 A1 | 11/2016 | Liu et al. | |
| 2017/0110402 A1 | 4/2017 | Smith et al. | |
| 2017/0236746 A1 | 8/2017 | Yu et al. | |
| 2017/0278860 A1 | 9/2017 | Aoyama | |
| 2017/0338241 A1 | 11/2017 | Lee | |
| 2017/0352678 A1 | 12/2017 | Lu et al. | |
| 2018/0026044 A1 | 1/2018 | Utsumi et al. | |
| 2018/0268902 A1 | 9/2018 | Tanaka | |

OTHER PUBLICATIONS

U.S. Appl. No. 15/638,672, filed Jun. 30, 2017, SanDisk Technologies LLC.
U.S. Appl. No. 15/902,169, filed Feb. 22, 2018, SanDisk Technologies LLC.
U.S. Appl. No. 15/928,337, filed Mar. 22, 2018, SanDisk Technologies LLC.
U.S. Appl. No. 15/950,505, filed Apr. 11, 2018, SanDisk Technologies LLC.
U.S. Appl. No. 15/950,616, filed Apr. 11, 2018, SanDisk Technologies LLC.
U.S. Appl. No. 16/020,637, filed Jun. 27, 2018, SanDisk Technologies LLC.
U.S. Appl. No. 16/020,739, filed Jun. 27, 2018, SanDisk Technologies LLC.
USPTO Communication, Notice of Allowance and Fee(s) Due in a Corresponding U.S. Appl. No. 16/020,637, dated May 8, 2019, 15 pages.
USPTO Office Communication, Non-Final Office Action for U.S. Appl. No. 16/020,739 , dated May 2, 2019, 17 pages.

* cited by examiner

THREE-DIMENSIONAL MEMORY DEVICE AND METHOD OF MAKING THE SAME USING CONCURRENT FORMATION OF MEMORY OPENINGS AND CONTACT OPENINGS

RELATED APPLICATIONS

The present application claims the benefit of priority from U.S. Provisional Application Ser. No. 62/640,196 filed on Mar. 8, 2018, the entire contents of which are incorporated herein by reference.

FIELD

The present disclosure relates generally to the field of semiconductor devices and specifically to methods of concurrently forming memory openings and contact openings of a three-dimensional memory device and structures formed by these methods.

BACKGROUND

Recently, ultra-high-density storage devices employing three-dimensional (3D) memory stack structures have been proposed. Such memory stack structures can employ an architecture known as Bit Cost Scalable (BiCS) architecture. For example, a 3D NAND stacked memory device can be formed from an array of an alternating stack of insulating materials and spacer material layers that are formed as electrically conductive layers or replaced with electrically conductive layers. Memory openings are formed through the alternating stack, and are filled with memory stack structures, each of which includes a vertical stack of memory elements and a vertical semiconductor channel.

SUMMARY

According to an aspect of the present disclosure, a method of forming a three-dimensional memory device is provided, which comprises: forming a first-tier structure including a first alternating stack of first insulating layers and first sacrificial material layers and a first retro-stepped dielectric material portion overlying first stepped surfaces of the first alternating stack in a staircase region over the substrate; concurrently forming at least two types of first-tier openings through the first-tier structure, wherein the at least two types of first-tier openings are selected from first type first-tier openings comprising first-tier memory openings located in a memory array region, second type first-tier openings comprising first-tier support openings located in the staircase region, and third type first-tier openings comprising first-tier staircase-region openings; filling each first-tier opening with a respective first-tier sacrificial opening fill structure; forming a second-tier structure including a second alternating stack of second insulating layers and second sacrificial material layers and a second retro-stepped dielectric material portion overlying second stepped surfaces of the second alternating stack; concurrently forming at least two types of second-tier openings through the second-tier structure, the at least two types of second-tier openings are selected from first type second-tier openings comprising second-tier memory openings located in the memory array region, second type second-tier openings comprising second-tier support openings located in the staircase region, and third type second-tier openings comprising second-tier staircase-region openings; forming memory opening fill structures including a respective memory stack structure within volumes of each vertically neighboring pair of a first-tier memory opening and a second-tier memory opening; forming support pillar structures within volumes of each vertically neighboring pair of a first-tier support opening and a second-tier support opening; replacing the first and second sacrificial material layers with first and second electrically conductive layers, respectively; and forming staircase-region contact via structures within volumes of the first-tier staircase-region openings and the second-tier staircase-region openings.

According to another aspect of the present disclosure, a three-dimensional memory device is provided, which comprises: a stack of a conductive plate layer and source-level material layers located over a substrate; a first-tier structure overlying the source-level material layers and including a first alternating stack of first insulating layers and first electrically conductive layers, a first retro-stepped dielectric material portion overlying first stepped surfaces of the first alternating stack in a staircase region, and a first silicate glass liner located between the first stepped surfaces and the first retro-stepped dielectric material portion; a second-tier structure overlying the first-tier structure and including a second alternating stack of second insulating layers and second electrically conductive layers, a second retro-stepped dielectric material portion overlying second stepped surfaces of the second alternating stack in the staircase region, and a second silicate glass liner located between the second stepped surfaces and the second retro-stepped dielectric material portion; memory stack structures comprising a respective pair of a vertical semiconductor channel and a memory film and extending through the first alternating stack, the second alternating stack, and an upper portion of the source-level material layers and located in the memory array region; support pillar structures located in the staircase region; and staircase-region contact via structures extending through the second retro-stepped dielectric material portion and contacting an annular top surface of a respective one of the first and second electrically conductive layers.

According to an aspect of the present disclosure, a method of forming a three-dimensional memory device comprises forming a first-tier structure including a first alternating stack of first insulating layers and first spacer material layers and a first retro-stepped dielectric material portion overlying first stepped surfaces of the first alternating stack in a staircase region over a substrate, wherein each of the first spacer material layers is formed as, or is subsequently replaced with, a respective first electrically conductive layer, and concurrently forming sacrificial first-tier memory opening fill portions in the memory array region and sacrificial first-tier staircase-region opening fill portions in the staircase region. The method further comprises forming a second-tier structure including a second alternating stack of second insulating layers and second spacer material layers and a second retro-stepped dielectric material portion overlying second stepped surfaces of the second alternating stack, wherein each of the second spacer material layers is formed as, or is subsequently replaced with, a respective second electrically conductive layer and forming sacrificial memory opening fill structures and sacrificial staircase-region opening fill structures that extend from a top surface of the second-tier structure to a bottom surface of the first-tier structure. The method further comprises forming memory openings by removing the sacrificial memory opening fill structures, forming memory stack structures in the memory openings, forming sacrificial staircase-region openings by removing the sacrificial staircase-region opening fill structures, and forming staircase-region contact via structures contacting a respective one of the first and second electrically conductive layers in the staircase-region openings.

According to another aspect of the present disclosure, a three-dimensional memory device is provided, which comprises: a first-tier structure located over a substrate, the first-tier structure including a first alternating stack of first insulating layers and first electrically conductive layers and a first retro-stepped dielectric material portion overlying first stepped surfaces of the first alternating stack, wherein all layers of the first alternating stack are present in a memory array region and the first stepped surfaces are present in a staircase region; a second-tier structure located over the first-tier structure and including a second alternating stack of second insulating layers and second electrically conductive layers and a second retro-stepped dielectric material portion overlying second stepped surfaces of the second alternating stack; and memory stack structures and staircase-region contact via structures that extend through the first-tier structure and the second-tier structure, wherein: each of the memory stack structures comprises a respective memory film and a respective vertical semiconductor channel; and each of the staircase-region contact via structures contacts a respective one of the first or second electrically conductive layers and is laterally spaced from each of the first and second electrically conducive layers other than the respective one of the first or second electrically conductive layers by a respective insulating spacer.

According to yet another aspect of the present disclosure, a method of forming a three-dimensional memory device is provided, which comprises: forming a stack of a conductive plate layer and source-level material layers over a substrate; forming a first-tier structure over a substrate, the first-tier structure including a first alternating stack of first insulating layers and first spacer material layers and a first retro-stepped dielectric material portion overlying first stepped surfaces of the first alternating stack, wherein all layers of the first alternating stack are present in a memory array region and the first stepped surfaces are present in a staircase region, and each of the first spacer material layers is formed as, or is subsequently replaced with, a respective first electrically conductive layer; concurrently forming sacrificial first-tier memory opening fill portions in the memory array region and a sacrificial first-tier peripheral-region opening fill portion through the first retro-stepped dielectric material portion; forming a second-tier structure including a second alternating stack of second insulating layers and second spacer material layers and a second retro-stepped dielectric material portion overlying second stepped surfaces of the second alternating stack, wherein each of the second spacer material layers is formed as, or is subsequently replaced with, a respective second electrically conductive layer; forming memory openings by anisotropically etching second-tier memory openings through the second-tier structure over areas of the sacrificial first-tier memory opening fill portions and removing the sacrificial first-tier memory opening fill portions; forming memory stack structures in the memory openings; forming a peripheral-region opening by anisotropically etching a sacrificial second-tier peripheral-region opening over the sacrificial first-tier peripheral-region opening fill portion and removing the sacrificial first-tier peripheral-region opening fill portion; and forming a peripheral contact via structure in the peripheral-region opening.

According to still another aspect of the present disclosure, a three-dimensional memory device is provided, which comprises: a stack of a conductive plate layer and source-level material layers overlying a substrate; a first-tier structure overlying the source-level material layers, the first-tier structure including a first alternating stack of first insulating layers and first electrically conductive layers, a first retro-stepped dielectric material portion overlying first stepped surfaces of the first alternating stack, and a first dielectric pillar structure overlying a portion of the source-level material layers; a second-tier structure overlying the first-tier structure, the second-tier structure including a second alternating stack of second insulating layers and second electrically conductive layers, a second retro-stepped dielectric material portion overlying second stepped surfaces of the second alternating stack, and a second dielectric pillar structure overlying the first dielectric pillar structure; memory stack structures extending through each electrically conductive layer in the first and second alternating stacks and comprising a respective memory film and a vertical semiconductor channel; first staircase-region contact via structures contacting a respective first electrically conductive layer and having a respective straight sidewall extending from a top surface to a bottom surface of a respective first staircase-region contact via structure; and a plate contact via structure extending through the first and second dielectric pillar structures, contacting a top surface of the conductive plate layer, and including a lower sidewall contacting the first dielectric pillar structure, an upper sidewall contacting the second dielectric pillar structure, and an interconnecting horizontal surface adjoining the lower sidewall and the upper sidewall and located within a horizontal plane including an interface between the first dielectric pillar structure and the second dielectric pillar structure.

DETAILED DESCRIPTION

Figure 1A:
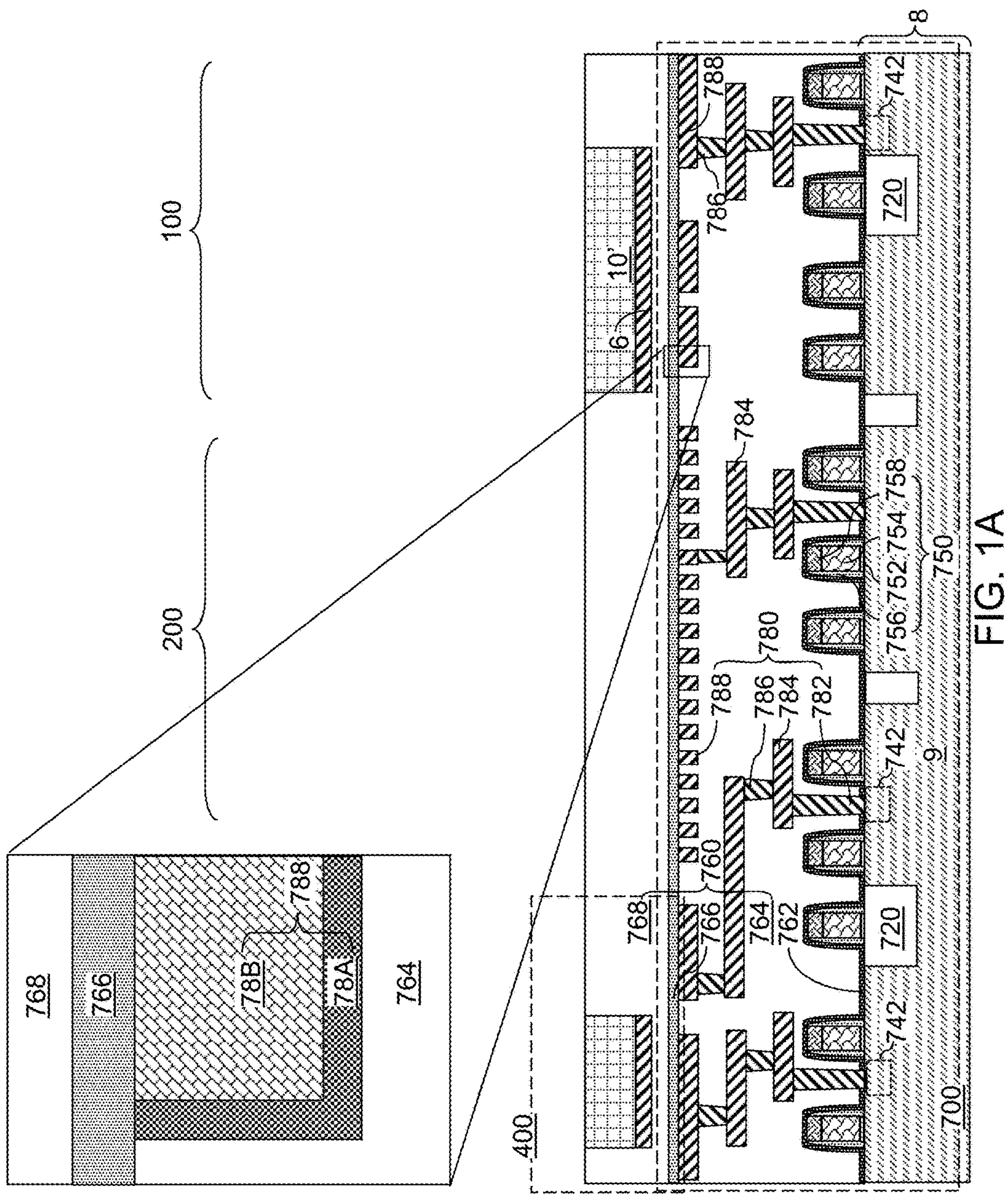
FIG. 1A is a vertical cross-sectional view of a first exemplary structure after formation of semiconductor devices, lower-level dielectric material layers, lower-level metal interconnect structures, a planar conducive plate layer, and a planar semiconductor material layer on a semiconductor substrate according to a first embodiment of the present disclosure.

As discussed above, the present disclosure is directed to methods of concurrently forming memory openings and contact openings for a three-dimensional memory device and structures formed by the same, the various aspects of which are discussed in detail herebelow. The embodiments of the disclosure can be employed to form multi-purpose contacts in contact openings formed during the same etching step for various structures including a multilevel memory structure, non-limiting examples of which include semiconductor devices such as three-dimensional monolithic memory array devices comprising a plurality of NAND memory strings. The multi-purpose contacts decrease the number of contact processing steps thus reducing the process cost and complexity.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-memory-level" element refers to an element that vertically extends through a memory level.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulating material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and can be fabricated employing the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Figure 1B:
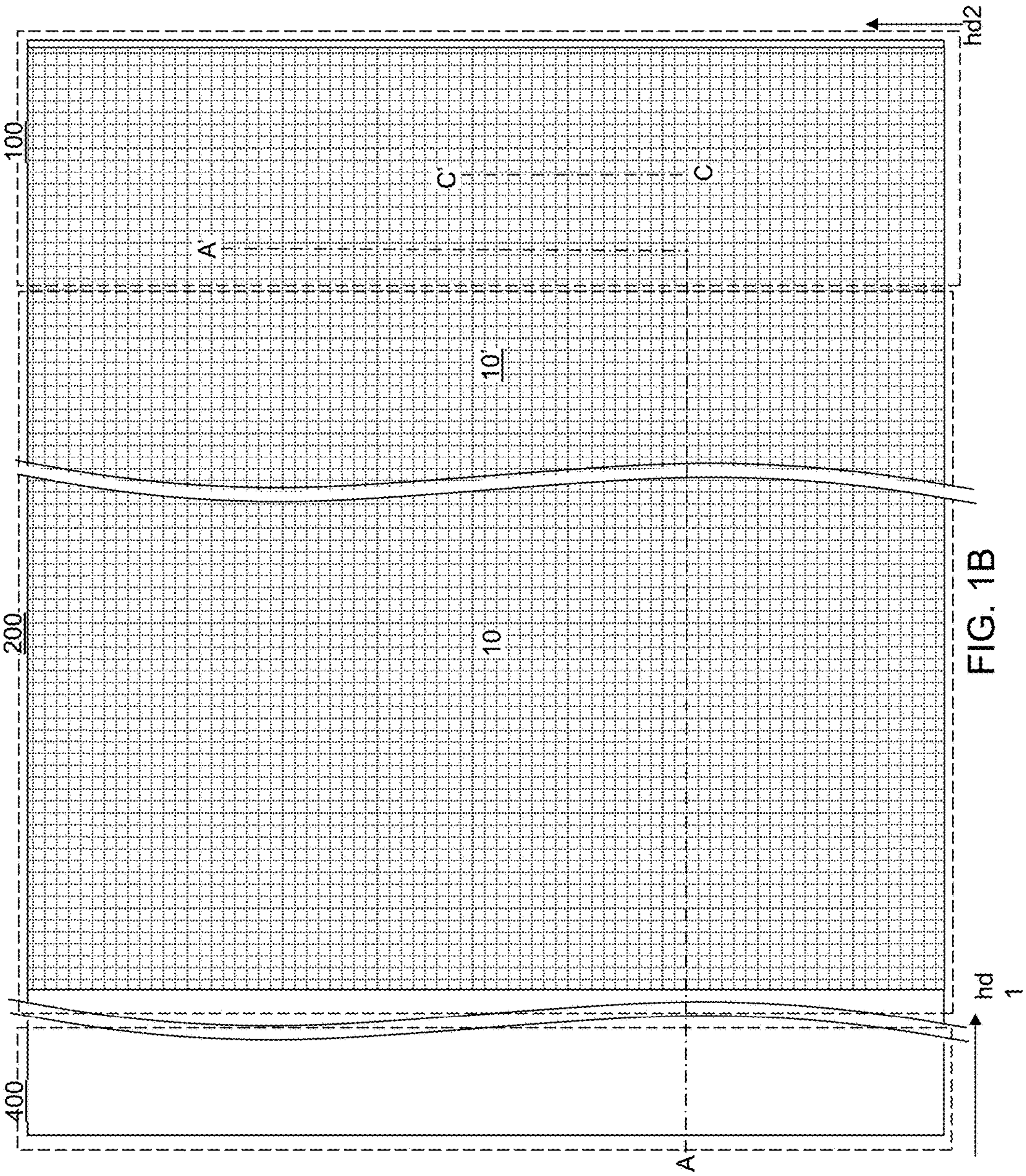
FIG. 1B is a top-down view of the first exemplary structure of FIG. 1A. The hinged vertical plane A-A' is the plane of the vertical cross-sectional view of FIG. 1A.
Figure 1C:
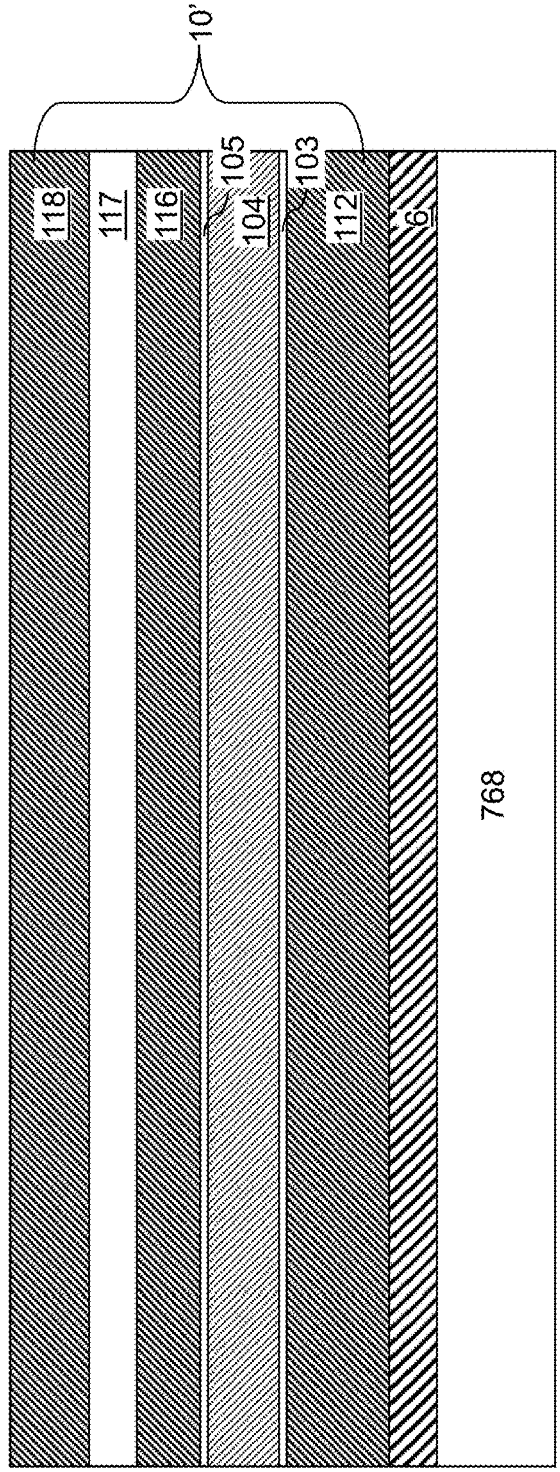
FIG. 1C is a vertical cross-sectional view of the first exemplary structure along the vertical plane C-C' of FIG. 1A.

Referring to FIGS. 1A-1C, a first exemplary structure according to a first embodiment of the present disclosure is illustrated. FIG. 1C is a magnified view of an in-process source-level material layers 10' illustrated in FIGS. 1A and 1B. The first exemplary structure includes a semiconductor substrate 8 and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746, and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which is herein referred to as lower-level dielectric material layers 760. The lower-level dielectric material layers 760 can include, for example, a dielectric liner 762 (such as a silicon nitride liner that blocks diffusion of mobile ions and/or apply appropriate stress to underlying structures), at least one first dielectric material layer 764 that overlies the dielectric liner 762, a silicon nitride layer (e.g., hydrogen diffusion barrier) 766 that overlies the dielectric material layer 764, and at least one second dielectric layer 768.

The dielectric layer stack including the lower-level dielectric material layers 760 functions as a matrix for lower-level metal interconnect structures 780 that provide electrical wiring among the various nodes of the semiconductor devices and landing pads for through-memory-level contact via structures to be subsequently formed. The lower-level metal interconnect structures 780 are embedded within the dielectric layer stack of the lower-level dielectric material layers 760, and comprise a lower-level metal line structure located under and optionally contacting a bottom surface of the silicon nitride layer 766.

For example, the lower-level metal interconnect structures 780 can be embedded within the at least one first dielectric material layer 764. The at least one first dielectric material layer 764 may be a plurality of dielectric material layers in which various elements of the lower-level metal interconnect structures 780 are sequentially embedded. Each dielectric material layer among the at least one first dielectric material layer 764 may include any of doped silicate glass, undoped silicate glass, organosilicate glass, silicon nitride, silicon oxynitride, and dielectric metal oxides (such as aluminum oxide). In one embodiment, the at least one first dielectric material layer 764 can comprise, or consist essentially of, dielectric material layers having dielectric constants that do not exceed the dielectric constant of undoped silicate glass (silicon oxide) of 3.9. The lower-level metal interconnect structures 780 can include various device contact via structures 782 (e.g., source and drain electrodes which contact the respective source and drain nodes of the device or gate electrode contacts), intermediate lower-level metal line structures 784, lower-level metal via structures 786, and topmost lower-level metal line structures 788 that are configured to function as landing pads for through-memory-level contact via structures to be subsequently formed.

The topmost lower-level metal line structures 788 can be formed within a topmost dielectric material layer of the at least one first dielectric material layer 764 (which can be a plurality of dielectric material layers). Each of the lower-level metal interconnect structures 780 can include a metallic nitride liner 78A and a metal fill structure 78B. Top surfaces of the topmost lower-level metal line structures 788 and the topmost surface of the at least one first dielectric material layer 764 may be planarized by a planarization process, such as chemical mechanical planarization. The silicon nitride layer 766 can be formed directly on the top surfaces of the topmost lower-level metal line structures 788 and the topmost surface of the at least one first dielectric material layer 764.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional conductive plate layer 6 and in-process source-level material layers 10'. The optional conductive plate layer 6, if present, provides a high conductivity conduction path for electrical current that flows into, or out of, the in-process source-level material layers 10'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses can also be employed. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 can include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses can also be employed.

The in-process source-level material layers 10' can include various layers that are subsequently modified to form source-level material layers. The source-level material layers, upon formation, include a source contact layer that functions as a common source region for vertical field effect transistors of a three-dimensional memory device. In one embodiment, the in-process source-level material layer 10' can include, from bottom to top, a lower source-level material layer 112, a lower sacrificial liner 103, a source-level sacrificial layer 104, an upper sacrificial liner 105, an upper source-level material layer 116, a source-level insulating layer 117, and an optional source-select-level conductive layer 118.

The lower source-level material layer 112 and the upper source-level material layer 116 can include a doped semiconductor material such as doped polysilicon or doped amorphous silicon. The conductivity type of the lower source-level material layer 112 and the upper source-level material layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 can be in a range from 10 nm to 300 nm, such as from 20 nm to 150 nm, although lesser and greater thicknesses can also be employed.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be employed.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be employed.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be employed. The optional source-select-level conductive layer 118 can include a conductive material that can be employed as a source-select-level gate electrode. For example, the optional source-select-level conductive layer 118 can include a doped semiconductor material such as doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be employed.

The in-process source-level material layers 10' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 10' may be patterned to provide openings in areas in which through-memory-level contact via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed. The at least one second dielectric material layer 768 can include a blanket layer portion 768A underlying the conductive plate layer 6 and the in-process source-level material layers 10' and a patterned portion 768B that fills gaps among the patterned portions of the conductive plate layer 6 and the in-process source-level material layers 10'.

The optional conductive plate layer 6 and the in-process source-level material layers 10' can be patterned such that an opening extends over a staircase region 200 in which contact via structures contacting word line electrically conductive layers are to be subsequently formed. In one embodiment, the staircase region 200 can be laterally spaced from the memory array region 100 along a first horizontal direction (e.g., word line direction) hd1. A horizontal direction that is perpendicular to the first horizontal direction hd1 is herein referred to as a second horizontal direction (e.g., bit line direction) hd2. In one embodiment, additional openings in the optional conductive plate layer 6 and the in-process source-level material layers 10' can be formed within the area of a memory array region 100, in which a three-dimensional memory array including memory stack structures is to be subsequently formed. A peripheral device region 400 that is subsequently filled with a field dielectric material portion can be provided adjacent to the staircase region 200.

The region of the semiconductor devices 710 and the combination of the lower-level dielectric layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are embedded in the lower-level dielectric layers 760.

The lower-level metal interconnect structures 780 can be electrically shorted to active nodes (e.g., transistor active regions 742 or gate electrodes 754) of the semiconductor devices 710 (e.g., CMOS devices), and are located at the level of the lower-level dielectric layers 760. Through-memory-level contact via structures can be subsequently formed directly on the lower-level metal interconnect structures 780 to provide electrical connection to memory devices to be subsequently formed. In one embodiment, the pattern of the lower-level metal interconnect structures 780 can be selected such that the topmost lower-level metal line structures 788 (which are a subset of the lower-level metal interconnect structures 780 located at the topmost portion of the lower-level metal interconnect structures 780) can provide landing pad structures for the through-memory-level contact via structures to be subsequently formed.

Figure 2:
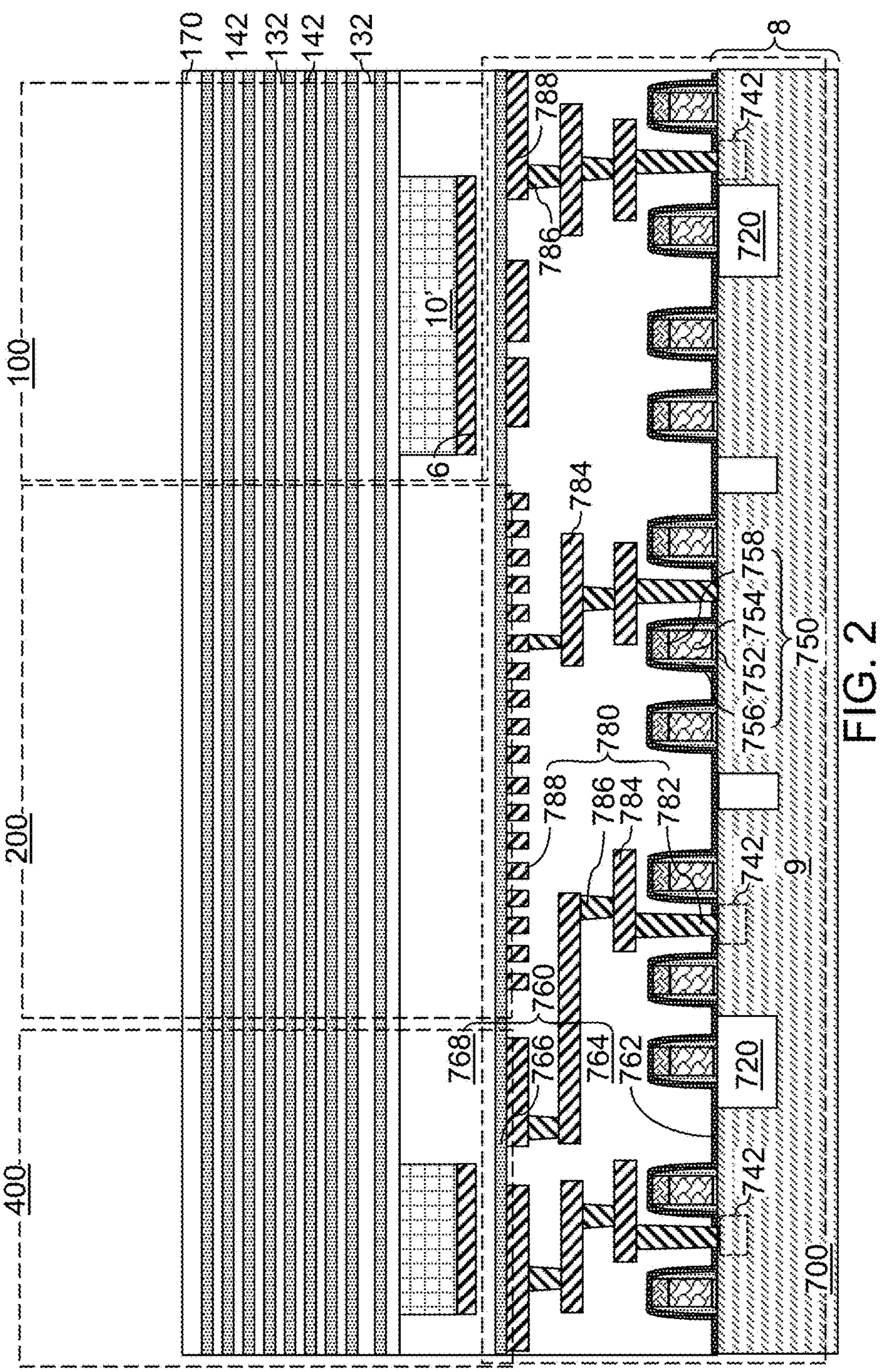
FIG. 2 is a vertical cross-sectional view of the first exemplary structure after formation of a first alternating stack of first insulting layers and first spacer material layers according to the first embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 3:
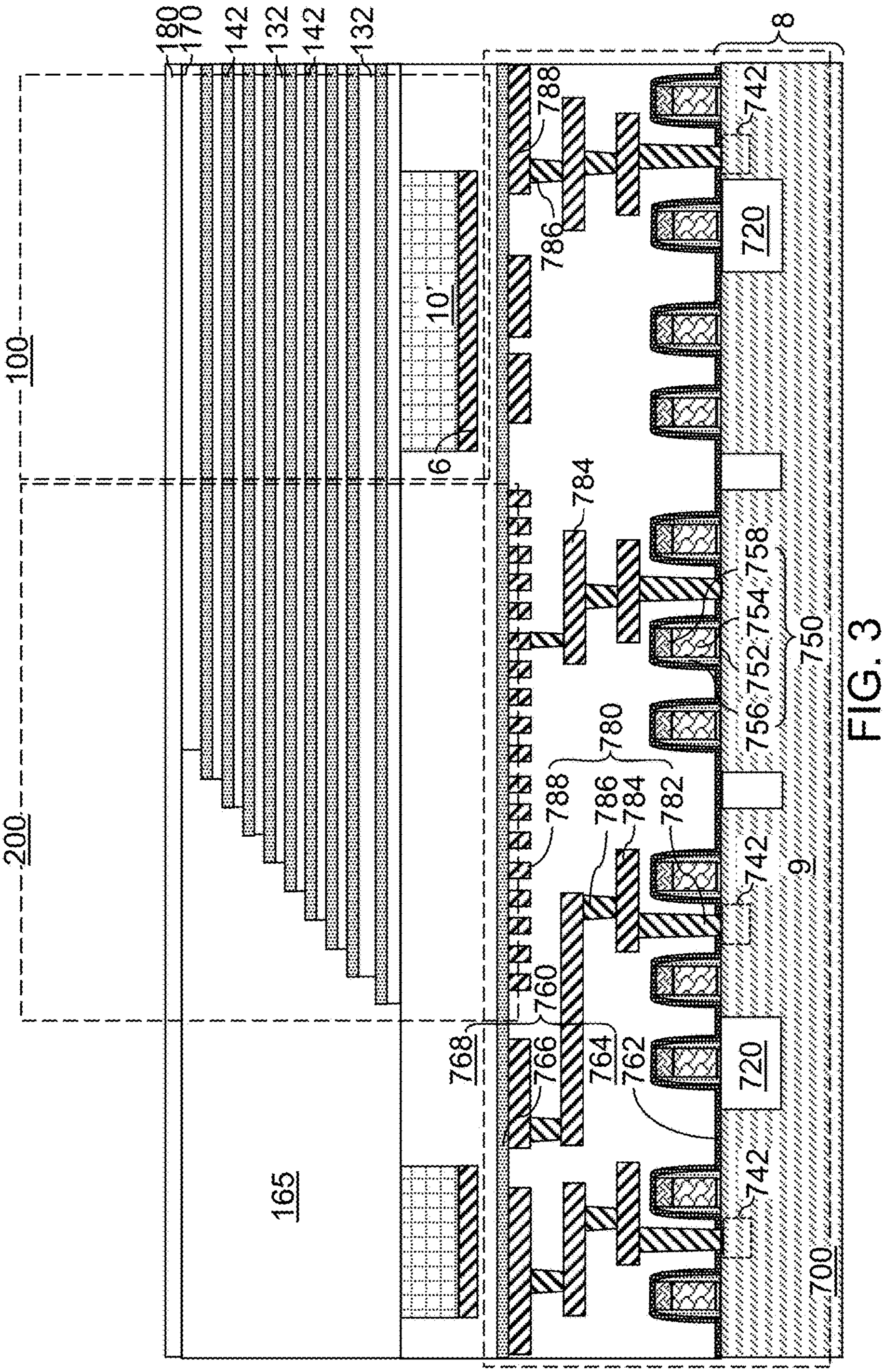
FIG. 3 is a vertical cross-sectional view of the first exemplary structure after patterning of first stepped surfaces on the first alternating stack and formation of a first retro-stepped dielectric material portion and an inter-tier dielectric layer according to the first embodiment of the present disclosure.

Referring to FIG. 3, the first insulating cap layer 170 and the first-tier alternating stack (132, 142) can be patterned to form first stepped surfaces in the staircase region 200. The staircase region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 can be physically exposed at the first stepped surfaces. The cavity overlying the first stepped surfaces is herein referred to as a first stepped cavity.

A dielectric fill material (such as undoped silicate glass or doped silicate glass) can be deposited to fill the first stepped cavity. Excess portions of the dielectric fill material can be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified. The first-tier structure (132, 142, 170, 165) includes a first alternating stack of first insulating layers and first spacer material layers (such as the first sacrificial material layers 142) and a first retro-stepped dielectric material portion 165 overlying the first stepped surfaces of the first alternating stack (132, 142). All layers of the first alternating stack (132, 142) are present within the portion of the first alternating stack (132, 142) in the memory array region 100, and the first stepped surfaces are present in the staircase region 200. Each of the first spacer material layers can be formed as, or can be subsequently replaced with, a respective first electrically conductive layer.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phosphosilicate glass. The thickness of the inter-tier dielectric layer 180 can be in a range from 30 nm to 300 nm, although lesser and greater thicknesses can also be employed.

Figure 4A:
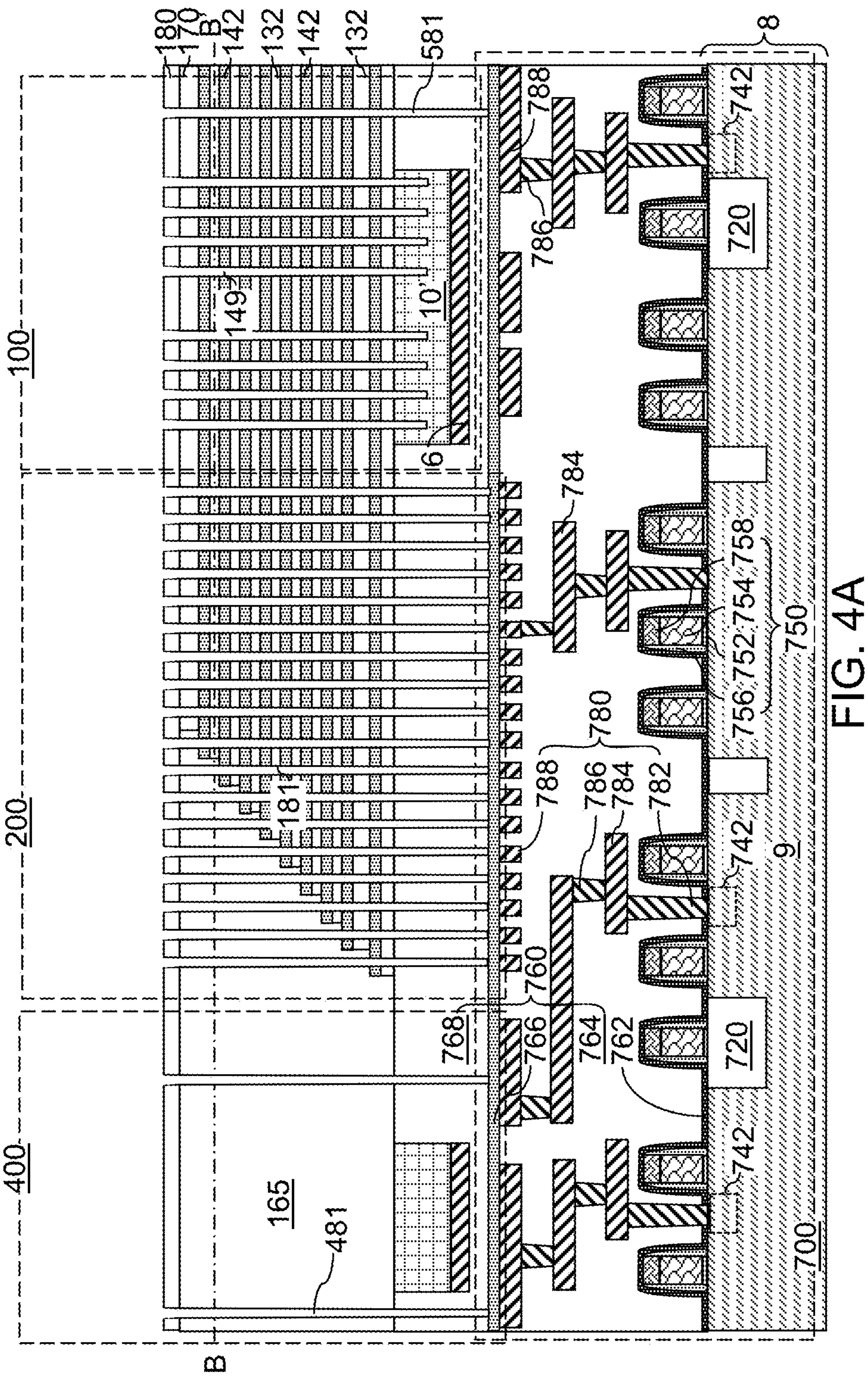
FIG. 4A is a vertical cross-sectional view of the first exemplary structure after formation of first-tier memory openings, first-tier staircase-region openings, first-tier array-region openings, and first-tier peripheral-region openings according to the first embodiment of the present disclosure.
Figure 4B:
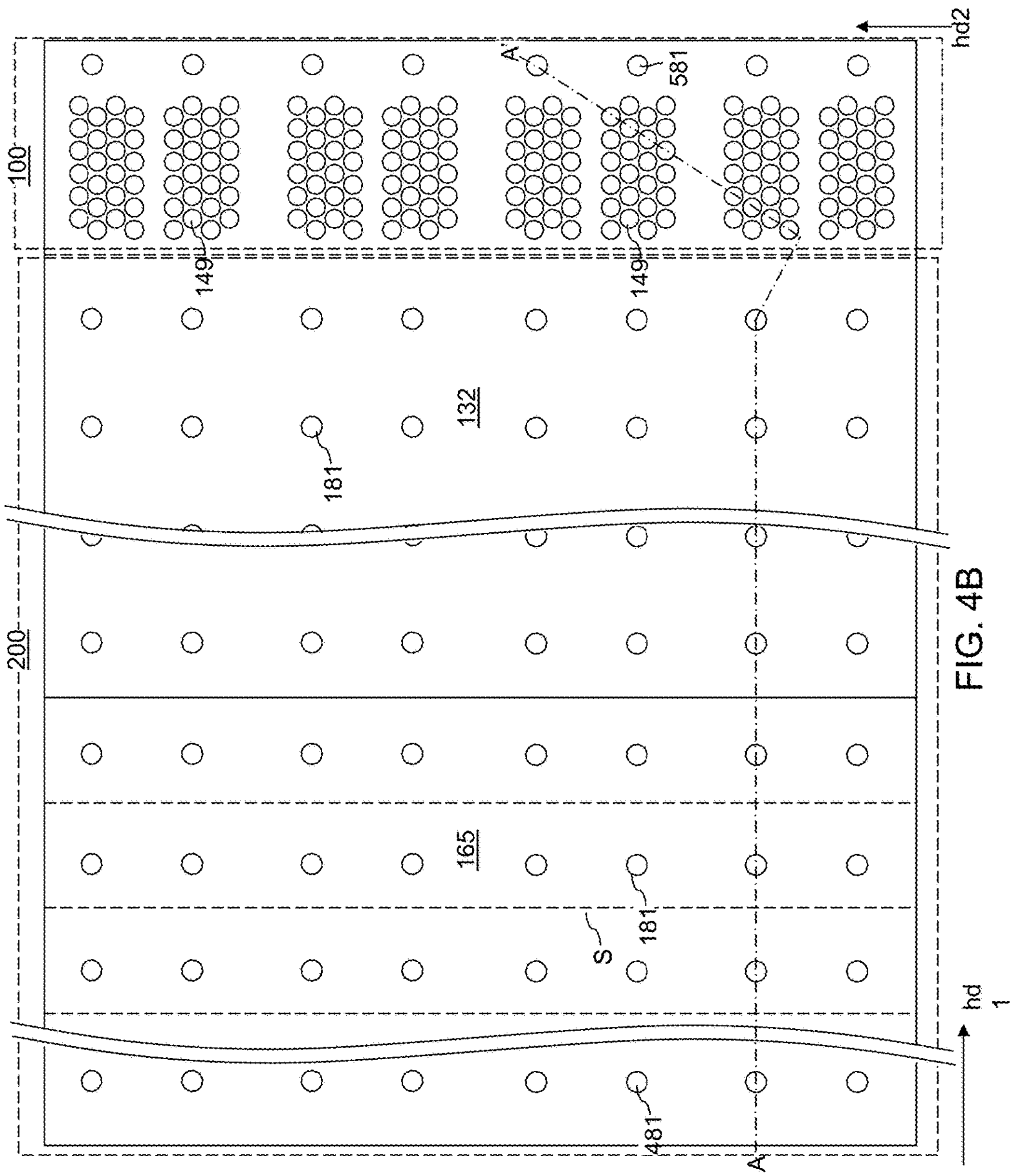
FIG. 4B is a horizontal cross-sectional view of the first exemplary structure along the horizontal plane B-B' in FIG. 4A. The zig-zag vertical plane A-A' corresponds to the plane of the vertical cross-sectional view of FIG. 4A.

Referring to FIGS. 4A and 4B, various first-tier openings (149, 181, 481, 581) can be formed through the inter-tier dielectric layer 180 and the first-tier structure (132, 142, 170, 165) and into the in-process source-level material layers 10' and into the at least one second dielectric layer 768. A photoresist layer (not shown) can be applied over the inter-tier dielectric layer 180, and can be lithographically patterned to form various openings therethrough. The pattern of openings in the photoresist layer can be transferred through the inter-tier dielectric layer 180 and the first-tier structure (132, 142, 170, 165) and into the in-process source-level material layers 10' and the at least one second dielectric layer 768 by a first anisotropic etch process to form the various first-tier openings (149, 181, 481, 581) concurrently, i.e., during the first anisotropic etch process. The various first-tier openings (149, 181, 481, 581) can include first-tier memory openings 149, first-tier staircase-region openings 181, first-tier array-region openings 581, and first-tier peripheral-region openings 481. The first-tier array-region openings 581 and first-tier peripheral-region openings 481 are collectively referred to as first-tier contact openings (581, 481).

The first-tier memory openings 149 are openings that are formed in the memory array region 100 through each layer within the first alternating stack (132, 142) and are subsequently employed to form memory stack structures therein. The first-tier memory openings 149 can be formed in clusters of first-tier memory openings 149 that are laterally spaced apart along the second horizontal direction hd2. Each cluster of first-tier memory openings 149 can be formed as a two-dimensional array of first-tier memory openings 149. Locations of steps S in the first-tier alternating stack (132, 142) are illustrated as dotted lines in FIG. 4B.

The first-tier staircase-region openings 181 are openings that are formed in the staircase region 200 and are subsequently employed to form staircase-region contact via structures that interconnect a respective pair of an underlying lower-level metal interconnect structure 780 (such as a topmost lower-level metal line structure 788) and an electrically conductive layer (which can be formed as one of the spacer material layers or can be formed by replacement of a sacrificial material layer within the electrically conductive layer). A subset of the first-tier staircase-region openings 181 that is formed through the first retro-stepped dielectric material portion 165 can be formed through a respective horizontal surface of the first stepped surfaces. Further, each of the first-tier staircase-region openings 181 can be formed directly above (i.e., above, and with an areal overlap with) a respective one of the lower-level metal interconnect structure 780.

The first-tier array-region openings 581 can be formed within a respective area of the memory array region 100 that contains an opening in the optional conductive plate layer 6 and in-process source-level material layers 10'. Each first-tier array-region opening 581 can be formed directly above a respective one of the lower-level metal interconnect structure 780. The first-tier peripheral-region openings 481 can be formed within a respective area of the peripheral region 400 that contains an opening in the optional conductive plate layer 6 and in-process source-level material layers 10'. Each first-tier peripheral-region opening 481 can be formed directly above a respective one of the lower-level metal interconnect structure 780.

In one embodiment, the first anisotropic etch process can include an initial etch step in which the materials of the first-tier alternating stack (132, 142) are etched concurrently with the material of the first retro-stepped dielectric material portion 165. The chemistry of the initial etch step can alternate to optimize etching of the first and second materials in the first-tier alternating stack (132, 142) while providing a comparable average etch rate to the material of the first retro-stepped dielectric material portion 165. The first anisotropic etch process can employ, for example, a series of reactive ion etch processes or a single reaction etch process (e.g., $CF_4/O_2/Ar$ etch). The sidewalls of the various first-tier openings (149, 181, 481, 581) can be substantially vertical, or can be tapered.

After etching through the alternating stack (132, 142) and the first retro-stepped dielectric material portion 165, the chemistry of a terminal portion of the first anisotropic etch process can be selected to etch through the dielectric material(s) of the at least one second dielectric layer 768 with a higher etch rate than an average etch rate for the in-process source-level material layers 10'. For example, a terminal portion of the anisotropic etch process may include a step that etches the dielectric material(s) of the at least one second dielectric layer 768 selective to a semiconductor material within a component layer in the in-process source-level material layers 10'. In one embodiment, the terminal portion of the first anisotropic etch process can etch through the optional source-select-level conductive layer 118, the source-level insulating layer 117, the upper source-level material layer 116, the upper sacrificial liner 105, the source-level sacrificial layer 104, and the lower sacrificial liner 103, and at least partly into the lower source-level material layer 112. The terminal portion of the first anisotropic etch process can include at least one etch chemistry for etching the various semiconductor materials of the in-process source-level material layers 10'.

In one embodiment, the bottom surfaces of the first-tier memory openings 149 can be recessed surfaces of the lower source-level material layer 112, and the bottom surfaces of the first-tier staircase-region openings 181, the first-tier array-region openings 581, and the first-tier peripheral-region openings 481 can be horizontal surfaces of the silicon nitride layer 766 that overlies the topmost lower-level metal line structures 788 and acts as an etch stop layer. In another embodiment, the bottom surfaces of the first-tier memory openings 149 can be recessed surfaces of the lower source-level material layer 112, and the bottom surfaces of the first-tier staircase-region openings 181, the first-tier array-region openings 581, and the first-tier peripheral-region openings 481 can be physically exposed top surfaces of the topmost lower-level metal line structures 788 after etching through the etch stop silicon nitride layer 766. The photoresist layer can be subsequently removed, for example, by ashing.

Figure 5B:
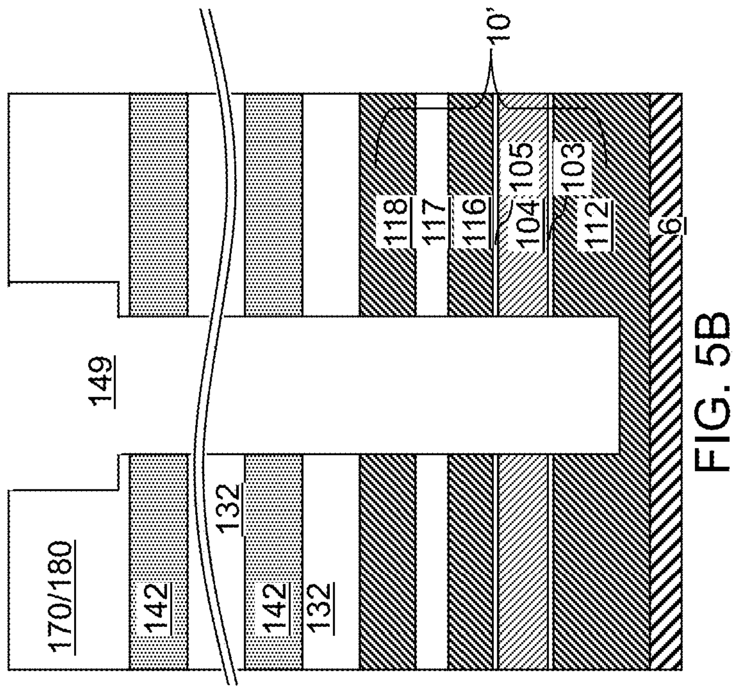
FIGS. 5A and 5B illustrate optional processing steps that can be employed to laterally expand portions of each first-tier opening at the level of the inter-tier dielectric layer according to the first embodiment of the present disclosure.
Figure 5A:
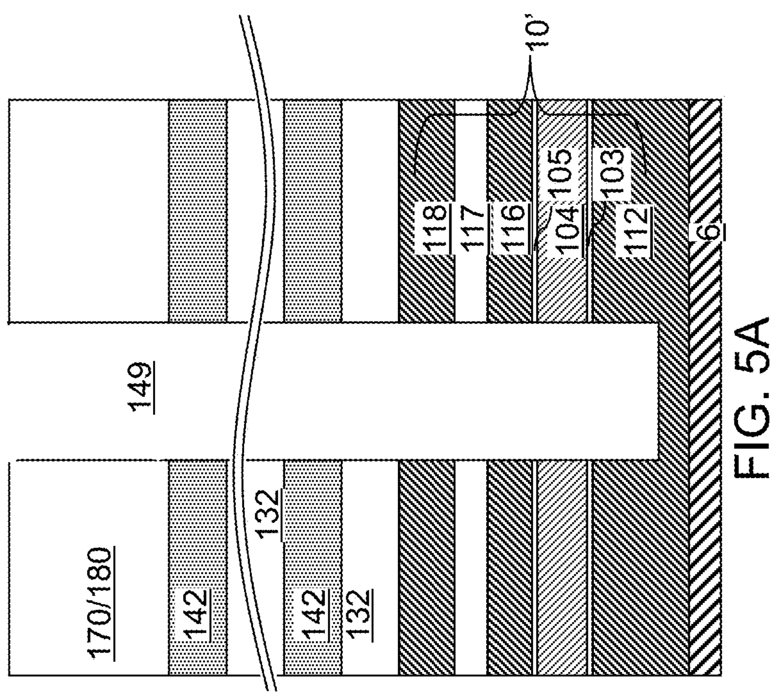

Optionally, the portions of the first-tier memory openings 149, the first-tier staircase-region openings 181, the first-tier array-region openings 581, and the first-tier peripheral-region openings 481 at the level of the inter-tier dielectric layer 180 can be laterally expanded by an isotropic etch. FIGS. 5A and 5B illustrate a processing sequence for laterally expanding portions of the first-tier memory openings 149 at the level of the inter-tier dielectric layer 180. FIG. 5A illustrates a first-tier memory opening 149 immediately after the anisotropic etch that forms the first-tier memory openings 149. As discussed above, the first anisotropic etch process can terminate after each of the first-tier memory openings 149 extends to the lower source layer 112. The inter-tier dielectric layer 180 can comprise a dielectric material (such as borosilicate glass) having a greater etch rate than the first insulating layers 132 (that can include undoped silicate glass). Referring to FIG. 5B, an isotropic etch (such as a wet etch employing HF) can be employed to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 6:
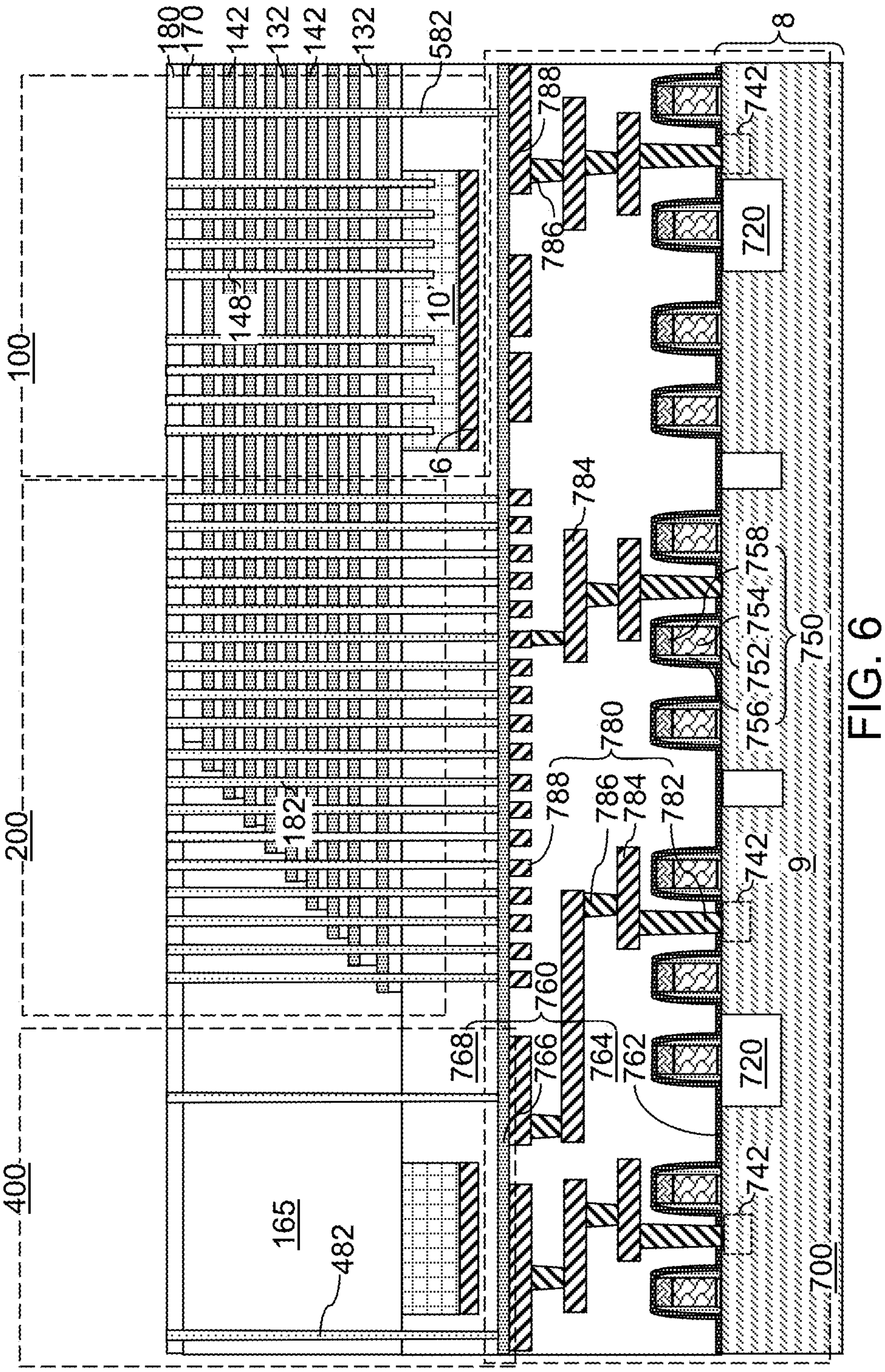
FIG. 6 is a vertical cross-sectional view of the first exemplary structure after formation of sacrificial first-tier memory opening fill portions, sacrificial first-tier staircase-region opening fill portions, sacrificial first-tier array-region opening fill portions, and sacrificial first-tier peripheral-region opening fill portions according to the first embodiment of the present disclosure.

Referring to FIG. 6, sacrificial first-tier opening fill portions (148, 182, 482, 582) can be formed in the various first-tier openings (149, 181, 481, 581). For example, a sacrificial first-tier fill material is concurrently deposited at the same time in each of the first-tier openings (149, 181, 481, 581). The sacrificial first-tier fill material includes a material that can be subsequently removed selective to the materials of the first insulating layers 132 and the first sacrificial material layers 142.

In one embodiment, the sacrificial first-tier fill material can include a semiconductor material such as silicon (e.g., amorphous silicon (a-Si) or polysilicon), a silicon-germanium alloy, germanium, a III-V compound semiconductor material, or a combination thereof. Optionally, a thin etch stop layer (such as a silicon oxide layer or a silicon nitride layer having a thickness in a range from 1 nm to 3 nm) may be employed prior to depositing the sacrificial first-tier fill material. The sacrificial first-tier fill material may be formed by a non-conformal deposition or a conformal deposition method.

In another embodiment, the sacrificial first-tier fill material can include a silicon oxide material having a higher etch rate than the materials of the first insulating layers 132, the first insulating cap layer 170, and the inter-tier insulating layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop layer (such as a silicon nitride layer having a thickness in a range from 1 nm to 3 nm) may be employed prior to depositing the sacrificial first-tier fill material. The sacrificial first-tier fill material may be formed by a non-conformal deposition or a conformal deposition method.

In yet another embodiment, the sacrificial first-tier fill material can include a carbon-containing material (such as amorphous carbon or diamond-like carbon) that can be subsequently removed by ashing, or a silicon-based polymer that can be subsequently removed selective to the materials of the first alternating stack (132, 142).

Portions of the deposited sacrificial first-tier fill material can be removed from above the topmost layer of the first-tier alternating stack (132, 142), such as from above the inter-tier dielectric layer 180. For example, the sacrificial first-tier fill material can be recessed to a top surface of the inter-tier dielectric layer 180 employing a planarization process. The planarization process can include a recess etch, chemical mechanical planarization (CMP), or a combination thereof. The top surface of the inter-tier dielectric layer 180 can be employed as an etch stop layer or a planarization stop layer.

Remaining portions of the sacrificial first-tier fill material comprise sacrificial first-tier opening fill portions (148, 182, 482, 582). Specifically, each remaining portion of the sacrificial material in a first-tier memory opening 149 constitutes a sacrificial first-tier memory opening fill portion 148. Each remaining portion of the sacrificial material in a first-tier staircase-region opening 181 constitutes a sacrificial first-tier staircase-region opening fill portion 182. Each remaining portion of the sacrificial material in a first-tier array-region opening 581 constitutes a sacrificial first-tier array-region opening fill portion 582. Each sacrificial first-tier array-region opening fill portion 582 extends through each layer in the first alternating stack (132, 142). Each remaining portion of the sacrificial material in a first-tier peripheral-region opening 481 constitutes a sacrificial first-tier peripheral-region opening fill portion 482. Each sacrificial first-tier peripheral-region opening fill portion 482 extends through the first retro-stepped dielectric material portion 165, and does not contact the first alternating stack (132, 142). The sacrificial first-tier array-region opening fill portions 582 and the sacrificial first-tier peripheral-region opening fill portion 482 are collectively referred to as first-tier contact opening fill portions (482, 582).

The various sacrificial first-tier opening fill portions (148, 182, 482, 582) are concurrently formed, i.e., during a same set of processes including the deposition process that deposits the sacrificial first-tier fill material and the planarization process that removes this material from above the first alternating stack (132, 142) (such as from above the top surface of the inter-tier dielectric layer 180). The top surfaces of the sacrificial first-tier opening fill portions (148, 182, 482, 582) can be coplanar with the top surface of the inter-tier dielectric layer 180. Each of the sacrificial first-tier opening fill portions (148, 182, 482, 582) may, or may not, include cavities therein.

Figure 7:
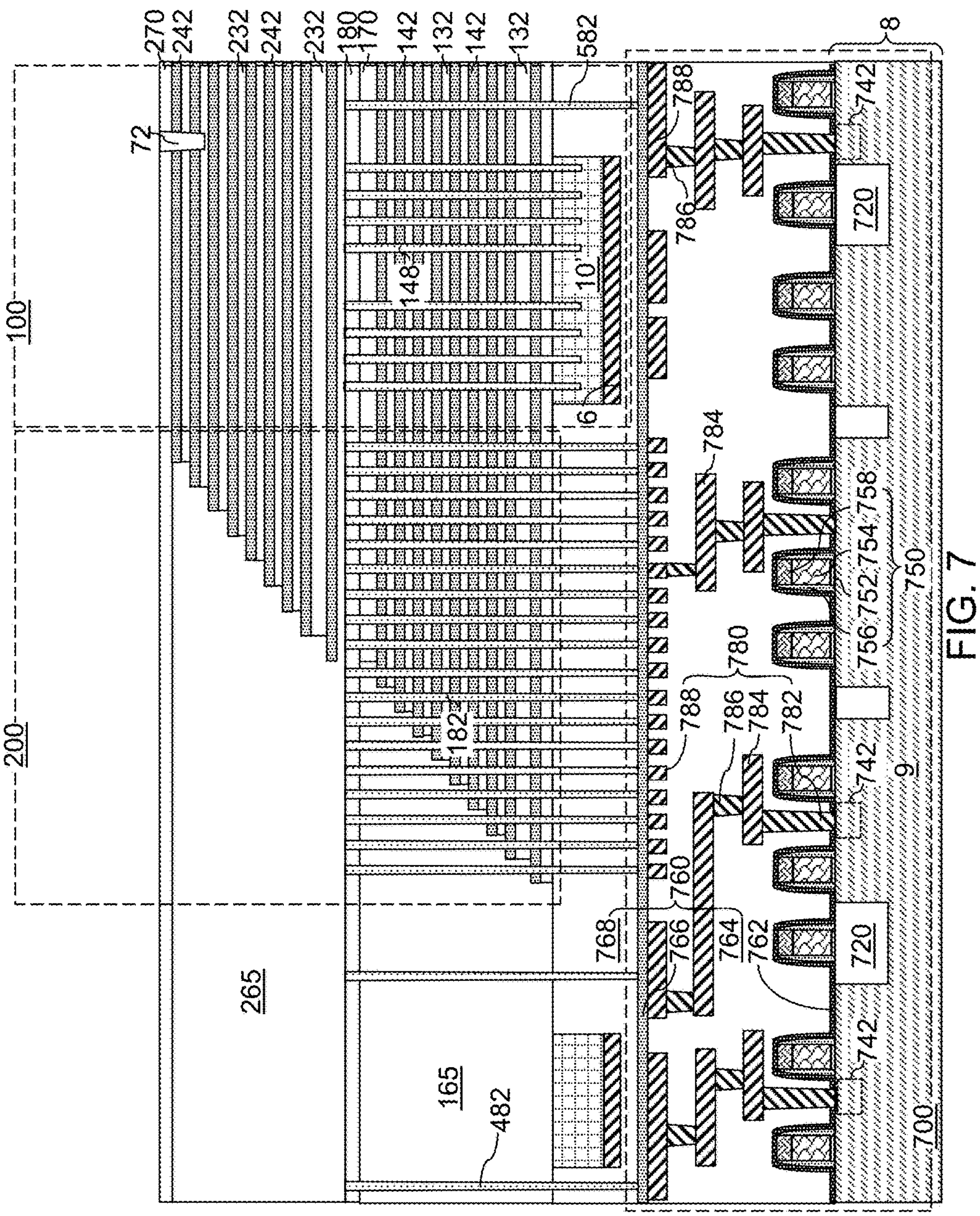
FIG. 7 is a vertical cross-sectional view of the first exemplary structure after formation of a second alternating stack of second insulating layers and second spacer material layers, a second-tier retro-stepped dielectric material portion, and a second insulating cap layer according to the first embodiment of the present disclosure.

Referring to FIG. 7, a second-tier structure can be formed over the first-tier structure (132, 142, 170, 148). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces in the second stepped area can be formed in the staircase region 200 employing a same set of processing steps as the processing steps employed to form the first stepped surfaces in the first stepped area with suitable adjustment to the pattern of at least one masking layer. A second retro-stepped dielectric material portion 265 can be formed over the second stepped surfaces in the staircase region 200.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the in-process source-level material layers 10', and at least one retro-stepped dielectric material portion (165, 265) can be formed over the staircase regions on the at least one alternating stack (132, 142, 232, 242).

Optionally, drain-select-level isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 8A:
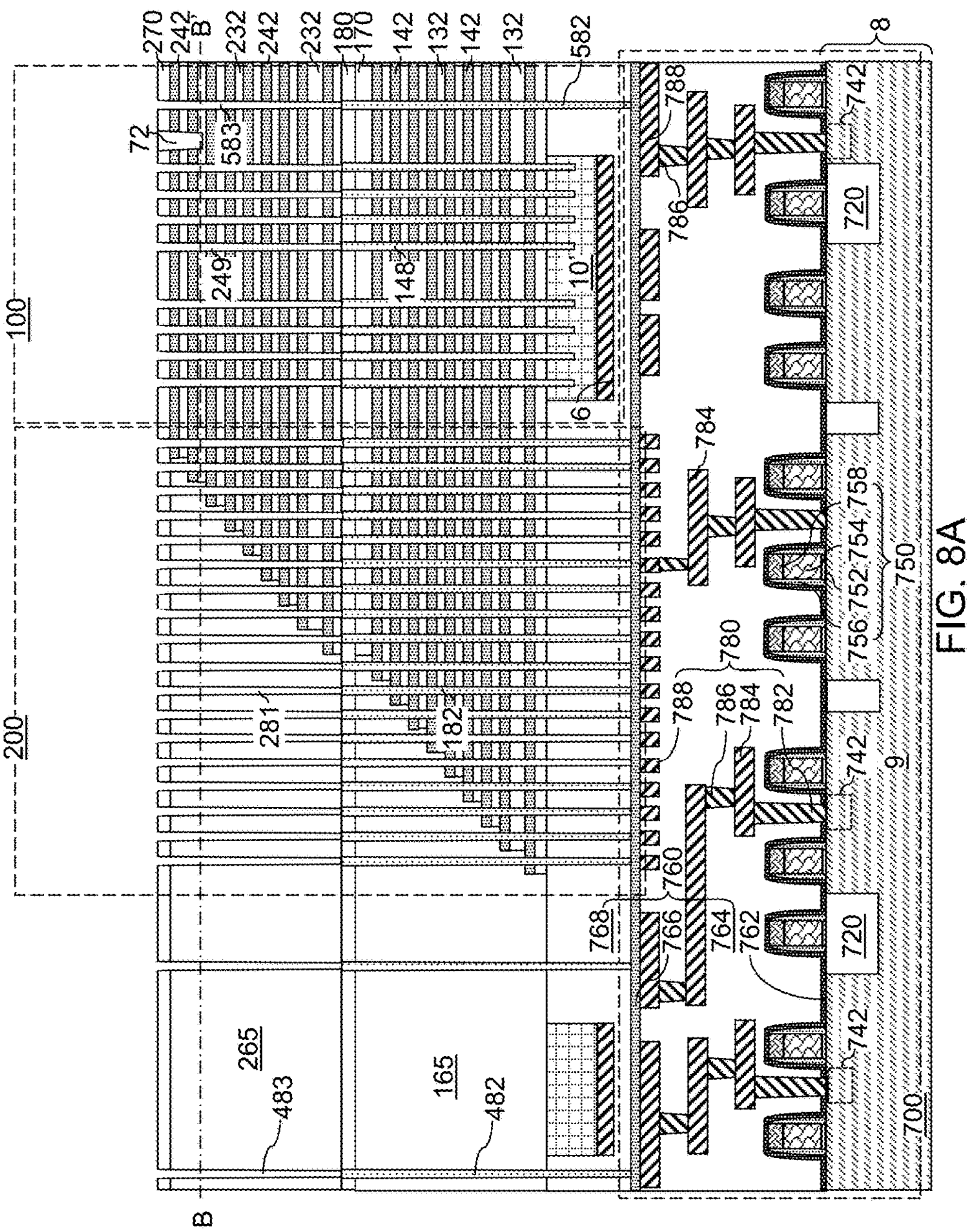
FIG. 8A is a vertical cross-sectional view of the first exemplary structure after formation of second-tier memory openings, second-tier staircase-region openings, second-tier array-region openings, and second-tier peripheral-region openings according to the first embodiment of the present disclosure.
Figure 8B:
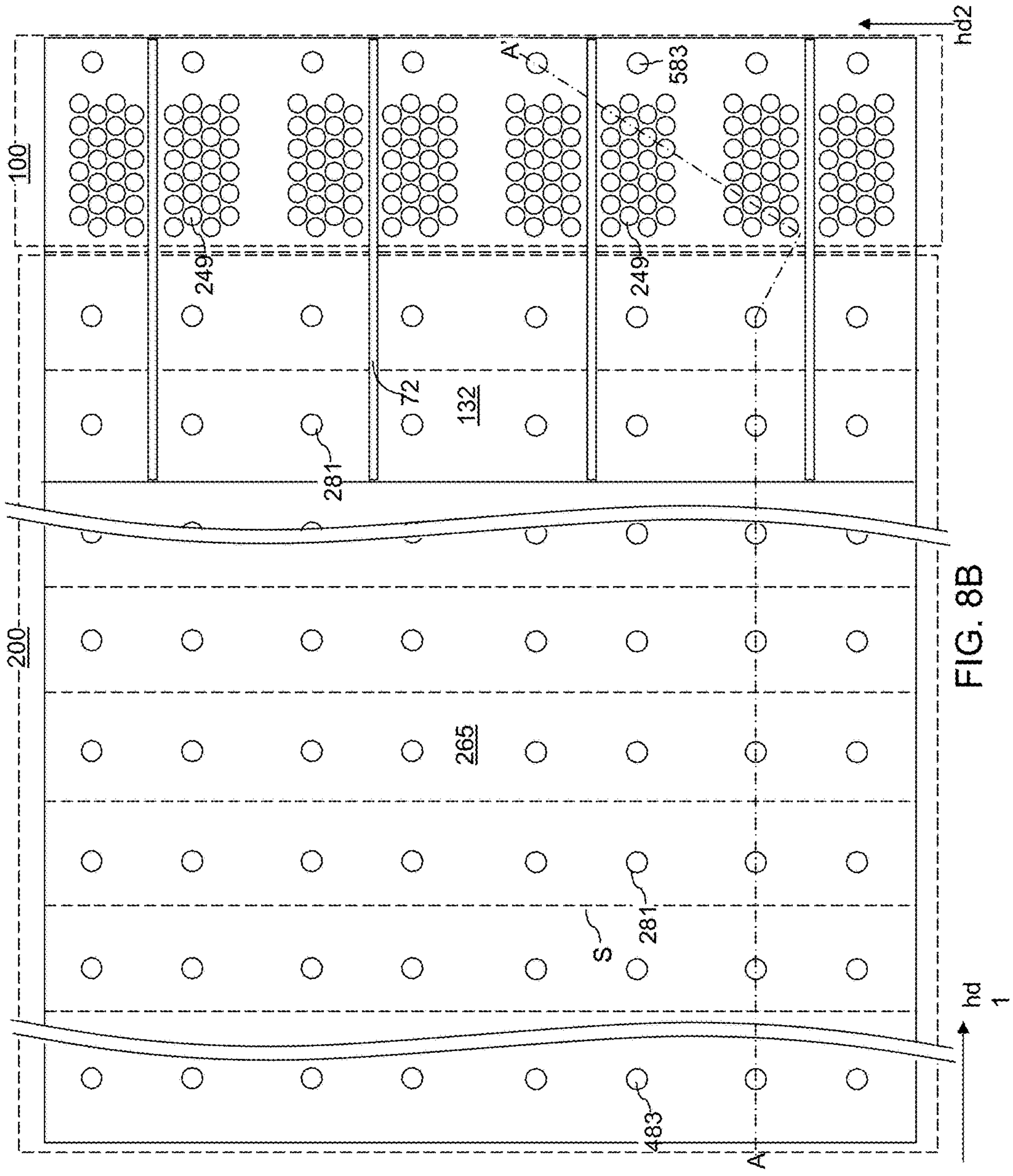
FIG. 8B is a horizontal cross-sectional view of the first exemplary structure along the horizontal plane B-B' in FIG. 8A. The zig-zag vertical plane A-A' corresponds to the plane of the vertical cross-sectional view of FIG. 8A.

Referring to FIGS. 8A and 8B, various second-tier openings (249, 281, 583, 483) can be formed through the second-tier structure (232, 242, 265, 270, 72). A photoresist layer (not shown) can be applied over the second insulating cap layer 270, and can be lithographically patterned to form various openings therethrough. The pattern of the openings can be the same as the pattern of the various first-tier openings (149, 181, 481, 581), which is the same as the sacrificial first-tier opening fill portions (148, 182, 482, 582). Thus, the lithographic mask employed to pattern the first-tier openings (149, 181, 481, 581) can be employed to pattern the photoresist layer.

The pattern of openings in the photoresist layer can be transferred through the second-tier structure (232, 242, 265, 270, 72) by a second anisotropic etch process to form various second-tier openings (249, 281, 483, 583) concurrently, i.e., during the second anisotropic etch process. The various second-tier openings (249, 281, 483, 583) can include second-tier memory openings 249, second-tier staircase-region openings 281, second-tier array-region openings 583, and second-tier peripheral-region openings 483.

The second-tier memory openings 249 are formed directly on a top surface of a respective one of the sacrificial first-tier memory opening fill portions 148. The second-tier staircase-region openings 281 are formed directly on a top surface of a respective one of the sacrificial first-tier staircase-region opening fill portions 182. Further, each second-tier staircase-region openings 281 can be formed through a horizontal surface within the second stepped surfaces, which include the interfacial surfaces between the second alternating stack (232, 242) and the second retro-stepped dielectric material portion 265. The second-tier array-region openings 583 can be formed on a top surface of a respective one of the sacrificial first-tier array-region opening fill portions 582. The second-tier peripheral-region openings 483 can be formed directly one a top surface of a respective one of the sacrificial first-tier peripheral-region opening fill portions 482. Locations of steps S in the first-tier alternating stack (132, 142) and the second-tier alternating stack (232, 242) are illustrated as dotted lines in FIG. 8B.

The second anisotropic etch process can include an etch step in which the materials of the second-tier alternating stack (232, 242) are etched concurrently with the material of the second retro-stepped dielectric material portion 265. The chemistry of the etch step can alternate to optimize etching of the materials in the second-tier alternating stack (232, 242) while providing a comparable average etch rate to the material of the second retro-stepped dielectric material portion 265. The second anisotropic etch process can employ, for example, a series of reactive ion etch processes or a single reaction etch process (e.g., $CF_4/O_2/Ar$ etch). The sidewalls of the various second-tier openings (249, 281, 483, 583) can be substantially vertical, or can be tapered. A bottom periphery of each second-tier opening (249, 281, 483, 583) may be laterally offset, and/or may be located entirely within, a periphery of a top surface of an underlying sacrificial first-tier opening fill portion (148, 182, 482, 582). The photoresist layer can be subsequently removed, for example, by ashing.

Figure 9:
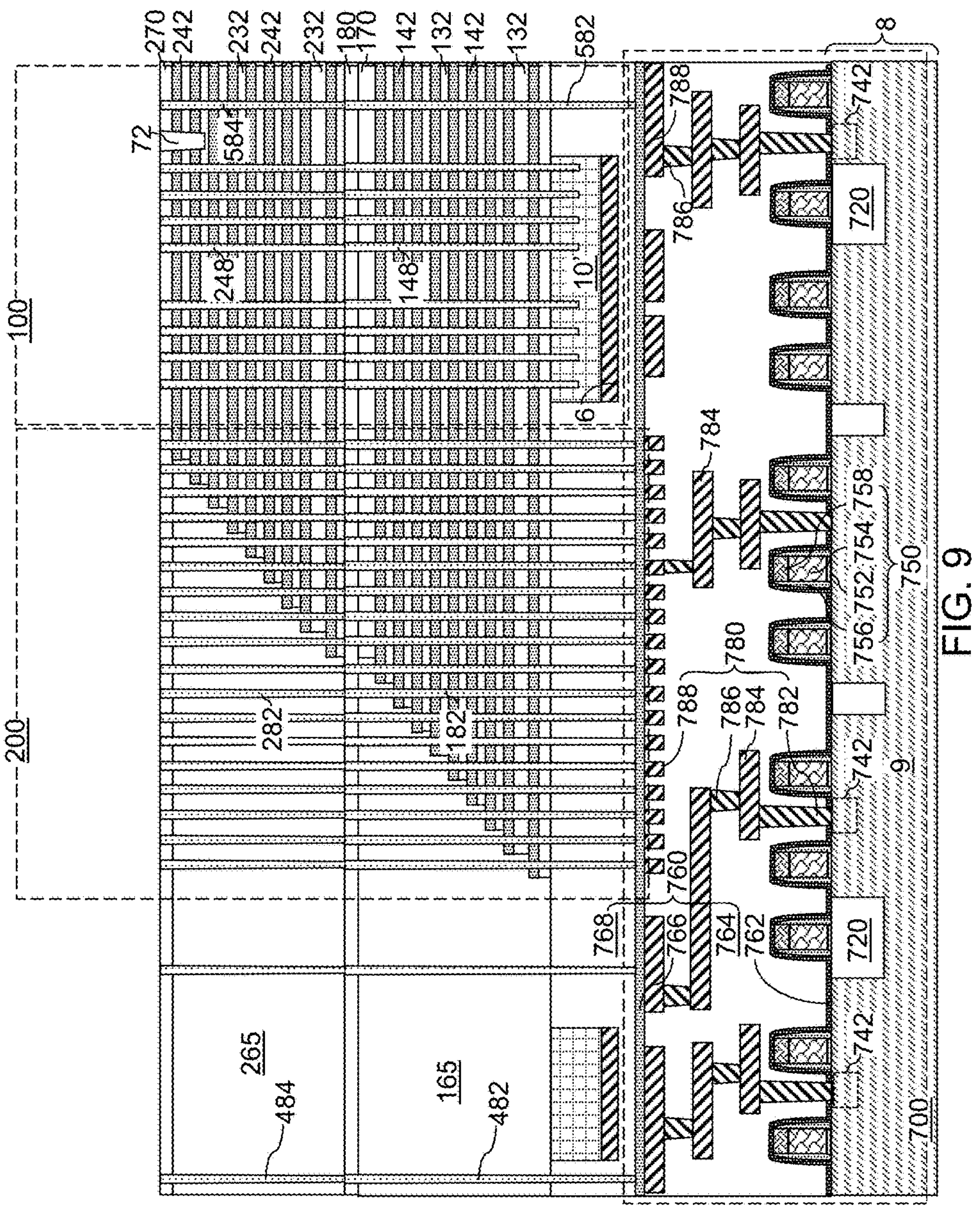
FIG. 9 is a vertical cross-sectional view of the first exemplary structure after formation of sacrificial second-tier memory opening fill portions, sacrificial second-tier staircase-region opening fill portions, sacrificial second-tier array-region opening fill portions, and sacrificial second-tier peripheral-region opening fill portions according to the first embodiment of the present disclosure.

Referring to FIG. 9, sacrificial second-tier opening fill portions (248, 284, 484, 584) can be formed in the various second-tier openings (249, 281, 483, 583). For example, a sacrificial second-tier fill material is concurrently deposited at the same time in each of the second-tier openings (249, 281, 483, 583). The sacrificial second-tier fill material includes a material that can be subsequently removed selective to the materials of the second insulating layers 232 and the second sacrificial material layers 242. For example, the sacrificial second-tier fill material can be any of the materials that can be employed as the sacrificial first-tier fill material. An etch stop liner may be optionally deposited prior to deposition of the sacrificial second-tier fill material. Portions of the deposited sacrificial second-tier fill material can be removed from above the topmost layer of the second-tier alternating stack (232, 242), such as from above the second insulating cap layer 270. For example, the sacrificial second-tier fill material can be recessed to a top surface of the second insulating cap layer 270 employing a planarization process. The planarization process can include a recess etch, chemical mechanical planarization (CMP), or a combination thereof. The top surface of the second insulating cap layer 270 can be employed as an etch stop layer or a planarization stop layer.

Remaining portions of the sacrificial second-tier fill material comprise sacrificial second-tier opening fill portions (248, 282, 484, 584). Specifically, each remaining portion of the sacrificial material in a second-tier memory opening 249 constitutes a sacrificial second-tier memory opening fill portion 248. Each remaining portion of the sacrificial material in a second-tier staircase-region opening 281 constitutes a sacrificial second-tier staircase-region opening fill portion 282. Each remaining portion of the sacrificial material in a second-tier array-region opening 583 constitutes a sacrificial second-tier array-region opening fill portion 584. Each sacrificial second-tier array-region opening fill portion 584 extends through each layer in the second alternating stack (232, 242). Each remaining portion of the sacrificial material in a second-tier peripheral-region opening 483 constitutes a sacrificial second-tier peripheral-region opening fill portion 484. Each sacrificial second-tier peripheral-region opening fill portion 484 extends through the second retro-stepped dielectric material portion 265, and does not contact the second alternating stack (232, 242). The sacrificial second-tier array-region opening fill portions 584 and the sacrificial second-tier peripheral-region opening fill portion 484 are collectively referred to as second-tier contact opening fill portions (484, 584).

The various sacrificial second-tier opening fill portions (248, 282, 484, 584) are concurrently formed, i.e., during a same set of processes including the deposition process that deposits the sacrificial second-tier fill material and the planarization process that removes this material from above the second alternating stack (232, 242) (such as from above the top surface of the second insulating cap layer 270). The top surfaces of the sacrificial second-tier opening fill portions (248, 282, 484, 584) can be coplanar with the top surface of the second insulating cap layer 270. Each of the sacrificial second-tier opening fill portions (248, 282, 484, 584) may, or may not, include cavities therein.

Each vertical stack of a sacrificial first-tier memory opening fill portion 148 and a sacrificial second-tier memory opening fill portion 248 constitutes a sacrificial memory opening fill structure (148, 248). Each vertical stack of a sacrificial first-tier staircase-region opening fill portion 182 and a sacrificial second-tier staircase-region opening fill portion 282 constitutes a sacrificial staircase-region opening fill structure (182, 282). Each vertical stack of a sacrificial first-tier array-region opening fill portion 582 and a sacrificial second-tier array-region opening fill portion 584 constitutes a sacrificial array-region opening fill structure (582, 584). Each vertical stack of a sacrificial first-tier peripheral-region opening fill portion 482 and a sacrificial second-tier peripheral-region opening fill portion 484 constitutes a sacrificial peripheral-region opening fill structure (482, 484). Each of the sacrificial memory opening fill structures (148, 248), the sacrificial staircase-region opening fill structures (182, 282), the sacrificial array-region opening fill structures (582, 584), and the sacrificial peripheral-region opening fill structures (482, 484) vertically extend from the top surface of the second-tier structure (232, 242, 270, 265, 72) below a bottom surface of the first-tier structure (132, 142, 170, 165). The sacrificial memory opening fill structures (148, 248) extend into the in-process source-level material layers 10', and the sacrificial staircase-region opening fill structures (182, 282), the sacrificial array-region opening fill structures (582, 584), and the sacrificial peripheral-region opening fill structures (482, 484) extend at least to the silicon nitride layer 766 and may extend to top surfaces of the lower-level metal interconnect structures 780. The sacrificial array-region opening fill structures (582, 584) and the sacrificial peripheral-region opening fill structures (482, 484) are collectively referred to as contact opening fill structures {(582, 584), (482, 484)}.

Figure 10:
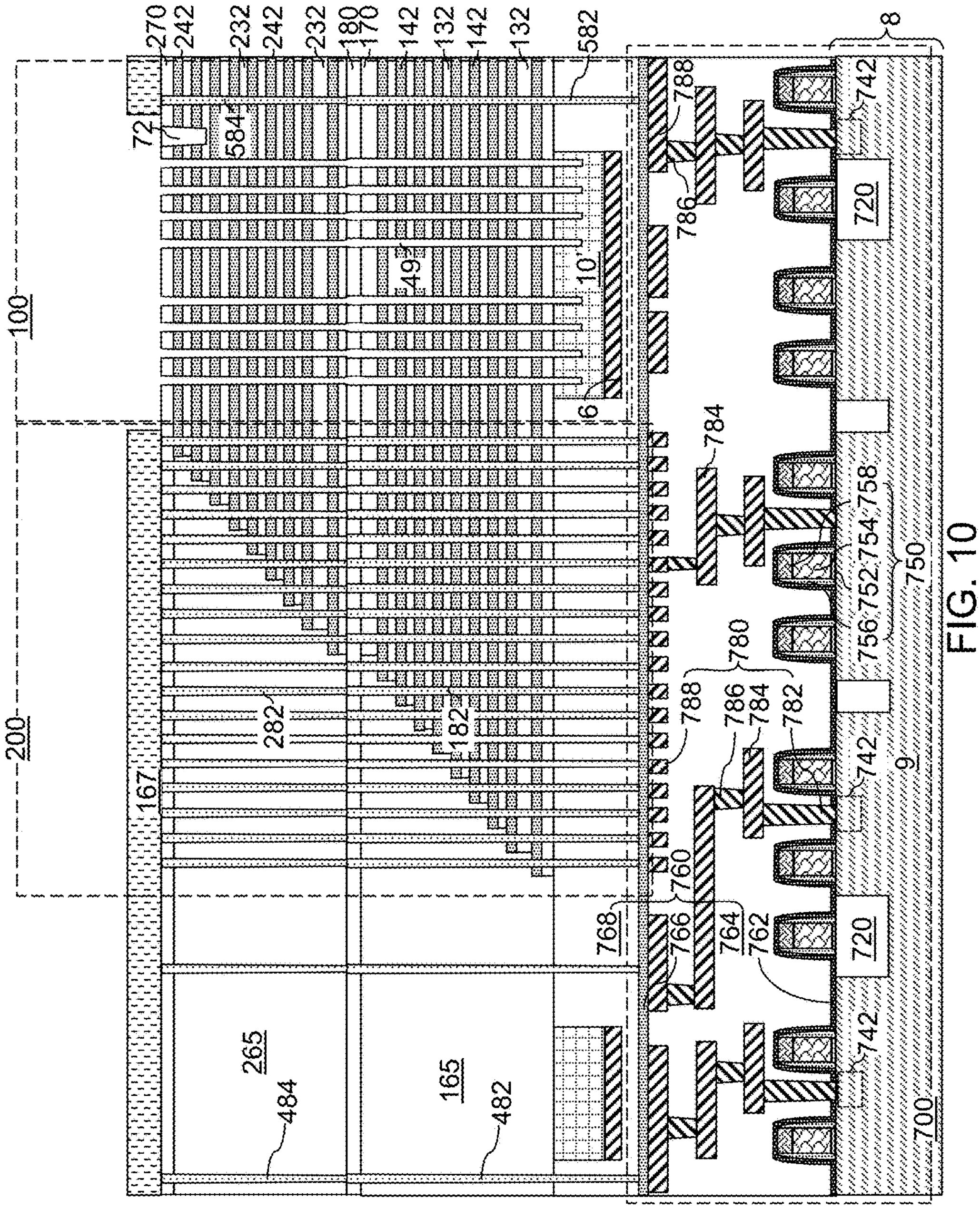
FIG. 10 is a vertical cross-sectional view of the first exemplary structure after formation of a first masking layer that covers the sacrificial second-tier staircase-region opening fill portions, the sacrificial second-tier array-region opening fill portions, and the sacrificial second-tier peripheral-region opening fill portions according to the first embodiment of the present disclosure.

Referring to FIG. 10, a first masking layer 167 can be applied and patterned to cover the sacrificial staircase-region opening fill structures (182, 282), the sacrificial array-region opening fill structures (582, 584), and the sacrificial peripheral-region opening fill structures (482, 484) while not covering the sacrificial memory opening fill structures (148, 248) in the memory array region 100. The first masking layer 167 can be a photoresist layer or a patterning film that is lithographically patterned employing a patterned photoresist layer (not shown).

The sacrificial second-tier fill material and the sacrificial first-tier fill material can be removed from underneath the opening(s) in the first masking layer 167 employing an etch process that etches the sacrificial second-tier fill material and the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each volume from which a sacrificial memory opening fill structure (148, 248) is removed.

FIGS. 11A-11D provide sequential cross-sectional views of a memory opening 49 during formation of a memory opening fill structure 58. The same structural change occurs in each memory openings 49.

Figure 11A:
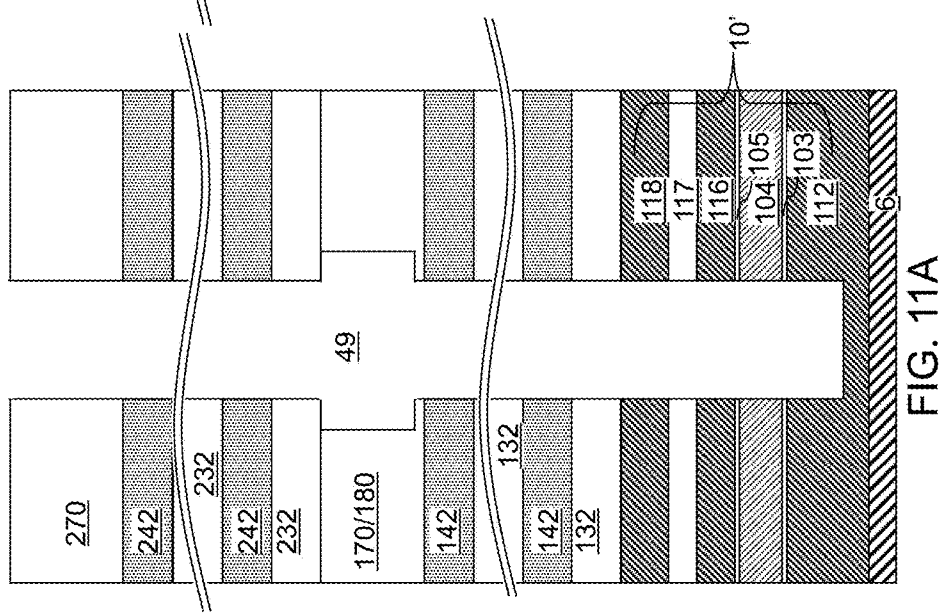
FIGS. 11A-11D are sequential vertical cross-sectional views of an inter-tier memory opening during formation of a memory opening fill structure according to the first embodiment of the present disclosure.

Referring to FIG. 11A, a memory opening 49 in the first exemplary device structure of FIGS. 10A and 10B is illustrated. The memory opening 49 extends through the first-tier structure and the second-tier structure.

Figure 11B:
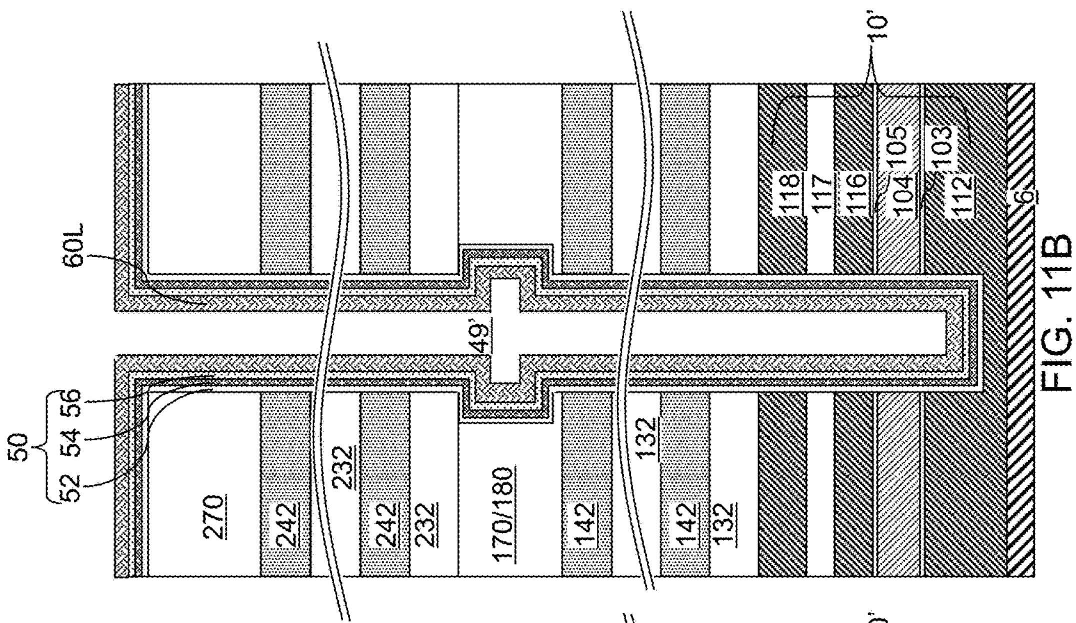

Referring to FIG. 11B, a stack of layers including a blocking dielectric layer 52, a charge storage layer 54, a tunneling dielectric layer 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include a dielectric semiconductor compound such as silicon oxide, silicon oxynitride, silicon nitride, or a combination thereof.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer. Alternatively, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The stack of the blocking dielectric layer 52, the charge storage layer 54, and the tunneling dielectric layer 56 constitutes a memory film 50 that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be employed. A cavity 49' is formed in the volume of each memory opening 49 that is not filled with the deposited material layers (52, 54, 56, 60L).

Figure 11C:
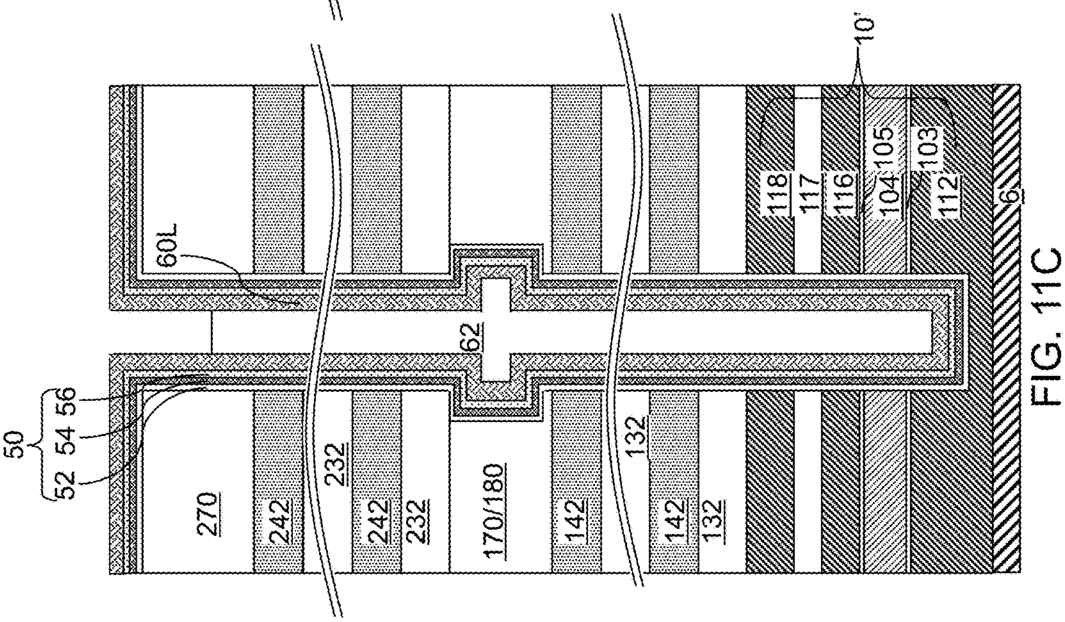

Referring to FIG. 11C, in case the cavity 49' in each memory opening is not completely filled by the semiconductor channel material layer 60L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the second insulating cap layer 270 can be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Figure 11D:
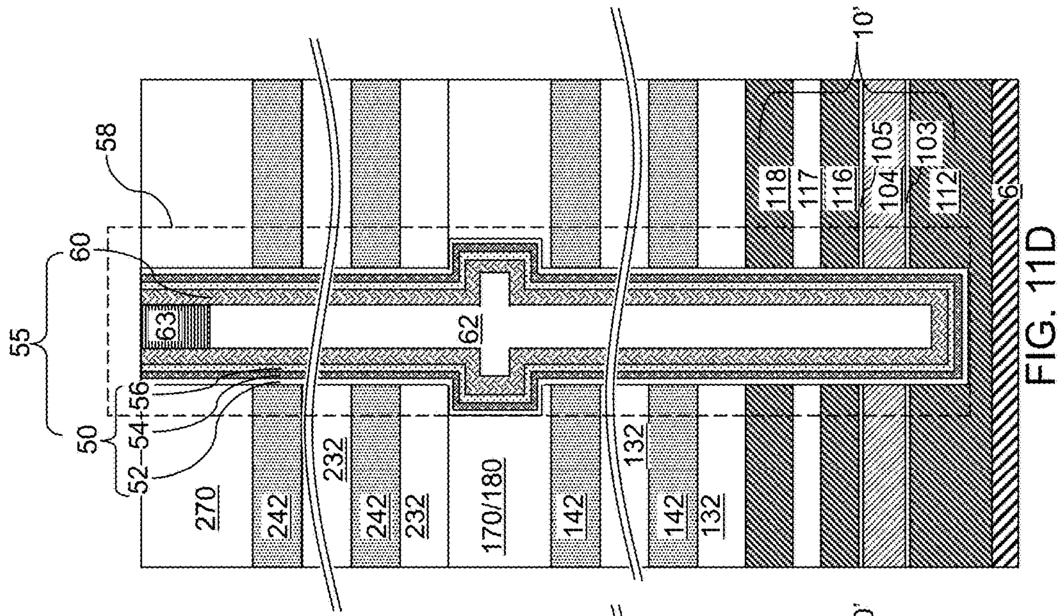

Referring to FIG. 11D, a doped semiconductor material can be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 can be removed by a planarization process such as a chemical mechanical planarization (CMP) process.

Each remaining portion of the doped semiconductor material having a doping of the second conductivity type constitutes a drain region 63. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be employed. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. Each top end of the vertical semiconductor channels 60 can be contacted by a respective drain region 63. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 10', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 12:
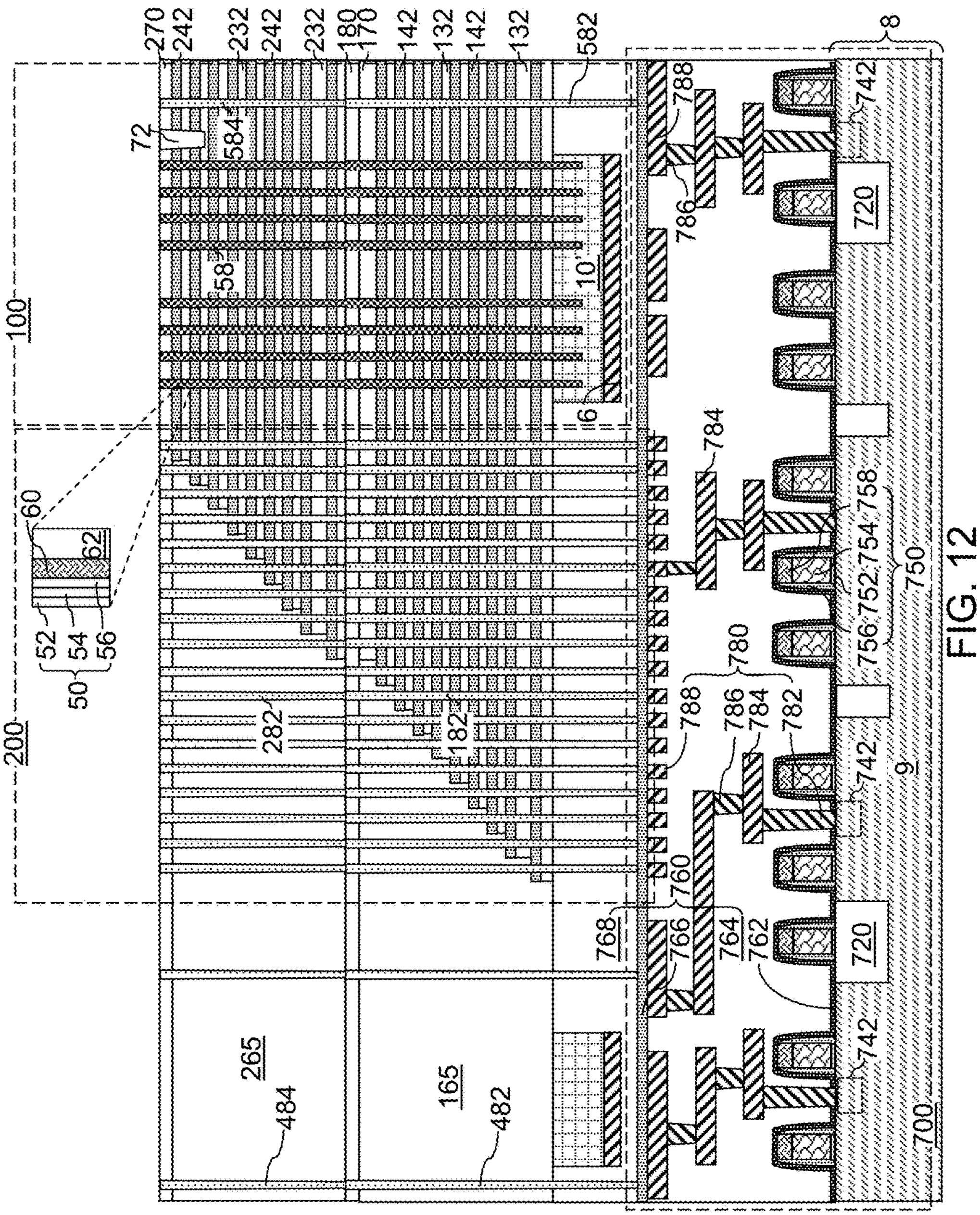
FIG. 12 is a vertical cross-sectional view of the first exemplary structure after formation of memory opening fill structures according to the first embodiment of the present disclosure.

Referring to FIG. 12, the first exemplary structure is illustrated after formation of the memory opening fill structures 58. The processing steps of FIGS. 10 and 11A-11D replace the sacrificial memory opening fill structures (148, 248) with memory opening fill structures 58.

Figure 13:
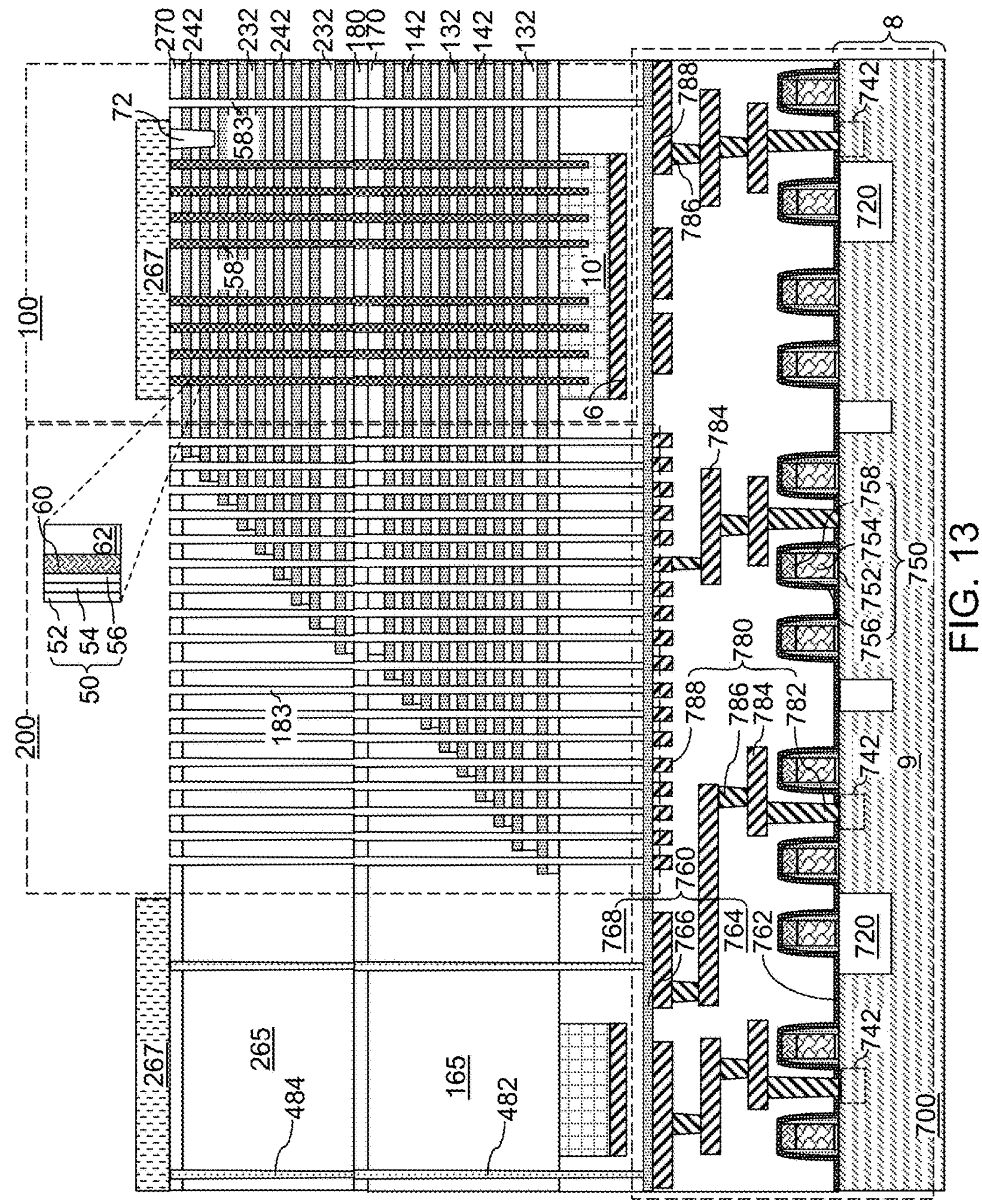
FIG. 13 is a vertical cross-sectional view of the first exemplary structure after formation of a second masking layer that covers the memory opening fill structures and the sacrificial second-tier peripheral-region opening fill portions according to the first embodiment of the present disclosure.

Referring to FIG. 13, a second masking layer 267 can be applied and patterned to cover the memory opening fill structures 58 and the sacrificial peripheral-region opening fill structures (482, 484) while not covering the sacrificial staircase-region opening fill structures (182, 282) in the staircase region 200 or the sacrificial array-region opening fill structures (582, 584) in the memory array region 100. The second masking layer 267 can be a photoresist layer or a patterning film that is lithographically patterned employing a patterned photoresist layer (not shown).

The sacrificial second-tier fill material and the sacrificial first-tier fill material can be removed from underneath the opening(s) in the second masking layer 267 employing an etch process that etches the sacrificial second-tier fill material and the sacrificial first-tier fill material selective to the materials of the first and second insulating layers (132, 232), the first and second sacrificial material layers (142,242), the first and second insulating cap layers (170, 270), the first and second retro-stepped dielectric material portion (165, 265), and the inter-tier dielectric layer 180. A staircase-region opening 183 is formed in each volume from which a sacrificial staircase-region opening fill structure (182, 282) is removed. An array-region opening 583 is formed in each volume from which a sacrificial array-region opening fill structure (582, 584) is removed.

Each staircase-region opening 183 can be formed through a respective one of the horizontal surfaces of the stepped surfaces in the staircase region 200. Each staircase-region opening 183 can vertically extend from the top surface of the second insulating cap layer 270 to the bottommost surface of the at least one second dielectric layer 768, and may extend to top surfaces of the lower-level metal interconnect structures 780 in case the staircase-region openings 183 extend through the silicon nitride layer 766.

In one embodiment, each of the staircase-region opening 183 can be a cylindrical via cavity. As used herein, a "cylindrical via cavity" refers to a via cavity having only a straight sidewall or straight sidewalls such that each straight sidewall is vertical or substantially vertical. As used herein, a surface is "substantially vertical" if the taper angle of the surface with respect to a vertical direction is less than 5 degrees. A first subset of the staircase-region openings 183 can be cylindrical via cavities extending through the second retro-stepped dielectric material portion 265 and a subset of layers within the second alternating stack (232, 242) and the first alternating stack (132, 142). A second subset of the staircase-region openings 183 can be cylindrical via cavities extending through the second retro-stepped dielectric material portion 265 and the first retro-stepped dielectric material portion 165 and a subset of layers within the first alternating stack (132, 142). A top surface of the etch stop silicon nitride layer 766 can be physically exposed at the bottom of each of the staircase-region openings 183.

Figure 14A:
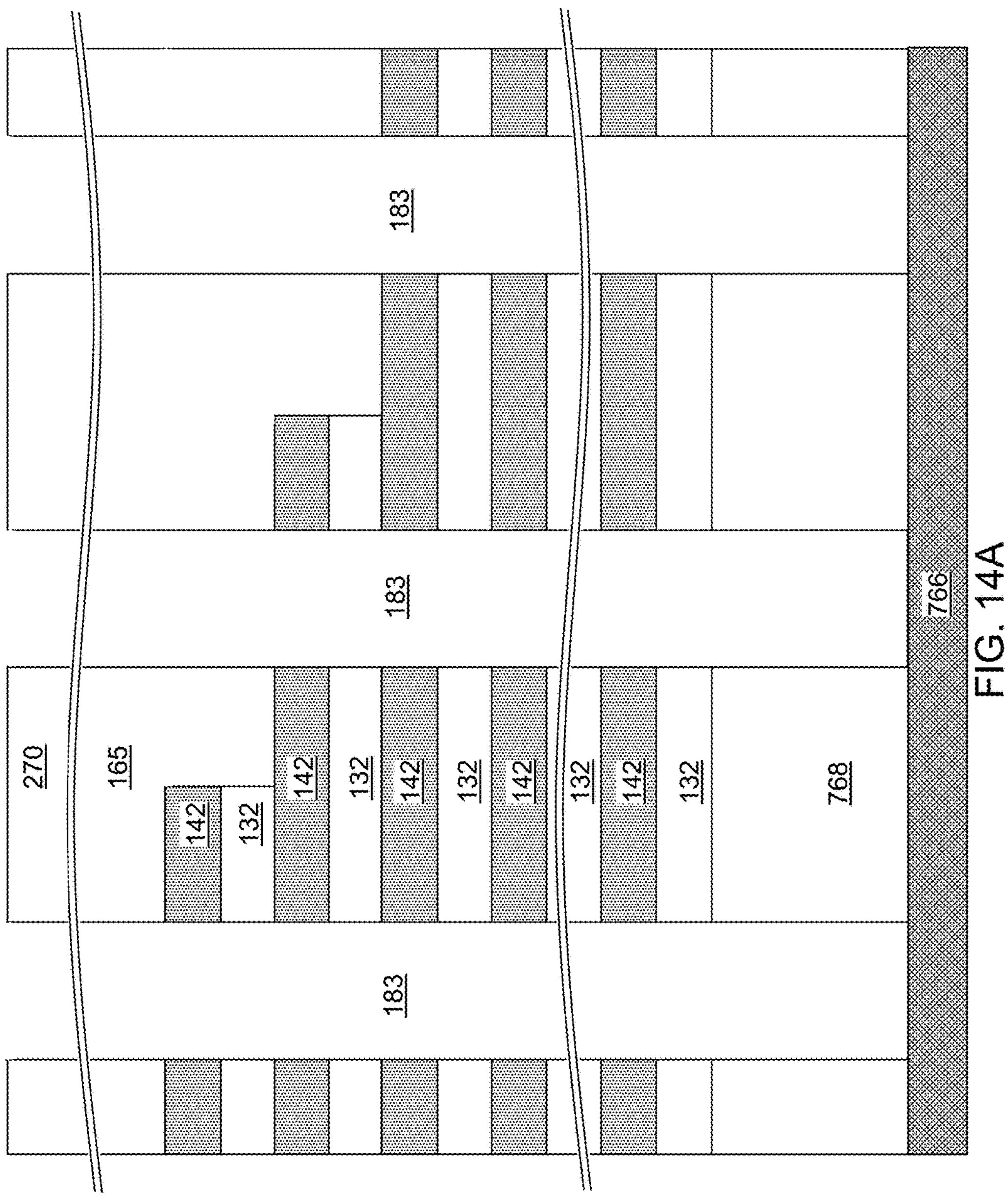
FIGS. 14A-14D illustrate sequential vertical cross-sectional views of a set of staircase-region openings during formation of temporary staircase-region opening fill structures according to the first embodiment of the present disclosure.
Figure 14B:
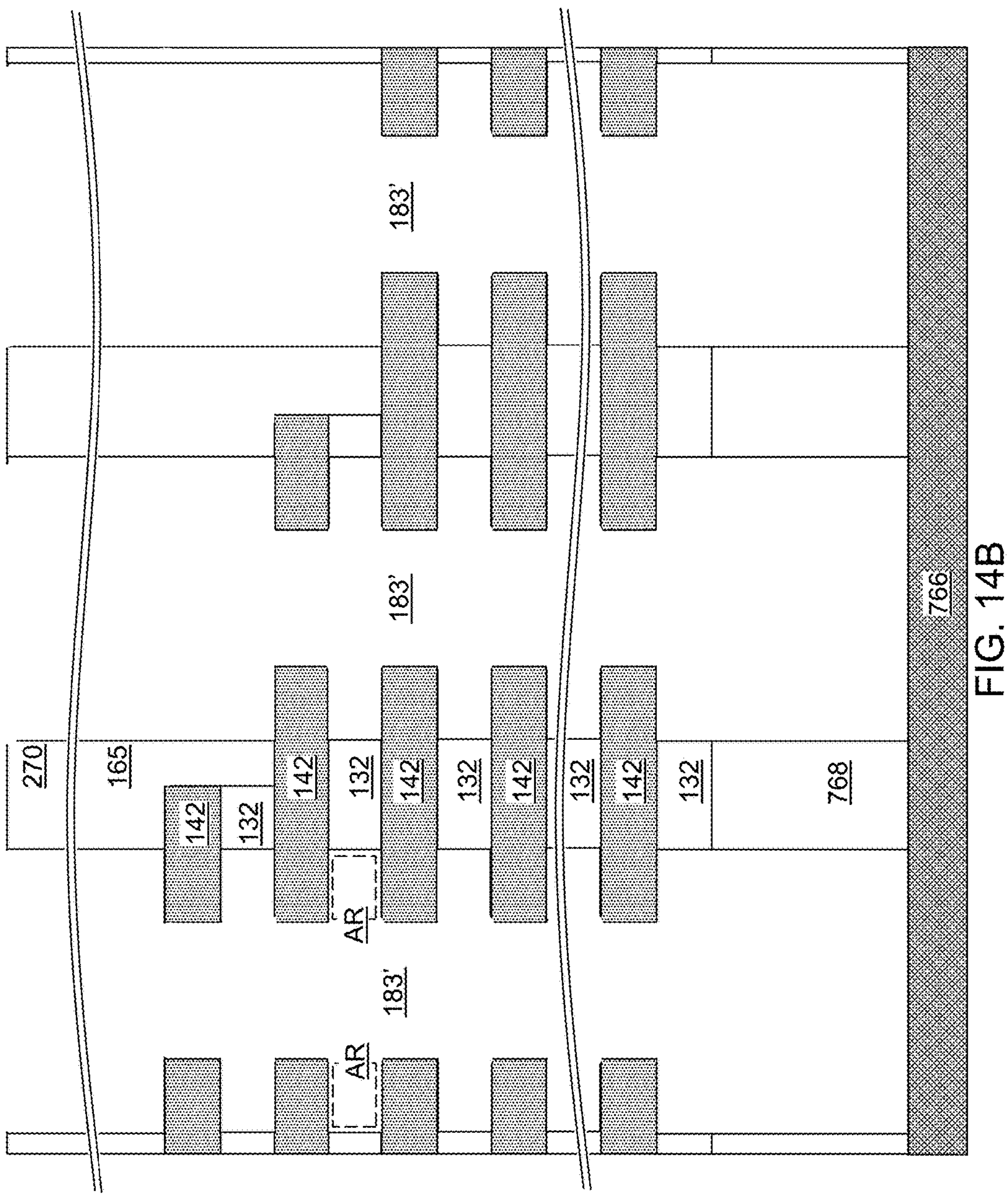

Referring to FIG. 14B, an isotropic etch process can be performed to laterally recess the insulating layers (132, 232) with respect to the spacer material layers such as the first and second sacrificial material layers (142, 242). Each staircase-region opening 183 can be converted from a cylindrical via cavity to a ribbed via cavity 183'. As used herein, a "ribbed via cavity" refers to a via cavity including at least one annular laterally protruding volume. Each annular laterally protruding volume of a ribbed via cavity is herein referred to as a "rib region."

In one embodiment, the retro-stepped dielectric material portions (165, 265) can include a same dielectric material or a similar dielectric material as the insulating layers (132, 232). For example, the first and second insulating layers (132, 232) can include undoped silicate glass, and the retro-stepped dielectric material portions (165, 265) can include undoped silicate glass or doped silicate glass. In this case, the ribbed via cavities 183' can be formed from the cylindrical staircase-region openings 183 by etching materials of the retro-stepped dielectric material portions (165, 265) and the insulating layers (132, 232) selective to the spacer material layers (i.e., the first and second sacrificial material layers (142, 242)).

In one embodiment, the dielectric materials of the first and second insulating cap layers (170, 270), the first and second retro-stepped dielectric material portions (165, 265), and the insulating layers (132, 232) can comprise silicon oxide materials (such as undoped silicate glass and various doped silicate glasses), and the first and second sacrificial material layers (142, 242) can include a sacrificial material that is not a silicate glass material (such as silicon nitride or a semiconductor material). In this case, the first and second insulating cap layers (170, 270), the first and second retro-stepped dielectric material portions (165, 265), and the insulating layers (132, 232) can be etched selective to the materials of the first and second sacrificial material layers (142, 242) to form the ribbed via cavities 183'.

In one embodiment, the spacer material layers of the alternating stacks (132, 142, 232, 242) can include sacrificial material layers (142, 242) that are composed of silicon nitride, and the insulating layers (132, 232) and the retro-stepped dielectric material portions (265, 165) can include silicon oxide materials. In this case, the retro-stepped dielectric material portions (165, 265) and each insulating layer (132, 232) physically exposed to the staircase-region openings 183 can be isotropically recessed by a wet etch process employing hydrofluoric acid. Each ribbed via cavity 183' can include a ribbed cavity region extending through the alternating stacks (132, 142, 232, 242), an overlying cavity laterally surrounded by the second retro-stepped dielectric material portion 265 and optionally by the first retro-stepped dielectric material portion 165 (in case the ribbed via cavity 183' extends only through the first-tier alternating stack (132, 142) and does not extend through the second-tier alternating stack (232, 242)), and an underlying cavity that underlies the alternating stacks (132, 142, 232, 242). Each ribbed via cavity 183' can include annular recesses AR, or rib regions, formed at levels of insulating layers (132, 232) in the subset of layers within the alternating stacks (132, 142, 232, 242) through which the ribbed via cavity 183' vertically extends.

Figure 14C:
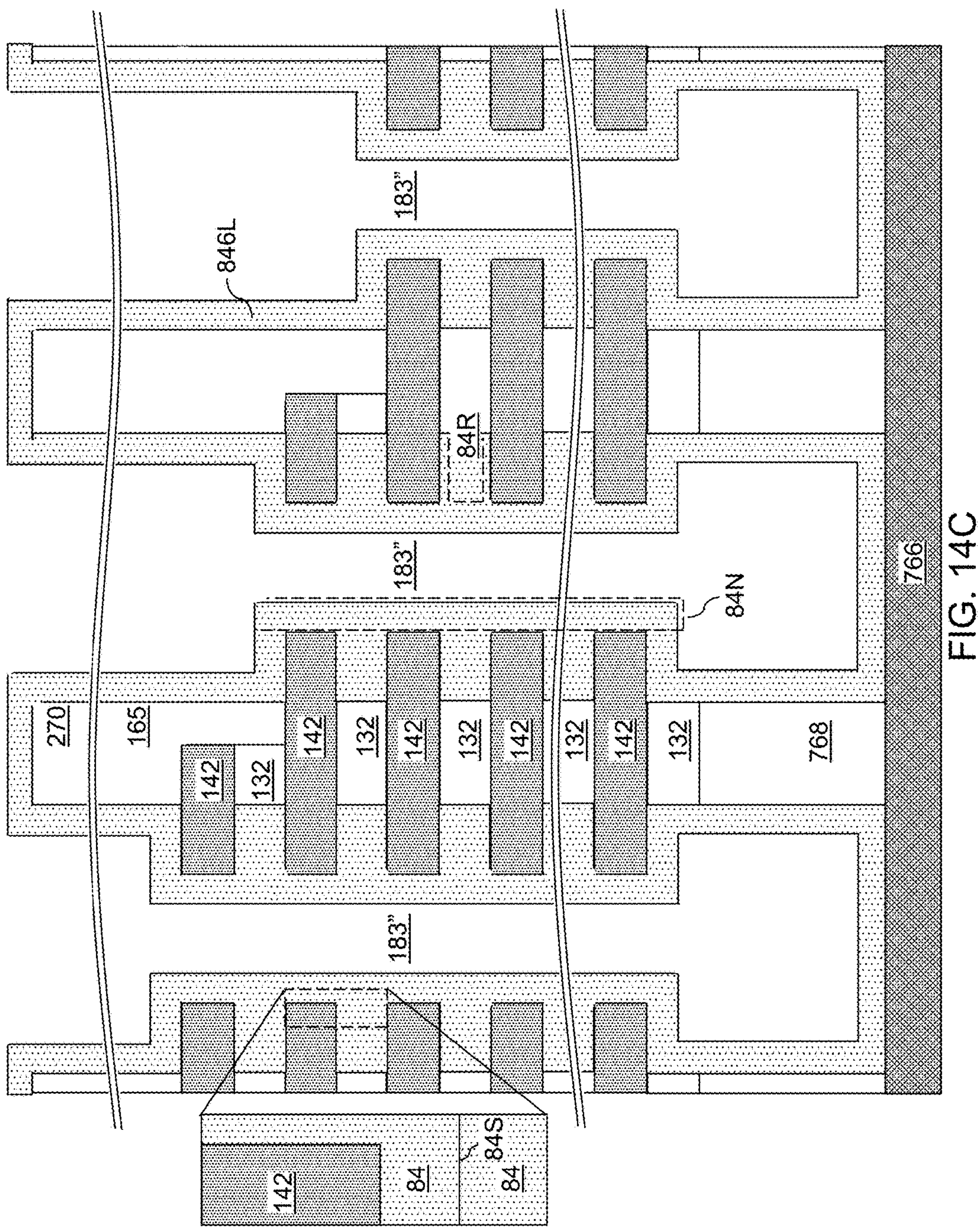

Referring to FIG. 14C, a conformal dielectric via liner 846L can be deposited at the periphery of the ribbed via cavities 183' by a conformal deposition process. The conformal dielectric via liner 846L includes a dielectric material that is different from the material of the sacrificial material layers (142, 242). For example, the conformal dielectric via liner 846L can include silicon oxide or a dielectric metal oxide (such as aluminum oxide). In one embodiment, the conformal dielectric via liner 846L can include undoped silicate glass formed by thermal decomposition of tetraethylorthosilicate (TEOS). The thickness of the conformal dielectric via liner 846L can be greater than one half of the maximum thickness of the sacrificial material layers (142, 242). Portions of the conformal dielectric via liner 846L deposited at peripheries of the ribbed via cavities 183' fill the annular recesses AR (i.e., the annular rib regions). Thus, volumes formed by isotropic etching of the insulating layers (132, 232) are filled with rib portions of the conformal dielectric via liner 846L. A neck portion 84N of the conformal dielectric via liner 846L can be formed around each set of at least one annular portions of the conformal dielectric via liner 846L that fill the annular recess(es) of each ribbed via cavity 183'. An annular seam 84S can be present within each portion of the conformal dielectric via liner 846L that fills the annular recesses AR, which is herein referred to as an insulating spacer rib portion 84R. The conformal dielectric via liner 846L can be formed directly on each physically exposed top surface of the etch stop layer 766. An unfilled void 183" can be present within each ribbed via cavity 183' after deposition of the conformal dielectric via liner 846L.

Figure 14D:
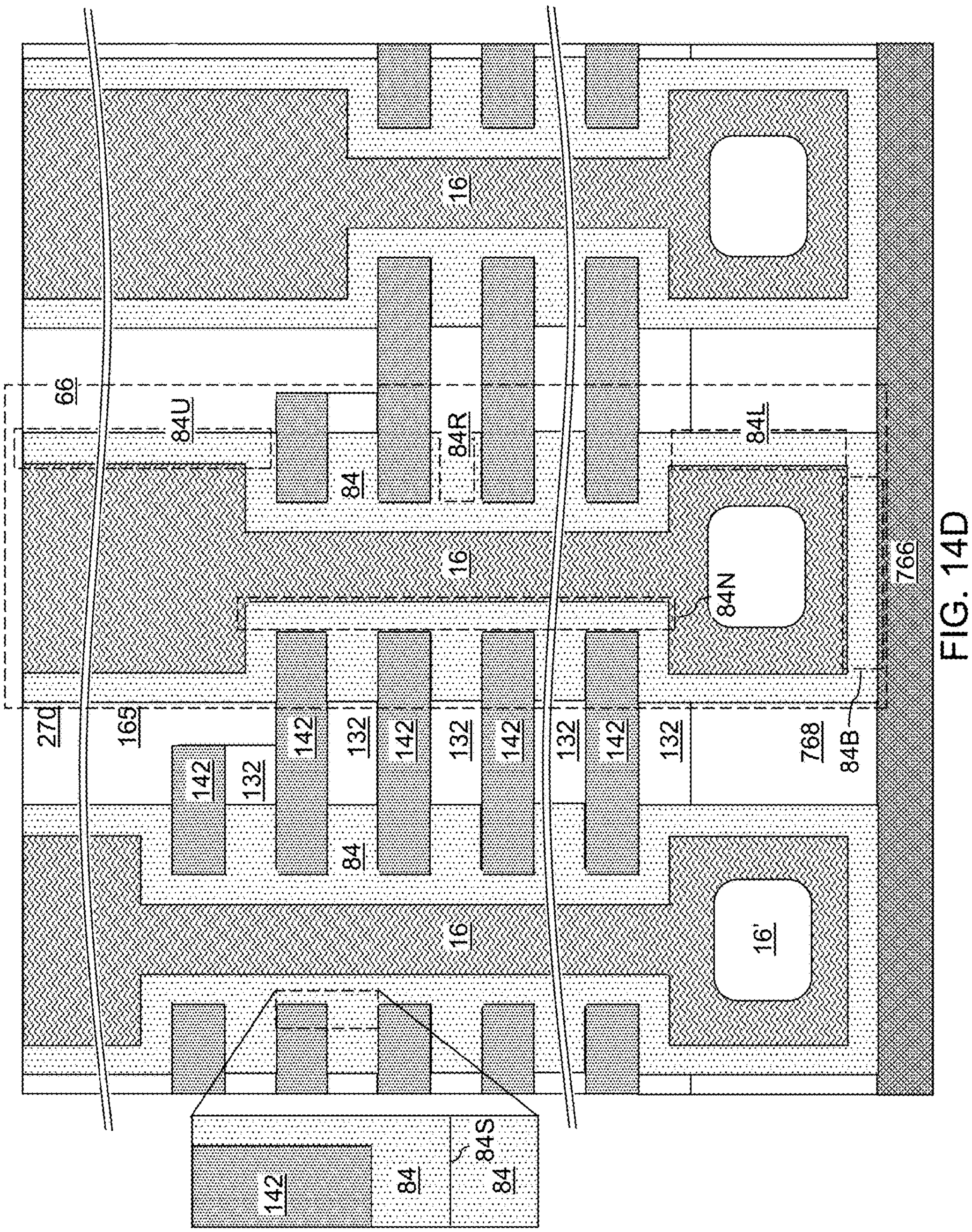

Referring to FIG. 14D, a temporary fill material can be deposited in each of the unfilled voids 183" in the staircase-region openings by a conformal deposition process. The temporary fill material is a material that can be removed selective to the material of the conformal dielectric via liner 846L. The temporary fill material can include amorphous silicon, polysilicon, a silicon-containing alloy material, or a doped silicate glass or an organosilicate glass having a greater etch rate than the silicon oxide materials of the first and second insulating layers (132, 232). Temporary staircase-region opening fill portions 16 can be formed in the unfilled voids 183" by deposition of the temporary fill material and planarization of the temporary fill material from above the top surface of the second insulating cap layer 270. The temporary fill material can be deposited by a non-conformal deposition process or a conformal deposition process. A cavity 16' may be present at a lower portion of each staircase-region opening. Planarization of the temporary fill material can be performed by a chemical mechanical planarization (CMP) process or by a recess etch process. Horizontal portions of the conformal dielectric via liner 846L can be removed from above the top surface of the second insulating cap layer 270 by the planarization process.

Each remaining portion of the temporary fill material filling the unfilled voids 183" constitutes a temporary staircase-region opening fill portion 16. Remaining portions of the conformal dielectric via liner 846L constitute insulating spacers. Each insulating spacer that includes at least one insulating spacer rib portion 84R is herein referred to as an in-process ribbed insulating spacer 84. Each in-process ribbed insulating spacer 84 can include a neck portion 584N that vertically extends through a respective subset of the layers in the alternating stacks (132, 142, 232, 242), one or more insulating spacer rib portions 84R attached to an outer periphery of the neck portion 84N, an upper cylindrical portion 84U extending through the second insulating cap layer 270 and the second retro-stepped dielectric material portion 265 and optionally through the first retro-stepped dielectric material portion 165, a lower cylindrical portion 84L that extends through the at least one second dielectric layer 768. Each adjoining set of an in-process ribbed insulating spacer 84 and a temporary staircase-region opening fill portion 16 constitutes a temporary staircase-region opening fill structure 66. Each temporary staircase-region opening fill structure 66 can be formed between a neighboring pair of vertical steps S and through a respective one of the horizontal surfaces within the first and second stepped surfaces. In one embodiment, the temporary staircase-region opening fill structures 66 can be formed in rows that extend along the first horizontal direction hd1 (e.g., word line direction).

Figure 14E:
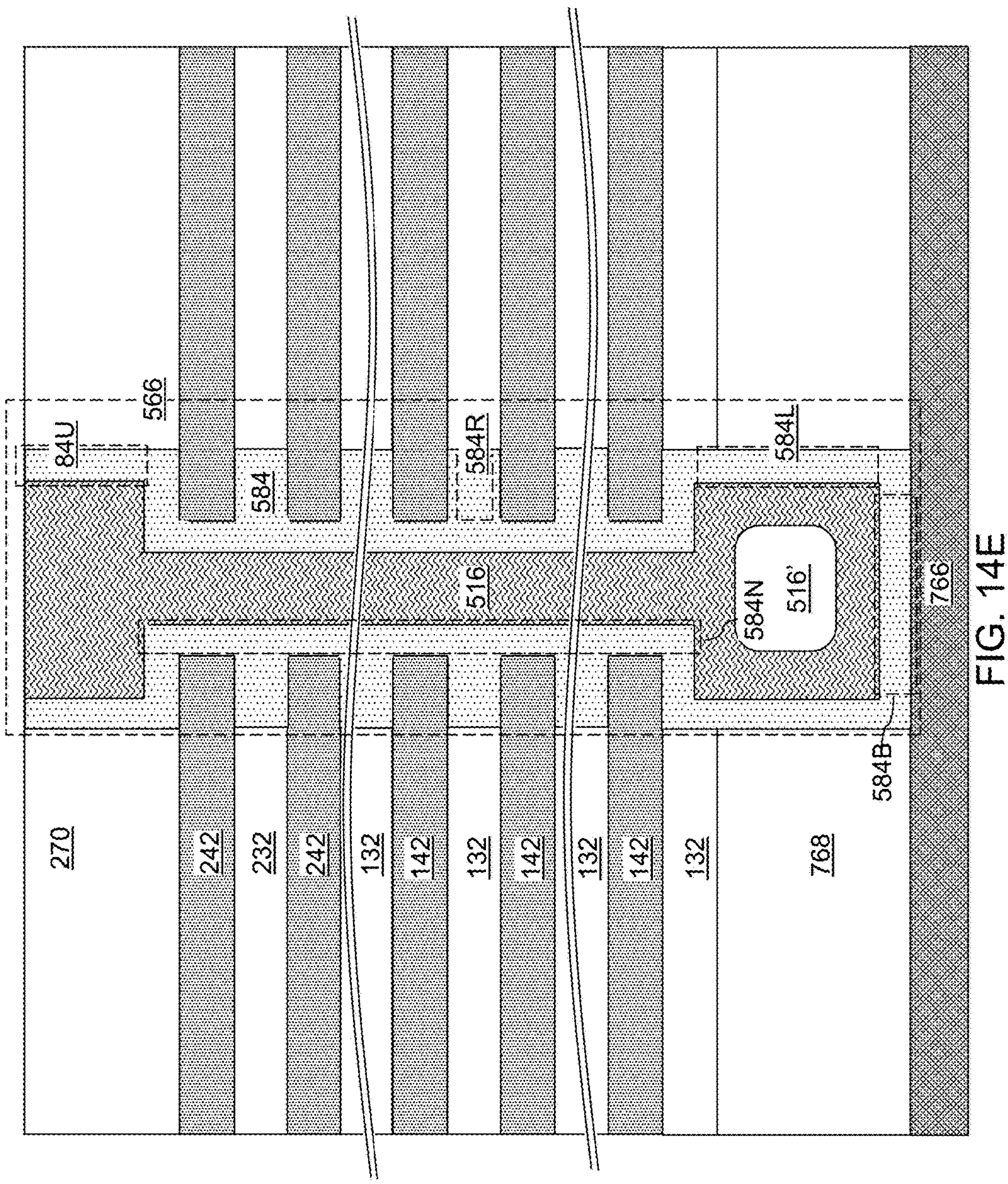
FIG. 14E is a vertical cross-sectional view of an array-region opening after formation of a temporary array-region opening fill structure according to the first embodiment of the present disclosure.

Referring to FIG. 14E, each of the array-region openings 583 goes through similar structural changes during the processing steps of FIGS. 14A-14D as the structural changes that occur in the staircase-region openings 183. Each portion of the temporary fill material deposited in the array-region openings 583 constitutes a temporary array-region opening fill portion 516. Remaining portions of the conformal dielectric via liner 846L in the array-region openings constitute insulating spacers, which are herein referred to as array-region insulating spacers 584. Each array-region insulating spacer 584 includes at least one array-region insulating spacer rib portion 584R. Each array-region insulating spacer 584 can include a neck portion 584N that vertically extends through each layer in the alternating stacks (132, 142, 232, 242), insulating spacer rib portions 584R attached to an outer periphery of the neck portion 84N, an upper cylindrical portion 584U extending through the second insulating cap layer 270, a lower cylindrical portion 584L that extends through the at least one second dielectric layer 768. Each adjoining set of an array-region insulating spacer 584 and a temporary array-region opening fill portion 516 constitutes a temporary array-region opening fill structure 566.

Figure 15A:
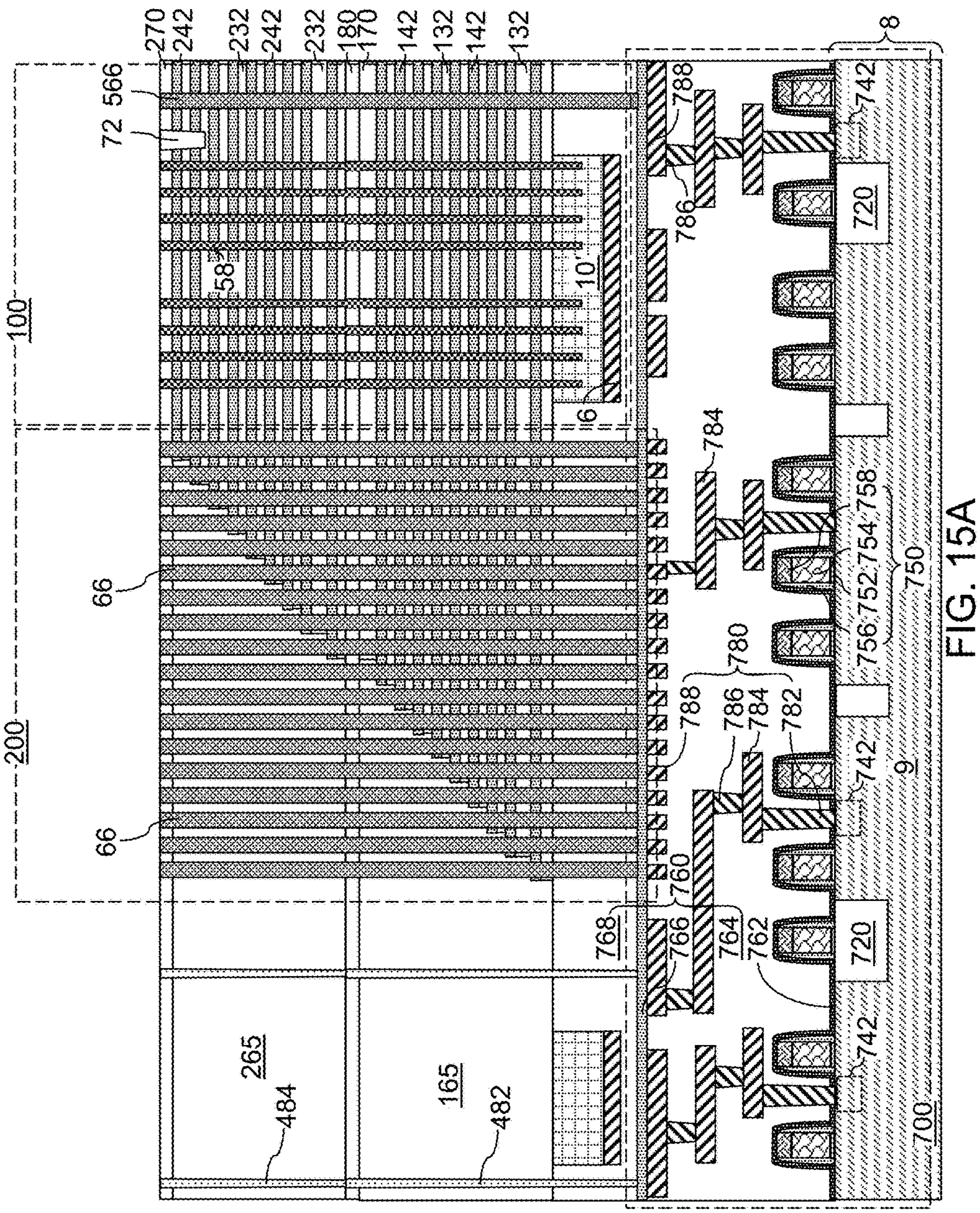
FIG. 15A is a vertical cross-sectional view of the first exemplary structure after formation of the temporary staircase-region opening fill structures and the temporary array-region opening fill structures according to the first embodiment of the present disclosure.
Figure 15B:
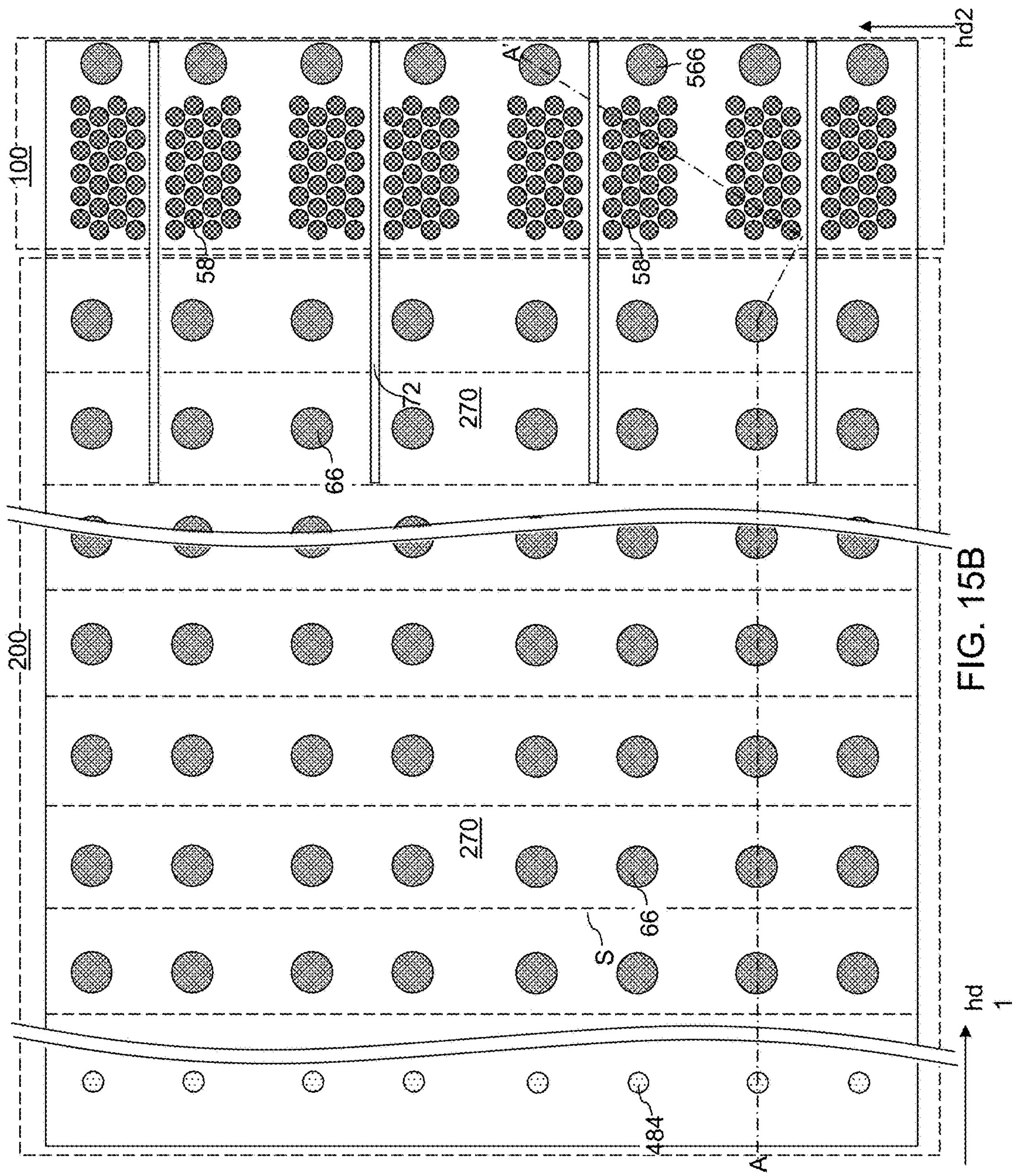
FIG. 15B is a top-down view of the first exemplary structure of FIG. 15A. The zig-zag vertical plane A-A' corresponds to the plane of the vertical cross-sectional view of FIG. 15A.

FIGS. 15A and 15B illustrate the first exemplary structure after formation of the temporary staircase-region opening fill structures 66 and the temporary array-region opening fill structures 566.

Figure 16A:
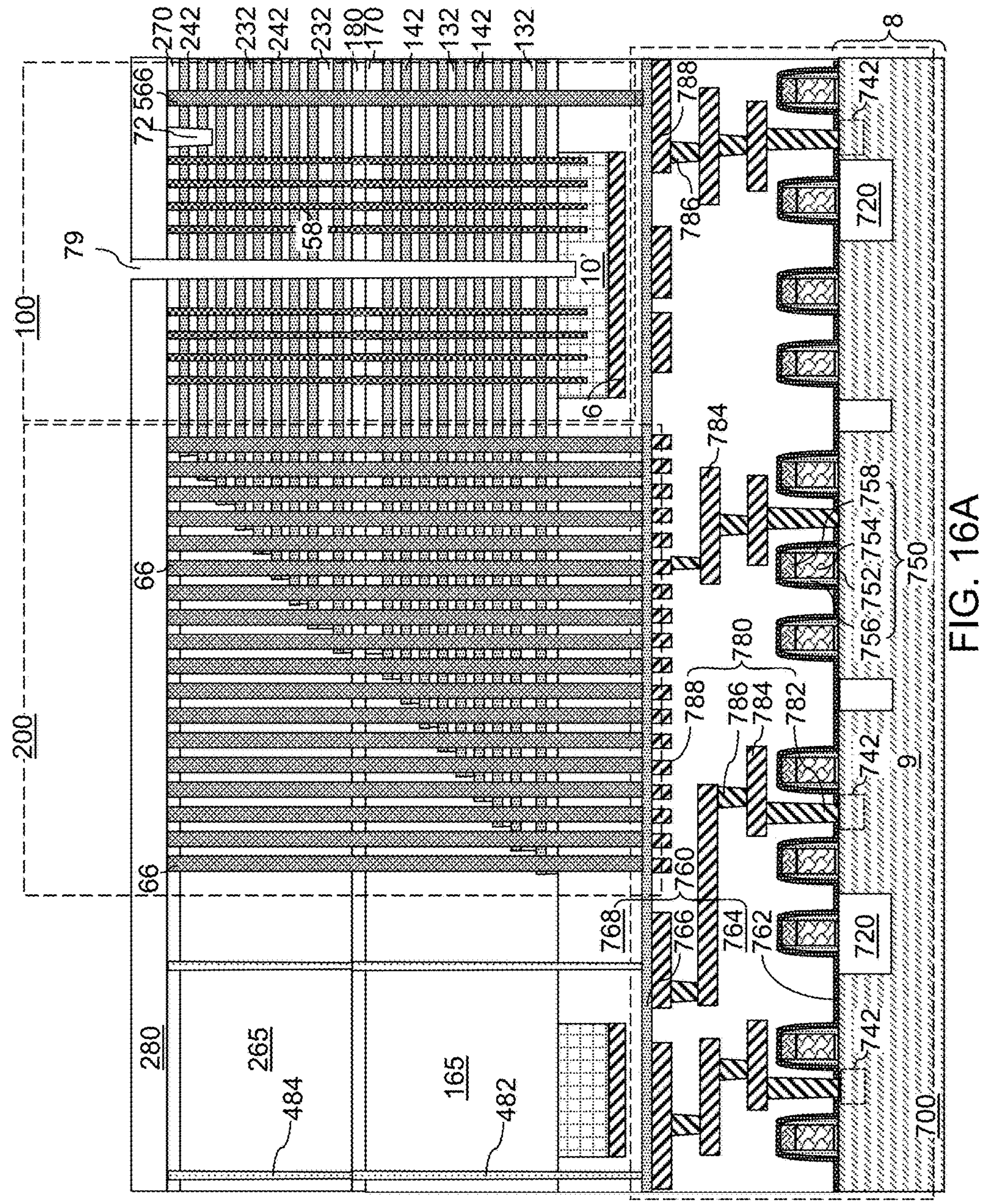
FIG. 16A is a vertical cross-sectional view of the first exemplary structure after formation of backside trenches according to the first embodiment of the present disclosure.
Figure 16B:
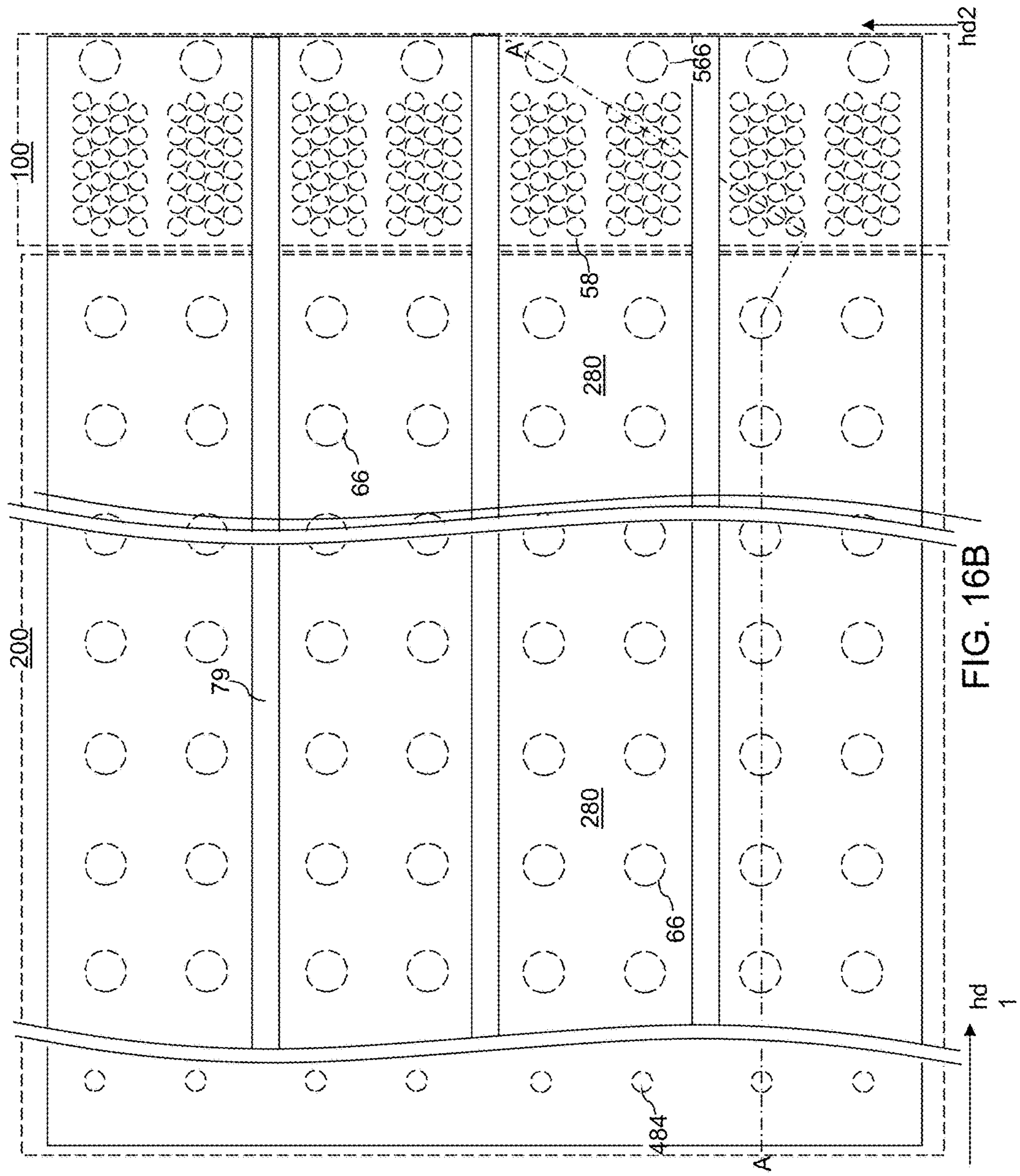
FIG. 16B is a horizontal cross-sectional view of the first exemplary structure along the horizontal plane B-B' in FIG. 16A. The zig-zag vertical plane A-A' corresponds to the plane of the vertical cross-sectional view of FIG. 16A.

Referring to FIGS. 16A and 16B, a contact level dielectric layer 280 can be formed over the memory-level assembly. The contact level dielectric layer 280 is formed at a contact level through which various contact via structures are subsequently formed to the drain regions 63. The contact level dielectric layer 280 includes a dielectric material such as silicon oxide, and has a thickness in a range from 100 nm to 600 nm, although lesser and greater thicknesses can also be employed.

Backside trenches 79 are subsequently formed through the contact level dielectric layer 280 and the memory-level assembly. For example, a photoresist layer can be applied and lithographically patterned over the contact level dielectric layer 280 to form elongated openings that extend along the first horizontal direction hd1. An anisotropic etch is performed to transfer the pattern in the patterned photoresist layer through a predominant portion of the memory-level assembly to the in-process source-level material layers 10'. For example, the backside trenches 79 can extend through the optional source-select-level conductive layer 118, the source-level insulating layer 117, the upper source layer 116, and the upper sacrificial liner 105 and into the source-level sacrificial layer 104. The optional source-select-level conductive layer 118 and the source-level sacrificial layer 104 can be employed as etch stop layers for the anisotropic etch process that forms the backside trenches 79. The photoresist layer can be subsequently removed, for example, by ashing.

The backside trenches 79 extend along the first horizontal direction hd1, and thus, are elongated along the first horizontal direction hd1. The backside trenches 79 can be laterally spaced among one another along a second horizontal direction hd2, which can be perpendicular to the first horizontal direction hd1. The backside trenches 79 can extend through the memory array region 100 (which may extend over a memory plane) and the staircase region 200. The backside trenches 79 can laterally divide the memory-level assembly into memory blocks.

Figure 17A:
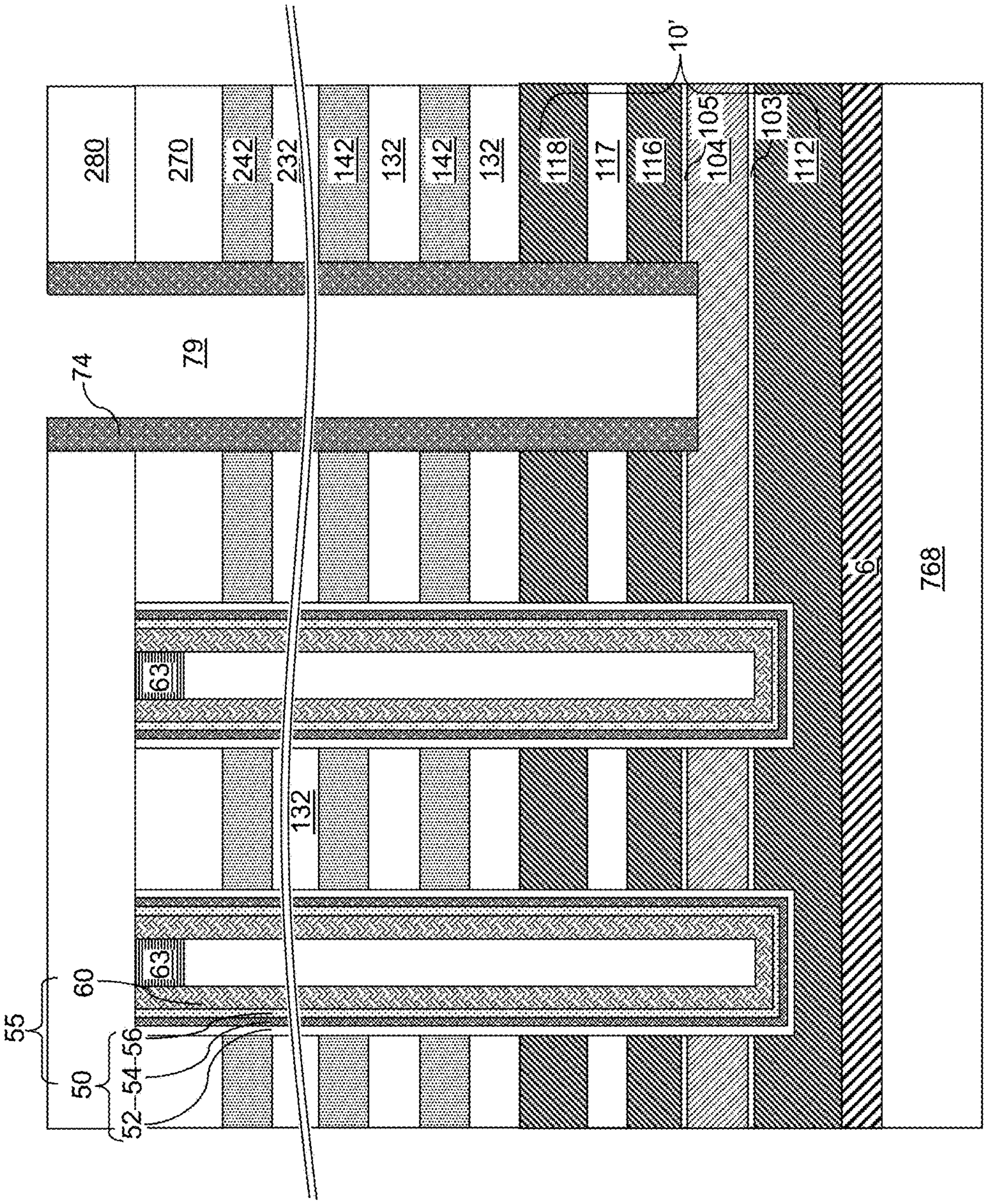
FIGS. 17A-17E are sequential vertical cross-sectional views of a region including a pair of memory opening fill structures and a backside trench during replacement of a sacrificial source layer with a source contact layer according to the first embodiment of the present disclosure.

Referring to FIG. 17A, backside trench spacers 74 can be formed on sidewalls of the backside trenches 79 by conformal deposition of a dielectric spacer material and an anisotropic etch of the dielectric spacer material. The dielectric spacer material is a material that can be removed selective to the materials of first and second insulating layers (132, 232). For example, the dielectric spacer material can include silicon nitride. The lateral thickness of the backside trench spacers 74 can be in a range from 4 nm to 60 nm, such as from 8 nm to 30 nm, although lesser and greater thicknesses can also be employed.

Figure 17B:
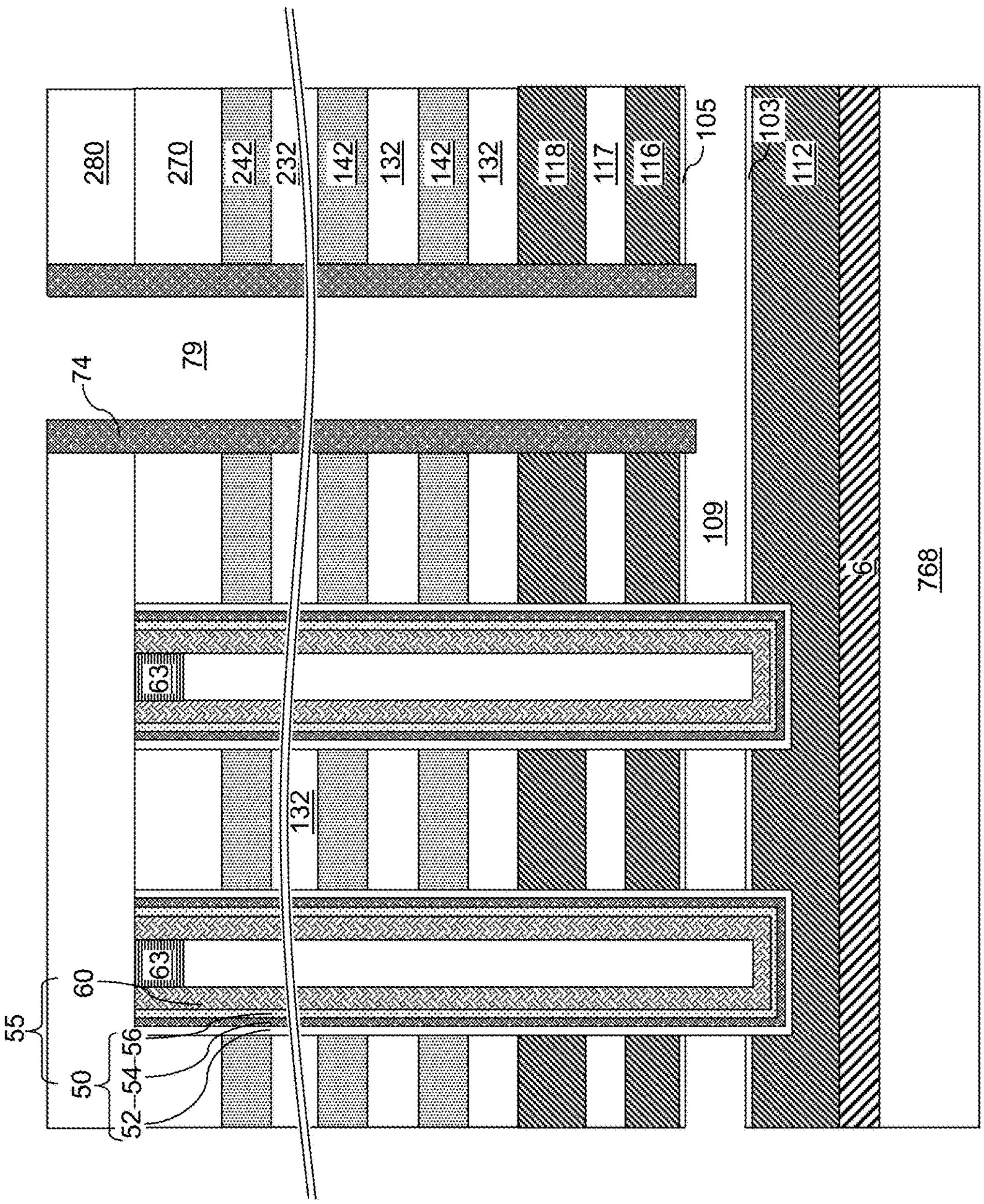

Referring to FIG. 17B, an etchant that etches the material of the source-level sacrificial layer 104 selective to the materials of the backside trench spacers 74, the upper sacrificial liner 105, and the lower sacrificial liner 103 can be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process employing hot trimethyl-2 hydroxyethyl ammonium hydroxide ("hot TMY") can be employed to remove the source-level sacrificial layer 104 selective to the backside trench spacers 74 and the upper and lower sacrificial liners (105, 103). A source cavity 109 is formed in the volume from which the source-level sacrificial layer 104 is removed.

Figure 17C:
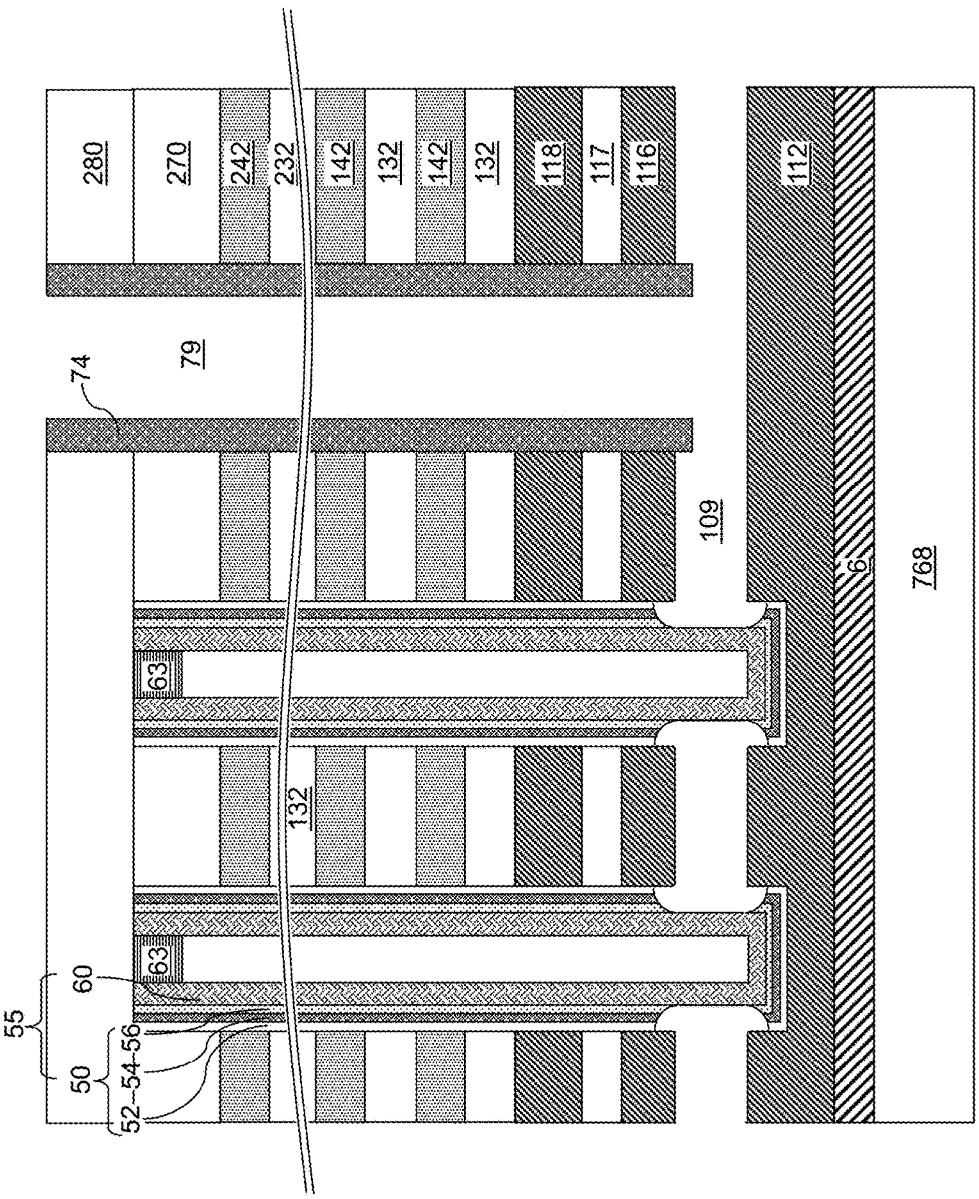

Referring to FIG. 17C, a sequence of isotropic etchants, such as wet etchants, can be applied through the backside trenches 79 and the source cavity 109 to the physically exposed portions of the memory films 50 in the source cavity 109 to sequentially etch the various component layers of the memory films 50 from outside to inside, and to physically expose cylindrical surfaces of the vertical semiconductor channels 60 at the level of the source cavity 109. The upper and lower sacrificial liners (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liners (105, 103). A top surface of the lower source layer 112 and a bottom surface of the upper source layer 116 can be physically exposed to the source cavity 109.

Figure 17D:
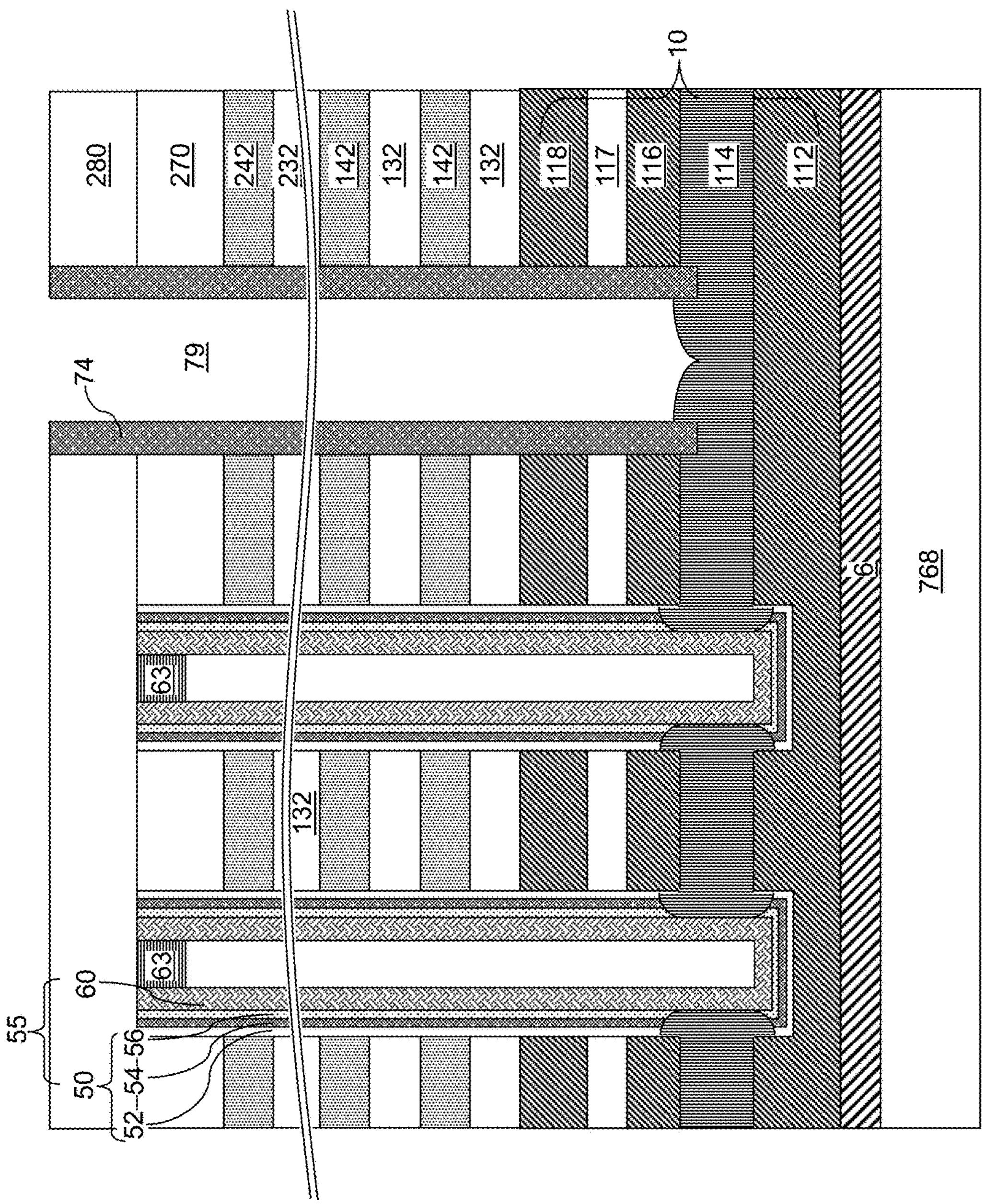

Referring to FIG. 17D, a doped semiconductor material having a doping of the second conductivity type can be deposited by a selective semiconductor deposition process. A semiconductor precursor gas, an etchant, and a dopant precursor gas can be flowed concurrently into a process chamber including the first exemplary structure during the selective semiconductor deposition process. For example, if the second conductivity type is n-type, a semiconductor precursor gas such as silane, disilane, or dichlorosilane, an etchant gas such as hydrogen chloride, and a dopant precursor gas such as phosphine, arsine, or stibine can be flowed. The deposited doped semiconductor material forms a source contact layer 114, which can contact sidewalls of the vertical semiconductor channels 60. The duration of the selective semiconductor deposition process can be selected such that the source cavity is filled with the source contact layer 114, and the source contact layer 114 contacts the exposed portions of the semiconductor channel 60 and bottom end portions of inner sidewalls of the backside trench spacers 74. In one embodiment, the doped semiconductor material can include doped polysilicon.

The layer stack including the lower source layer 112, the source contact layer 114, and the upper source layer 116 constitutes a buried source layer (112, 114, 116), which function as a common source region that is connected each of the vertical semiconductor channels 60 and has a doping of the second conductivity type. The average dopant concentration in the buried source layer (112, 114, 116) can be in a range from $5.0\times10^{19}/cm^3$ to $2.0\times10^{21}/cm^3$, although lesser and greater dopant concentrations can also be employed. The set of layers including the buried source layer (112, 114, 116), the source-level insulating layer 117, and the optional source-select-level conductive layer 118 constitutes source level layers 10, which replaced the in-process source level layers 10'.

Figure 17E:
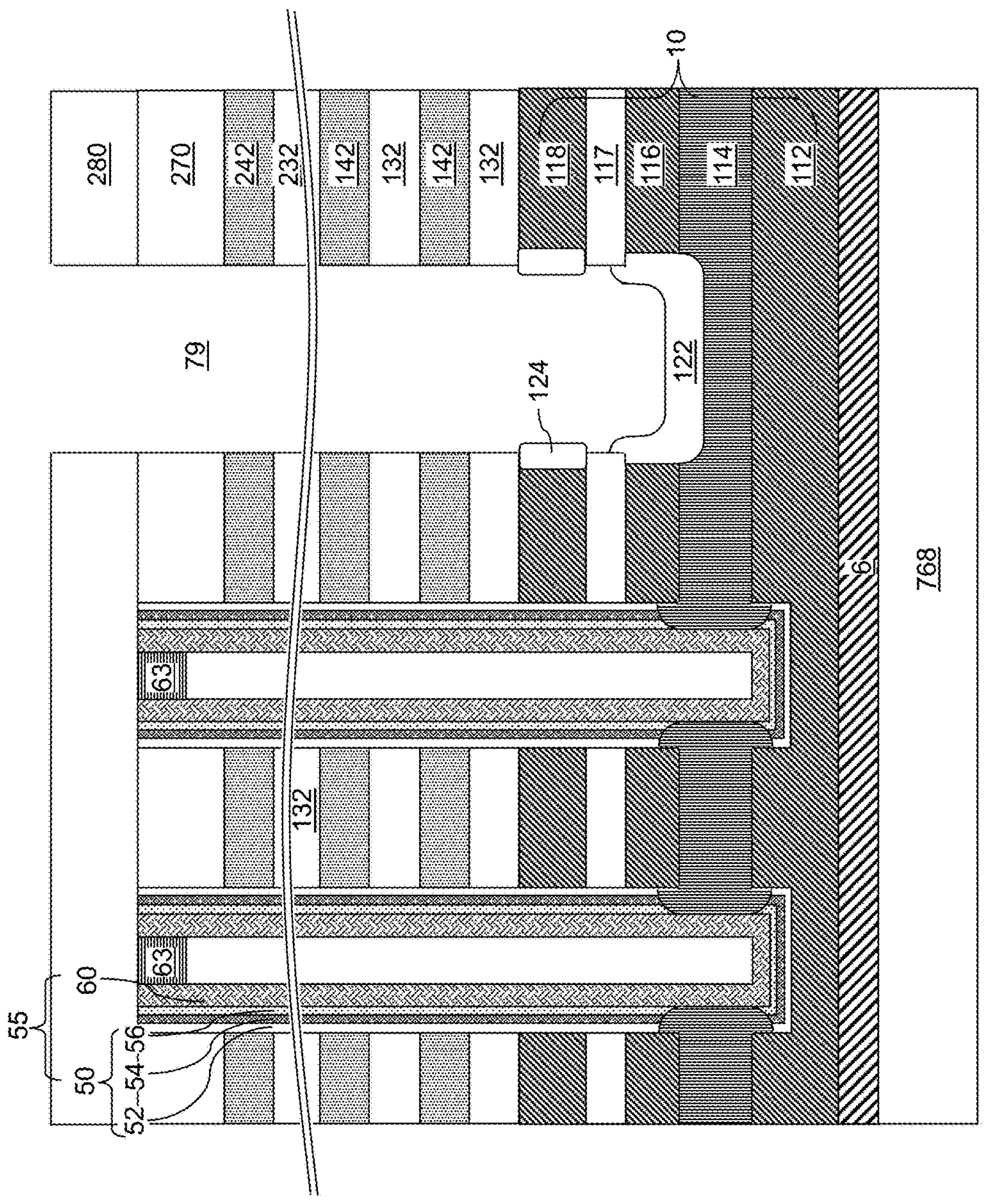

Referring to FIG. 17E, an oxidation process can be performed to convert physically exposed surface portions of the source-select-level conductive layer 118, the upper source layer 116, the source-level sacrificial layer 104, and the lower source layer 112. A thermal oxidation process or a plasma oxidation process may be employed. Semiconductor oxide material portions (such as silicon oxide portions) can be formed at the level of the in-process source level layers 10' around each backside trench 79. For example, a plate semiconductor oxide portion 122 can be formed on the source contact layer 114 and the upper source layer 116, and annular semiconductor oxide portion 124 can be formed on the source-select-level conductive layer 118 within each backside trench 79.

Figure 18:
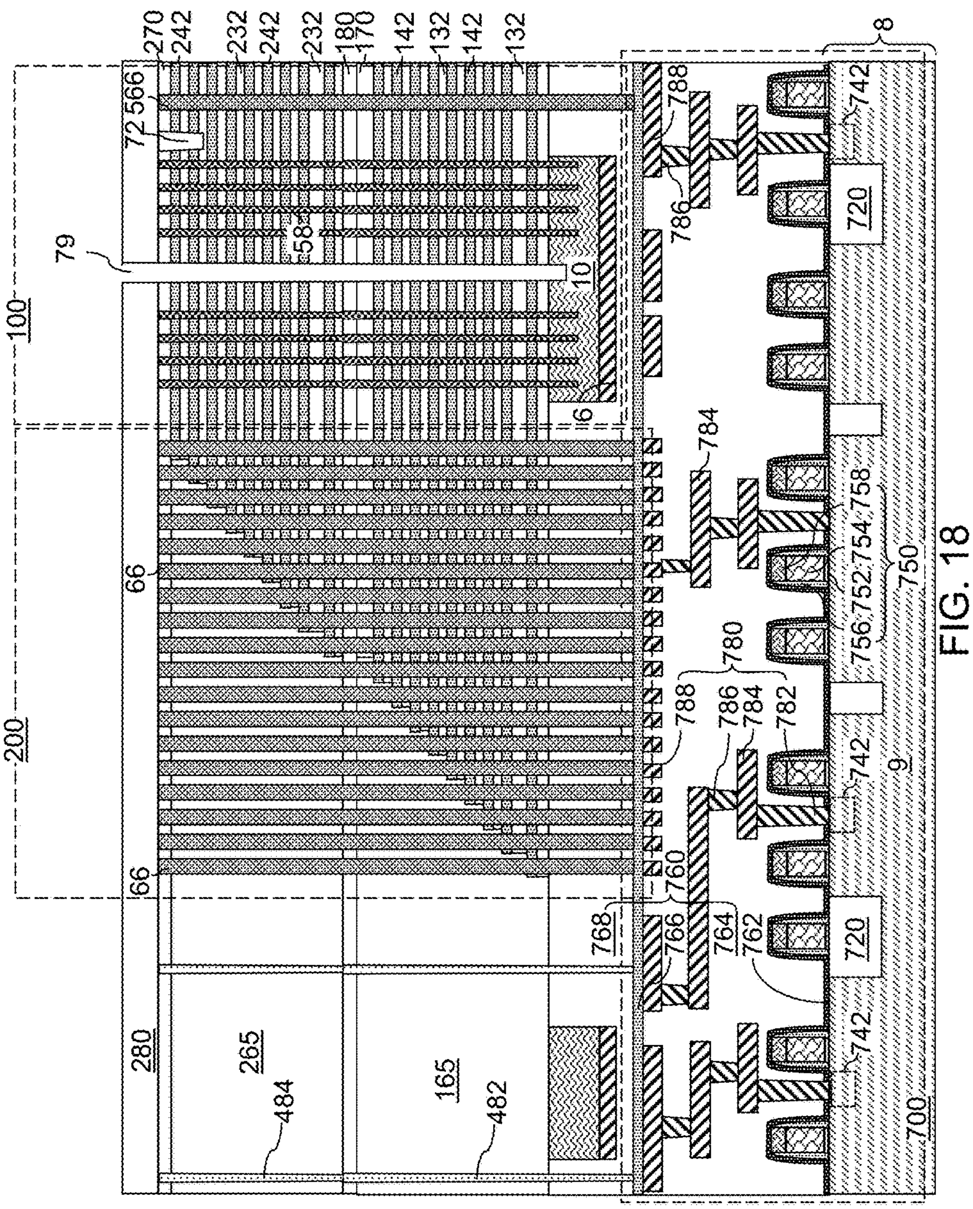
FIG. 18 is a vertical cross-sectional view of the first exemplary structure after replacement of in-process source-level material layers with source-level material layers according to the first embodiment of the present disclosure.

FIG. 18 illustrates the first exemplary structure after formation of the semiconductor oxide material portions (122, 124).

Figure 19:
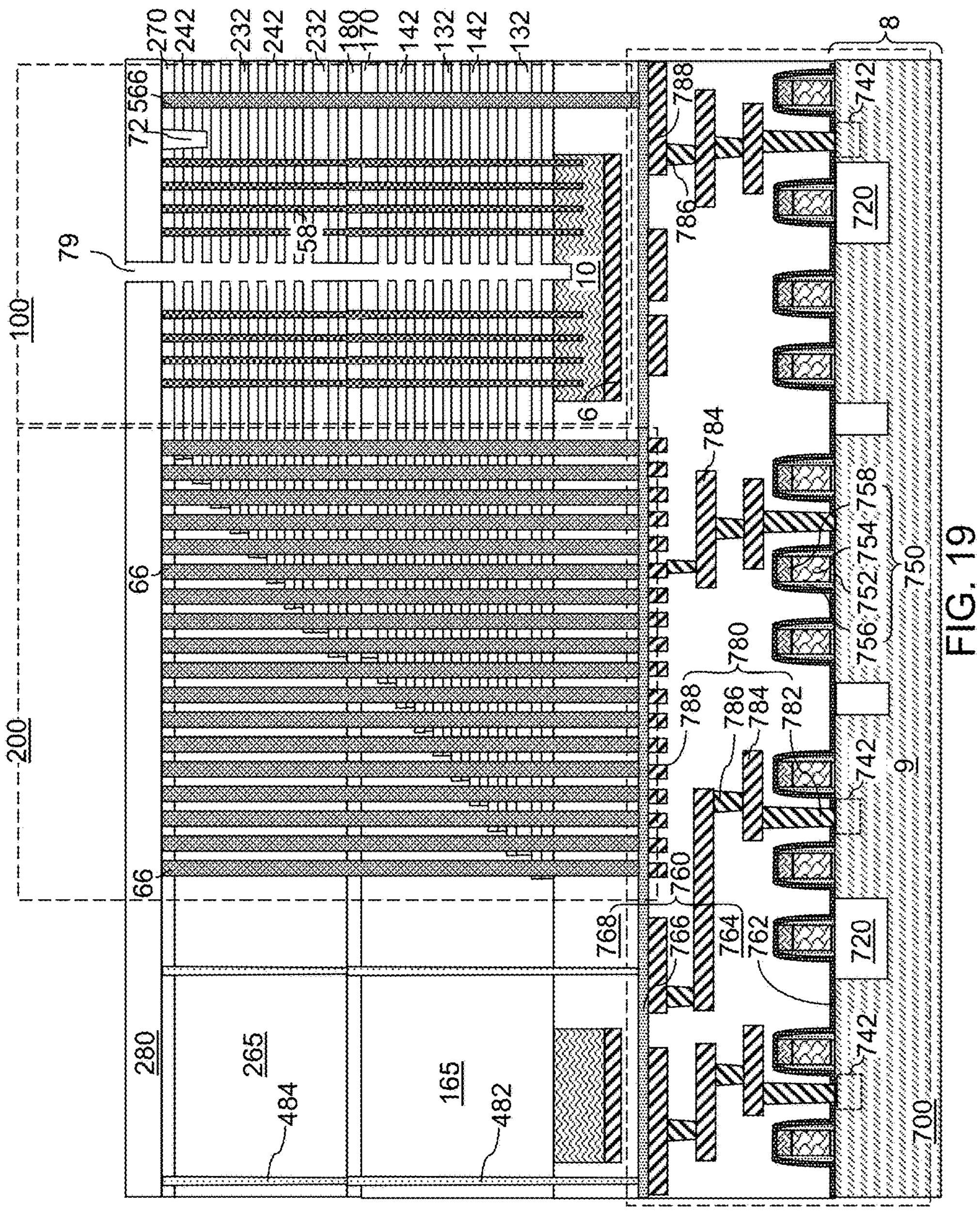
FIG. 19 is a vertical cross-sectional view of the first exemplary structure after removal of the sacrificial material layer to form backside recesses according to the first embodiment of the present disclosure.

Referring to FIG. 19, an etchant that selectively etches the materials of the first and second sacrificial material layers (142, 242) with respect to the materials of the first and second insulating layers (132, 232), the first and second insulating cap layers (170, 270), the material of the in-process ribbed insulating spacers 84 and the array-region insulating spacers 584, the material of the outermost layer of the memory films 50 can be introduced into the backside trenches 79, for example, employing an isotropic etch process. For example, the first and second sacrificial material layers (142, 242) can include silicon nitride, the materials of the first and second insulating layers (132, 232), the first and second insulating cap layers (170, 270), the material of the in-process ribbed insulating spacers 84 and the array-region insulating spacers 584, and the material of the outermost layer of the memory films 50 can include silicon oxide materials. First backside recesses 143 are formed in volumes from which the first sacrificial material layers 142 are removed. Second backside recesses 243 are formed in volumes from which the second sacrificial material layers 242 are removed.

The isotropic etch process can be a wet etch process employing a wet etch solution, or can be a gas phase (dry) etch process in which the etchant is introduced in a vapor phase into the backside trenches 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 8. A backside recess (143, 243) can be vertically bounded by a top surface of an underlying insulating layer (132 or 232) and a bottom surface of an overlying insulating layer (132 or 232). In one embodiment, each of the first and second backside recesses (243, 243) can have a uniform height throughout.

Figure 20:
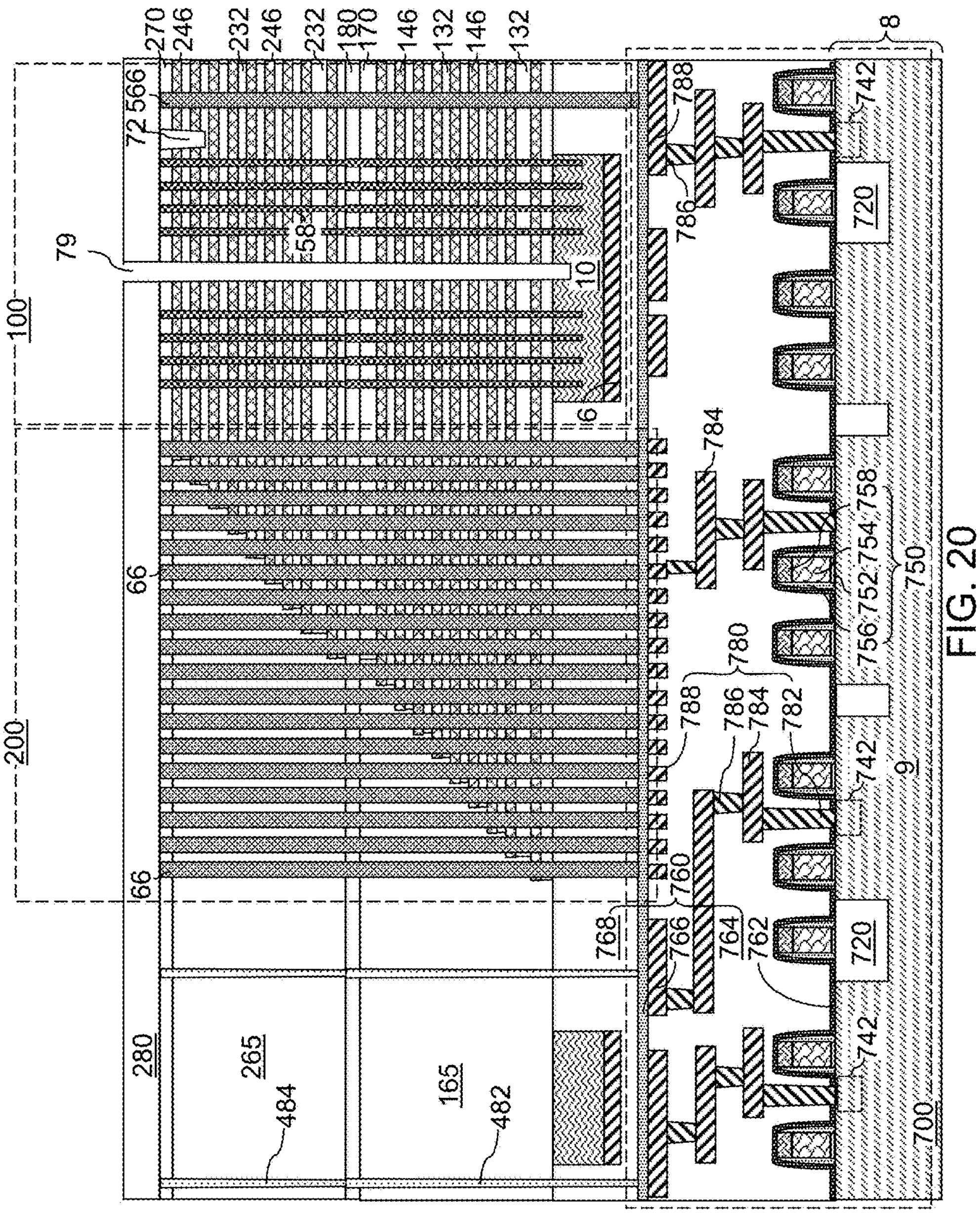
FIG. 20 is a vertical cross-sectional view of the first exemplary structure after replacement of sacrificial material layers with electrically conductive layers according to the first embodiment of the present disclosure.

Referring to FIG. 20, a backside blocking dielectric layer (not shown) can be optionally deposited in the backside recesses and the backside trenches 79 and over the contact level dielectric layer 280. The backside blocking dielectric layer can be deposited on the physically exposed portions of the outer surfaces of the memory stack structures 55, which are portions of the memory opening fill structures 58. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses (243, 243), on the sidewalls of the backside trench 79, and over the contact level dielectric layer 280. The at least one conductive material can include at least one metallic material, i.e., an electrically conductive material that includes at least one metallic element.

A plurality of first electrically conductive layers 146 can be formed in the plurality of first backside recesses 243, a plurality of second electrically conductive layers 246 can be formed in the plurality of second backside recesses 243, and a continuous metallic material layer (not shown) can be formed on the sidewalls of each backside trench 79 and over the contact level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside trenches 79. Specifically, the deposited metallic material of the continuous metallic material layer can be etched back from the sidewalls of each backside trench 79 and from above the contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level isolation structures 72 constitutes drain select gate electrodes. A subset of the electrically conductive layer (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly includes all structures located above the topmost surface of the lower-level metal interconnect structures 780, and is located over, and is vertically spaced from, the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Figure 21:
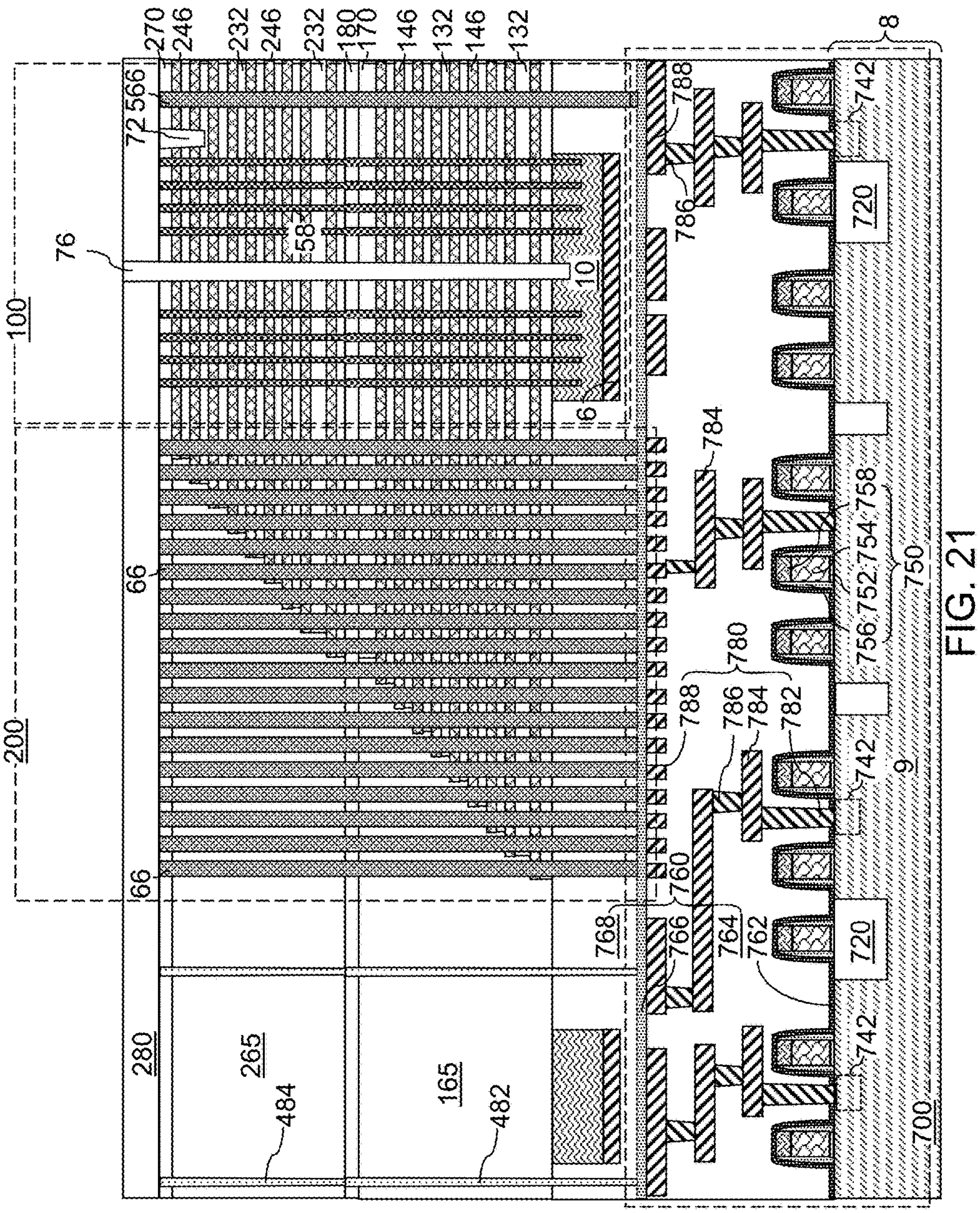
FIG. 21 is a vertical cross-sectional view of the first exemplary structure after formation of dielectric wall structures in the backside recesses according to the first embodiment of the present disclosure.

Referring to FIG. 21, an insulating material can be deposited in the backside trenches 79 by a conformal deposition process. Excess portions of the insulating material deposited over the top surface of the contact level dielectric layer 280 can be removed by a planarization process such as a recess etch or a chemical mechanical planarization (CMP) process. Each remaining portion of the insulating material in the backside trenches 79 constitutes a dielectric wall structure 76. The dielectric wall structures 76 include an insulating material such as silicon oxide, silicon nitride, and/or a dielectric metal oxide. Each dielectric wall structure 76 can vertically extend through first alternating stacks (132, 146) of first insulating layers 132 and first electrically conductive layers 146 and second alternating stacks (232, 246) of second insulating layers 232 and second electrically conductive layers 246, and laterally extends along the first horizontal direction hd1 and are laterally spaced apart among one another along the second horizontal direction hd2.

Figure 22A:
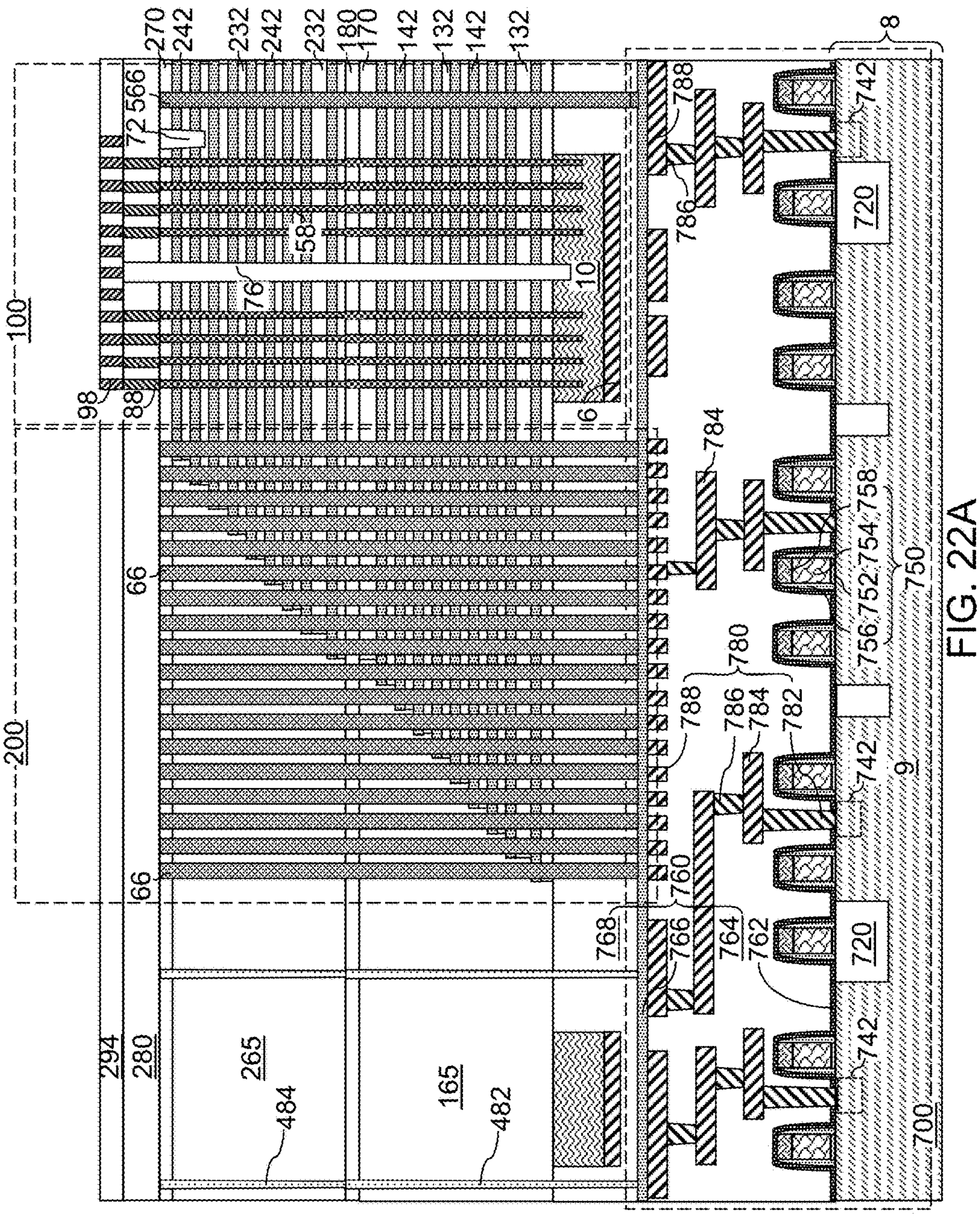
FIG. 22A is a vertical cross-sectional view of the first exemplary structure after formation of drain contact via structures, a bit-line-level dielectric material layer, and bit lines according to the first embodiment of the present disclosure.
Figure 22B:
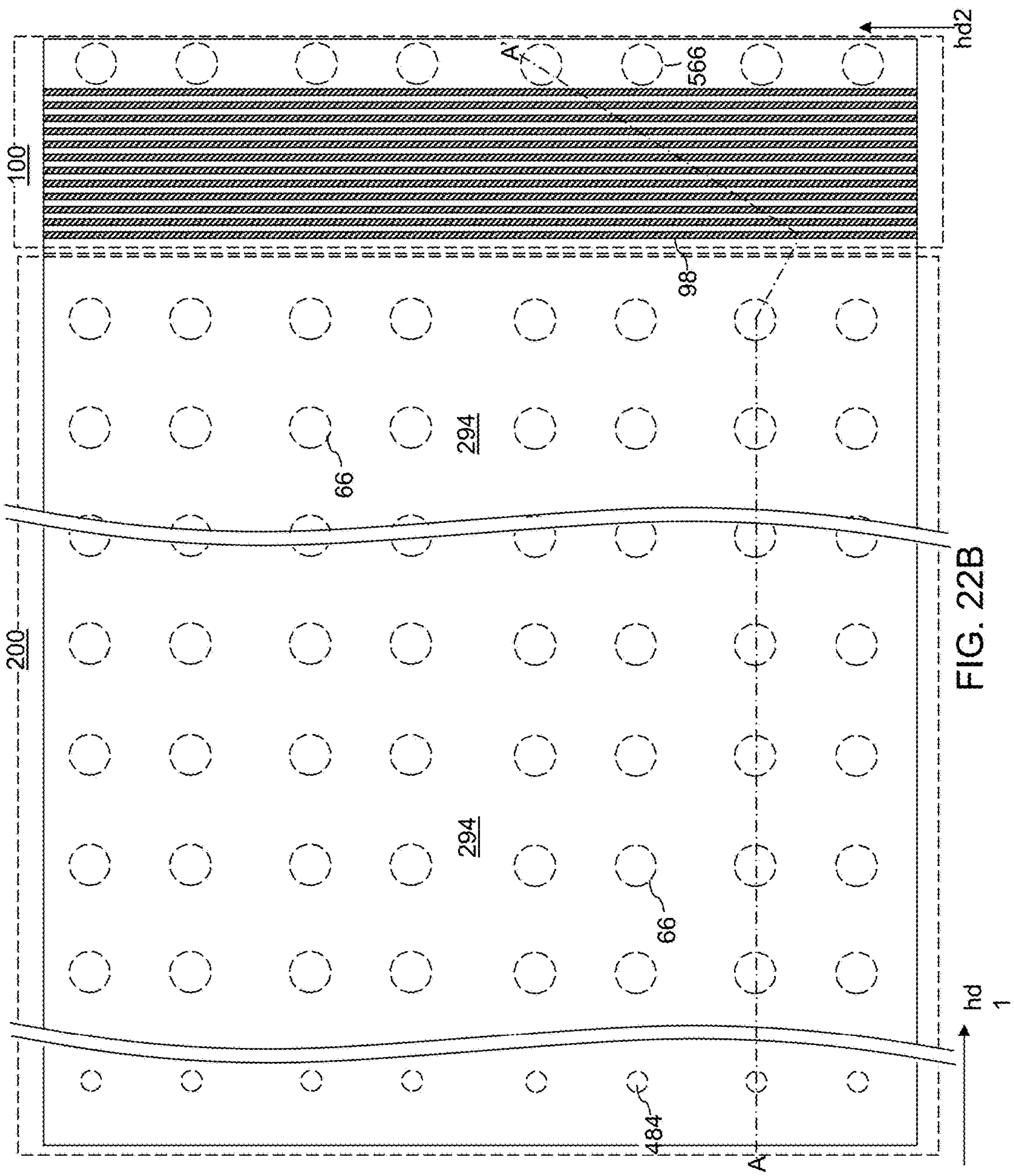
FIG. 22B is a horizontal cross-sectional view of the first exemplary structure along the horizontal plane B-B' in FIG. 22A. The zig-zag vertical plane A-A' corresponds to the plane of the vertical cross-sectional view of FIG. 22A.

Referring to FIGS. 22A and 22B, drain contact via structures 88 can be formed through the contact level dielectric layer 280. Each drain contact via structure 88 can be formed on a top surface of a respective one of the drain regions 63.

A line level dielectric layer 294 can be deposited over the contact level dielectric layer 280. The line level dielectric layer 294 can include a dielectric material such as silicon oxide, and can have a thickness in a range from 100 nm to 600 nm, although lesser and greater thicknesses can also be employed. Bit lines 98 can be formed through the line level dielectric layer 294 on a respective subset of the drain contact via structures 88. In one embodiment, the bit lines 98 can laterally extend along the second horizontal direction hd2, and can be laterally spaced among one another along the first horizontal direction hd1.

Figure 23A:
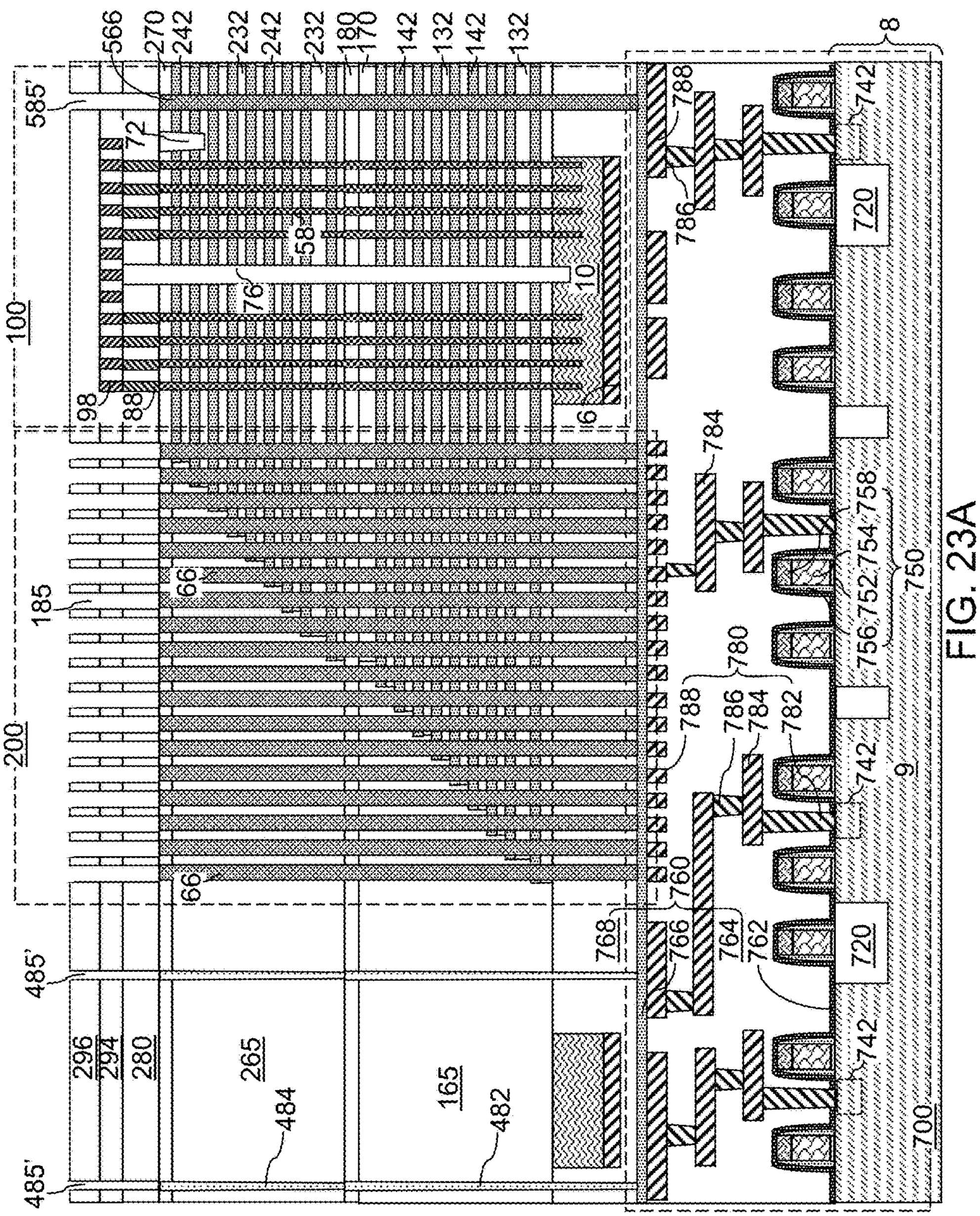
FIG. 23A is a vertical cross-sectional view of the first exemplary structure after formation of contact-level staircase-region openings, contact-level array-region openings, and contact-level peripheral-region openings according to the first embodiment of the present disclosure.
Figure 23B:
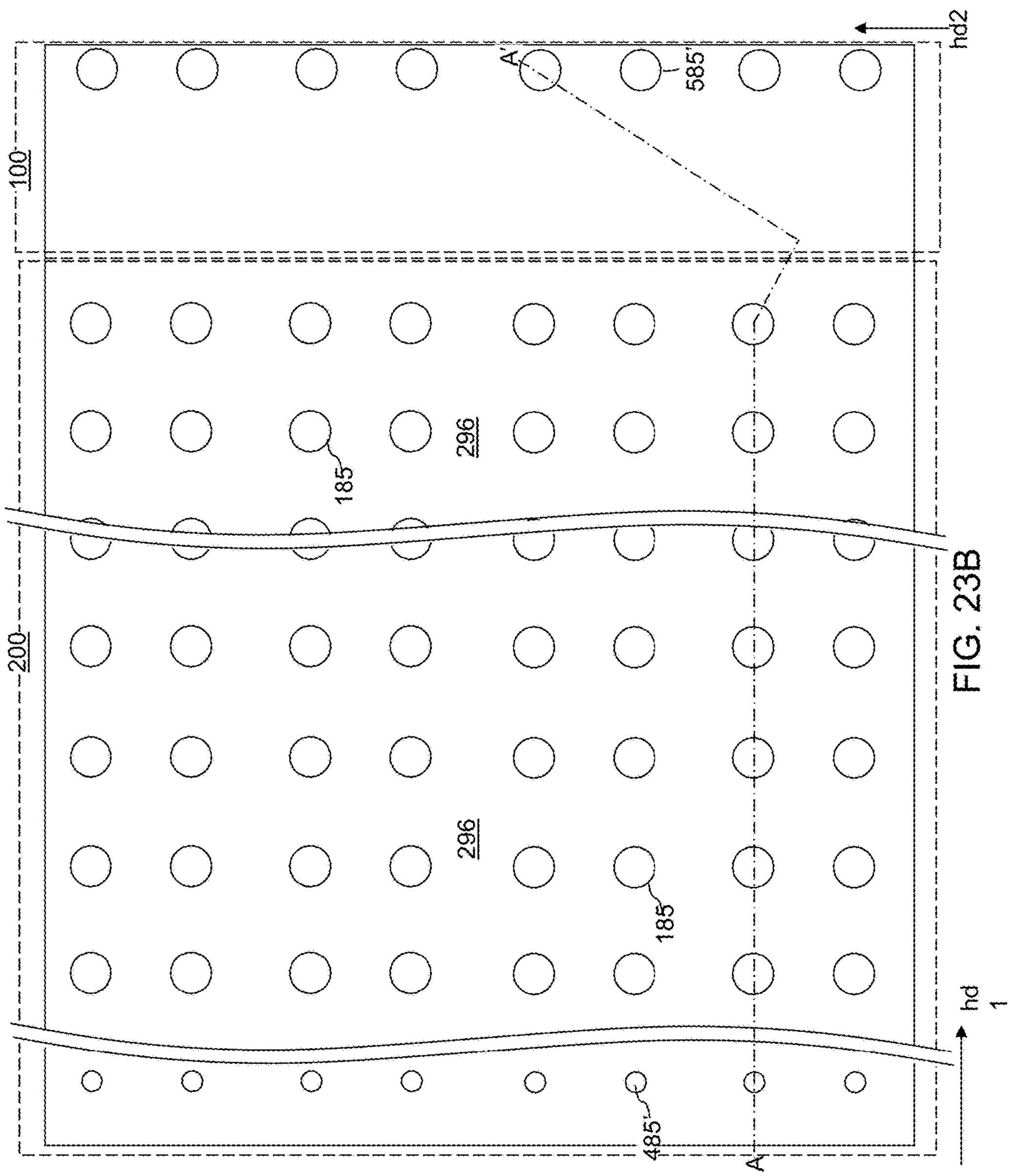
FIG. 23B is a horizontal cross-sectional view of the first exemplary structure along the horizontal plane B-B' in FIG. 23A. The zig-zag vertical plane A-A' corresponds to the plane of the vertical cross-sectional view of FIG. 23A.

Referring to FIGS. 23A and 23B, a via level dielectric layer 296 can be formed over the line level dielectric layer 294. The via level dielectric layer 296 can include a dielectric material such as silicon oxide, and can have a thickness in a range from 100 nm to 600 nm, although lesser and greater thicknesses can also be employed. A photoresist layer (not shown) can be applied over the via level dielectric layer 296, and can be lithographically patterned to form openings therein. The pattern in the photoresist layer can be transferred through the via level dielectric layer 296, the line level dielectric layer 294, and the contact level dielectric layer 280 by an anisotropic etch process to form various contact-level openings (185, 485', 585'). The contact-level openings (185, 485', 585') can include contact-level staircase-region openings 185 that are formed over the temporary staircase-region opening fill structures 66, contact-level array-region openings 585' that are formed over the temporary array-region opening fill structures 566, and contact-level peripheral-region openings 485' that are formed over the sacrificial peripheral-region opening fill structures (482, 484). The photoresist layer can be subsequently removed, for example, by ashing.

Figure 24A:
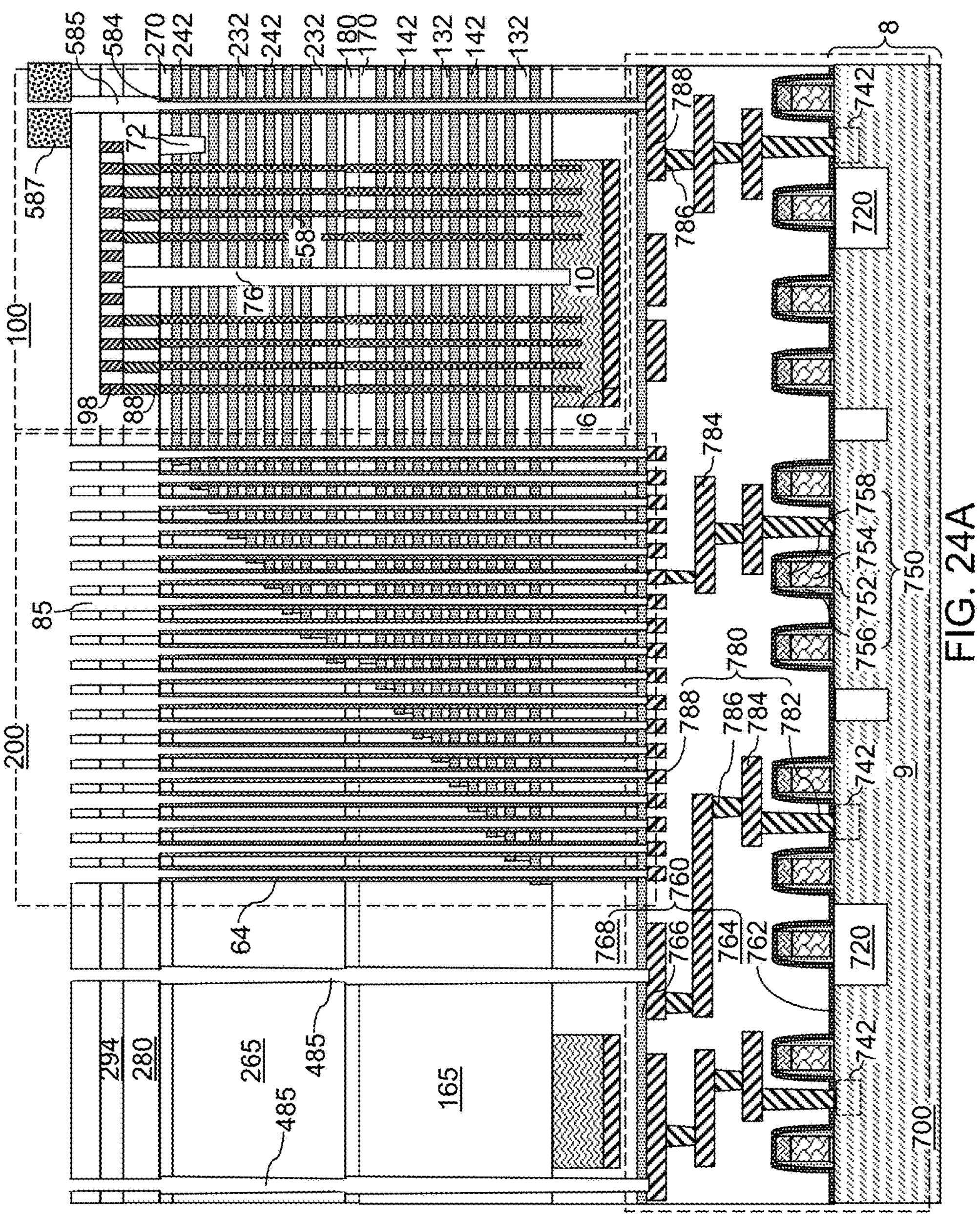
FIG. 24A is a vertical cross-sectional view of the first exemplary structure after formation of staircase-region openings, array-region openings, and peripheral-region openings by removal of the temporary staircase-region opening fill structures, the sacrificial array-region opening fill structures, and the sacrificial peripheral-region opening fill structures, and application and patterning of a patterning film, an anisotropic etch that removed uncovered horizontal portions of various insulating spacers according to the first embodiment of the present disclosure.
Figure 24B:
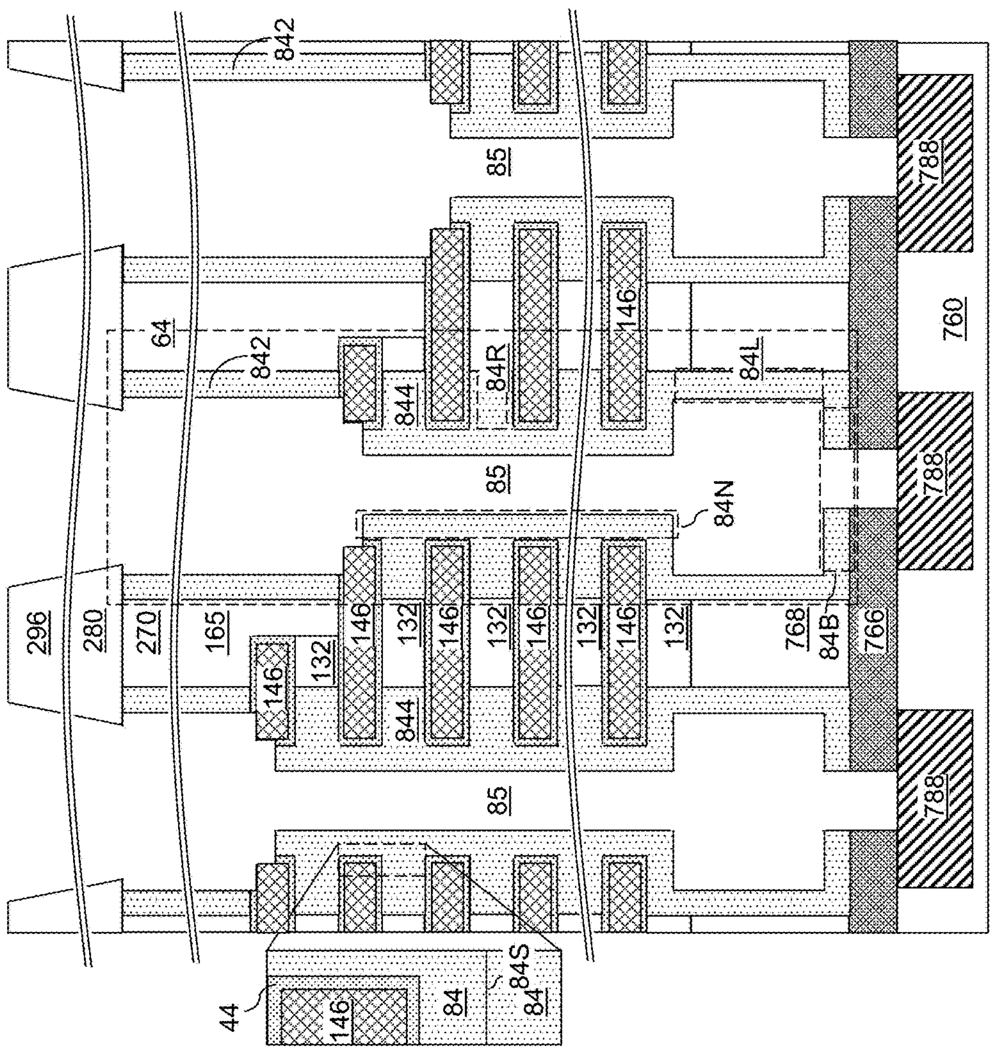
FIG. 24B is a vertical cross-sectional view of a region including a set of staircase-region openings after the processing steps of FIG. 24A.
Figure 24C:
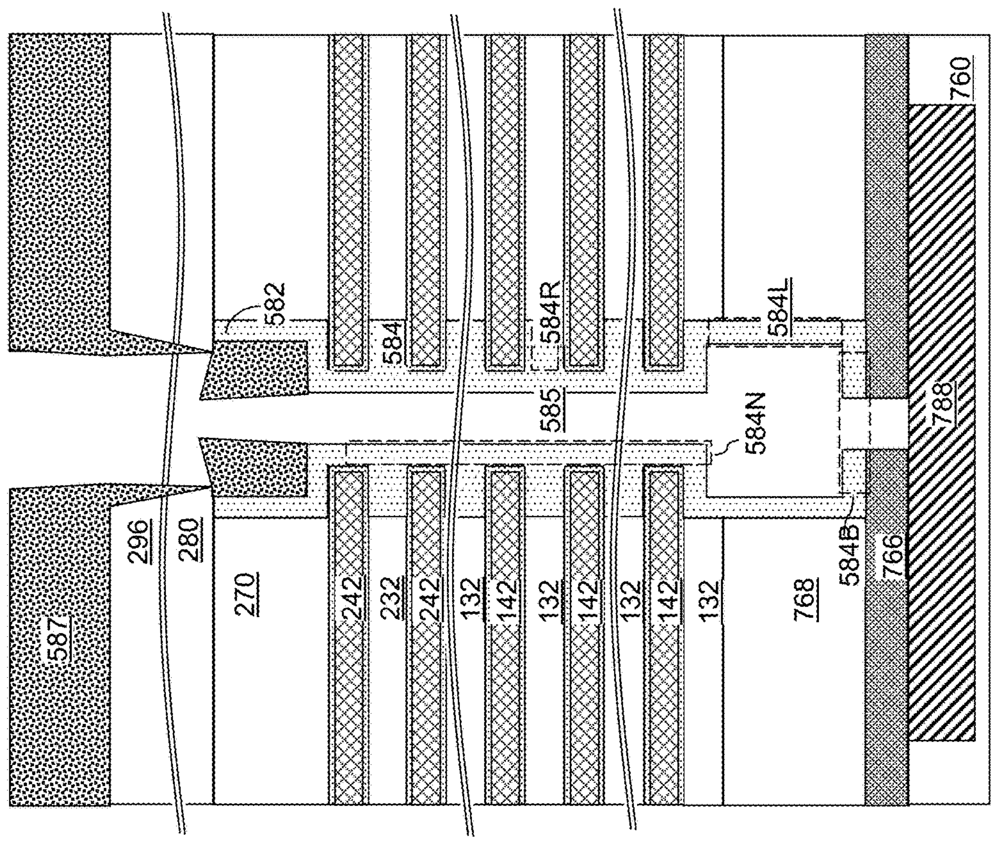
FIG. 24C is a vertical cross-sectional view of a region including an array-region opening after the processing steps of FIG. 24A.
Figure 25A:
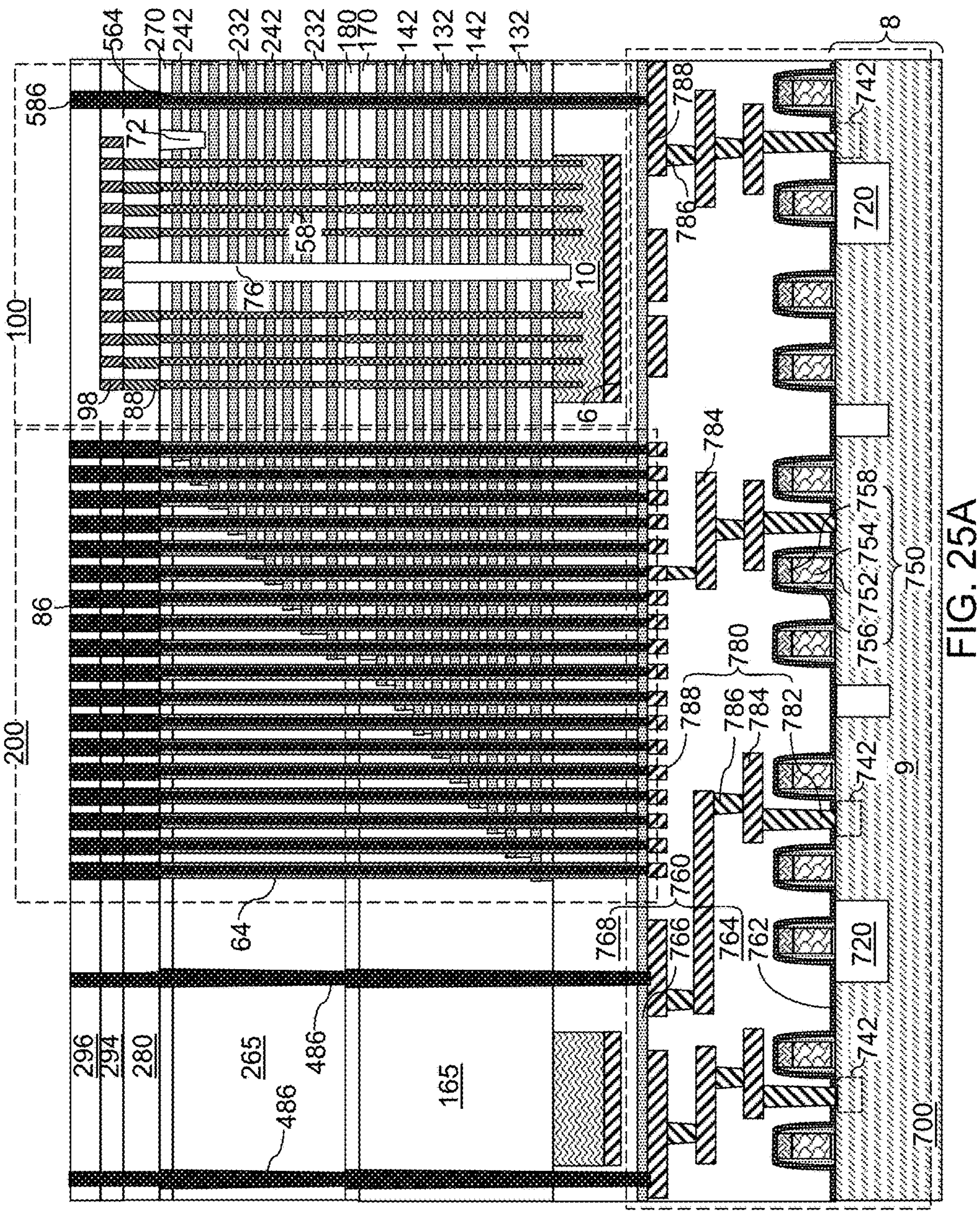
FIG. 25A is a vertical cross-sectional view of the first exemplary structure after formation of various contact via structures according to the first embodiment of the present disclosure.
Figure 25B:
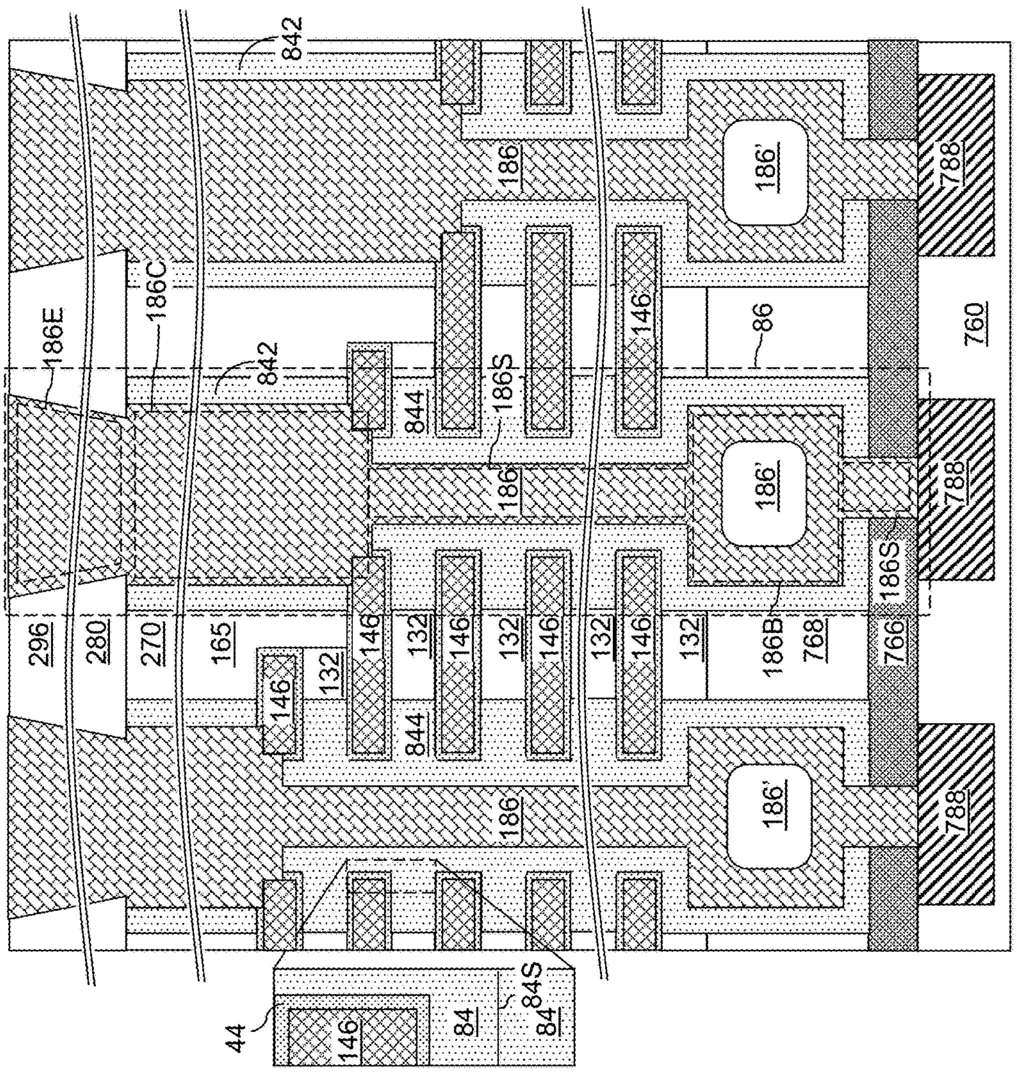
FIG. 25B is a vertical cross-sectional view of a region including a set of staircase-region openings after the processing steps of FIG. 25A.
Figure 25C:
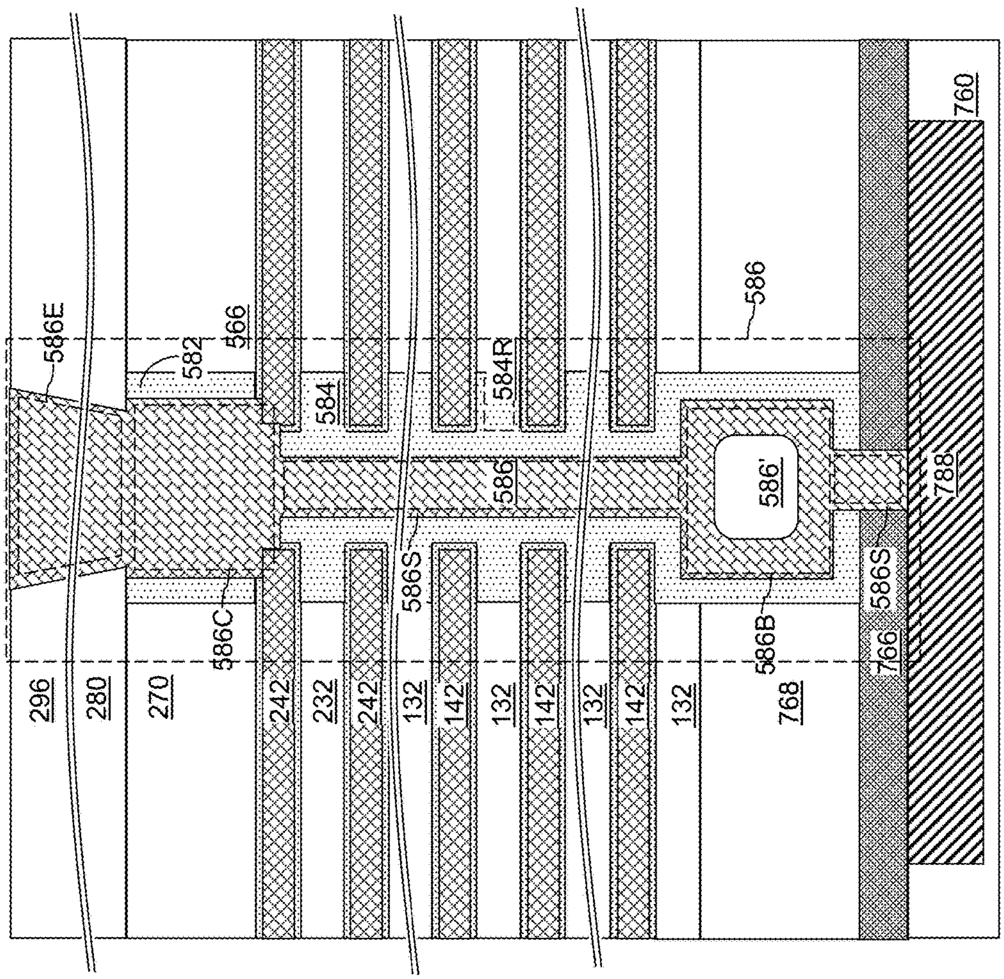
FIG. 25C is a vertical cross-sectional view of a region including an array-region opening after the processing steps of FIG. 25A.
Figure 25D:
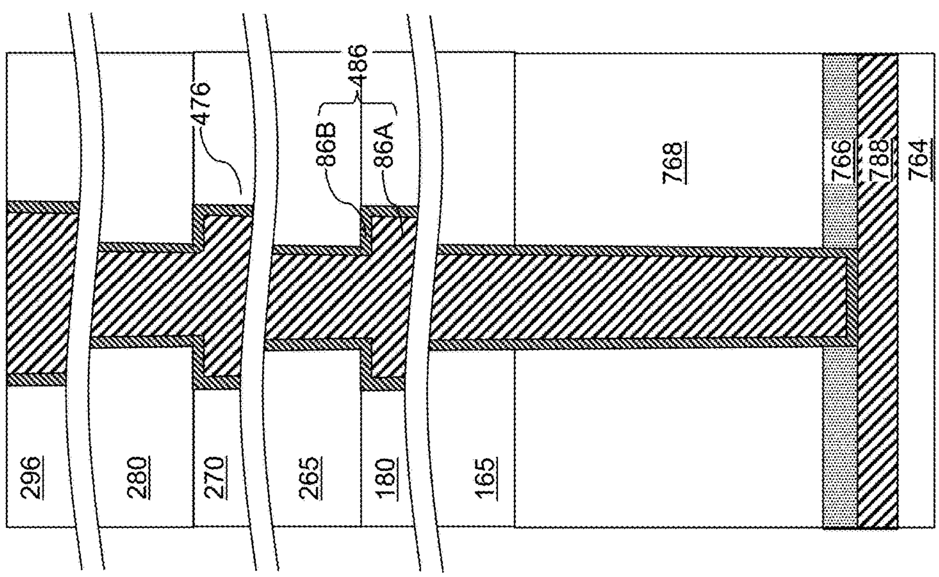
FIG. 25D is a vertical cross-sectional view of a region including a peripheral-region opening after the processing steps of FIG. 25A.

Referring to FIGS. 24A-24C, the sacrificial peripheral-region opening fill structures (482, 484), the temporary staircase-region opening fill portions 16, and the temporary array-region opening fill portions 516 can be removed selective to the material of the in-process ribbed insulating spacer 84 and the array-region insulating spacers 584, the materials of the first and second retro-stepped dielectric material portions (165, 265), and the materials of the at least one second dielectric layer 768, the inter-tier dielectric layer 180, the contact level dielectric layer 280, the line level dielectric layer 294, and the via level dielectric layer 296. For example, the in-process ribbed insulating spacer 84, the array-region insulating spacers 584, the first and second retro-stepped dielectric material portions (165, 265), the at least one second dielectric layer 768, the inter-tier dielectric layer 180, the contact level dielectric layer 280, the line level dielectric layer 294, and the via level dielectric layer 296 can include undoped silicate glass or doped silicate glass, and the sacrificial peripheral-region opening fill structures (482, 484), the temporary staircase-region opening fill portions 16, and the temporary array-region opening fill portions 516 can include a semiconductor material such as amorphous silicon or a silicon-germanium alloy, organosilicate glass, or borosilicate glass or a doped silicate glass having a high etch rate in dilute hydrofluoric acid.

A staircase-region opening 85 is formed in each combination of a contact-level staircase-region openings 185 and an underlying volume from which a temporary staircase-region opening fill portion 16 is removed. An array-region opening 585 is formed in each combination of a contact-level array-region opening 585' and an underlying volume from which a temporary array-region opening fill portion 516 is removed. A peripheral-region opening 485 is formed in each combination of a contact-level peripheral-region opening 485' and an underlying volume from which a sacrificial peripheral-region opening fill structure (482, 484) is removed.

Subsequently, a patterning film 587 can be anisotropically deposited and patterned to cover upper horizontal surfaces of the array-region opening 585 without covering bottom horizontal surfaces of the array-region openings 585. The patterning film 587 is anisotropically deposited to provide good coverage on horizontal surfaces that are proximal to the upper end of each array-region opening 585 while providing poor coverage on vertical surfaces and recessed surfaces of the array-region openings 585. The patterning film 587 can include amorphous carbon or diamond-like carbon (DLC). For example, a commercially available example of the patterning film 587 is Advanced Patterning Film™ supplied by Applied Materials, Inc™.

Horizontal portions of the in-process ribbed insulating spacer 84 and bottom horizontal portions of the array-region insulating spacers 584 are anisotropically etched by an anisotropic etch process. An annular top surface of a first electrically conductive layer 146 or a second electrically conductive layer 246 is physically exposed within each staircase-region opening 85. Remaining vertical portions of each in-process ribbed insulating spacer 84 include a ribbed insulating spacer 844 and a cylindrical insulating spacer 842. The ribbed insulating spacers 844 can include annular rib regions 84R that contact sidewalls of the first and/or second insulating layers (132, 232). The cylindrical insulating spacers 842 can contact the second retro-stepped dielectric material portion 265 and may contact the first retro-stepped dielectric material portion 165. The ribbed insulating spacers 844 and the cylindrical insulating spacers 842 around the staircase-region openings 85 are herein referred to as staircase-region insulating spacers 64. The patterning film 587 can be subsequently removed, for example, by ashing.

Referring to FIGS. 25A-25D, at least one conductive material is deposited within each of the staircase-region opening 85, the array-region openings 585, and the peripheral-region openings 485. The at least one conductive material can include a metallic liner material (such as TiN) and a metallic fill material (such as W, Cu, Co, Ru, Mo, etc.). Staircase-region contact via structures 186 are formed in the staircase-region openings 85. Each staircase-region contact via structures 186 contacts a respective one of the first and second electrically conductive layers (146, 246), and contacts a top surface of a respective one of the lower-level metal interconnect structures 780.

In one embodiment, the staircase-region contact via structures 186 comprise column-shaped contact via structures, and each of the column-shaped contact via structures 186 comprises: a shaft portion 186S extending through the first alternating stack (132, 146), a capital portion 186C adjoined to an upper end of the shaft portion 186S and having a greater lateral extent than the shaft portion 186S, and a base portion 186B adjoined to a lower end of the shaft portion 186S and having a greater lateral extent than the shaft portion 186S. Each of the column-shaped contact via structures 186 can include an extension region 186E located above the capital portion 186C. Each extension region 186E can have a different taper than an underlying capital portion 186C. Each of the column-shaped contact via structures 186 can include a protrusion region 186S having a lesser lateral extent than the base portion 186B and contacting a top surface of a respective one of the lower-level metal interconnect structures 780 (such as a topmost lower-level metal interconnect structure 788). A void 186' may be present within a bottom portion of each staircase-region contact via structure 186 below the first-tier structure at the level of the at least one second dielectric layer 768. Each contiguous set of a staircase-region contact via structure 186 and staircase-region insulating spacers 64 is herein referred to as a staircase-region contact assembly 86.

Through-memory-level contact via structures (586, 486) can be formed through the first alternating stack of the first insulating layers 132 and the first electrically conductive layers 146 and through the second alternating stack of the second insulating layers 232 and the second electrically conductive layers 246. Each through-memory-level contact via structure (586, 486) can be formed on a respective one of the lower-level metal interconnect structures 780 concurrently with formation of the staircase-region contact via structures 186. Volumes of the through-memory-level contact via structures (586, 486) include volumes of the sacrificial first-tier contact opening fill portions (582, 482).

The through-memory-level contact via structures (586, 486) comprise an array-region contact via structure 586 extending through each layer in the first alternating stack (132, 146) and the second alternating stack (232, 246). A volume of each array-region contact via structure 586 includes a volume of a respective sacrificial first-tier array-region opening fill portion 582. The through-memory-level contact via structures (586, 486) comprise a peripheral region contact via structure 486 extending through the first and second retro-stepped dielectric material portions (165, 265). A volume of each peripheral region contact via structure 486 includes a volume of a respective sacrificial first-tier peripheral-region opening fill portion 482.

The various embodiments of the first exemplary structure includes a three-dimensional memory device, which can include: a first-tier structure (132, 146, 170, 165) located over a substrate 8, the first-tier structure including a first alternating stack (132, 146) of first insulating layers 132 and first electrically conductive layers 146 and a first retro-stepped dielectric material portion 165 overlying first stepped surfaces of the first alternating stack (132, 146), wherein all layers of the first alternating stack (132, 146) are present in a memory array region 100 and the first stepped surfaces are present in a staircase region 200; a second-tier structure (232, 246, 270, 265, 72) located over the first-tier structure (132, 146, 170, 165) and including a second alternating stack (132, 146) of second insulating layers 232 and second electrically conductive layers 246 and a second retro-stepped dielectric material portion 265 overlying second stepped surfaces of the second alternating stack (132, 146); and memory stack structures 55 and staircase-region contact via structures 186 that extend through the first-tier structure (132, 146, 170, 165) and the second-tier structure (232, 246, 270, 265, 72). Each of the memory stack structures 55 comprises a respective memory film 50 and a respective vertical semiconductor channel 60, and each of the staircase-region contact via structures 186 contacts a respective one of the first and second electrically conductive layers (146, 246) and is laterally spaced from each of the first and second electrically conducive layers (146, 246) other than the respective one of the first and second electrically conductive layers by a respective insulating spacer (844, 842).

In one embodiment, the three-dimensional memory device further comprises lower-level dielectric material layers 760 embedding lower-level metal interconnect structures 780 located over the substrate 8 and under the first-tier structure (132, 146, 170, 165). The staircase-region contact via structures 186 contact a respective one of the lower-level metal interconnect structures 760.

In one embodiment, the insulating spacers (844, 842) comprise ribbed insulating spacers 844 laterally surrounding a respective one of the staircase-region contact via structures 186 and have a greater lateral extent at levels of the first insulating layers 132 than at levels of the first electrically conductive layers 146.

The three-dimensional memory device can further comprise through-memory-level contact via structures (586, 486) extending through the first-tier structure (132, 146, 170, 165) and the second-tier structure (232, 246, 270, 265, 72) and contacting a respective one of the lower-level metal interconnect structures 780 and electrically isolated from each of the electrically conductive layers (146, 246) within the first-tier structure (132, 146, 170, 165) and the second-tier structure (232, 246, 270, 265, 72).

In one embodiment, the through-memory-level contact via structures (586, 486) comprise an array-region contact via structure 586 extending through an opening in each layer in the first alternating stack (132, 146) and the second alternating stack (232, 246). In one embodiment, the three-dimensional memory device comprises an array-region ribbed insulating spacer 584 laterally surrounding the array-region contact via structure 586 and having a greater lateral extent at levels of the first and second insulating layers (132, 232) than at levels of the first and second electrically conductive layers (146, 246).

In one embodiment, the through-memory-level contact via structures (586, 486) further comprise a peripheral region contact via structure 486 vertically extending from a top surface of the second retro-stepped dielectric material portions (165, 265) and below a bottommost surface of the first retro-stepped dielectric material portion 165. In one embodiment, the peripheral region contact via structure 486 comprises: a first straight sidewall extending from the bottommost surface of the first retro-stepped dielectric material portion 165 (at an interface with the at least one second dielectric layer 768) to a bottommost surface of the second retro-stepped dielectric material portion 265 (at a horizontal interface with the inter-tier dielectric layer 180); a second straight sidewall extending from the bottommost surface of the second retro-stepped dielectric material portion 265 to the top surface of the second retro-stepped dielectric material portion 265 (at an interface with the contact level dielectric layer 280); and a horizontal surface connecting the first straight sidewall and the second straight sidewall and contacting the bottommost surface of the second retro-stepped dielectric material portion 265. The horizontal surface may be an annular surface, i.e., a surface having an outer periphery that is laterally offset outward from, and does not contact, an inner periphery.

Figure 26:
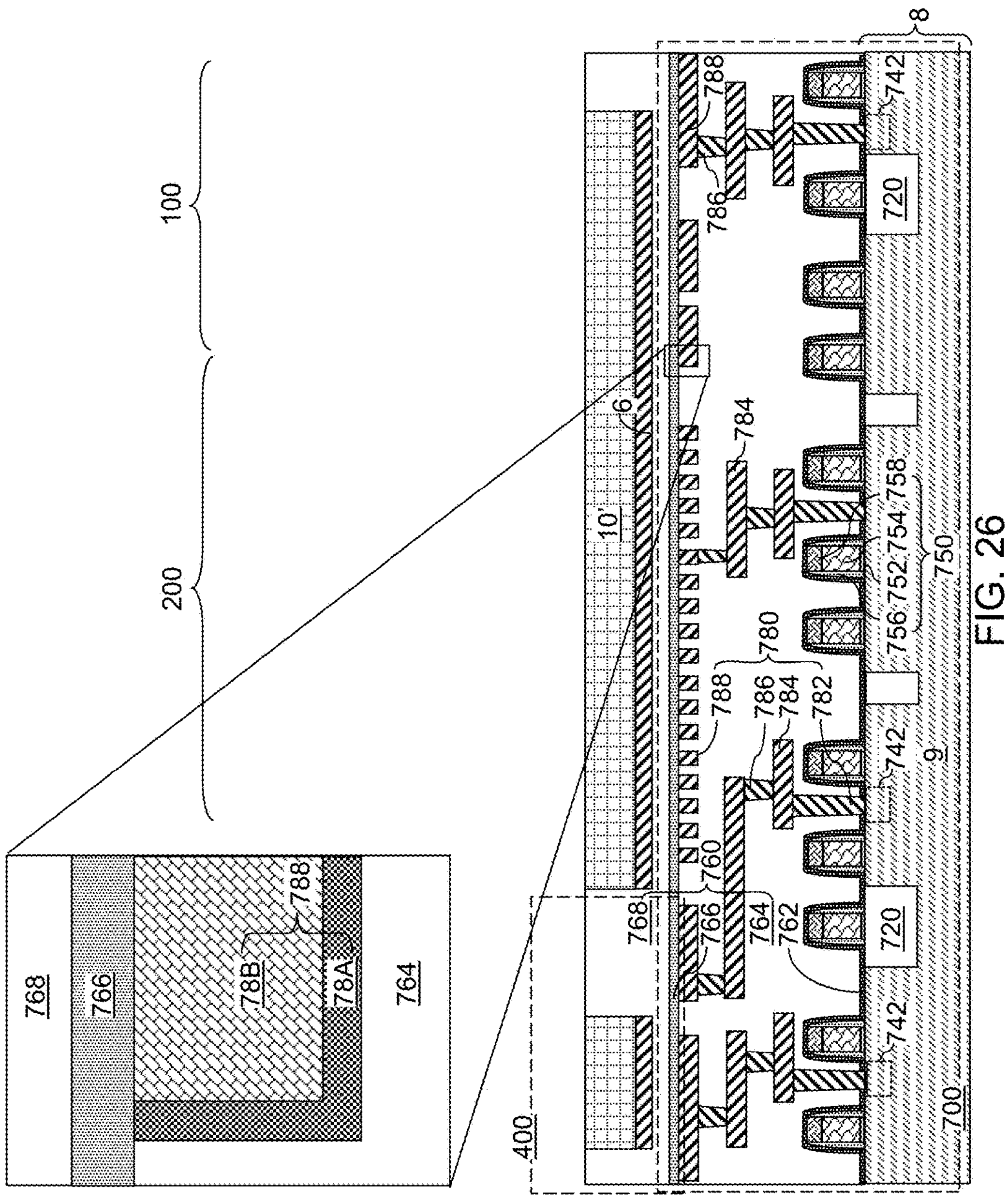
FIG. 26 is a vertical cross-sectional view of a second exemplary structure after formation of semiconductor devices, lower-level dielectric material layers, lower-level metal interconnect structures, a planar conducive plate layer, and a planar semiconductor material layer on a semiconductor substrate according to a second embodiment of the present disclosure.

Referring to FIG. 26, a second exemplary structure according to a second embodiment of the present disclosure can be derived from the first exemplary structure illustrated in FIGS. 1A-1C by modifying the pattern for the optional conductive plate layer 6 and in-process source-level material layers 10'. Specifically, the optional conductive plate layer 6 and in-process source-level material layers 10' are present in the staircase region 200.

Figure 27:
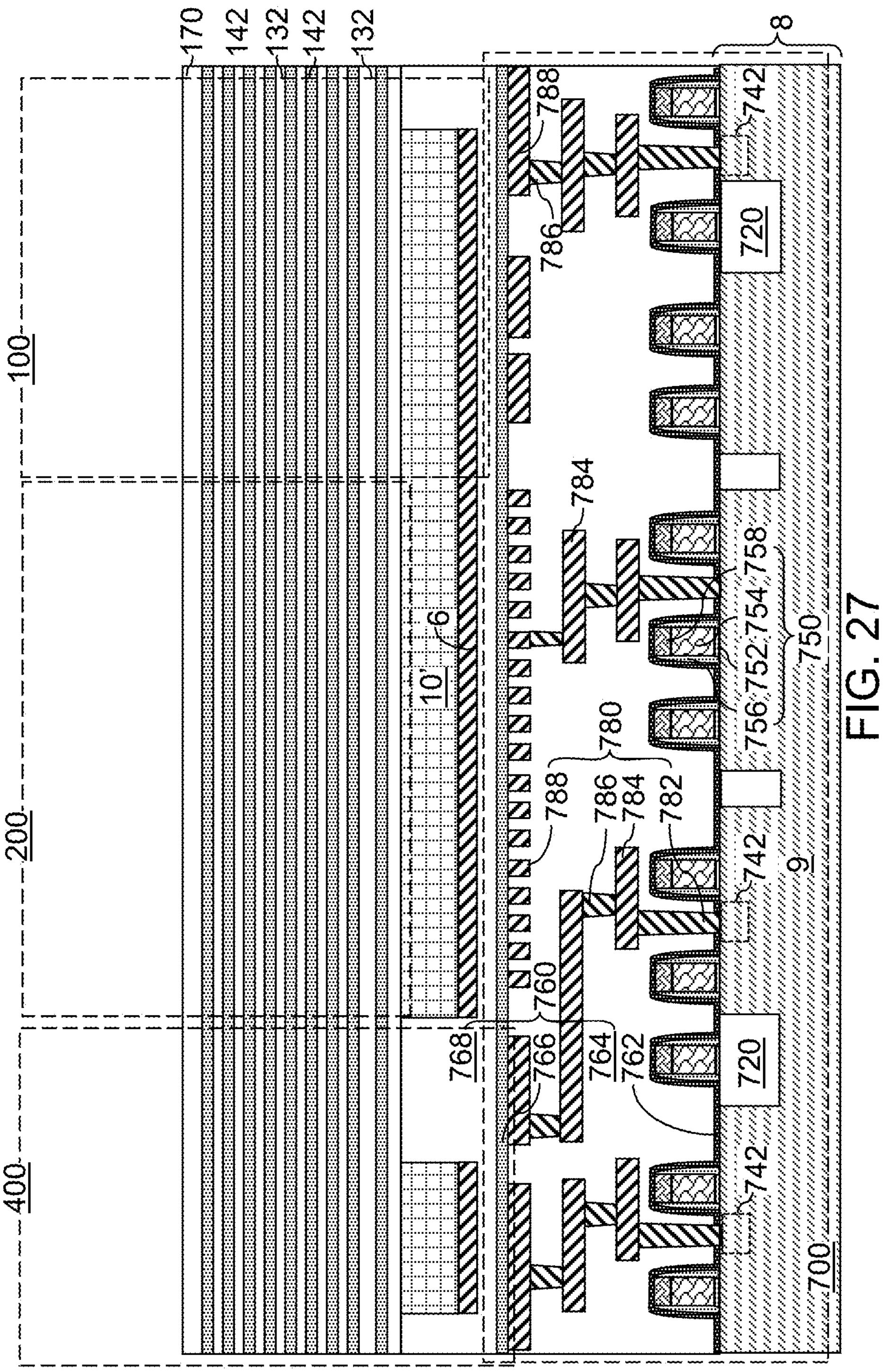
FIG. 27 is a vertical cross-sectional view of the second exemplary structure after formation of a first alternating stack of first insulting layers and first spacer material layers according to the second embodiment of the present disclosure.

Referring to FIG. 27, a first alternating stack of first insulting layers 132 and first spacer material layers (such as first sacrificial material layers 142) can be formed by performing the processing steps of FIG. 2.

Figure 28:
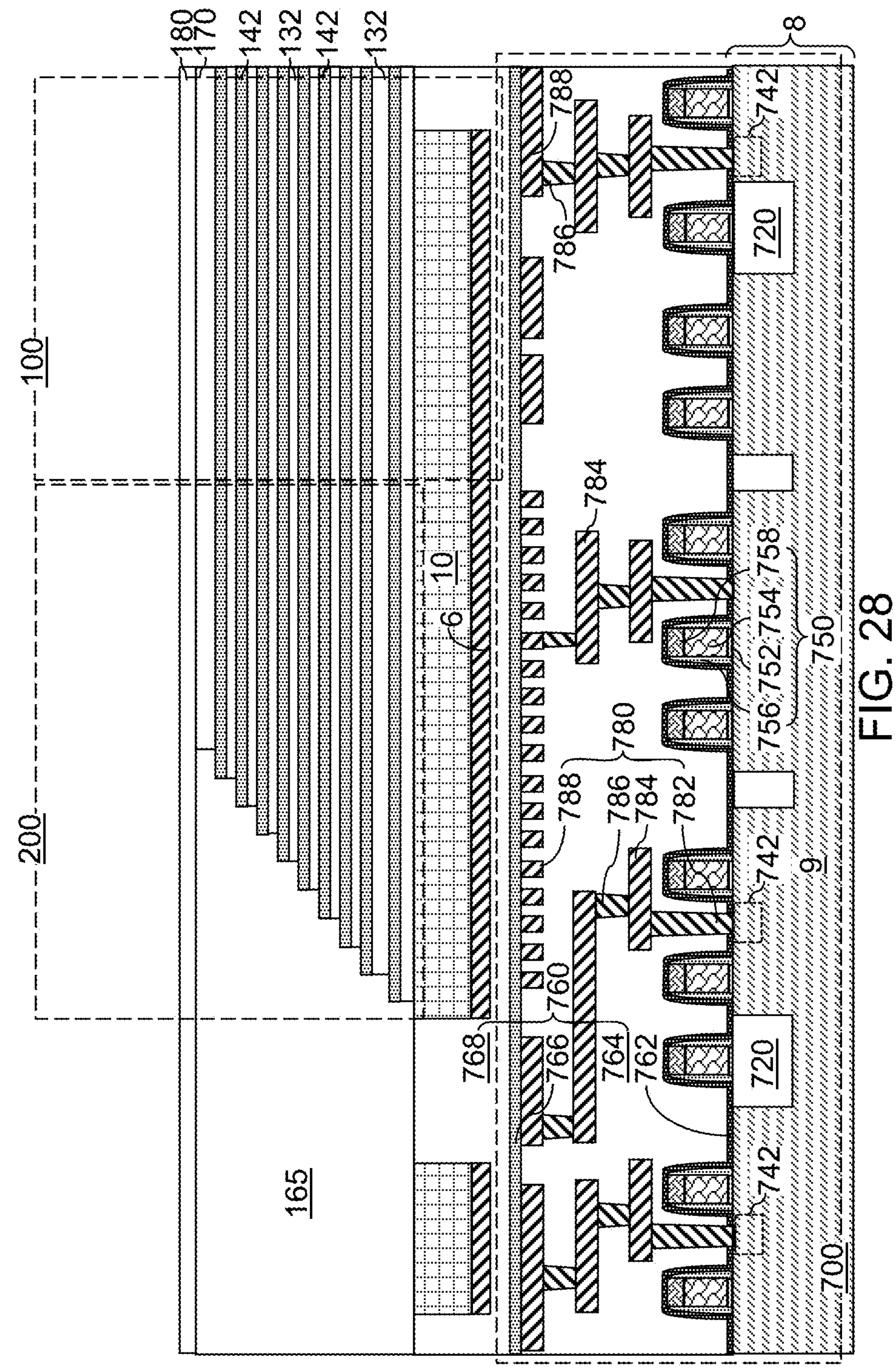
FIG. 28 is a vertical cross-sectional view of the second exemplary structure after patterning of first stepped surfaces on the first alternating stack and formation of a first retro-stepped dielectric material portion and an inter-tier dielectric layer according to the second embodiment of the present disclosure.

Referring to FIG. 28, first stepped surfaces are patterned on the first alternating stack (132, 142) and a first retro-stepped dielectric material portion 165 and an inter-tier dielectric layer 180 can be formed by performing the processing steps of FIG. 3.

Figure 29A:
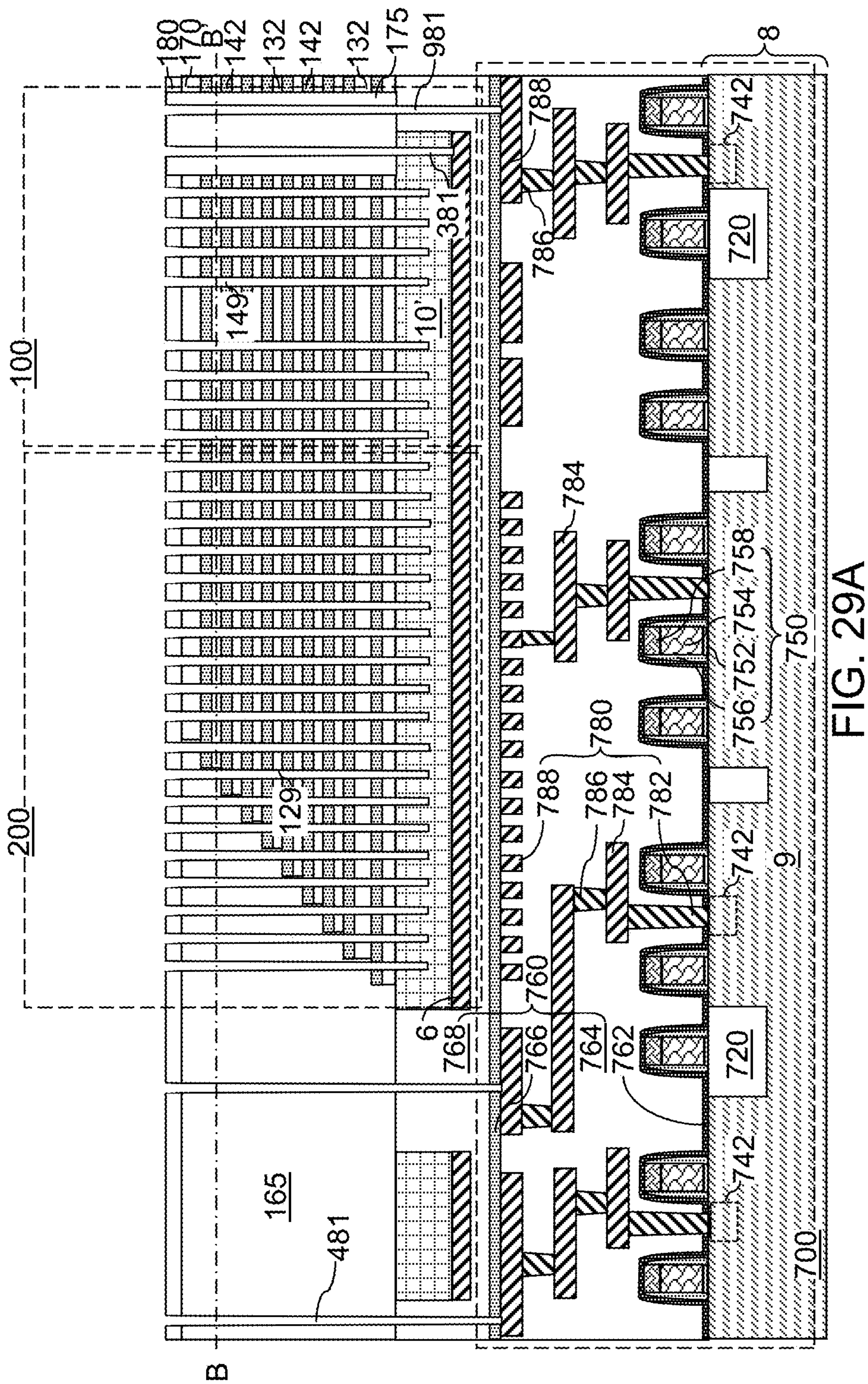
FIG. 29A is a vertical cross-sectional view of the second exemplary structure after formation of a first dielectric pillar structure, first-tier memory openings, first-tier support openings, first-tier plate contact openings, first-tier array-region openings, and first-tier peripheral-region openings according to the second embodiment of the present disclosure.
Figure 29B:
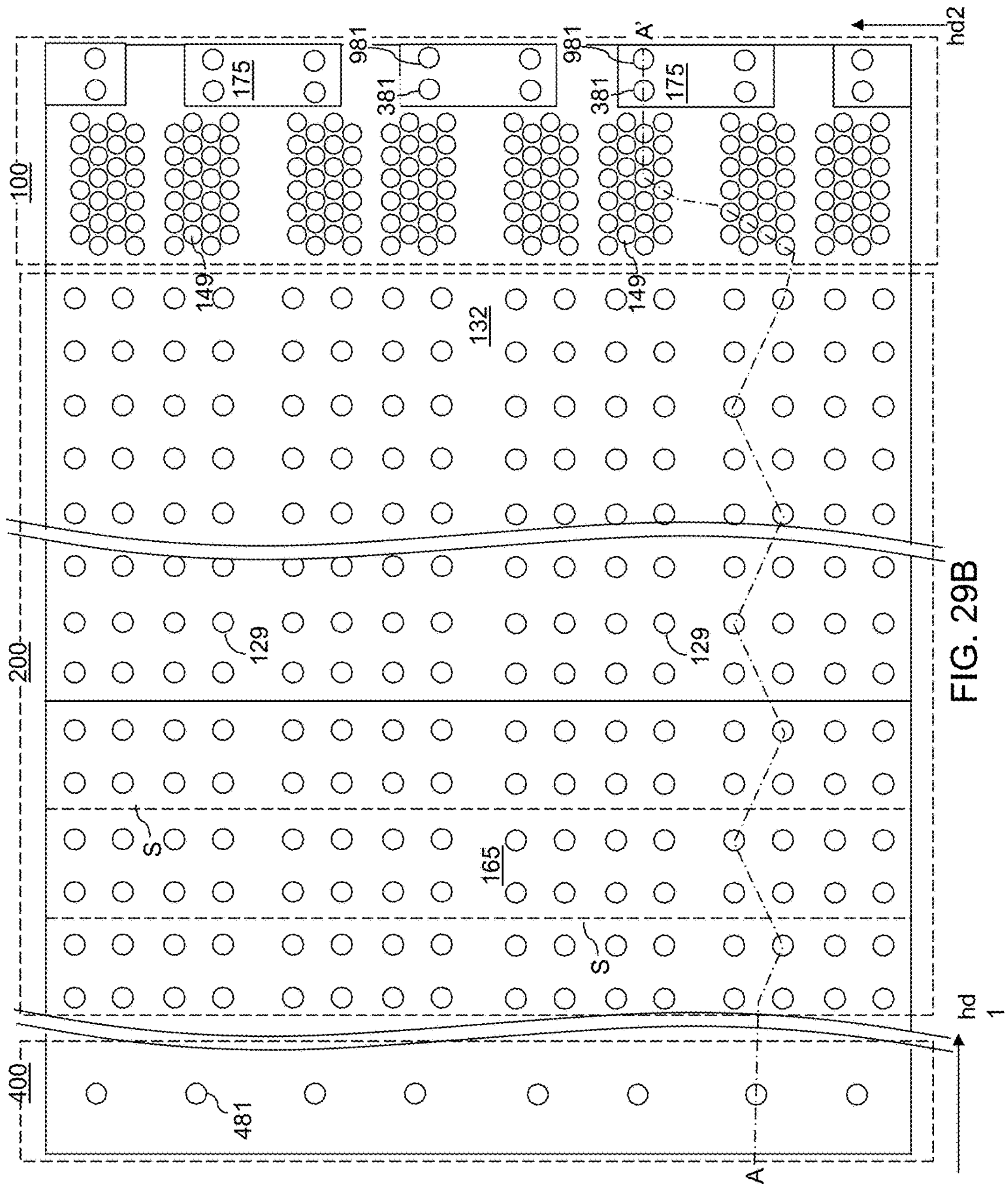
FIG. 29B is a horizontal cross-sectional view of the second exemplary structure along the horizontal plane B-B' in FIG. 29A. The zig-zag vertical plane A-A' corresponds to the plane of the vertical cross-sectional view of FIG. 29A.

Referring to FIGS. 29A and 29B, first dielectric pillar structures 175 can be formed within the memory array region 100. The areas over which the first dielectric pillar structures 175 are formed can include the areas of openings in the conductive plate layer 6 and in-process source-level material layers 10' and adjacent areas that overlie a peripheral portion of the in-process source-level material layer 10'. The first dielectric pillar structures 175 can be formed by applying a photoresist layer over the inter-tier dielectric layer 180 and the first-tier structure (132, 142, 170, 165), forming discrete openings within the memory array region 100, forming pillar cavities extending through the first-tier structure (132, 142, 170, 165) by an anisotropic etch process that employs the patterned photoresist layer as an etch mask, removing the photoresist layer, depositing a dielectric material such as silicon oxide in the pillar cavities, and removing excess portions of the dielectric material from above the top surface of the inter-tier dielectric layer 180. Each first dielectric pillar structure 175 can contact a top surface of the at least one second dielectric layer 768 and a top surface of a respective peripheral portion of the in-process source-level material layers 10'.

Various first-tier openings (149, 129, 381, 481, 981) can be formed through the inter-tier dielectric layer 180 and the first-tier structure (132, 142, 170, 165, 175) and into the in-process source-level material layers 10' and into the at least one second dielectric layer 768. A photoresist layer (not shown) can be applied over the inter-tier dielectric layer 180, and can be lithographically patterned to form various openings therethrough. The pattern of openings in the photoresist layer can be transferred through the inter-tier dielectric layer 180 and the first-tier structure (132, 142, 170, 165, 175) and into the in-process source-level material layers 10' and the at least one second dielectric layer 768 by a first anisotropic etch process to form the various first-tier openings (149, 129, 381, 481, 981) concurrently, i.e., during the first anisotropic etch process. The various first-tier openings (149, 129, 381, 481, 981) can include first-tier memory openings 149, first-tier support openings 129, first-tier plate contact openings 381, first-tier array-region openings 981, and first-tier peripheral-region openings 481. The first-tier plate contact openings 381, the first-tier array-region openings 981, and first-tier peripheral-region openings 481 are collectively referred to as first-tier contact openings (381, 981, 481).

The first-tier memory openings 149 are openings that are formed in the memory array region 100 through each layer within the first alternating stack (132, 142) and are subsequently employed to form memory stack structures therein. The first-tier memory openings 149 can be formed in clusters of first-tier memory openings 149 that are laterally spaced apart along the second horizontal direction hd2. Each cluster of first-tier memory openings 149 can be formed as a two-dimensional array of first-tier memory openings 149.

The first-tier support openings 129 are openings that are formed in the staircase region 200 and are subsequently employed to form support structures that are subsequently employed to provide structural support to the second exemplary structure during replacement of sacrificial material layers with electrically conductive layers. In case the first spacer materials are formed as first electrically conductive layers, the first-tier support openings 129 can be omitted. A subset of the first-tier support openings 129 can be formed through horizontal surfaces of the first stepped surfaces of the first alternating stack (132, 142). Locations of steps S in the first-tier alternating stack (132, 142) are illustrated as dotted lines in FIG. 29B.

The first-tier plate contact openings 381 can be formed through a respective one of the first dielectric pillar structures 175 and a respective peripheral portion of the in-process source-level material layers 10' and directly on the conductive plate layer 6. The first-tier array-region openings 981 can be formed through a respective one of the first dielectric pillar structures 175 and the at least one second dielectric layer 768 on, or through, a respective area of the silicon nitride layer 766. Each first-tier array-region opening 981 can be formed directly above a respective one of the lower-level metal interconnect structure 780. The first-tier peripheral-region openings 481 can be formed within a respective area of the peripheral region 400 that contains an opening in the conductive plate layer 6 and in-process source-level material layers 10'. Each first-tier peripheral-region opening 481 can be formed directly above a respective one of the lower-level metal interconnect structure 780.

In one embodiment, the first anisotropic etch process can include an initial etch step in which the materials of the first-tier alternating stack (132, 142) are etched concurrently with the materials of the first retro-stepped dielectric material portion 165 and the first dielectric pillar structure 175. The chemistry of the initial etch step can alternate to optimize etching of the first and second materials in the first-tier alternating stack (132, 142) while providing a greater average etch rate to the materials of the first retro-stepped dielectric material portion 165 and the first dielectric pillar structure 175. Thus, the first-tier contact openings (381, 981, 481) are formed with a greater depth than the first-tier memory openings 149 and the first-tier support openings 129, and thus, the first-tier plate contact openings 381 vertically extend into the in-process source-level material layers 10' and the first-tier array-region openings 981 and the first-tier peripheral-region openings 481 extend into the at least one second dielectric layer 768 before the bottom surfaces of the first-tier memory openings 149 and the first-tier support openings 129 reach the topmost surface of the in-process source-level material layers 10'. The first anisotropic etch process can employ, for example, a series of reactive ion etch processes or a single reaction etch process (e.g., $CF_4/O_2/Ar$ etch). The sidewalls of the various first-tier openings (149, 129, 381, 481, 981) can be substantially vertical, or can be tapered.

After etching through the alternating stack (132, 142) and the first retro-stepped dielectric material portion 165, the chemistry of a terminal portion of the first anisotropic etch process can be selected to etch through the dielectric material(s) of the at least one second dielectric layer 768 with a higher etch rate than an average etch rate for the in-process source-level material layers 10'. For example, a terminal portion of the anisotropic etch process may include a step that etches the dielectric material(s) of the at least one second dielectric layer 768 selective to a semiconductor material within a component layer in the in-process source-level material layers 10'. In one embodiment, the terminal portion of the first anisotropic etch process can etch through the optional source-select-level conductive layer 118, the source-level insulating layer 117, the upper source-level material layer 116, the upper sacrificial liner 105, the source-level sacrificial layer 104, and the lower sacrificial liner 103, and at least partly into the lower source-level material layer 112. The terminal portion of the first anisotropic etch process can include at least one etch chemistry for etching the various semiconductor materials of the in-process source-level material layers 10'. Because the first-tier plate contact openings 381 extend through an upper portion of the in-process source-level material layers 10' before the first-tier memory openings 149 and the first-tier support openings 129 reach the topmost surface of the in-process source-level material layers 10', the first-tier plate contact openings 381 reach the top surface of the conductive plate layer 6 and the first-tier memory openings 149 and the first-tier support openings 129 may be stopped at the source-level sacrificial layer 104. Alternatively, the first-tier memory openings 149 and the first-tier support openings 129 may reach the top surface of the conductive plate layer 6. In one embodiment, the conductive plate layer 6 can include a metallic material such as tungsten, tungsten silicide, tungsten nitride or titanium nitride.

The bottom surfaces of the first-tier memory openings 149 and the first-tier support openings 129 can be recessed surfaces of the lower source-level material layer 112, and the bottom surfaces of the first-tier plate contact openings 381 can be surfaces of the conductive plate layer 6. In one embodiment, the bottom surfaces of the first-tier array-region openings 981 and the first-tier peripheral-region openings 481 can be horizontal surfaces of the silicon nitride layer 766 that acts as an etch stop overlies the topmost lower-level metal line structures 788. In another embodiment, the bottom surfaces of the first-tier array-region openings 981 and the first-tier peripheral-region openings 481 can be physically exposed top surfaces of the topmost lower-level metal line structures 788 through the silicon nitride layer 766. The photoresist layer can be subsequently removed, for example, by ashing.

Optionally, the portions of the first-tier memory openings 149, the first-tier support openings 129, the first-tier plate contact openings 381, the first-tier array-region openings 981, and the first-tier peripheral-region openings 481 at the level of the inter-tier dielectric layer 180 can be laterally expanded by an isotropic etch employing the methods illustrated in FIGS. 5A and 5B.

Figure 30:
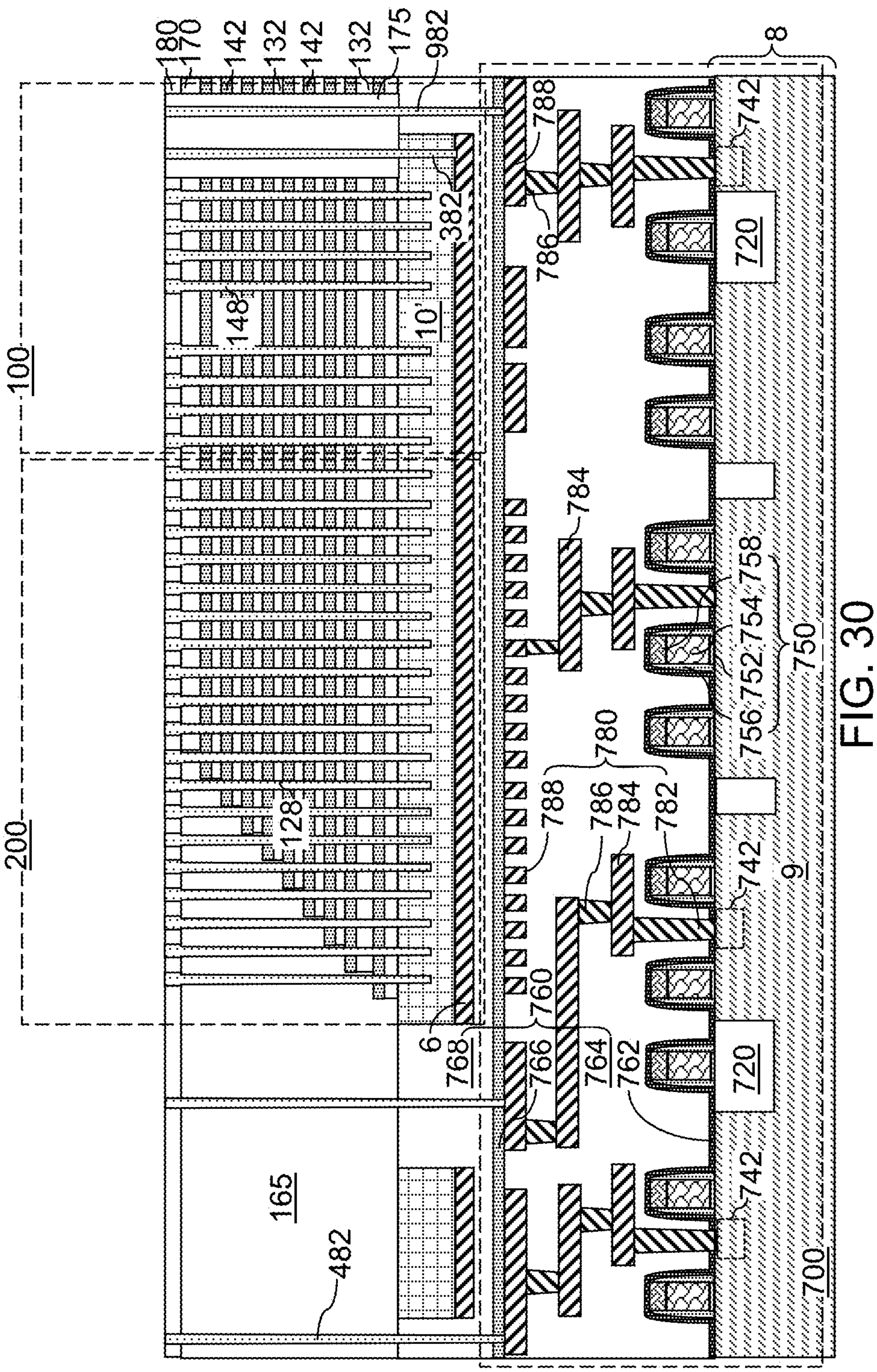
FIG. 30 is a vertical cross-sectional view of the second exemplary structure after formation of sacrificial first-tier memory opening fill portions, sacrificial first-tier support opening fill portions, sacrificial first-tier plate contact opening fill portions, sacrificial first-tier array-region opening fill portions, and sacrificial first-tier peripheral-region opening fill portions according to the second embodiment of the present disclosure.

Referring to FIG. 30, sacrificial first-tier opening fill portions (148, 128, 382, 482, 982) can be formed in the various first-tier openings (149, 129, 381, 481, 981) by performing the processing steps of FIG. 6. For example, a sacrificial first-tier fill material is deposited concurrently deposited in each of the first-tier openings first-tier openings (149, 129, 381, 481, 981), and is subsequently planarized to form the sacrificial first-tier opening fill portions (148, 128, 382, 482, 982).

Remaining portions of the sacrificial first-tier fill material comprise sacrificial first-tier opening fill portions (148, 128, 382, 482, 982). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The sacrificial first-tier support opening fill portions 128 vertically extend through at least a portion of the first alternating stack (132, 142), and may extend through the first retro-stepped dielectric material portion 165. Each remaining portion of the sacrificial material in a first-tier plate contact opening 381 constitutes a sacrificial first-tier plate contact opening fill portion 382. The first-tier plate contact openings 381 vertically extend through the first dielectric pillar structures 175 and the in-process source-level material layers 10'. Each remaining portion of the sacrificial material in a first-tier array-region opening 981 constitutes a sacrificial first-tier array-region opening fill portion 982. The first-tier array-region openings 981 vertically extend through the first dielectric pillar structures 175 and the at least one second dielectric layer 968. Each remaining portion of the sacrificial material in a first-tier peripheral-region opening 481 constitutes a sacrificial first-tier peripheral-region opening fill portion 482. Each sacrificial first-tier peripheral-region opening fill portion 482 extends through the first retro-stepped dielectric material portion 165, and does not contact the first alternating stack (132, 142). The sacrificial first-tier plate contact opening fill portions 382, the sacrificial first-tier array-region opening fill portions 982 and the sacrificial first-tier peripheral-region opening fill portion 482 are collectively referred to as first-tier contact opening fill portions (382, 482, 982).

The various sacrificial first-tier opening fill portions (148, 128, 382, 482, 982) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128, 382, 482, 982) can be coplanar with the top surface of the inter-tier dielectric layer 180. Each of the sacrificial first-tier opening fill portions (148, 128, 382, 482, 982) may, or may not, include cavities therein.

Figure 31:
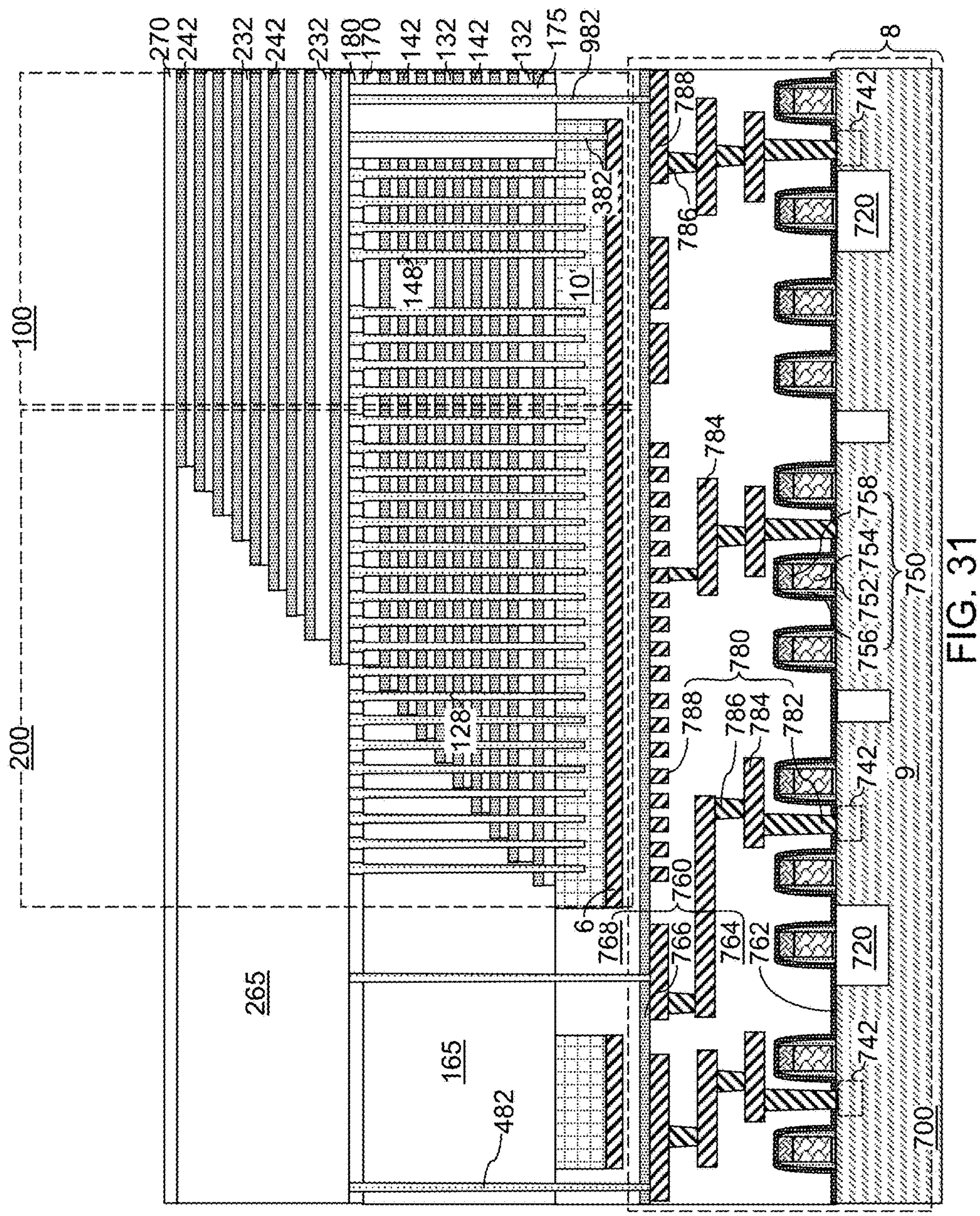
FIG. 31 is a vertical cross-sectional view of the second exemplary structure after formation of a second alternating stack of second insulating layers and second spacer material layers, a second-tier retro-stepped dielectric material portion, and a second insulating cap layer according to the second embodiment of the present disclosure.

Referring to FIG. 31, the processing steps of FIG. 7 can be performed to form a second-tier structure (232, 242, 265, 270) over the first-tier structure (132, 142, 170, 165). The second-tier structure (232, 242) includes a second alternating stack (232, 242) of second insulating layers 232 and second sacrificial material layers 242, a second retro-stepped dielectric material portion 265, and a second insulating cap layer 270. Second stepped surfaces may be formed prior to, or after, formation of the second insulating cap layer 270.

Figure 32:
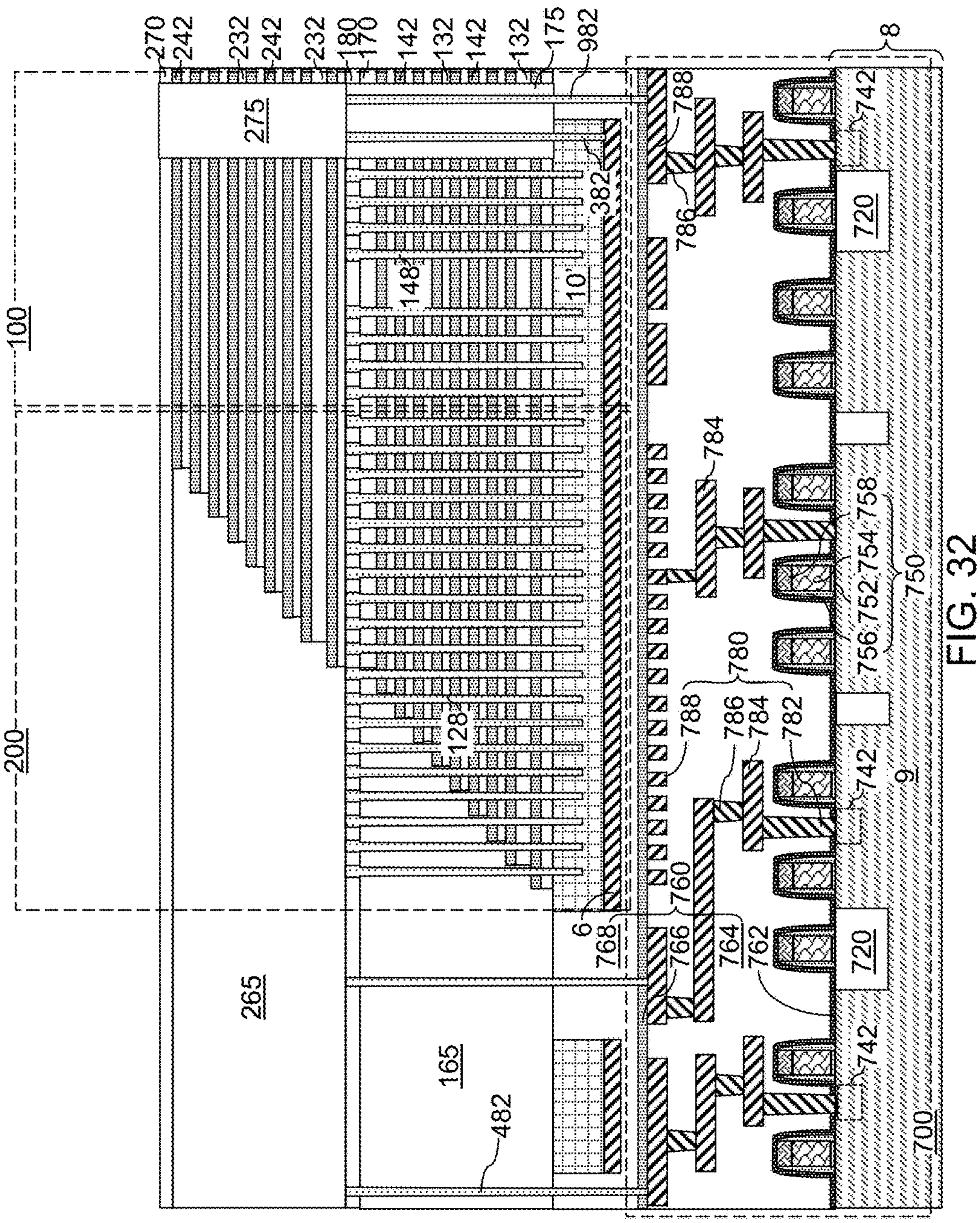
FIG. 32 is a vertical cross-sectional view of the second exemplary structure after formation of a second dielectric pillar structure according to the second embodiment of the present disclosure.

Referring to FIG. 32, second dielectric pillar structures 275 can be formed through the second-tier structure (232, 242, 265, 270) within the memory array region 100. The areas of the second dielectric pillar structures 275 can be the same as the areas of the first dielectric pillar structures 175. The second dielectric pillar structures 275 can be formed by applying a photoresist layer over the second-tier structure (232, 242, 265, 270), forming discrete openings within areas of the first dielectric pillar structures 175, forming pillar cavities extending through the second-tier structure (232, 242, 265, 270) by an anisotropic etch process that employs the patterned photoresist layer as an etch mask, removing the photoresist layer, depositing a dielectric material such as silicon oxide in the pillar cavities, and removing excess portions of the dielectric material from above the top surface of the second-tier structure (232, 242, 265, 270). Each second dielectric pillar structure 275 can contact a top surface of a respective one of the first dielectric pillar structures 175.

Figure 33A:
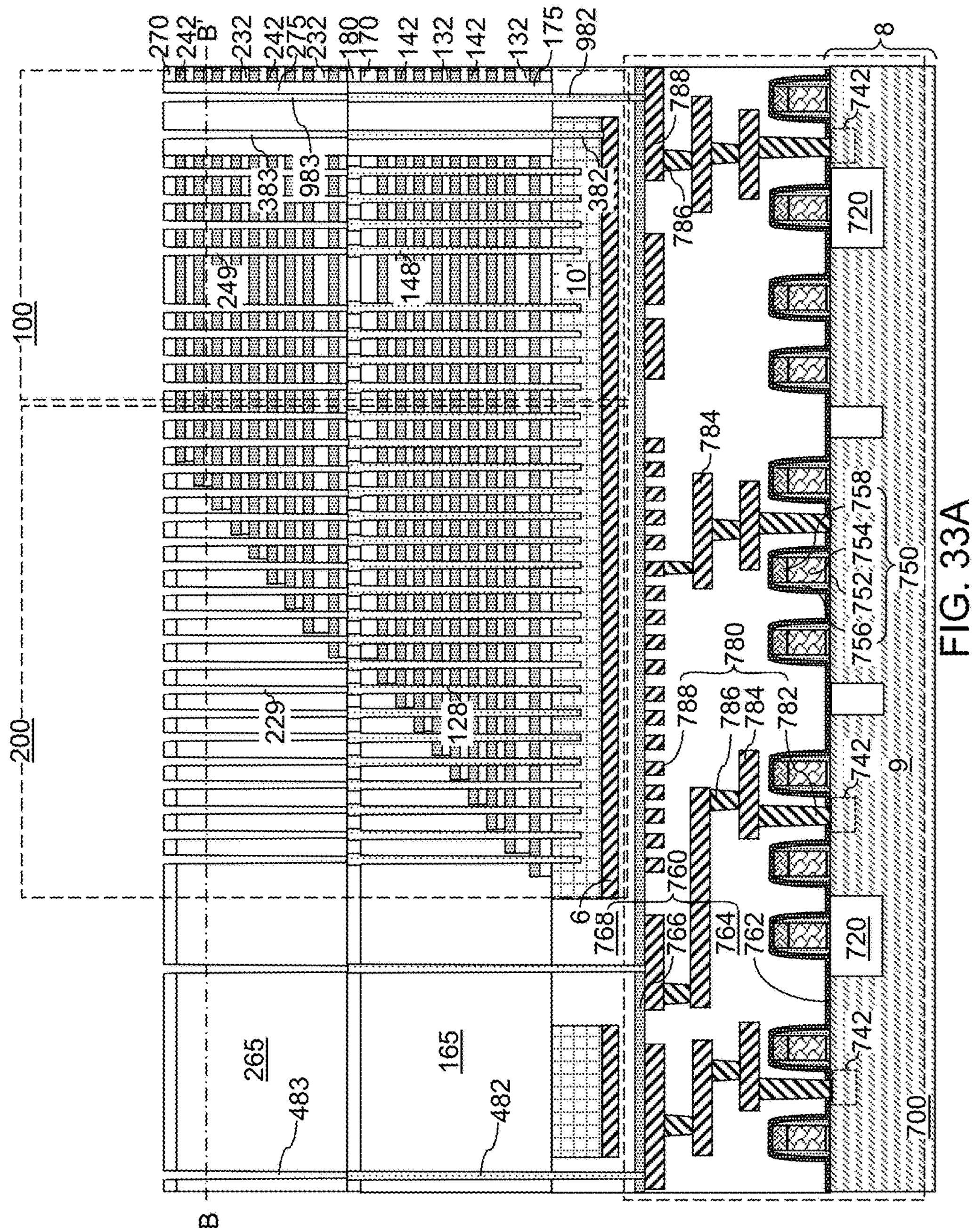
FIG. 33A is a vertical cross-sectional view of the second exemplary structure after formation of first-tier memory openings, first-tier support openings, first-tier plate contact openings, first-tier array-region openings, and first-tier peripheral-region openings according to the second embodiment of the present disclosure.
Figure 33B:
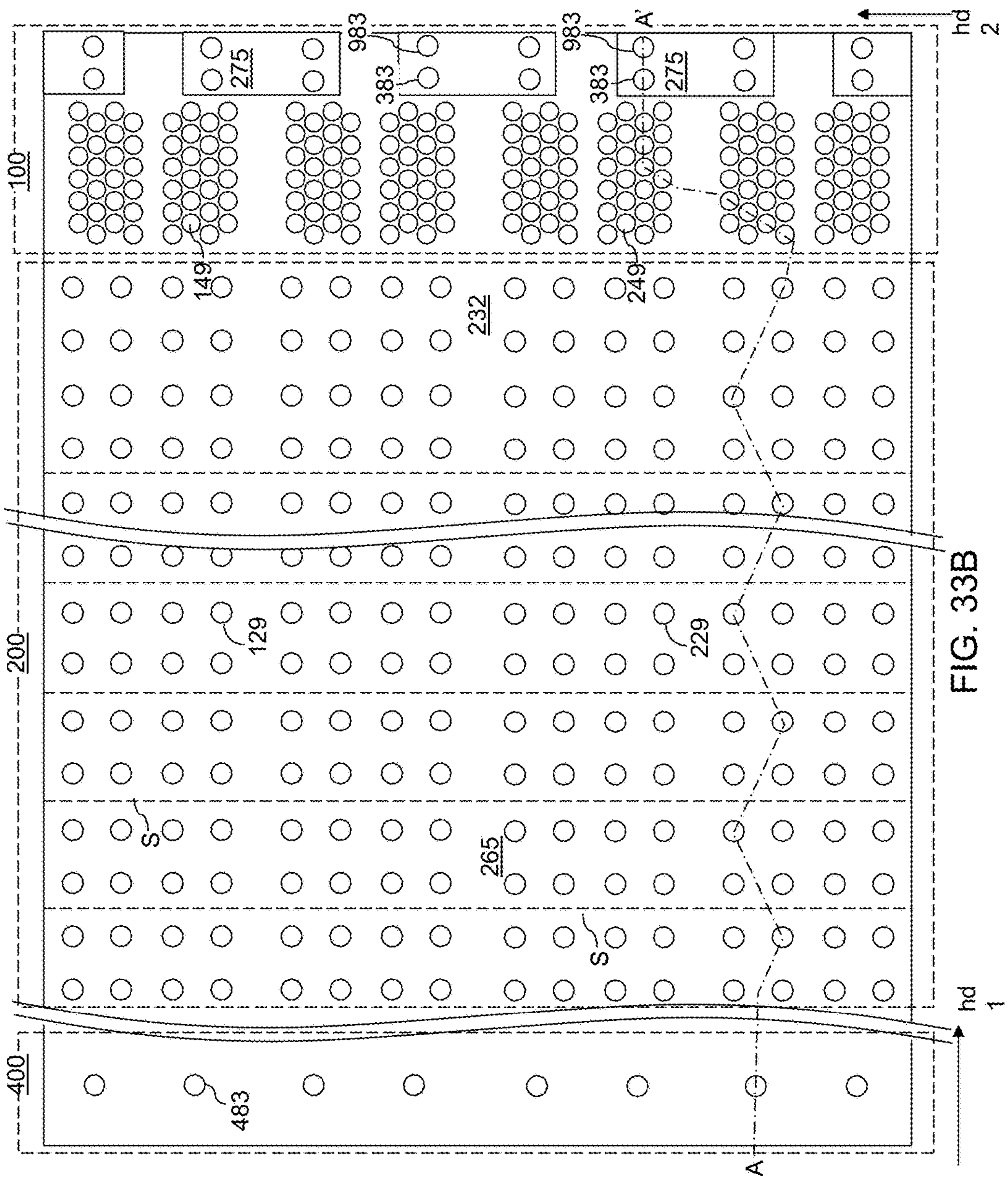
FIG. 33B is a horizontal cross-sectional view of the second exemplary structure along the horizontal plane B-B' in FIG. 33A. The zig-zag vertical plane A-A' corresponds to the plane of the vertical cross-sectional view of FIG. 33A.

Referring to FIGS. 33A and 33B, various second-tier openings (249, 229, 383, 483, 983) can be formed through the second-tier structure (232, 242, 265, 270, 275). A photoresist layer (not shown) can be applied over the second insulating cap layer 270, and can be lithographically patterned to form various openings therethrough. The pattern of the openings can be the same as the pattern of the various first-tier openings (149, 129, 381, 481, 981), which is the same as the sacrificial first-tier opening fill portions (148, 128, 382, 482, 982). Thus, the lithographic mask employed to pattern the first-tier openings (149, 129, 381, 481, 981) can be employed to pattern the photoresist layer.

The pattern of openings in the photoresist layer can be transferred through the second-tier structure (232, 242, 265, 270, 275) by a second anisotropic etch process to form various second-tier openings (249, 229, 383, 483, 983) concurrently, i.e., during the second anisotropic etch process. The various second-tier openings (249, 229, 383, 483, 983) can include second-tier memory openings 249, second-tier support openings 229, second-tier plate contact openings 383, second-tier array-region openings 983, and second-tier peripheral-region openings 483.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. The second-tier plate contact openings 383 are formed through the second-tier dielectric pillar portions 275 directly on a top surface of a respective one of the sacrificial first-tier plate contact opening fill portions 382. The second-tier array-region openings 983 can be formed through the second-tier dielectric pillar portions 275 on a top surface of a respective one of the sacrificial first-tier array-region opening fill portions 982. The second-tier peripheral-region openings 483 can be formed directly one a top surface of a respective one of the sacrificial first-tier peripheral-region opening fill portions 482. Locations of steps S in the first-tier alternating stack (132, 142) and the second-tier alternating stack (232, 242) are illustrated as dotted lines in FIG. 33B.

The second anisotropic etch process can include an etch step in which the materials of the second-tier alternating stack (232, 242) are etched concurrently with the materials of the second retro-stepped dielectric material portion 265 and the second dielectric pillar structure 275. The chemistry of the etch step can alternate to optimize etching of the materials in the second-tier alternating stack (232, 242) while providing a comparable average etch rate to the material of the second retro-stepped dielectric material portion 265. The second anisotropic etch process can employ, for example, a series of reactive ion etch processes or a single reaction etch process (e.g., $CF_4/O_2/Ar$ etch). The sidewalls of the various second-tier openings (249, 229, 383, 483, 983) can be substantially vertical, or can be tapered. A bottom periphery of each second-tier opening (249, 229, 383, 483, 983) may be laterally offset, and/or may be located entirely within, a periphery of a top surface of an underlying sacrificial first-tier opening fill portion (148, 128, 382, 482, 982). The photoresist layer can be subsequently removed, for example, by ashing.

Figure 34:
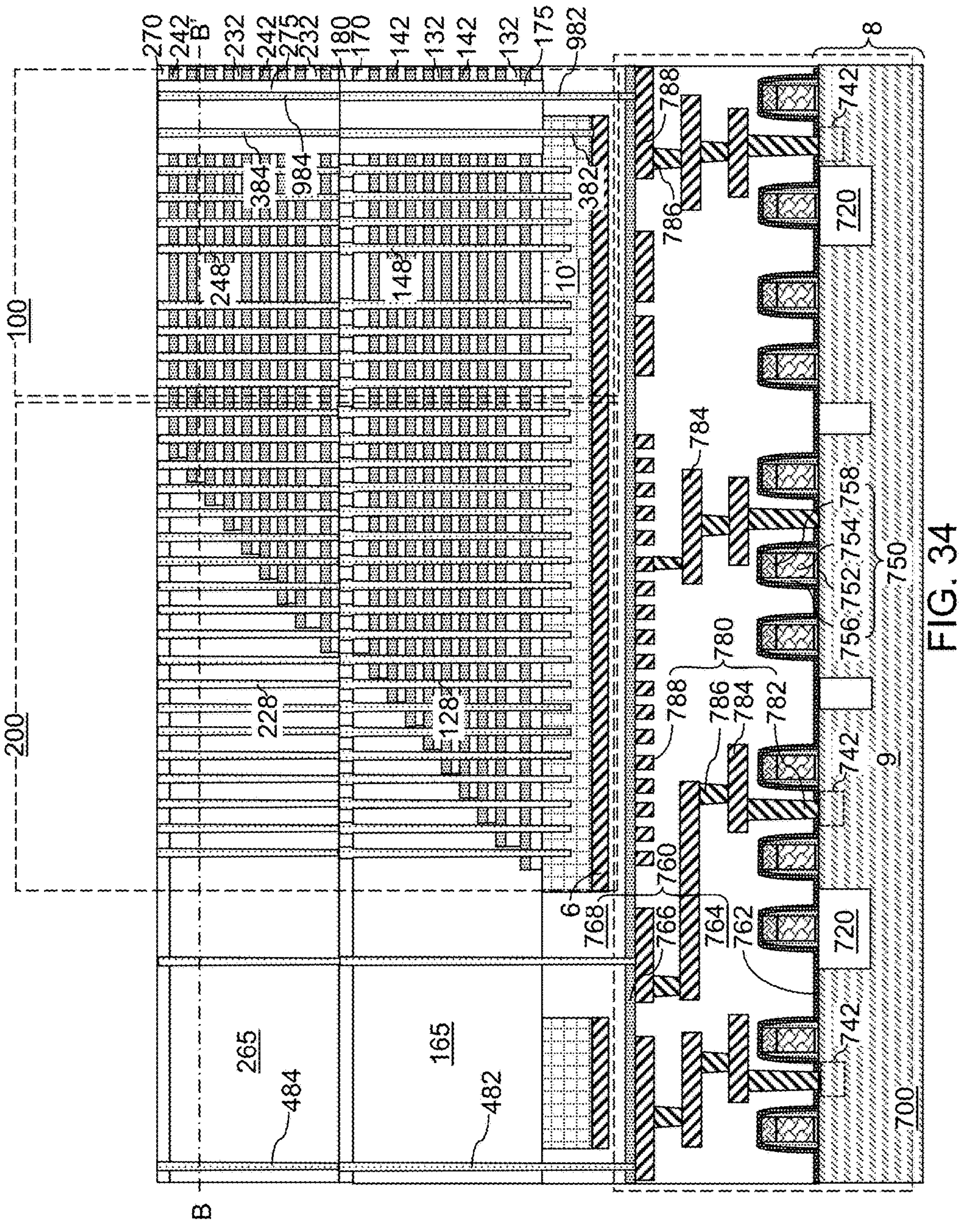
FIG. 34 is a vertical cross-sectional view of the second exemplary structure after formation of sacrificial second-tier memory opening fill portions, sacrificial second-tier support opening fill portions, sacrificial second-tier plate contact opening fill portions, sacrificial second-tier array-region opening fill portions, and sacrificial second-tier peripheral-region opening fill portions according to the second embodiment of the present disclosure.

Referring to FIG. 34, sacrificial second-tier opening fill portions (248, 228, 384, 484, 984) can be formed in the various second-tier openings (249, 229, 383, 483, 983). For example, a sacrificial second-tier fill material is deposited concurrently deposited in each of the second-tier openings (249, 229, 383, 483, 983). The sacrificial second-tier fill material includes a material that can be subsequently removed selective to the materials of the second insulating layers 232 and the second sacrificial material layers 242. For example, the sacrificial second-tier fill material can be any of the materials that can be employed as the sacrificial first-tier fill material. An etch stop liner may be optionally deposited prior to deposition of the sacrificial second-tier fill material. Portions of the deposited sacrificial second-tier fill material can be removed from above the topmost layer of the second-tier alternating stack (232, 242), such as from above the second insulating cap layer 270. For example, the sacrificial second-tier fill material can be recessed to a top surface of the second insulating cap layer 270 employing a planarization process. The planarization process can include a recess etch, chemical mechanical planarization (CMP), or a combination thereof. The top surface of the second insulating cap layer 270 can be employed as an etch stop layer or a planarization stop layer.

Remaining portions of the sacrificial second-tier fill material comprise sacrificial second-tier opening fill portions (248, 228, 384, 484, 984). Specifically, each remaining portion of the sacrificial material in a second-tier memory opening 249 constitutes a sacrificial second-tier memory opening fill portion 248. Each remaining portion of the sacrificial material in a second-tier support opening 229 constitutes a sacrificial second-tier support opening fill portion 228. Each remaining portion of the sacrificial material in a second-tier plate contact opening 383 constitutes a sacrificial second-tier plate contact opening fill portion 384. Each remaining portion of the sacrificial material in a second-tier array-region opening 983 constitutes a sacrificial second-tier array-region opening fill portion 984. Each sacrificial second-tier array-region opening fill portion 984 extends through a respective second dielectric pillar structure 275. Each remaining portion of the sacrificial material in a second-tier peripheral-region opening 483 constitutes a sacrificial second-tier peripheral-region opening fill portion 484. Each sacrificial second-tier peripheral-region opening fill portion 484 extends through the second retro-stepped dielectric material portion 265, and does not contact the second alternating stack (232, 242). The sacrificial second-tier plate contact opening fill portions 384, the sacrificial second-tier array-region opening fill portions 984, and the sacrificial second-tier peripheral-region opening fill portion 484 are collectively referred to as second-tier contact opening fill portions (384, 484, 984).

The various sacrificial second-tier opening fill portions (248, 228, 384, 484, 984) are concurrently formed, i.e., during a same set of processes including the deposition process that deposits the sacrificial second-tier fill material and the planarization process that removes the second-tier deposition process from above the second alternating stack (232, 242) (such as from above the top surface of the second insulating cap layer 270). The top surfaces of the sacrificial second-tier opening fill portions (248, 228, 384, 484, 984) can be coplanar with the top surface of the second insulating cap layer 270. Each of the sacrificial second-tier opening fill portions (248, 228, 384, 484, 984) may, or may not, include cavities therein.

Each vertical stack of a sacrificial first-tier memory opening fill portion 148 and a sacrificial second-tier memory opening fill portion 248 constitutes a sacrificial memory opening fill structure (148, 248). Each vertical stack of a sacrificial first-tier support opening fill portion 128 and a sacrificial second-tier support opening fill portion 228 constitutes a sacrificial support opening fill structure (128, 228). Each vertical stack of a sacrificial first-tier plate contact opening fill portion 382 and a sacrificial second-tier plate contact opening fill portion 384 constitutes a sacrificial plate contact opening fill structure (382, 384). Each vertical stack of a sacrificial first-tier array-region opening fill portion 982 and a sacrificial second-tier array-region opening fill portion 984 constitutes a sacrificial array-region opening fill structure (982, 984). Each vertical stack of a sacrificial first-tier peripheral-region opening fill portion 482 and a sacrificial second-tier peripheral-region opening fill portion 484 constitutes a sacrificial peripheral-region opening fill structure (482, 484). Each of the sacrificial memory opening fill structures (148, 248), the sacrificial support opening fill structures (128, 228), the sacrificial plate contact opening fill structures (382, 384), the sacrificial array-region opening fill structures (982, 984), and the sacrificial peripheral-region opening fill structures (482, 484) vertically extend from the top surface of the second-tier structure (232, 242, 270, 265, 275) below a bottom surface of the first-tier structure (132, 142, 170, 165, 175). The sacrificial memory opening fill structures (148, 248) and the sacrificial support opening fill structures (128, 228) extend into the in-process source-level material layers 10', the sacrificial plate contact opening fill structures (382, 384) contacts the conductive plate layer 6, and the sacrificial array-region opening fill structures (982, 984) and the sacrificial peripheral-region opening fill structures (482, 484) extend at least to the silicon nitride layer 766 and may extend to top surfaces of the lower-level metal interconnect structures 780. The sacrificial plate contact opening fill structures (382, 384), the sacrificial array-region opening fill structures (582, 584) and the sacrificial peripheral-region opening fill structures (482, 484) are collectively referred to as contact opening fill structures {(382, 384), (982, 984), (482, 484)}.

Figure 35:
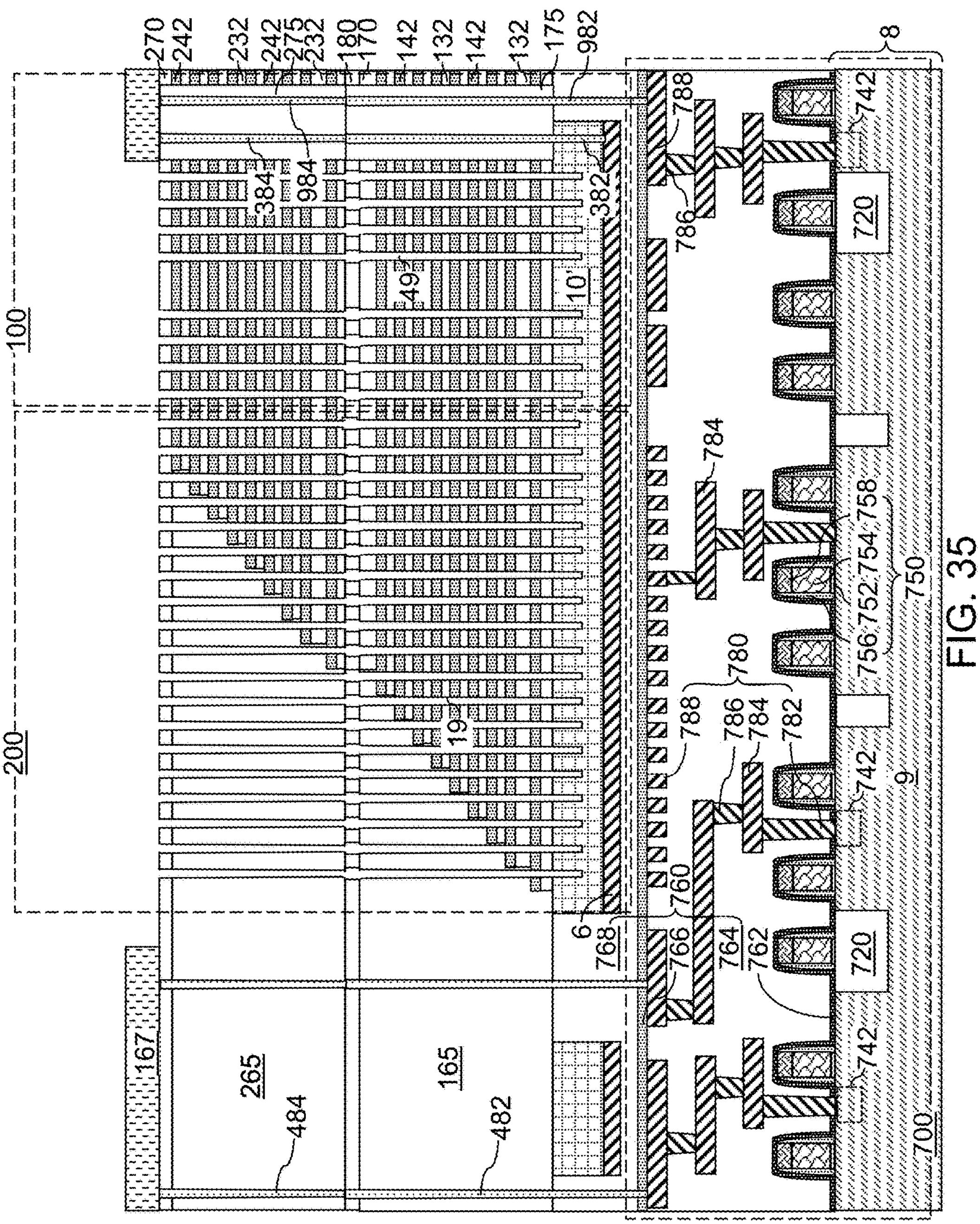
FIG. 35 is a vertical cross-sectional view of the second exemplary structure after formation of a first masking layer that covers the sacrificial second-tier plate contact opening fill portions, the sacrificial second-tier array-region opening fill portions, and the sacrificial second-tier peripheral-region opening fill portions and formation of memory openings and support openings according to the second embodiment of the present disclosure.
Figure 36B:
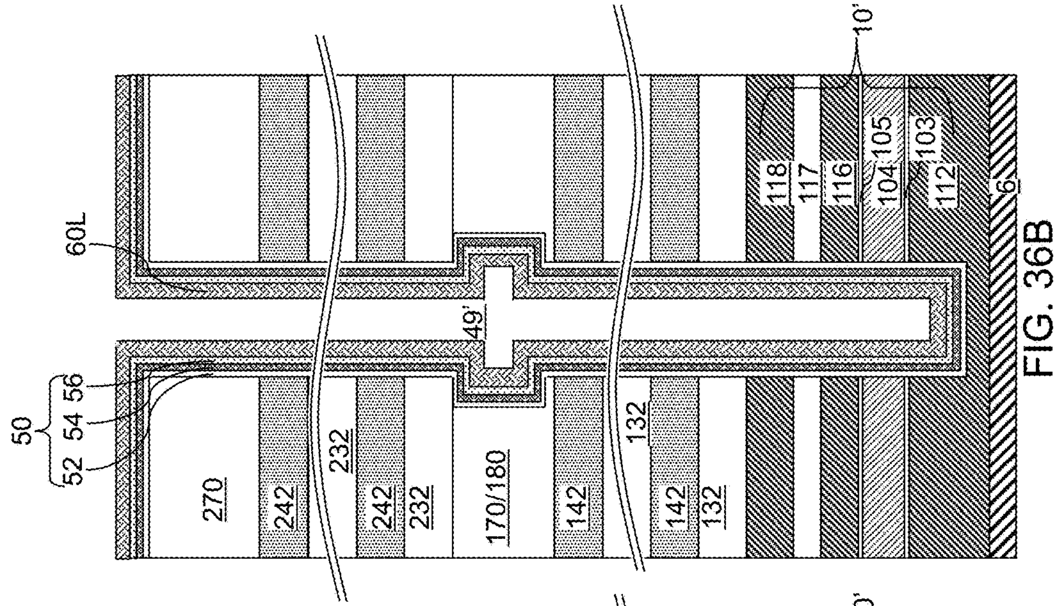
FIGS. 36A-36D are sequential vertical cross-sectional views of a memory opening during formation of a memory opening fill structure according to the second embodiment of the present disclosure.
Figure 36A:
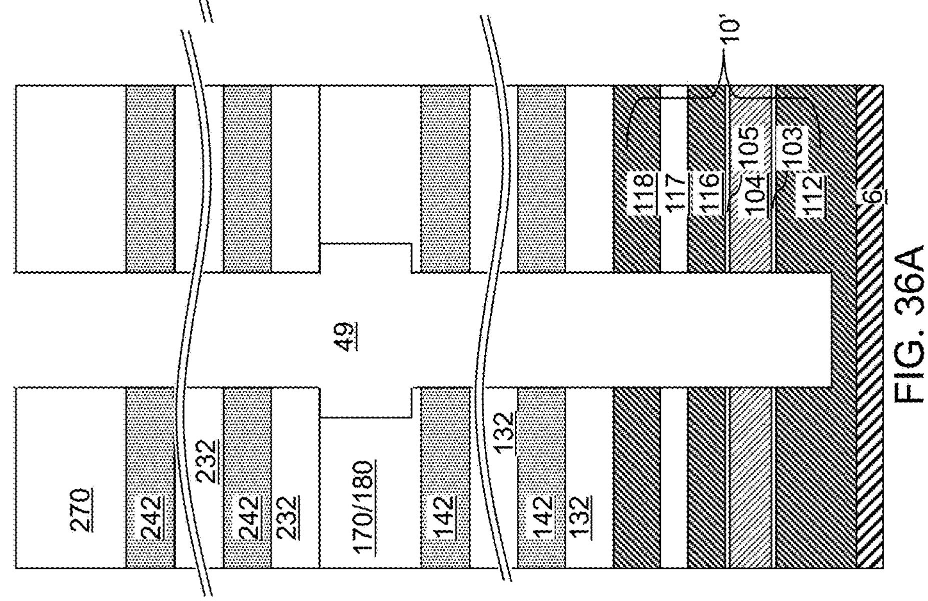
Figure 36D:
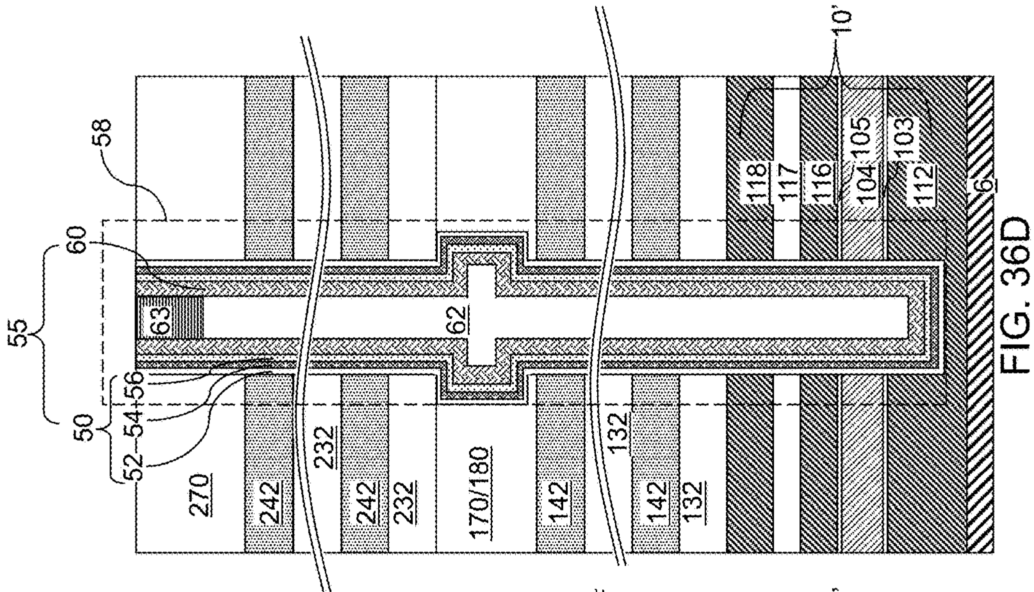
Figure 36C:
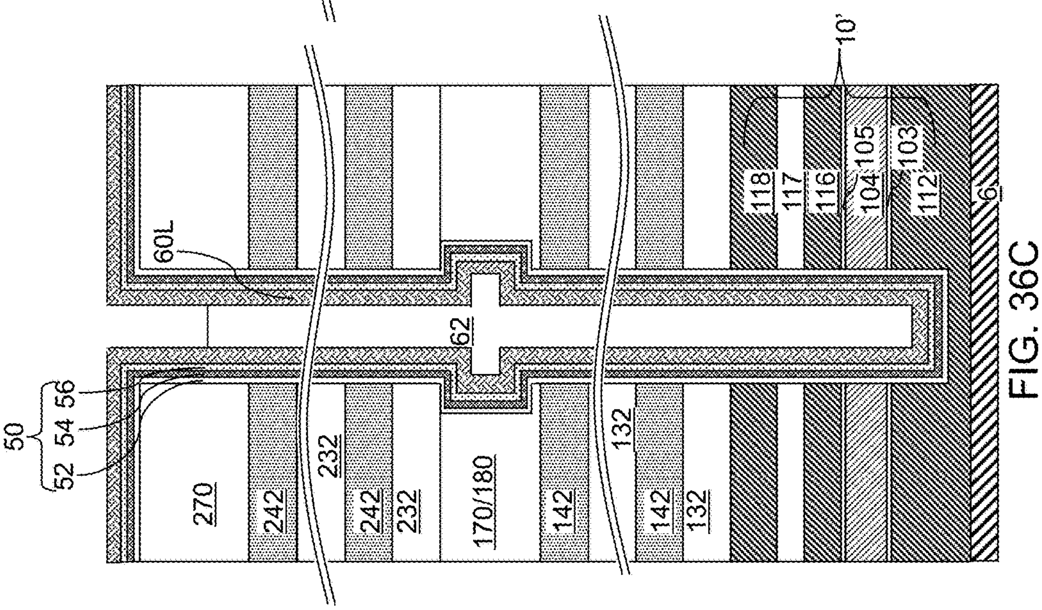

Referring to FIG. 35, a first masking layer 167 can be applied and patterned to cover the contact opening fill structures {(382, 384), (982, 984), (482, 484)} while not covering the sacrificial memory opening fill structures (148, 248) in the memory array region 100 and the sacrificial support opening fill structures (128, 228) in the staircase region 200. The first masking layer 167 can be a photoresist layer or a patterning film that is lithographically patterned employing a patterned photoresist layer (not shown).

The sacrificial second-tier fill material and the sacrificial first-tier fill material can be removed from underneath the opening(s) in the first masking layer 167 employing an etch process that etches the sacrificial second-tier fill material and the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each volume from which a sacrificial memory opening fill structure (148, 248) is removed. As support opening 19, which is also referred to as an inter-tier support opening 19, is formed in each volume from which a sacrificial support opening fill structure (128, 228) is removed. The first mask layer 167 can be subsequently removed, for example, by ashing.

Subsequently, the processing steps of FIGS. 11A-11D can be performed to form a memory opening fill structure 58 within each memory opening 49 and to form a support pillar structure 20 within each support opening 19. FIGS. 36A-36D provide sequential cross-sectional views of a memory opening 49 during formation of a memory opening fill structure 58. The same structural changes occur in each memory openings 49 to provide a respective memory opening fill structure 58 therein. Each memory opening fill structure 58 includes a respective memory stack structure 55, which includes a memory film 50 and a vertical semiconductor channel 60 laterally surrounded by the memory film 50. However, in this embodiment, the respective drain regions 63 shown in FIG. 11D function as doped contact regions 63 for a subsequent overlying channel portion of a drain-select-level transistor. Further, the same structural changes occur in each support opening 19 to provide a respective support pillar structure 20 therein.

Figure 37:
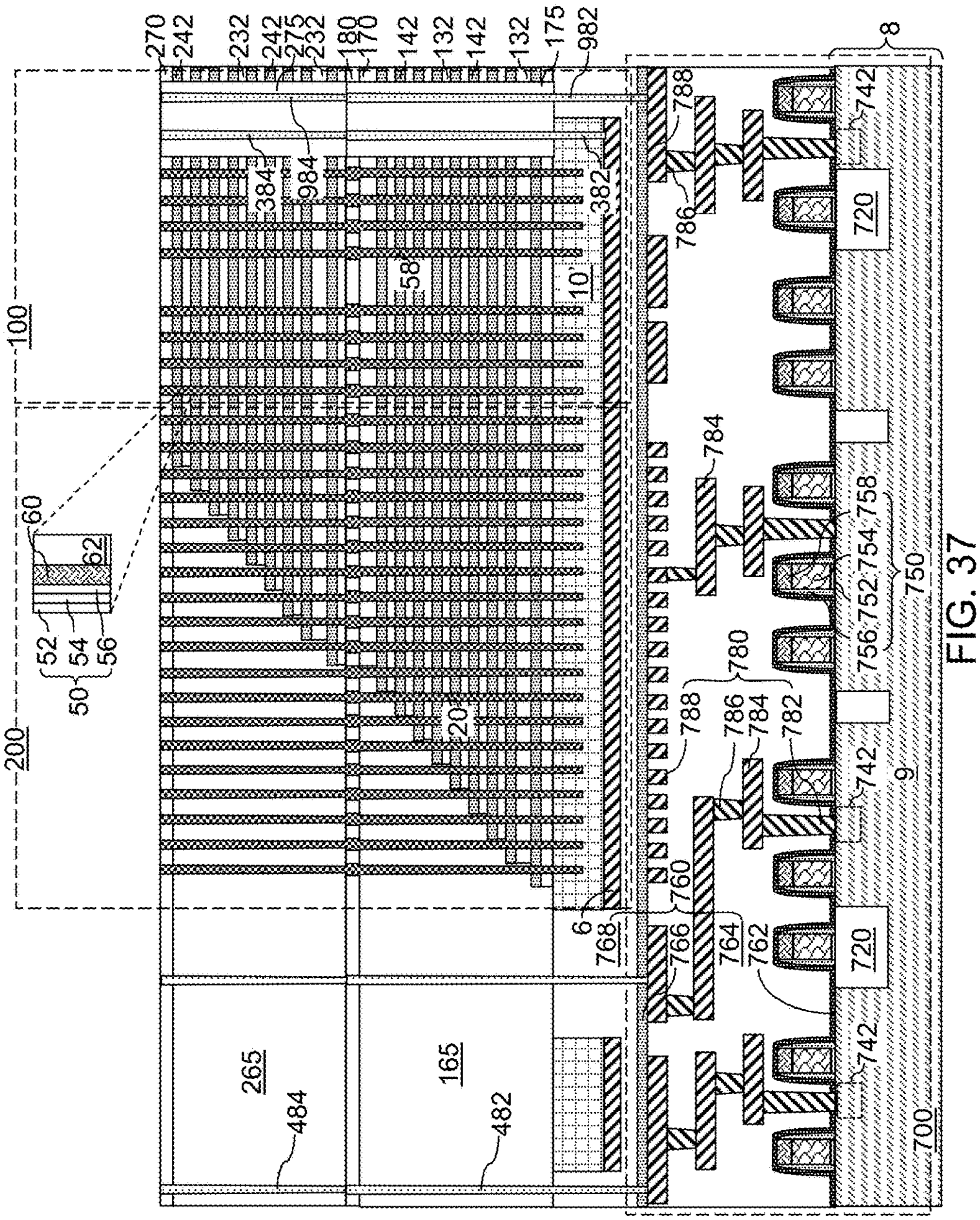
FIG. 37 is a vertical cross-sectional view of the second exemplary structure after formation of memory opening fill structures and support pillar structures according to the second embodiment of the present disclosure.

Referring to FIG. 37, the second exemplary structure is illustrated after formation of the memory opening fill structures 58 and the support pillar structures 20.

Figure 38:
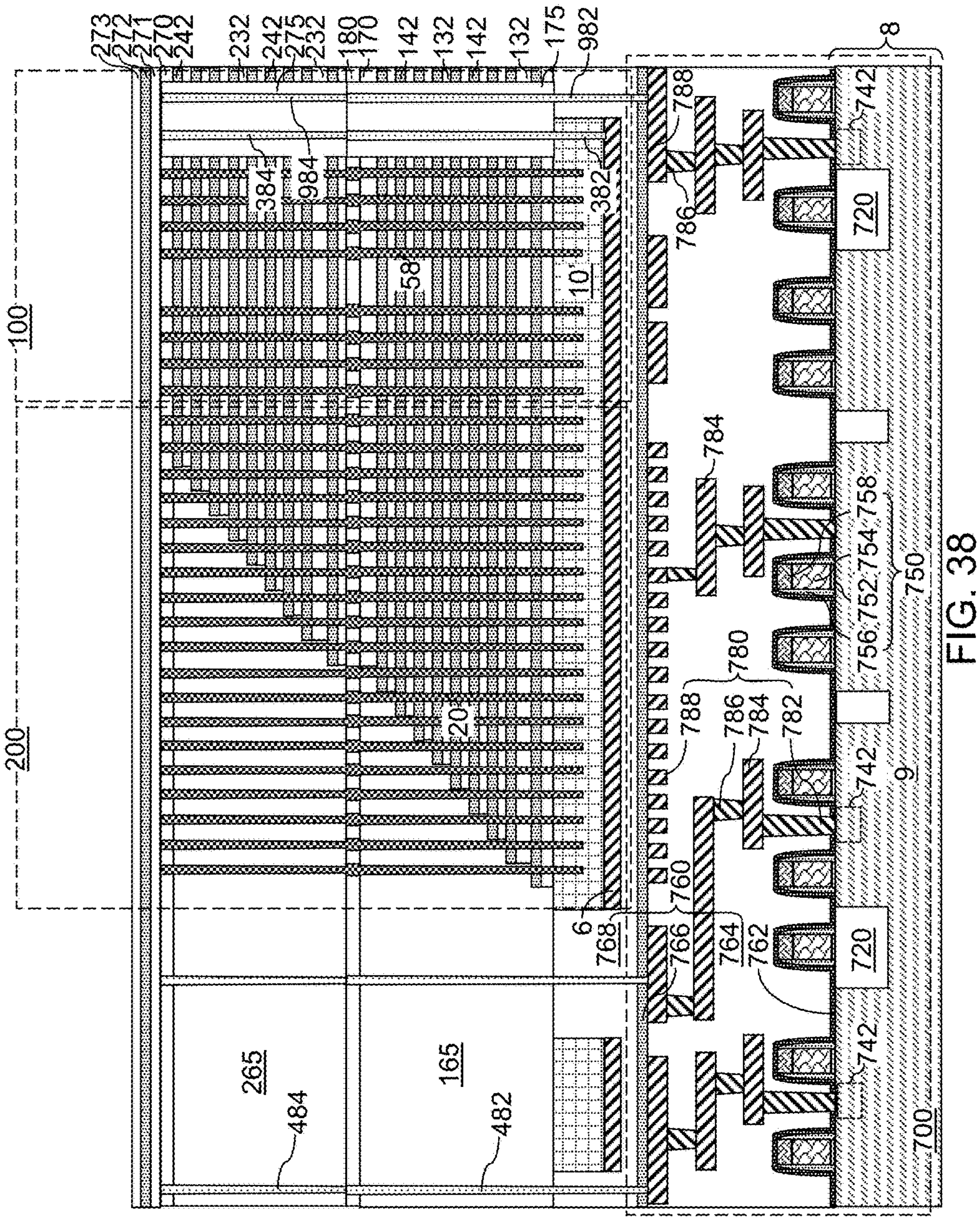
FIG. 38 is a vertical cross-sectional view of the second exemplary structure after formation of drain-select-level layers according to the second embodiment of the present disclosure.
Figure 39A:
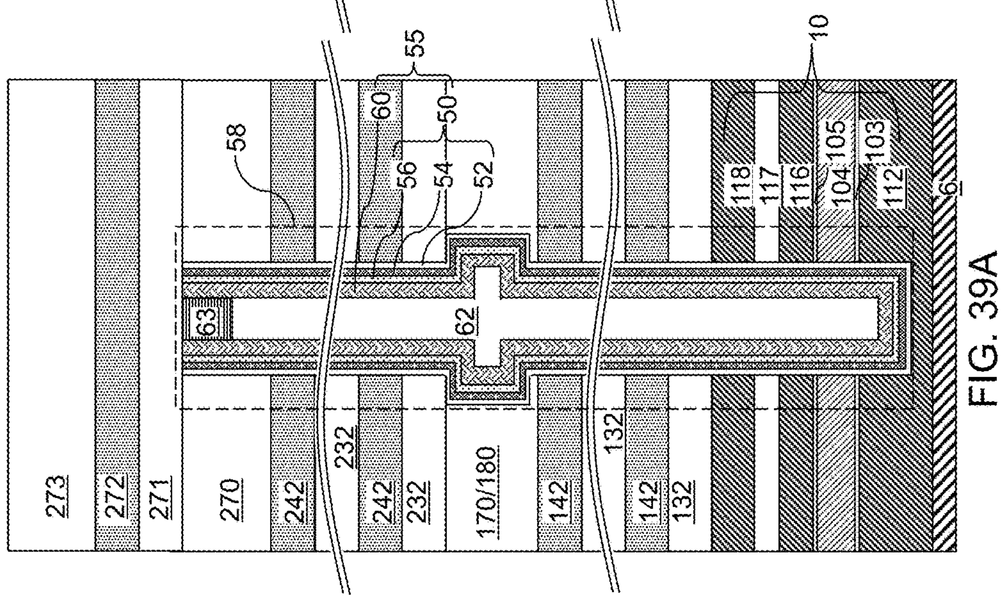
FIGS. 39A-39E are vertical cross-sectional views of a region of the second exemplary structure during formation of drain-select-level transistor components according to the second embodiment of the present disclosure.

Referring to FIGS. 38 and 39A, drain-select-level layers (271, 272, 273) can be formed over the second-tier structure (232, 242, 265, 270, 275). The drain-select-level layers (271, 272, 273) include a first drain-select-level insulating layer 271, a drain-select-level sacrificial layer 272, and a second drain-select-level insulating layer 273. The first drain-select-level insulating layer 271 and the second drain-select-level insulating layer 273 can have the same insulating material as the second insulating layers 232, and the drain-select-level sacrificial layer 272 can include the same material as the second sacrificial material layers 242. The thicknesses of each drain-select-level layer (271, 272, 273) may be in a range from 15 nm to 60 nm, although lesser and greater thicknesses can also be employed.

Figure 39B:
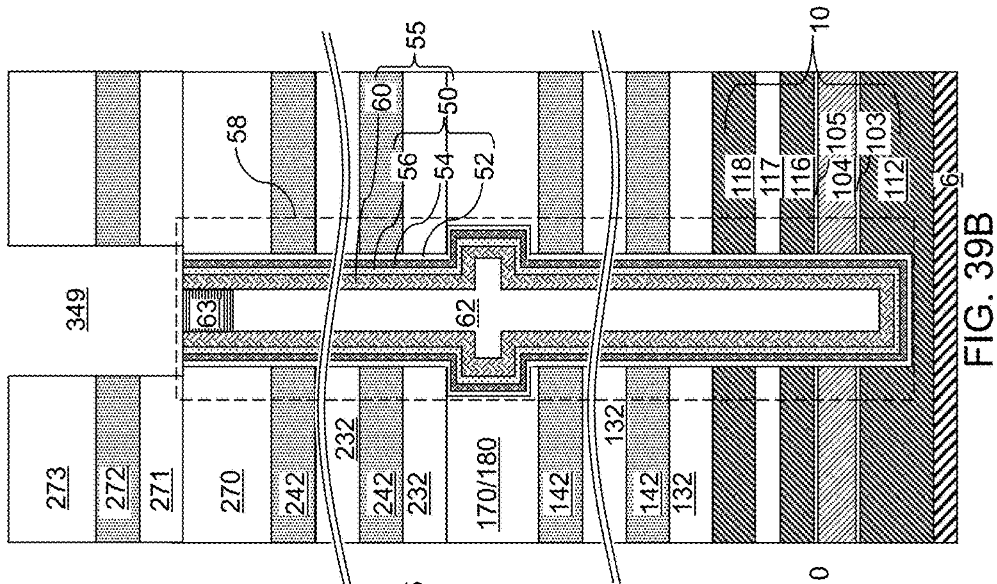

Referring to FIG. 39B, drain-select-level memory openings 349 are formed over each of the memory opening fill structures 58, for example, by applying and patterning a photoresist layer (not shown) over the drain-select-level layers (271, 272, 273) and by transferring the pattern in the photoresist layer through the drain-select-level layer (271, 272, 273) employing an anisotropic etch process. A top surface of a memory opening fill structure 58 is physically exposed at the bottom of each drain-select-level memory opening 349. A bottom periphery of each drain-select-level memory opening 349 may be partially or fully located within, at, and/or outside an outer periphery of the top surface of an underlying memory opening fill structure 58.

Figures 39C, 39D:
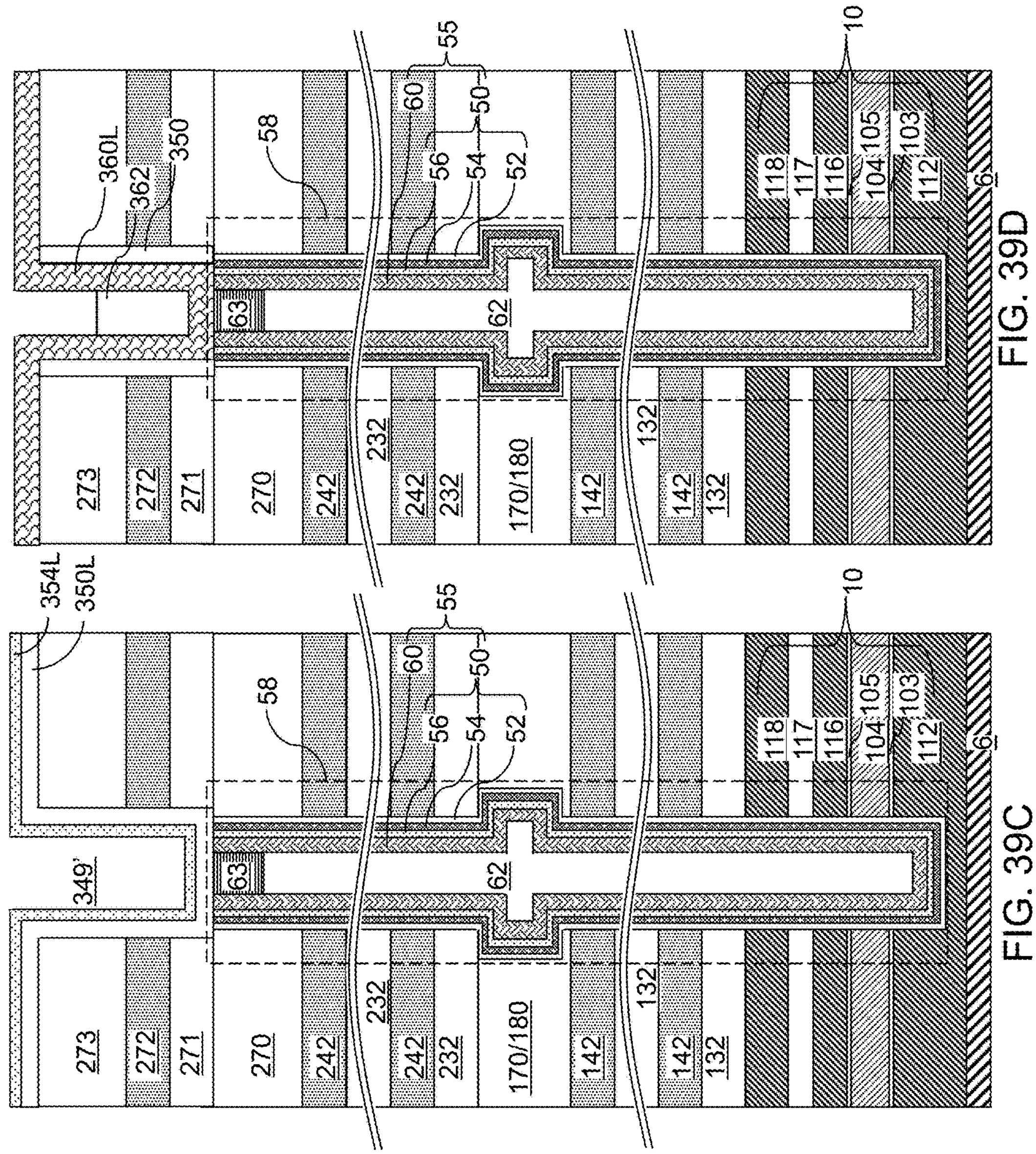

Referring to FIG. 39C, a continuous gate dielectric layer 350L and an optional continuous cover material layer 354L can be deposited in the drain-select-level memory openings 349. The continuous gate dielectric layer 350L includes a gate dielectric material such as silicon oxide. The memory films 50 can include at least one different dielectric material than the dielectric material of the continuous gate dielectric layer 350L. In one embodiment, the continuous gate dielectric layer 350L can include a silicon oxide layer having a thickness in a range from 1.5 nm to 10 nm, although lesser and greater thicknesses can also be employed. The continuous cover material layer 354L can include a sacrificial cover material such as amorphous silicon or a doped semiconductor material having a doping of the same conductivity type as the vertical semiconductor channels 60 and is subsequently incorporated into a drain-select-level channel portion. A drain-select-level cavity 349' may be present within each drain-select-level memory opening 349 after formation of the continuous gate dielectric layer 350L and the continuous cover material layer 354L.

Referring to FIG. 39D, an anisotropic etch process is performed to remove horizontal portions of the continuous gate dielectric layer 350L at each bottom region of the drain-select-level memory openings 349. Horizontal portions of the continuous cover material layer 354L can be etched through first, and horizontal portions of the continuous gate dielectric layer 350L can be subsequently etched by the anisotropic etch process. Each remaining cylindrical portion of the continuous gate dielectric layer 350L constitutes a drain-select-level gate dielectric 350.

A drain-select-level semiconductor channel material layer 360L can be subsequently deposited by a conformal deposition process. The drain-select-level semiconductor channel material layer 360L can have a doping of the same conductivity type as the vertical semiconductor channels 60. The drain-select-level semiconductor channel material layer 360L contacts the underlying doped contact region 63. If the continuous cover material layer 354L includes a sacrificial material such as amorphous carbon, the remaining portions of the continuous cover material layer 354L can be removed prior to deposition of the drain-select-level semiconductor channel material layer 360L. If the continuous cover material layer 354L include a doped semiconductor material, the remaining portions of the continuous cover material layer 354L may be incorporated into the drain-select-level semiconductor channel material layer 360L. A dielectric core material such as silicon oxide can be deposited in remaining volumes of the drain-select-level memory openings 349, and can be subsequently recessed to form a drain-select-level dielectric core 362.

Figure 39E:
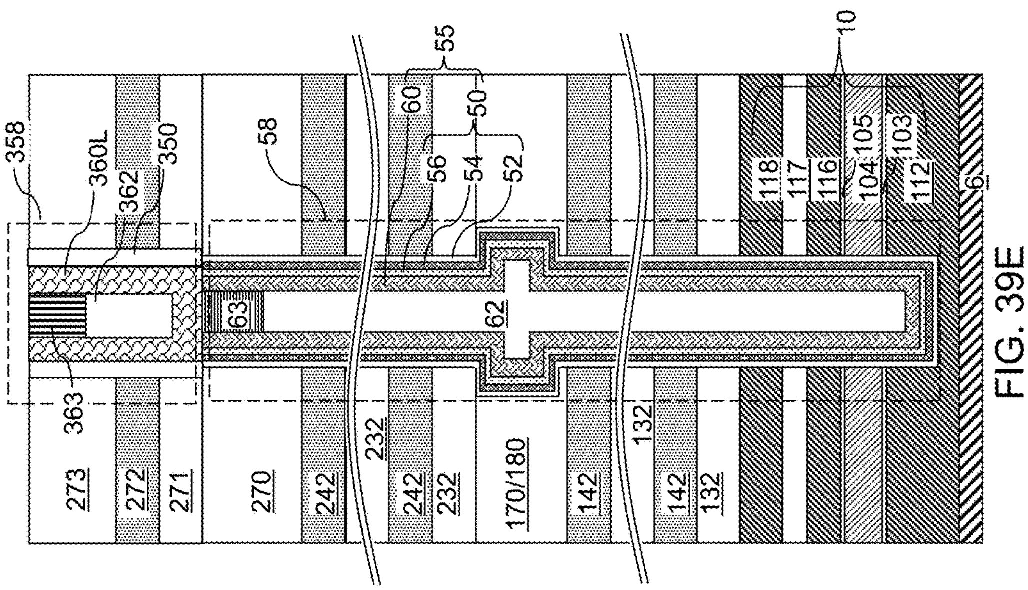
Figure 40:
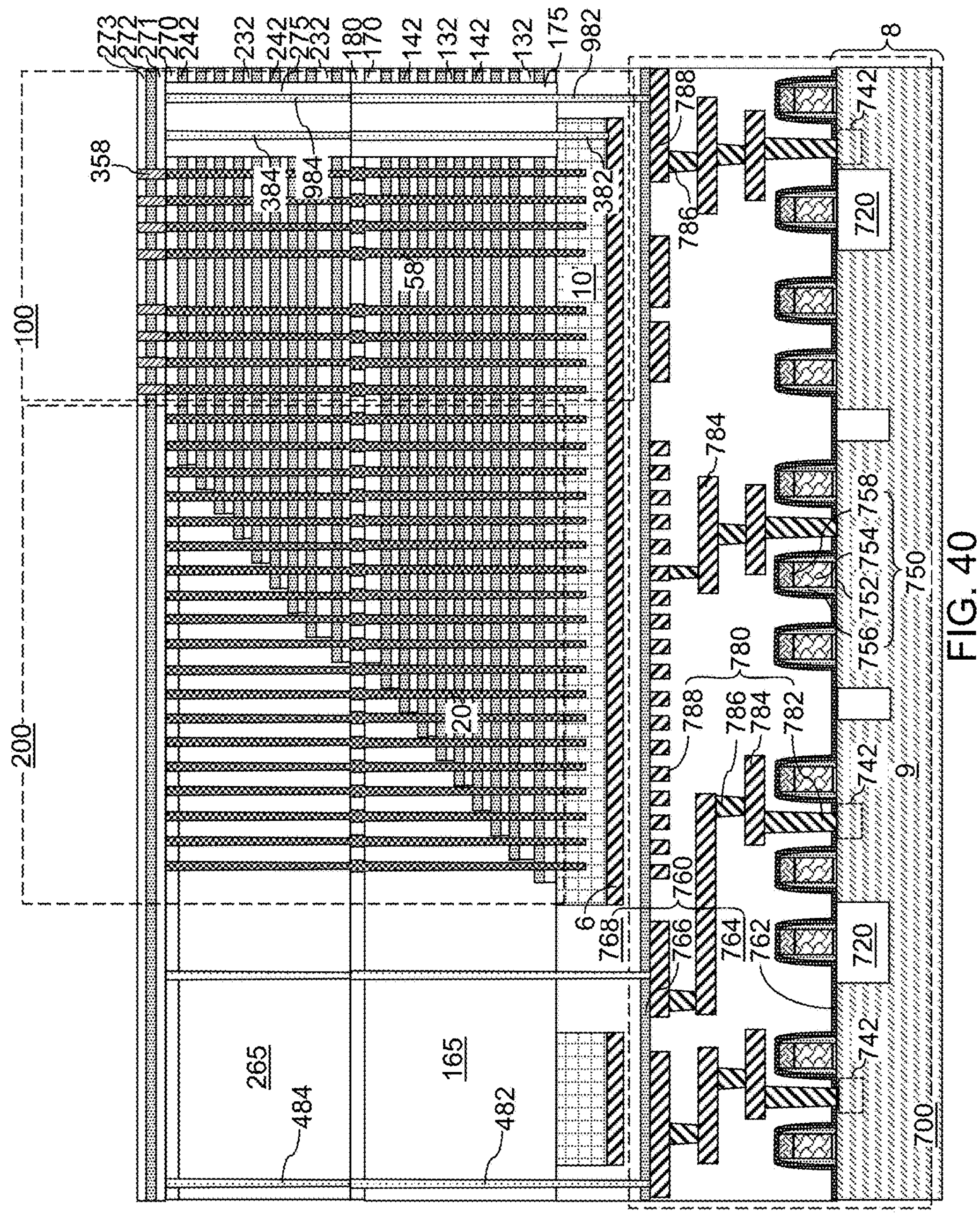
FIG. 40 is a vertical cross-sectional view of the second exemplary structure after formation of drain-select-level transistor components according to the second embodiment of the present disclosure.

Referring to FIGS. 39E and 40, a doped semiconductor material having a doping of the second conductivity type can be deposited over the drain-select-level dielectric cores 362. The drain-select-level semiconductor channel material layer 360L and the doped semiconductor material having a doping of the second conductivity type can be planarized by a recess etch process and/or by chemical mechanical planarization (CMP). Each remaining portion of the drain-select-level semiconductor channel material layer 360L constitutes a drain-select-level semiconductor channel 360. Each remaining portion of the doped semiconductor material having the doping of the second conductivity type constitutes a drain-select-level top active region 363. In this case, the drain-select-level top active regions 363 can function as drain regions. Each contiguous set of a drain-select-level gate dielectric 350, a drain-select-level semiconductor channel 360, a drain-select-level dielectric core 362, and a drain-select-level top active region 363 constitutes components of a respective drain-select-level transistor, i.e., drain-select-level transistor components of a respective drain-select-level transistor.

Figure 41A:
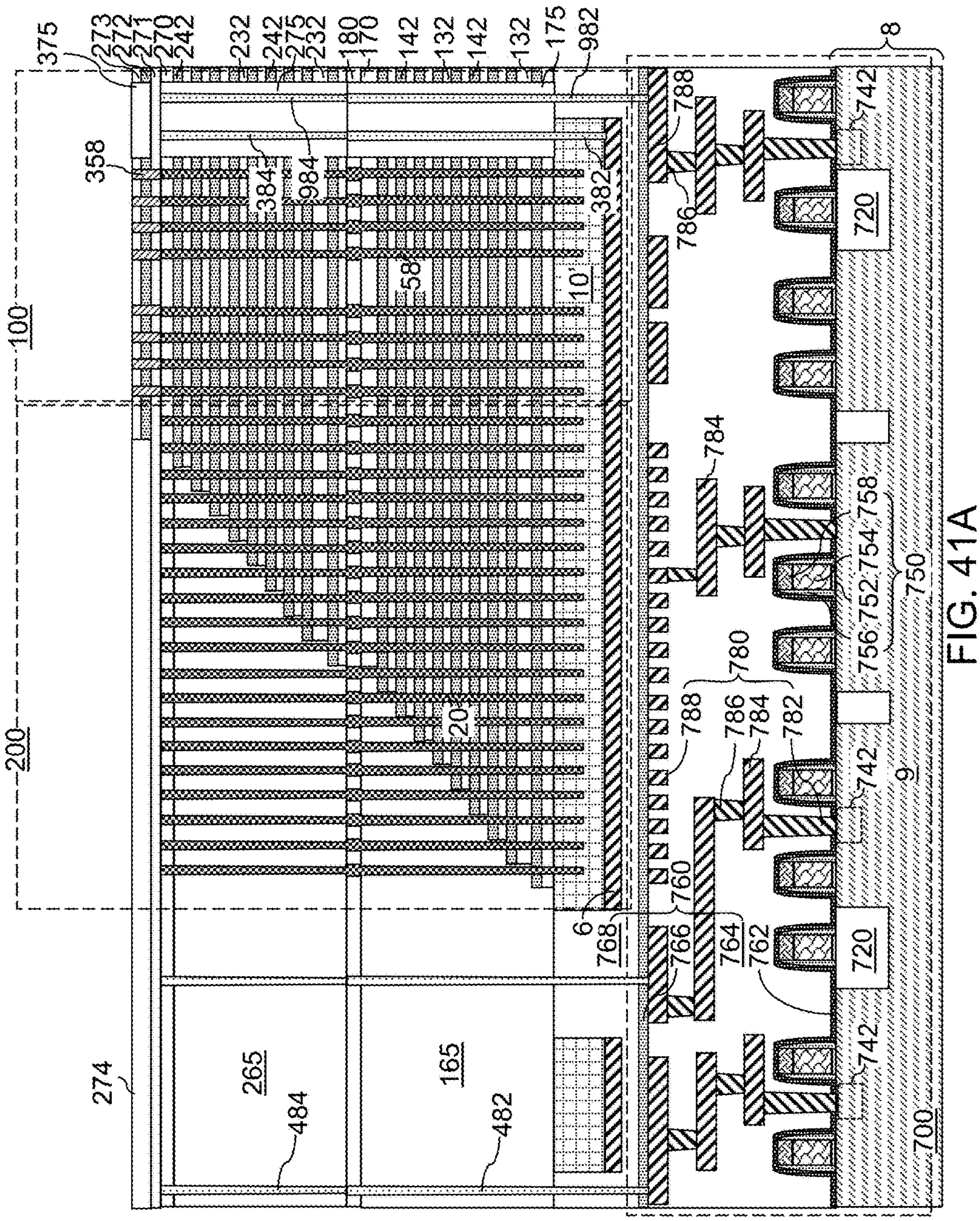
FIG. 41A is a vertical cross-sectional view of the second exemplary structure after formation of drain-select-level isolation structures according to the second embodiment of the present disclosure.
Figure 41B:
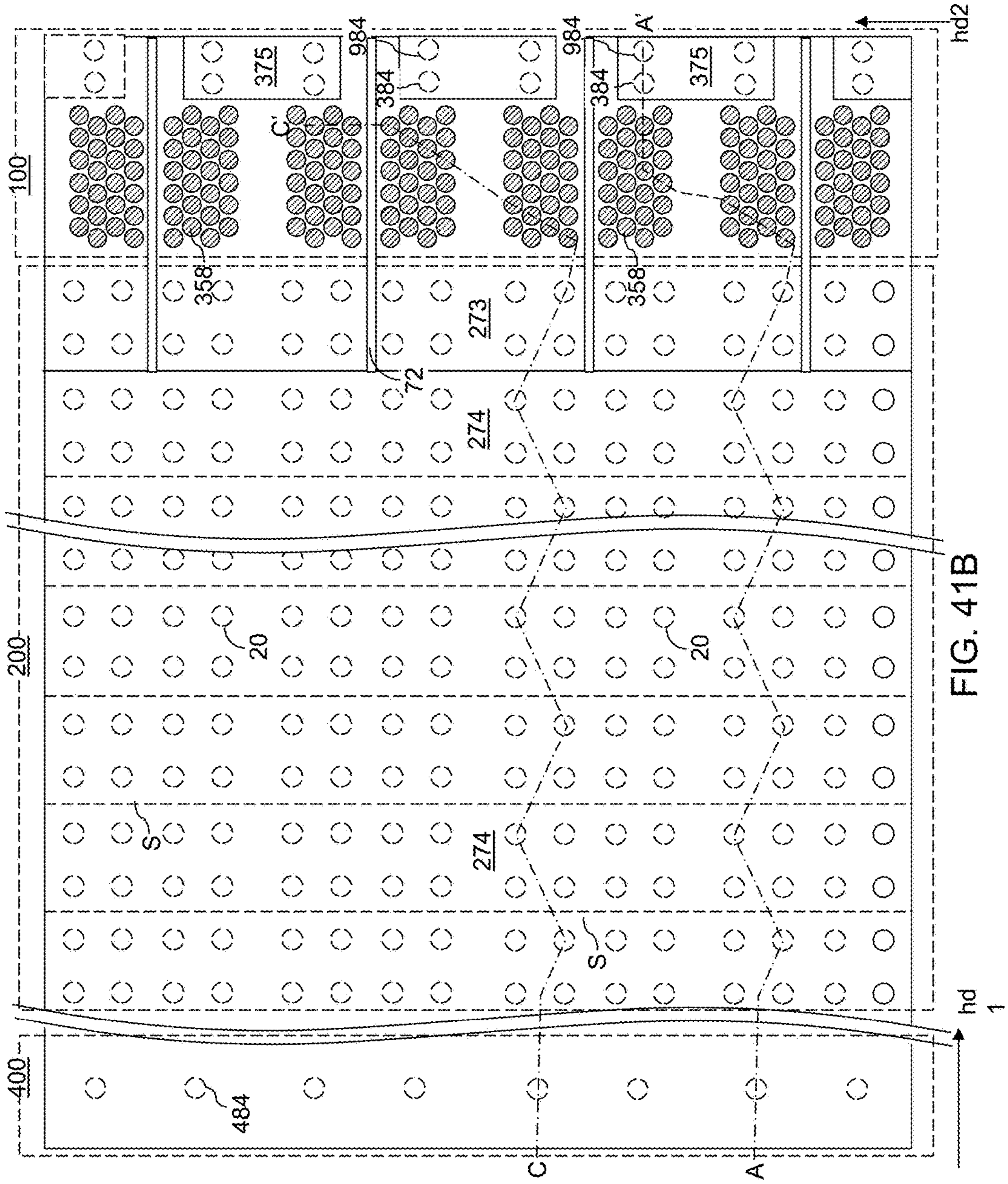
FIG. 41B is a horizontal cross-sectional view of the second exemplary structure along the horizontal plane B-B' in FIG. 41A. The zig-zag vertical plane A-A' corresponds to the plane of the vertical cross-sectional view of FIG. 41A.
Figure 41C:
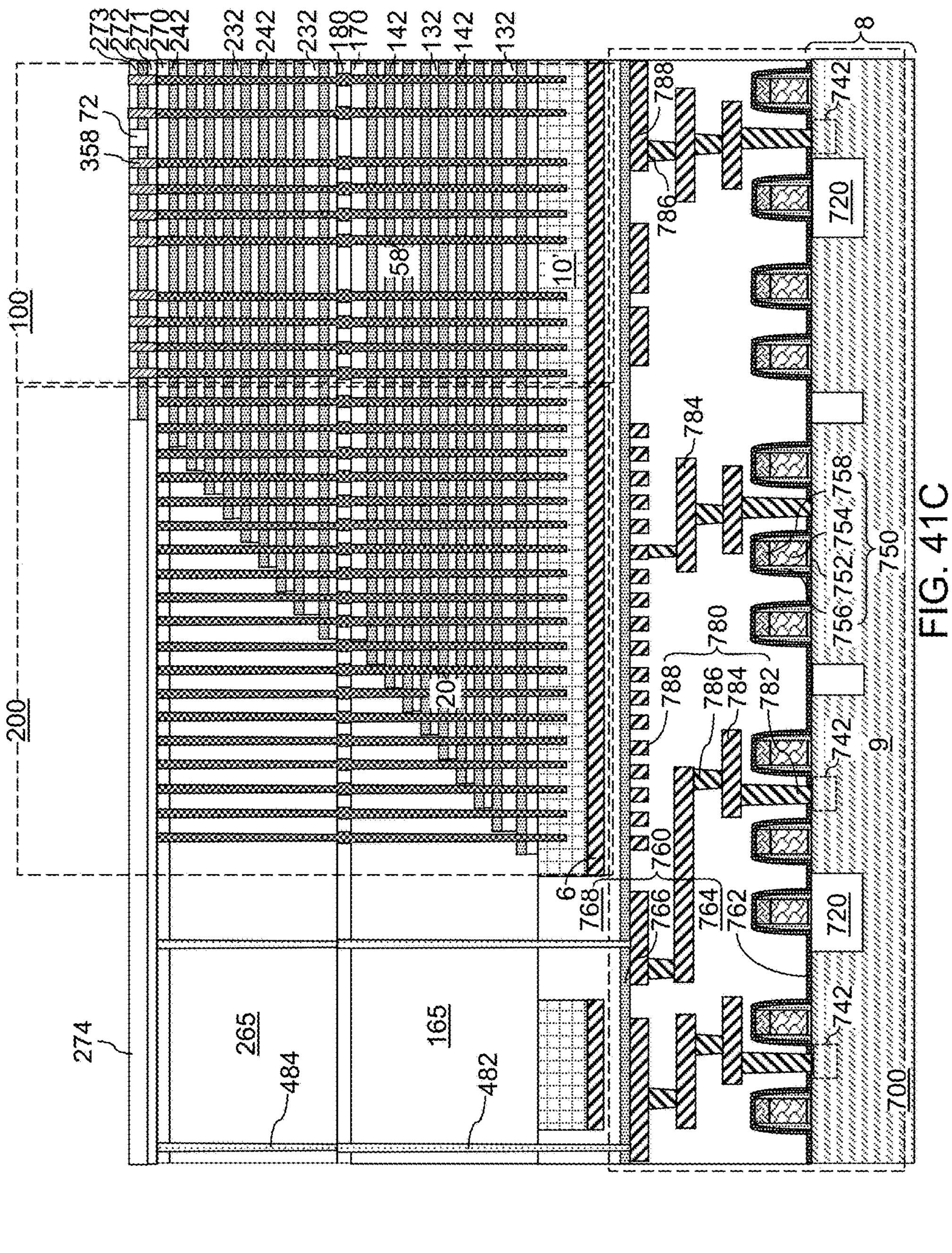
FIG. 41C is a vertical cross-sectional view of the second exemplary structure along the zig-zag vertical plane C-C' of FIG. 41B.

Referring to FIGS. 41A-41C, various trenches are formed through the second drain-select-level insulating layer 273 and the drain-select-level sacrificial layer 272, for example, by application and patterning of a photoresist layer and transfer of the pattern in to the photoresist layer through the second drain-select-level insulating layer 273 and the drain-select-level sacrificial layer 272. A dielectric fill material such as silicon oxide can be deposited in the various trenches and planarized (for example, by chemical mechanical planarization) to provide various dielectric material portions (72, 375, 274), which can include drain-select-level isolation structures 72 that divide the drain-select-level layers (271, 272, 273) along the first horizontal direction hd1, third dielectric pillar structures 375 that overlie the second dielectric pillars 275, and a field dielectric structure 274 that fills a region outside areas in which drain-select-level gate electrodes are to be subsequently formed. The first-tier structure (132, 142, 170, 165, 175), the inter-tier dielectric layer 180, the second-tier structure (232, 242, 270, 265, 275), and the drain-select-level structures (271, 272, 273, 72, 375, 274) collectively constitute a memory level assembly.

Figure 42:
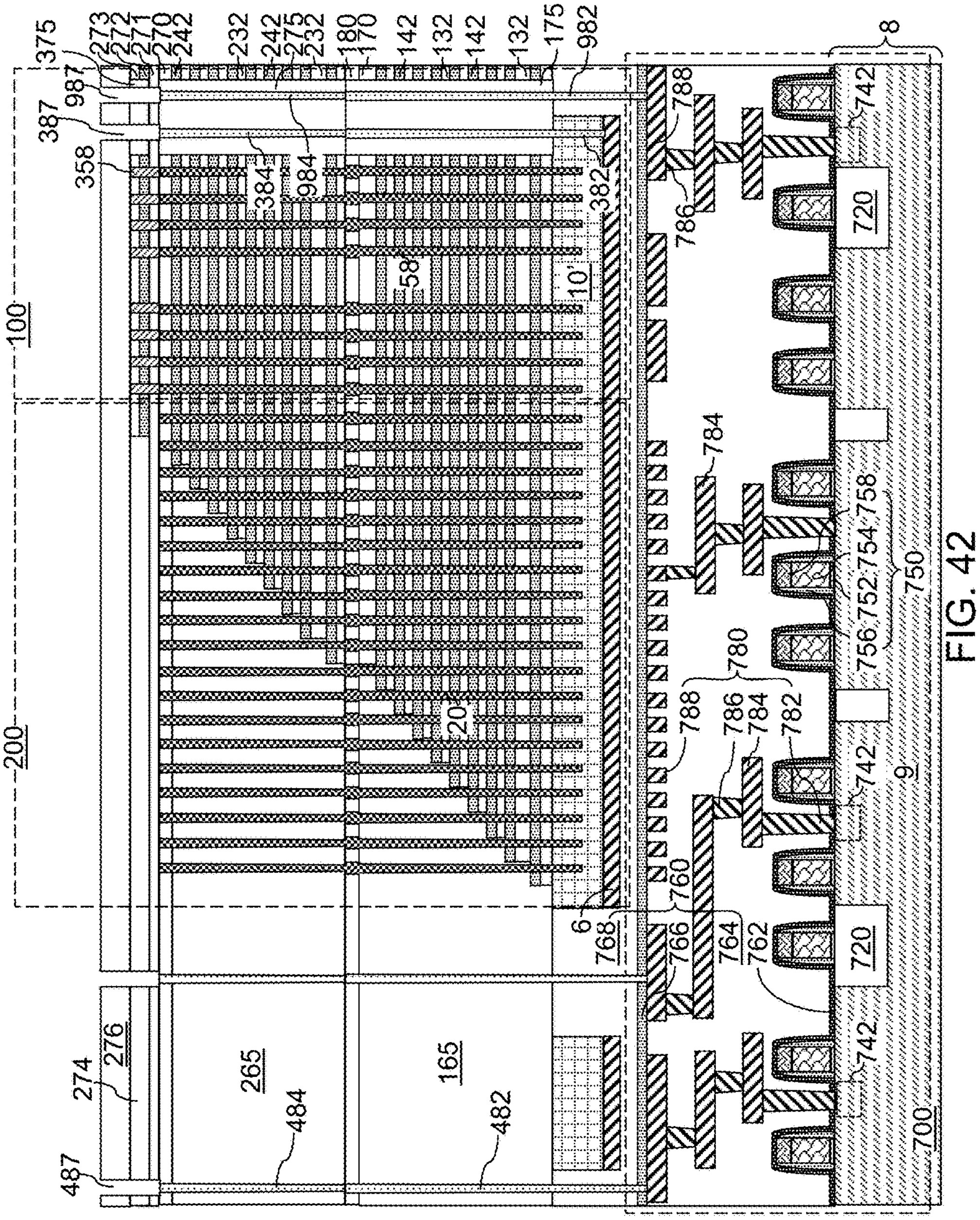
FIG. 42 is a vertical cross-sectional view of the second exemplary structure after formation of contact-level plate contact openings, contact-level array-region openings, and contact-level peripheral-region openings according to the second embodiment of the present disclosure.

Referring to FIG. 42, a contact level dielectric layer 276 can be formed over the memory-level assembly. The contact level dielectric layer 276 includes a dielectric material such as silicon oxide, and has a thickness in a range from 100 nm to 600 nm, although lesser and greater thicknesses can also be employed.

Various contact-level openings (387, 487, 987) can be formed through the contact level dielectric layer 276 and the drain-select-level layers (271, 272, 273) onto top surfaces of the second-tier contact opening fill portions (384, 484, 984). The contact-level openings (387, 487, 987) can include contact-level plate contact openings 387 that are formed on sacrificial second-tier plate contact opening fill structures 384, contact-level array-region openings 987 that are formed on sacrificial second-tier array-region opening fill structures 984, and contact-level peripheral-region openings 487 that are formed on sacrificial second-tier peripheral-region opening fill structures 484.

Figure 43:
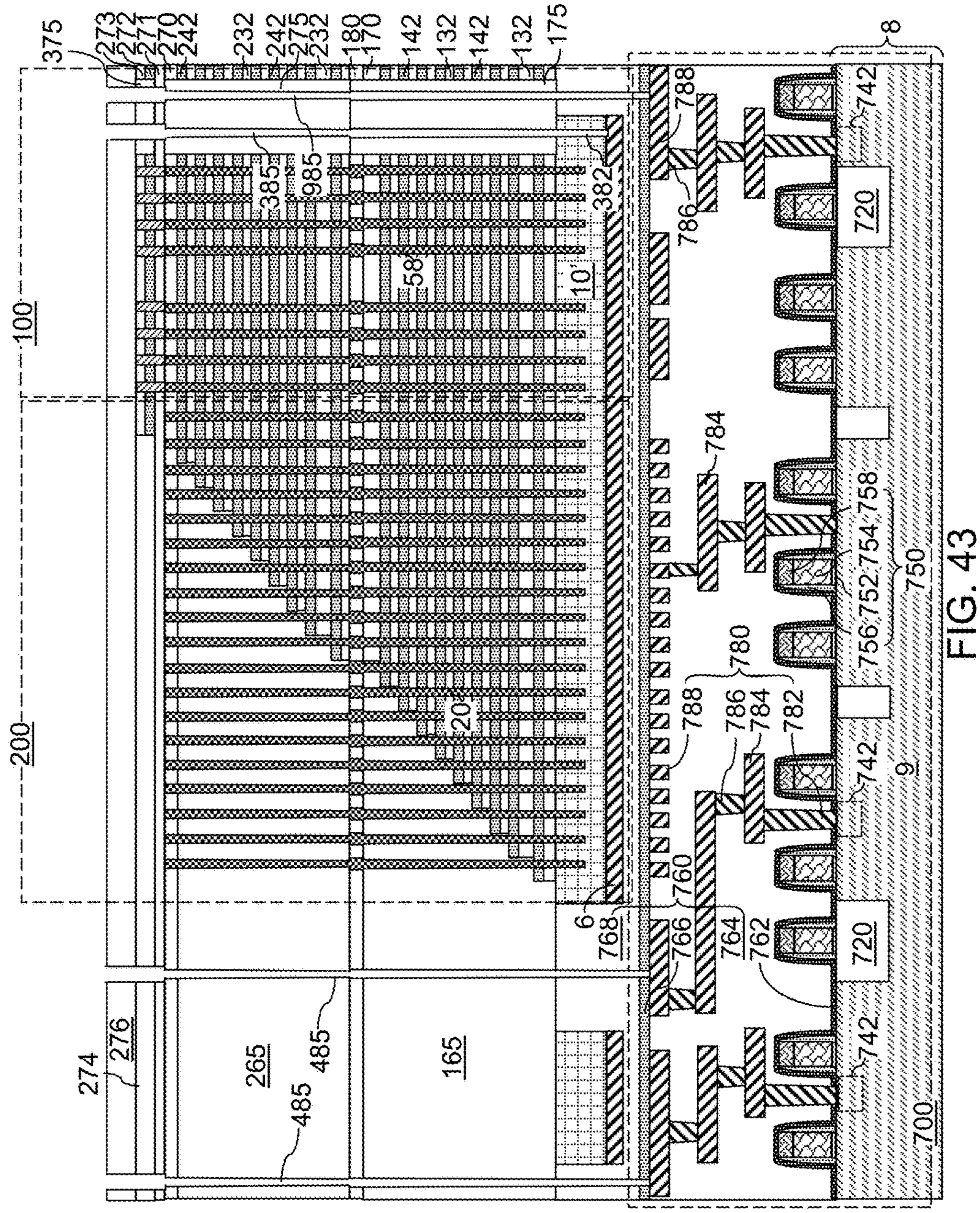
FIG. 43 is a vertical cross-sectional view of the second exemplary structure after formation of plate contact openings, array-region openings, and peripheral-region openings by removal of the sacrificial plate contact opening fill structures, the sacrificial array-region openings, and the sacrificial staircase-region opening fill structures according to the second embodiment of the present disclosure.
Figure 44A:
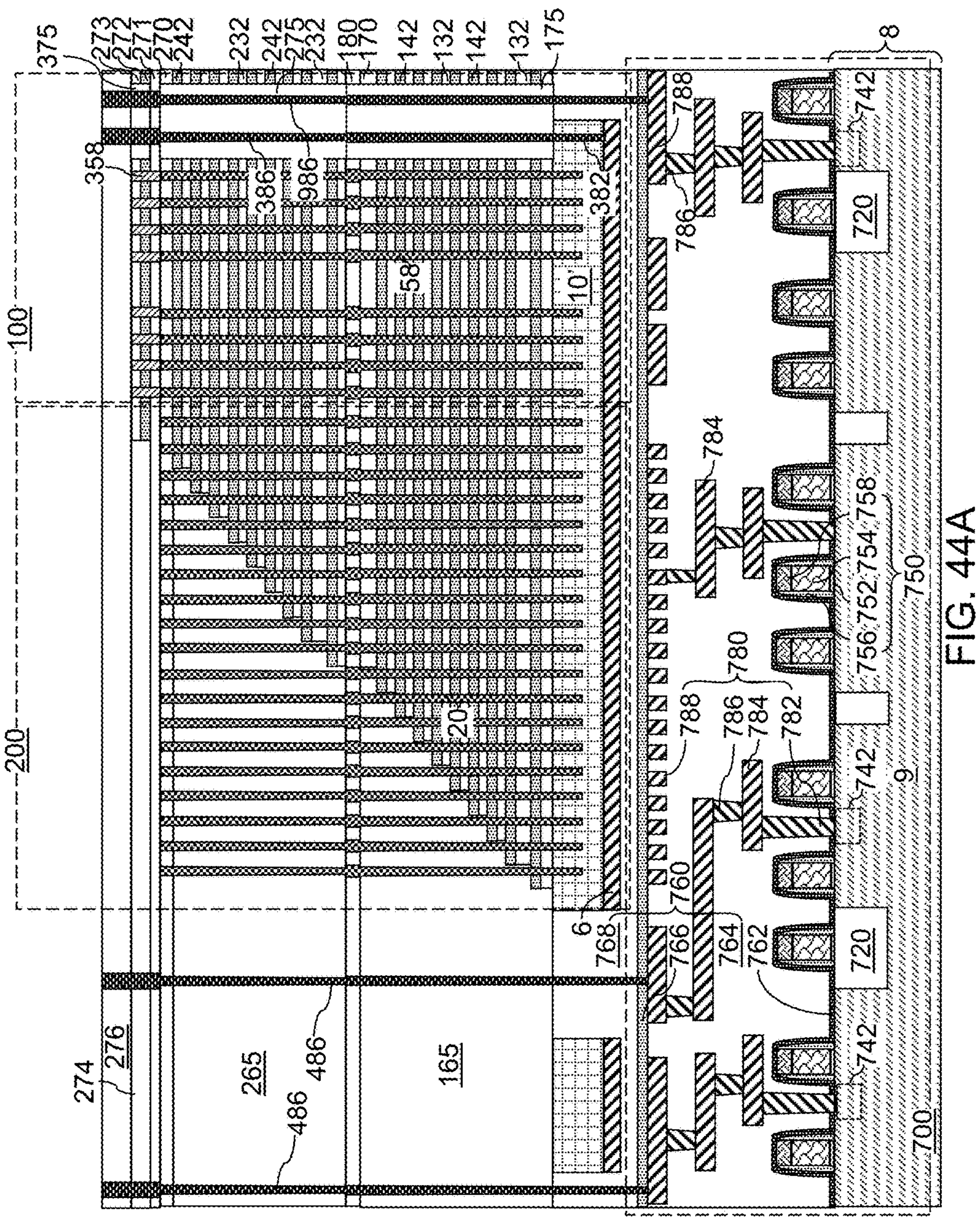
FIG. 44A is a vertical cross-sectional view of the second exemplary structure after formation of various contact via structures according to the second embodiment of the present disclosure.
Figure 44B:
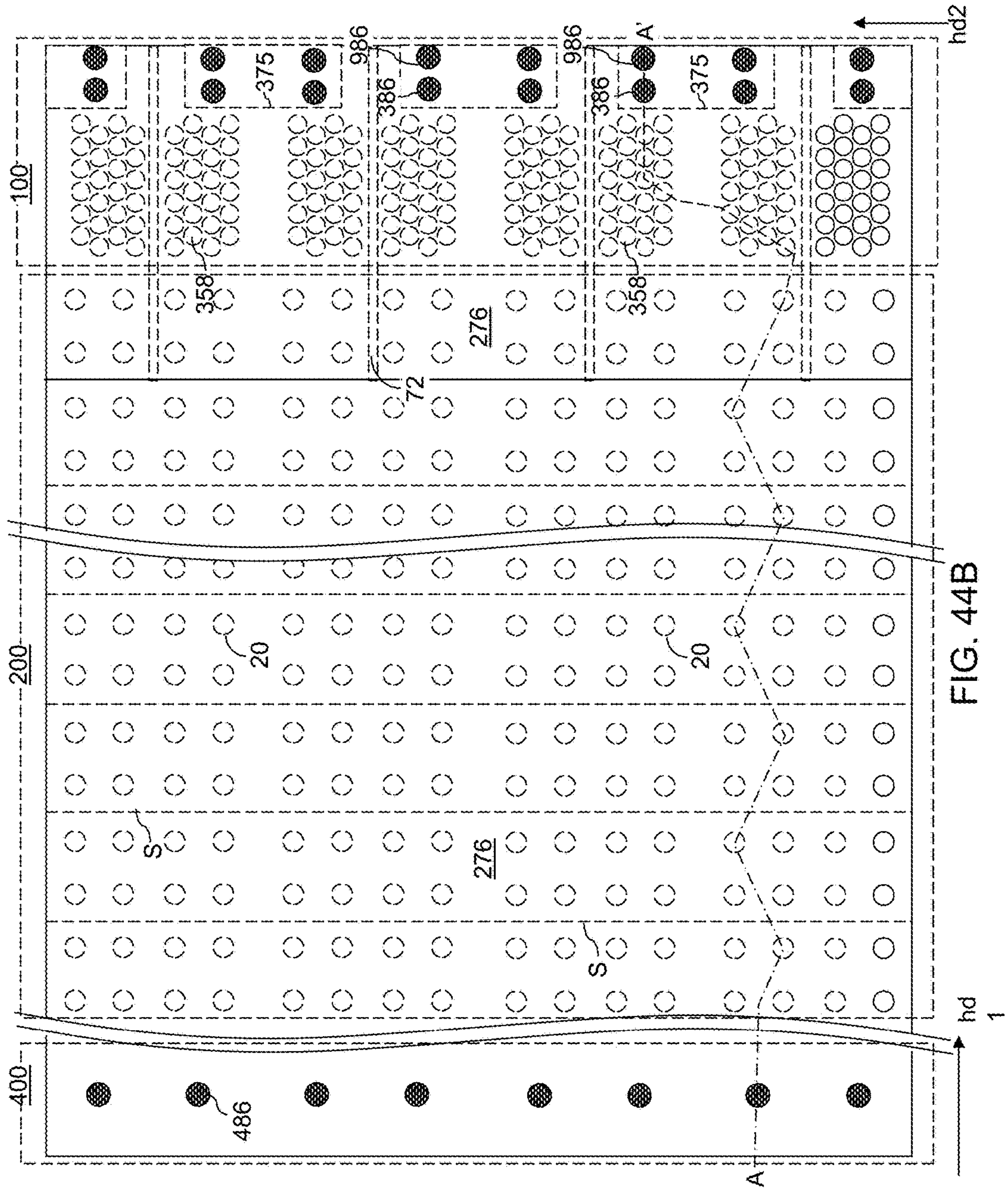
FIG. 44B is a horizontal cross-sectional view of the second exemplary structure along the horizontal plane B-B' in FIG. 44A. The zig-zag vertical plane A-A' corresponds to the plane of the vertical cross-sectional view of FIG. 44A.
Figure 44D:
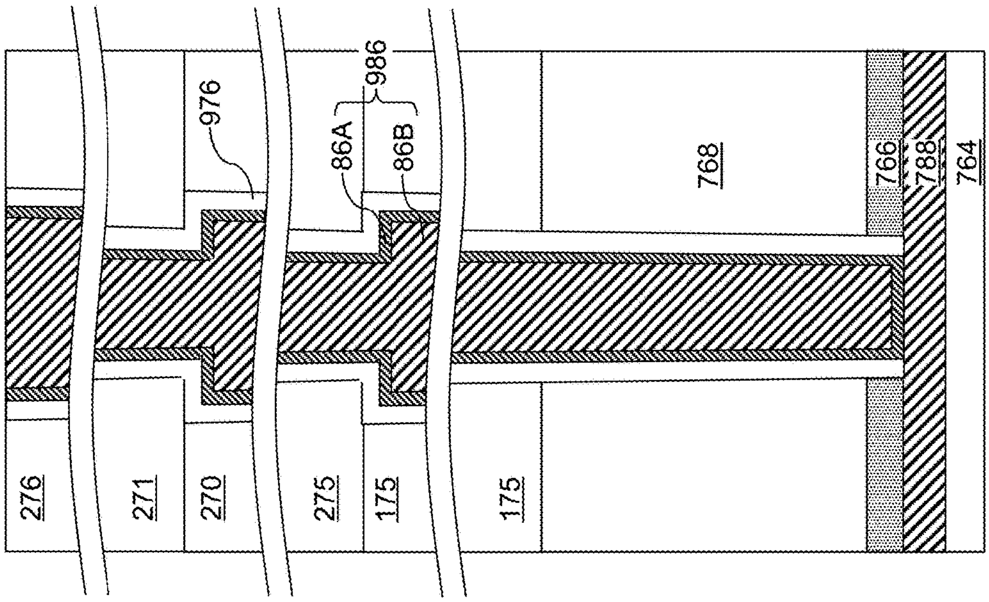
FIG. 44D is a vertical cross-sectional view of a region including an array-region contact via structure at the processing steps of FIGS. 44A and 44B.
Figure 44C:
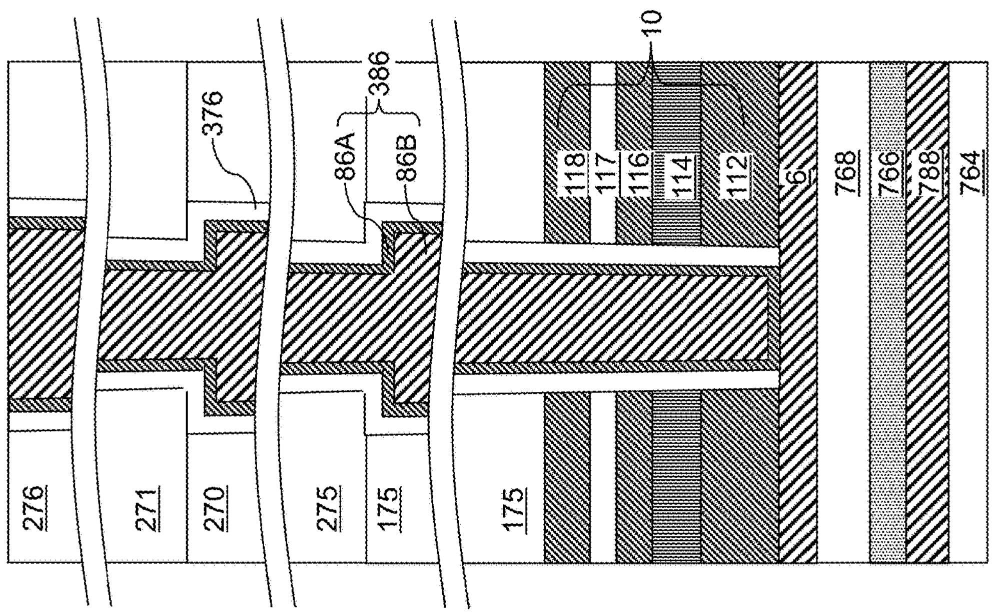
FIG. 44C is a vertical cross-sectional view of a region including a plate contact via structure at the processing steps of FIGS. 44A and 44B.
Figure 44E:
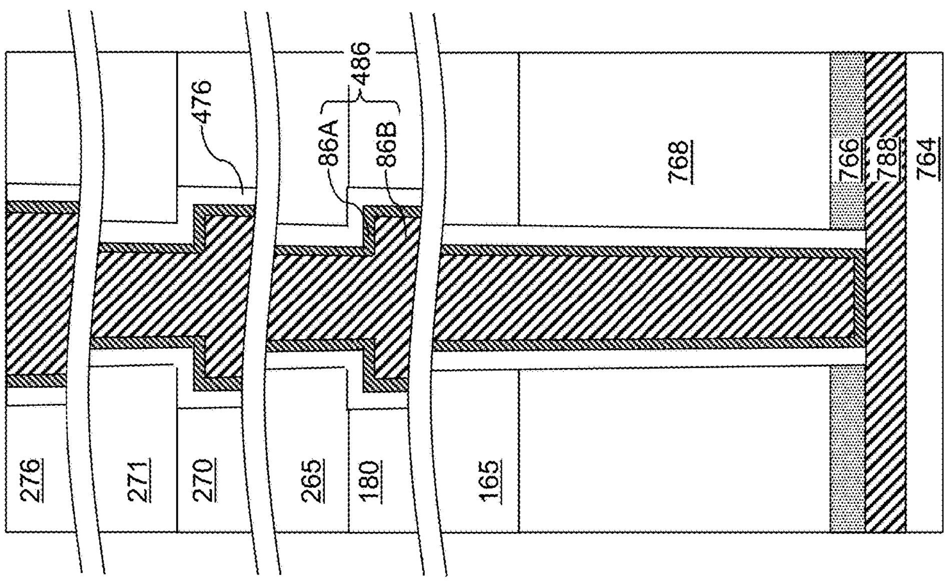
FIG. 44E is a vertical cross-sectional view of a region including a peripheral-region contact via structure at the processing steps of FIGS. 44A and 44B.

Referring to FIG. 43, the contact opening fill structures {(382, 384), (982, 984), (482, 484)} are subsequently removed, for example, by an isotropic etch process selective to the materials of the contact level dielectric layer 276, the dielectric material portions (72, 375, 274) at the drain select levels, the first and second retro-stepped dielectric material portions (165, 265), and the first and second dielectric pillar structures (175, 275). For example, if the contact opening fill structures {(382, 384), (982, 984), (482, 484)} include amorphous silicon or a silicon-germanium alloy, a wet etch process employing hot trimethyl-2 hydroxyethyl ammonium hydroxide ("hot TMY") or tetramethyl ammonium hydroxide (TMAH) can be employed to remove the contact opening fill structures {(382, 384), (982, 984), (482, 484)} selective to surrounding material portions.

Plate contact openings 385 are formed from the volumes from which the sacrificial plate contact opening fill structures (382, 384) are removed and from volumes of the contact-level plate contact openings 387. Array-region openings 985 are formed from the volumes from which the sacrificial array-region opening fill structures (582, 584) are removed and from volumes of the contact-level array-region openings 987. Peripheral-region openings 485 are formed from volumes from which the sacrificial peripheral-region opening fill structures (482, 484) are removed and from volumes of the contact-level peripheral-region openings 487.

Each plate contact opening 385 can be formed through the first and second dielectric pillar structures (175, 275) by removing a sacrificial first-tier plate contact opening fill portion 382 from underneath the sacrificial second-tier plate contact opening 383 concurrently with removal of the sacrificial first-tier peripheral-region opening fill portions 482. Each peripheral-region opening 485 can be formed by anisotropically etching a sacrificial second-tier peripheral-region opening 483 over the sacrificial first-tier peripheral-region opening fill portion 482 and removing the sacrificial first-tier peripheral-region opening fill portion 482.

Referring to FIGS. 44A-44E, dielectric liners (376, 476, 976) be formed in the various contact openings (385, 485, 985), which include the plate contact openings 385, the array-region openings 985, and the peripheral-region openings 485. The dielectric liners (376, 476, 976) can be formed by depositing a conformal dielectric material layer (such as a silicon oxide layer), and anisotropically etching horizontal portions of the conformal dielectric material layer that are not masked by any overlying material portion. The dielectric liners (376, 476, 976) include plate contact dielectric liners 376 that are formed in the plate contact openings 385, array-region dielectric liners 976 that are formed in the array-region openings 985, and peripheral-region dielectric liners 476 that are formed in the peripheral-region openings 485.

At least one conductive material can be deposited in the various contact openings (385, 485, 985). The at least one conductive material can include, for example, a metallic liner such as titanium nitride and a metallic fill material such as tungsten, cobalt, ruthenium, molybdenum, and/or copper. Various contact via structures are formed in the contact openings (385, 485, 985), which are herein referred to as through-memory-level contact via structures (386, 486, 986). The through-memory-level contact via structures (386, 486, 986) are concurrently formed, and include plate contact via structures 386 that are formed in the plate contact openings 385, array-region contact via structures 986 that are formed in the array-region openings 985, and peripheral-region contact via structures 486 that are formed in the peripheral-region openings 485. The plate contact via structures 386 can be formed directly on a top surface of the conductive plate layer 6. The conductive plate layer 6 can function as a buried source line layer and the plate contact via structures 386 can function as source line contact vias. Each of the array-region contact via structures 986 and the peripheral-region contact via structures 486 can be formed on a respective one of the lower-level metal interconnect structures 780. The through-memory-level contact via structures (386, 486, 986) can have top surfaces within the horizontal plane including the top surface of the contact level dielectric layer 276.

Figure 49A:
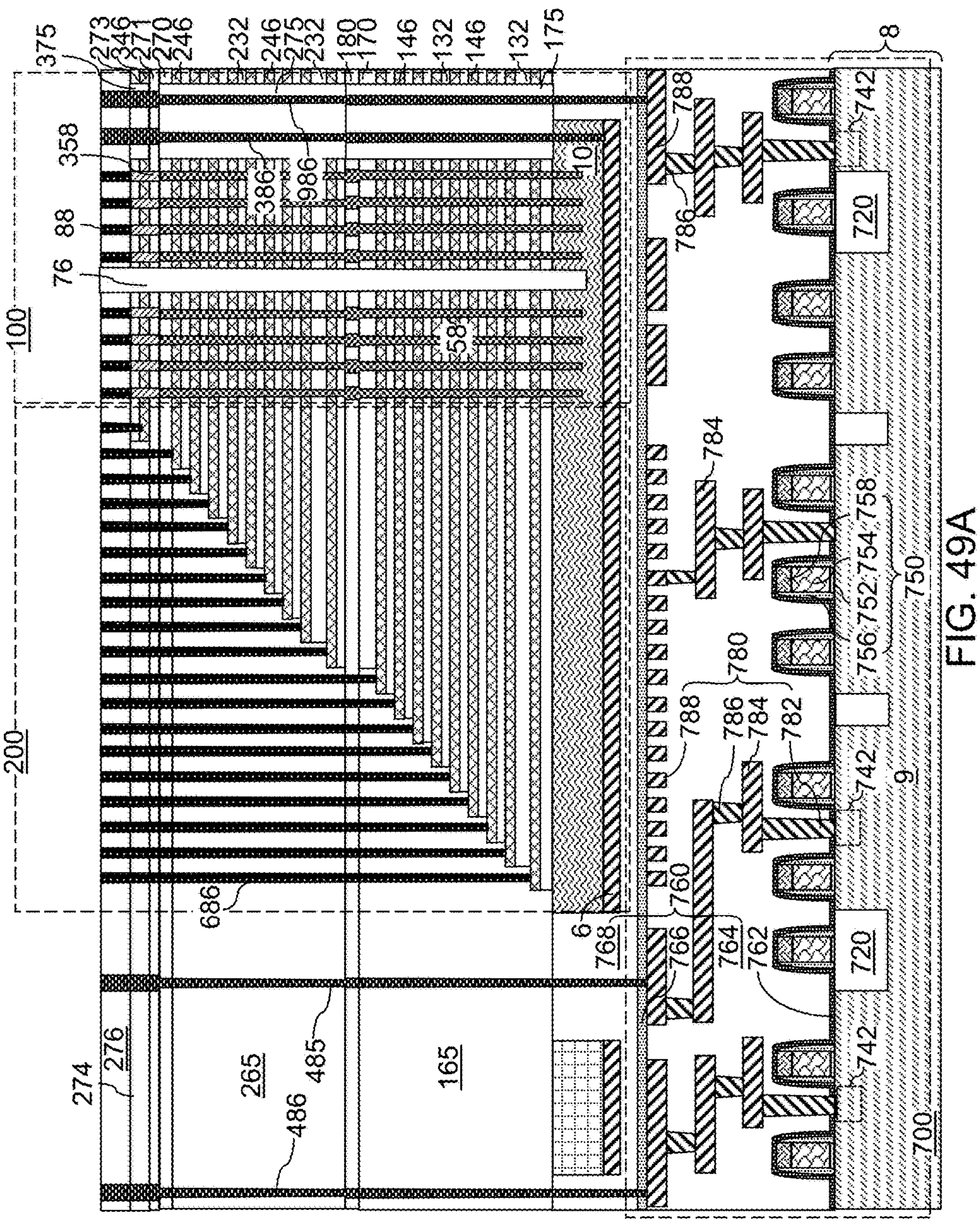
FIG. 49A is a vertical cross-sectional view of the second exemplary structure after formation of drain contact via structures and staircase-region contact via structures according to the second embodiment of the present disclosure.

The various through-memory-level contact via structures (386, 486, 986) can include horizontal stops at each horizontal plane at which top surfaces of sacrificial opening fill structures are formed because a subsequently etch process that forms an overlying opening can provide a bottom periphery of the overlying opening with a lateral offset with respect to the periphery of a top portion of an underlying sacrificial opening fill structure. Thus, each of the plate contact via structures 386, the array-region contact via structures 986, and the peripheral-region contact via structures 486 can have a horizontal step within the horizontal plane that includes the bottom surface of the second-tier structure (232, 242, 270, 265, 275), and within a horizontal plane that includes the top surface of the second-tier structure (232, 242, 270, 265, 275. In contrast, each staircase-region contact via structure 686 (to formed subsequently as shown in FIG. 49A) have straight sidewalls from a bottom-most portion to a topmost portion. Thus, staircase-region contact via structures 686 that extend below the bottom surface of the second-tier structure (232, 242, 270, 265, 275) do not include any horizontal step.

Each of the through-memory-level contact via structures (386, 486, 986) can include a respective metallic liner 86A having a uniform thickness and continuously extending from a bottom surface to a top surface of the respective through-memory-level contact via structure (386, 486, 986) and a respective metal fill material portion 86B filling a volume laterally surrounded by the respective metallic liner 86A. The thickness of the metallic liner 86A can be the same across all of the through-memory-level contact via structures (386, 486, 986) because the through-memory-level contact via structures (386, 486, 986) are formed by a same set of conductive material deposition processes.

Figure 45A:
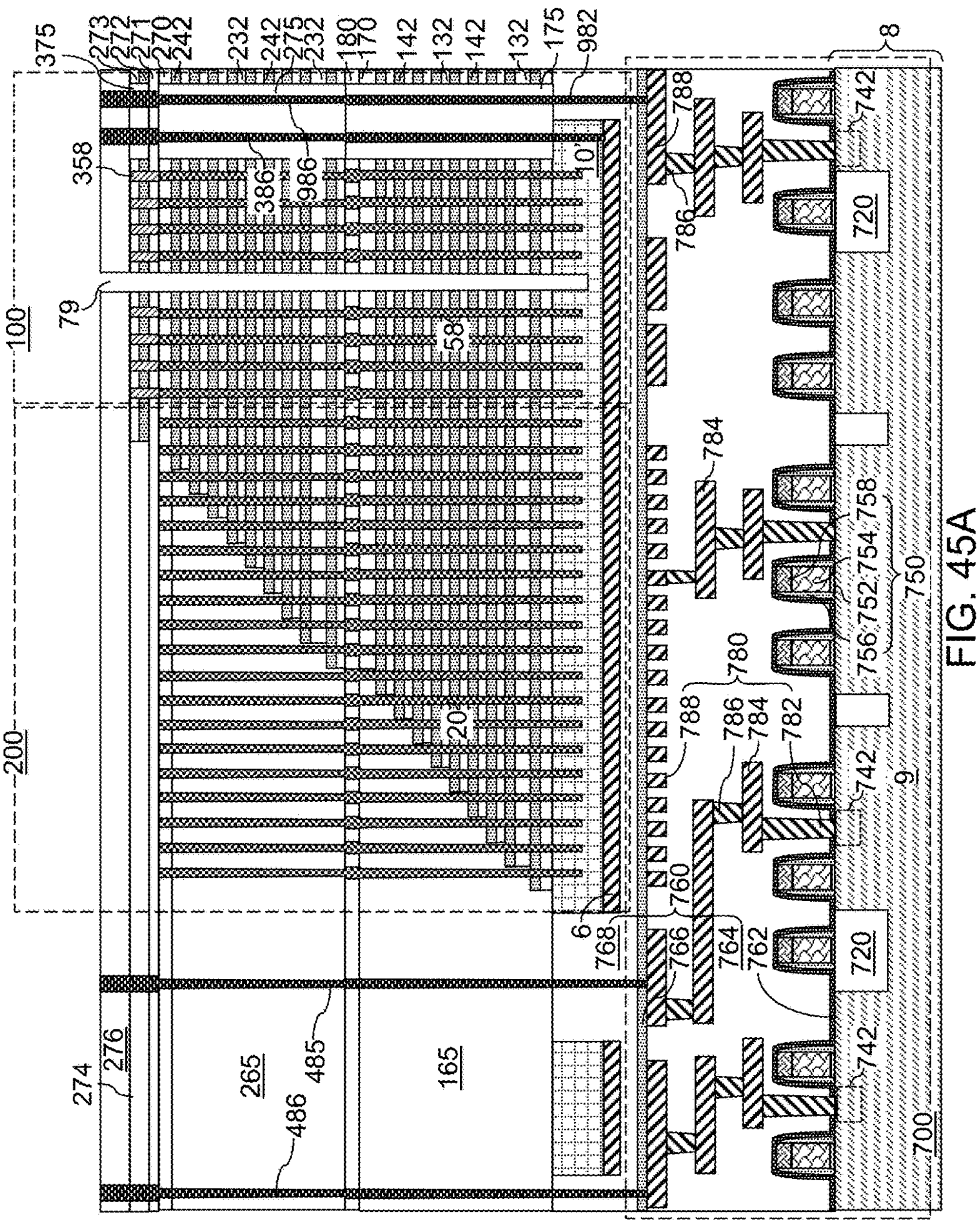
FIG. 45A is a vertical cross-sectional view of the second exemplary structure after formation of backside trenches according to the second embodiment of the present disclosure.
Figure 45B:
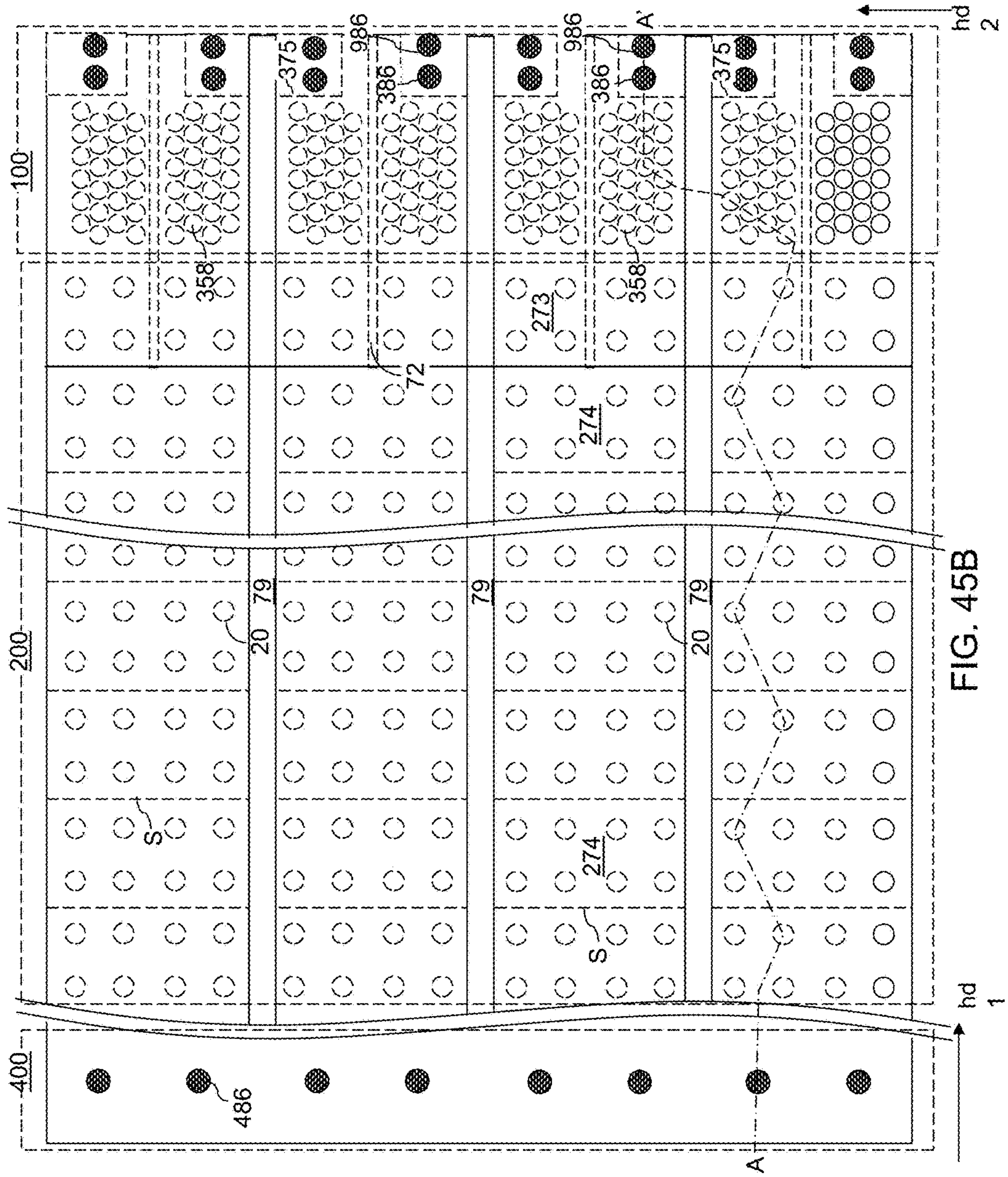
FIG. 45B is a horizontal cross-sectional view of the second exemplary structure along the horizontal plane B-B' in FIG. 45A. The zig-zag vertical plane A-A' corresponds to the plane of the vertical cross-sectional view of FIG. 45A.

Referring to FIGS. 45A and 45B, backside trenches 79 are subsequently formed through the contact level dielectric layer 280 and the memory-level assembly. For example, a photoresist layer can be applied and lithographically patterned over the contact level dielectric layer 276 to form elongated openings that extend along the first horizontal direction hd1. An anisotropic etch is performed to transfer the pattern in the patterned photoresist layer through a predominant portion of the memory-level assembly to the in-process source-level material layers 10'. For example, the backside trenches 79 can extend through the optional source-select-level conductive layer 118, the source-level insulating layer 117, the upper source layer 116, and the upper sacrificial liner 105 and into the source-level sacrificial layer 104. The optional source-select-level conductive layer 118 and the source-level sacrificial layer 104 can be employed as etch stop layers for the anisotropic etch process that forms the backside trenches 79. The photoresist layer can be subsequently removed, for example, by ashing.

The backside trenches 79 extend along the first horizontal direction hd1, and thus, are elongated along the first horizontal direction hd1. The backside trenches 79 can be laterally spaced among one another along a second horizontal direction hd2, which can be perpendicular to the first horizontal direction hd1. The backside trenches 79 can extend through the memory array region 100 (which may extend over a memory plane) and the staircase region 200. The backside trenches 79 can laterally divide the memory-level assembly into memory blocks.

Figure 46:
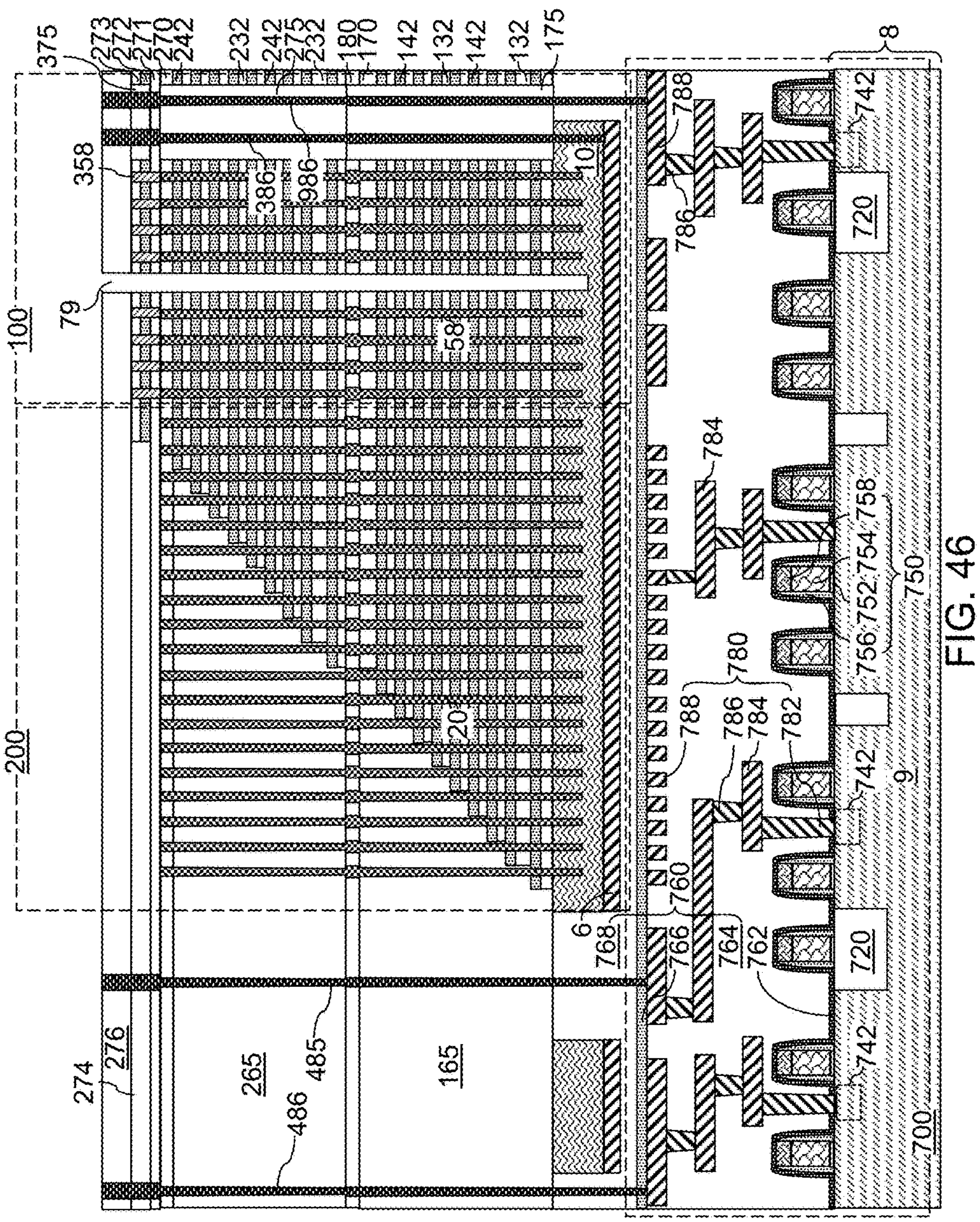
FIG. 46 is a vertical cross-sectional view of the second exemplary structure after replacement of in-process source-level material layers with source-level material layers according to the second embodiment of the present disclosure.

Referring to FIG. 46, the processing steps of FIGS. 17A-17E can be performed to replace the in-process source-level material layers 10' with source-level material layer layers 10.

Figure 47:
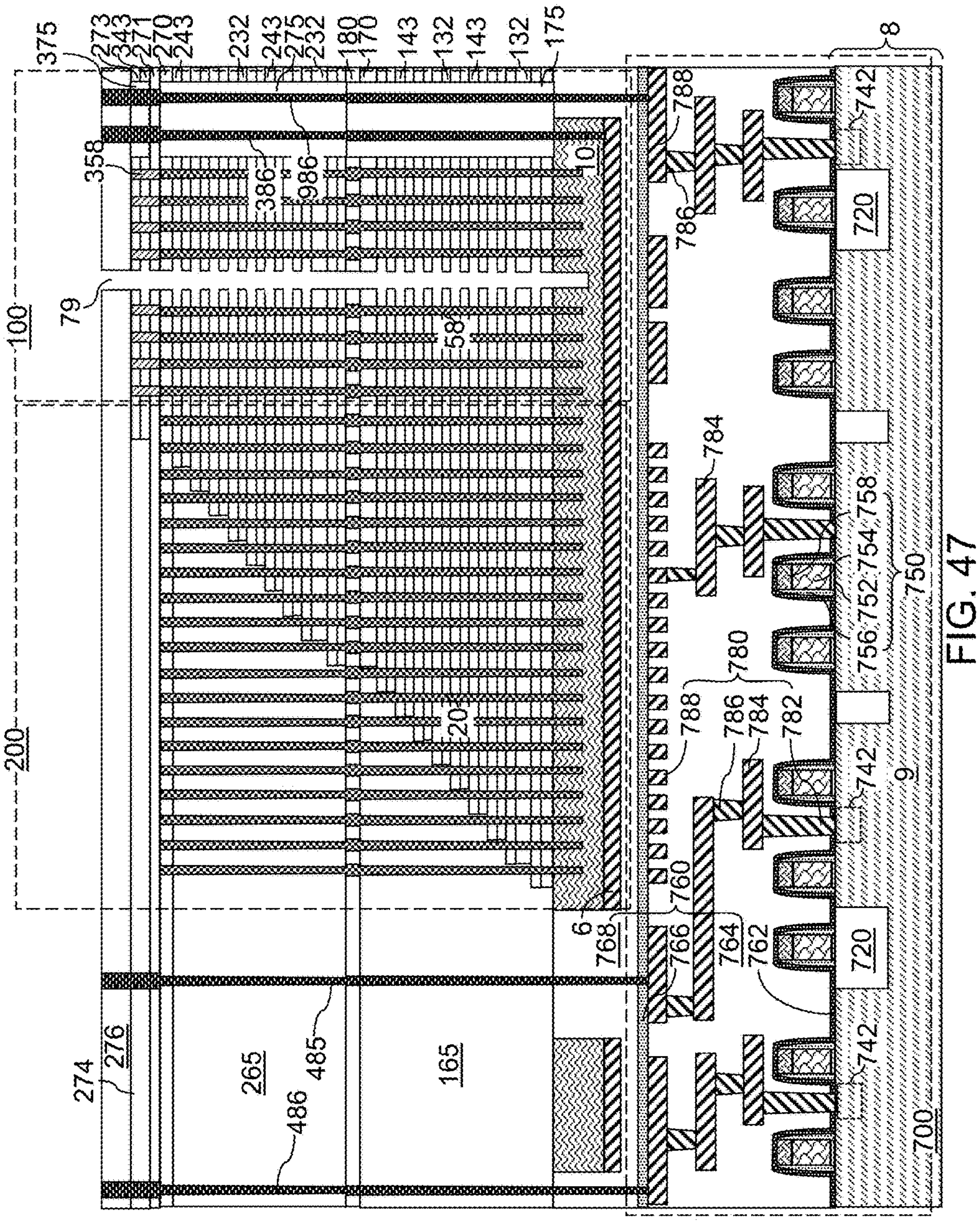
FIG. 47 is a vertical cross-sectional view of the second exemplary structure after removal of the sacrificial material layer to form backside recesses according to the second embodiment of the present disclosure.

Referring to FIG. 47, the processing steps of FIG. 19 can be performed to remove the first and second sacrificial material layers (142, 242). The drain-select-level sacrificial layer 272 can be removed selective to the first and second drain-select-level insulating layers (271, 273) concurrently with removal of the first and second sacrificial material layers (142, 242). A first backside recess 143 is formed in each volume from which a first sacrificial material layer 142 is removed. A second backside recess 243 is formed in each volume from which a second sacrificial material layer 242 is removed. A drain-select-level backside recess 343 is formed in the volume from which the drain-select-level sacrificial layer 272 is removed. Each of the first and second backside recesses (143, 243) and the drain-select-level backside recess 343 can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 8. A backside recess (143, 243) can be vertically bounded by a top surface of an underlying insulating layer (132 or 232) and a bottom surface of an overlying insulating layer (132 or 232). In one embodiment, each of the first and second backside recesses (143, 243) can have a uniform height throughout.

Figure 48:
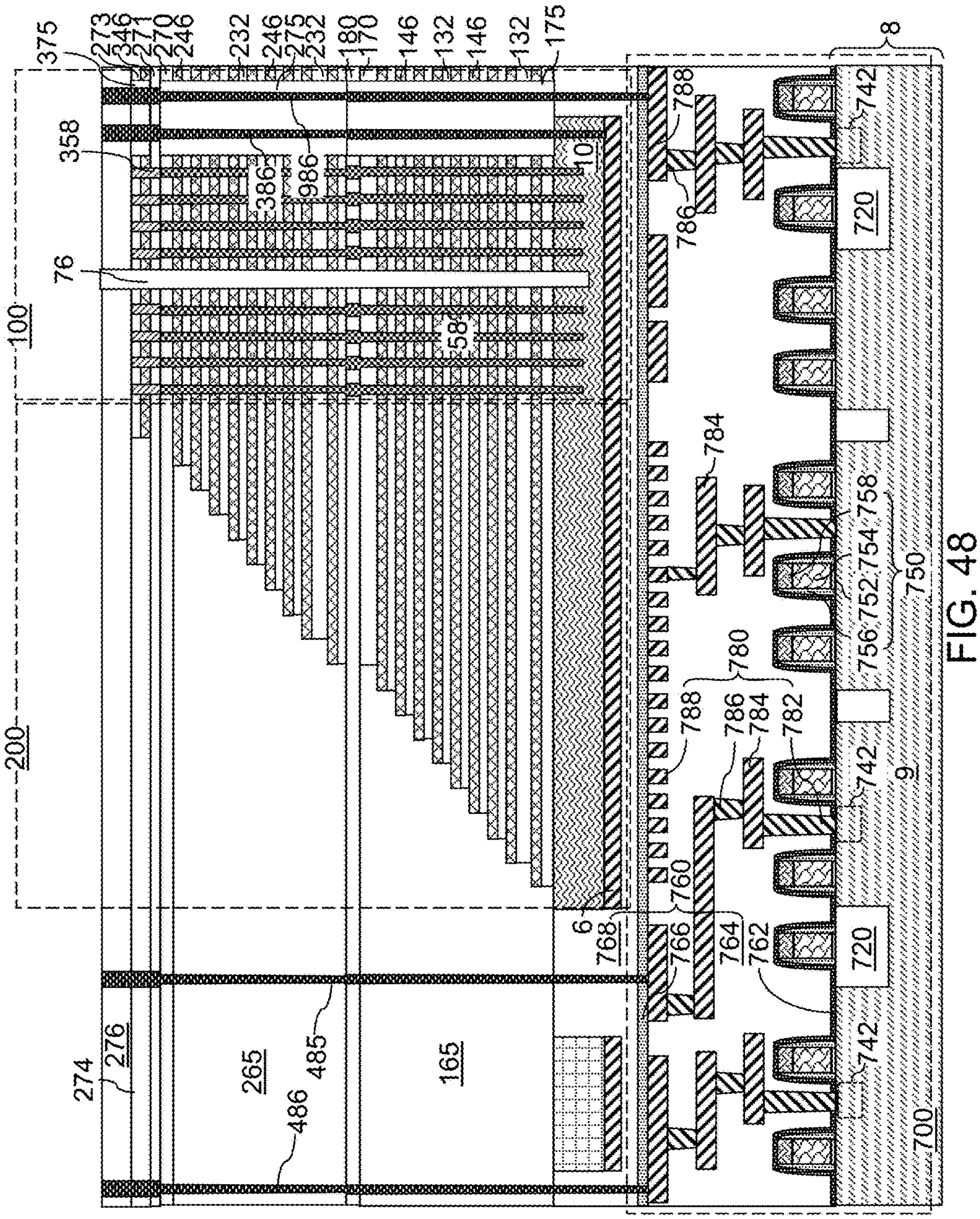
FIG. 48 is a vertical cross-sectional view of the second exemplary structure after replacement of sacrificial material layers with electrically conductive layers and formation of dielectric wall structures in the backside recesses according to the second embodiment of the present disclosure.

Referring to FIG. 48, the processing steps of FIG. 20 can be performed to optionally form a backside blocking dielectric layer in the backside recesses (143, 243, 343), and to form electrically conductive layers (146, 246, 346). The electrically conductive layers (146, 246, 346) include first electrically conductive layers 146 that are formed in the first backside recesses 143, second electrically conductive layers 246 that are formed in the second backside recesses 243, and a drain-select-level electrically conductive layer 346 that are formed in the drain-select-level backside recess 343. The first and second electrically conductive layers can be employed as word lines for the memory stack structures 55, and the drain-select-level electrically conductive layer 346 can be employed as a drain select level gate electrode that is the gate electrode for the drain-select-level transistors.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over, and is vertically spaced from, the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

An insulating material can be deposited in the backside trenches 79 by a conformal deposition process. Excess portions of the insulating material deposited over the top surface of the contact level dielectric layer 276 can be removed by a planarization process such as a recess etch or a chemical mechanical planarization (CMP) process. Each remaining portion of the insulating material in the backside trenches 79 constitutes a dielectric wall structure 76. The dielectric wall structures 76 include an insulating material such as silicon oxide, silicon nitride, and/or a dielectric metal oxide. Each dielectric wall structure 76 can vertically extend through first alternating stacks (132, 146) of first insulating layers 132 and first electrically conductive layers 146 and second alternating stacks (232, 246) of second insulating layers 232 and second electrically conductive layers 246, and laterally extends along the first horizontal direction hd1 and are laterally spaced apart among one another along the second horizontal direction hd2.

Figure 49B:
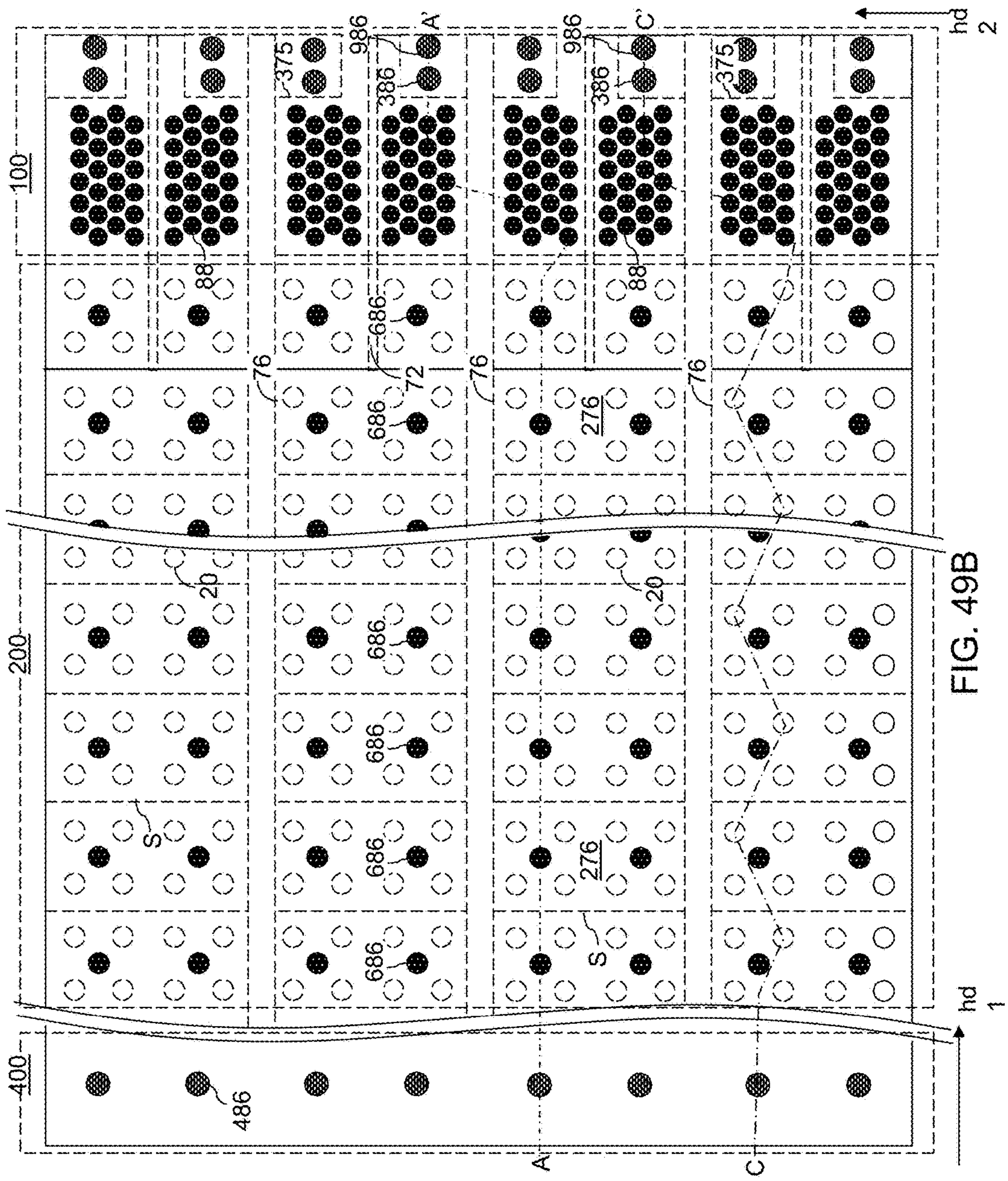
FIG. 49B is a horizontal cross-sectional view of the second exemplary structure along the horizontal plane B-B' in FIG. 49A. The zig-zag vertical plane A-A' corresponds to the plane of the vertical cross-sectional view of FIG. 49A.
Figure 49C:
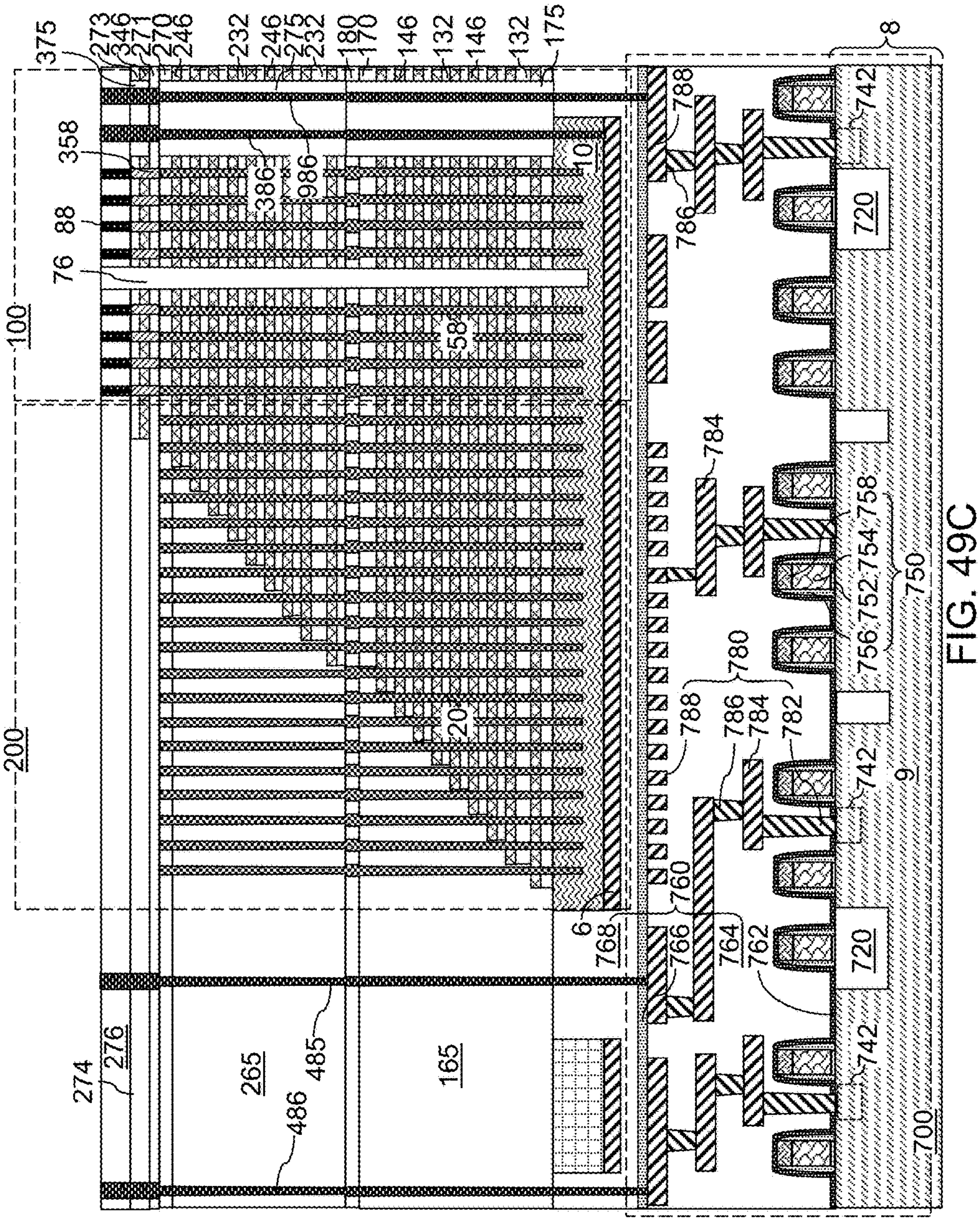
FIG. 49C is a vertical cross-sectional view of the second exemplary structure along the zig-zag vertical plane C-C' of FIG. 49B.

Referring to FIGS. 49A-49C, various contact via cavities can be formed through the contact level dielectric layer 276 and optionally through the field dielectric structure 274, the first drain-select-level insulating layer 271, the second insulating cap layer 270, the second retro-stepped dielectric material portion 265, the inter-tier dielectric layer 180, and/or the first retro-stepped dielectric material portion 165. For example, drain contact via cavities can be formed directly over the drain-select-level top active regions 363, and staircase region contact via cavities can be formed directly over the horizontal surfaces of the first and second stepped surfaces. At least one conductive material can be deposited in the various contact via cavities, and excess portions of the at least one conductive material can be removed from above the contact level dielectric layer 276 by a planarization process such as a recess etch or chemical mechanical planarization. Drain contact via structures 88 can be formed directly on a respective one of the drain-select-level top active regions 363. Staircase-region contact via structures 686 can be formed directly on a horizontal surface of a respective one of the first and second electrically conductive layers (146, 246) and on the drain-select-level electrically conductive layer 346.

Figure 50:
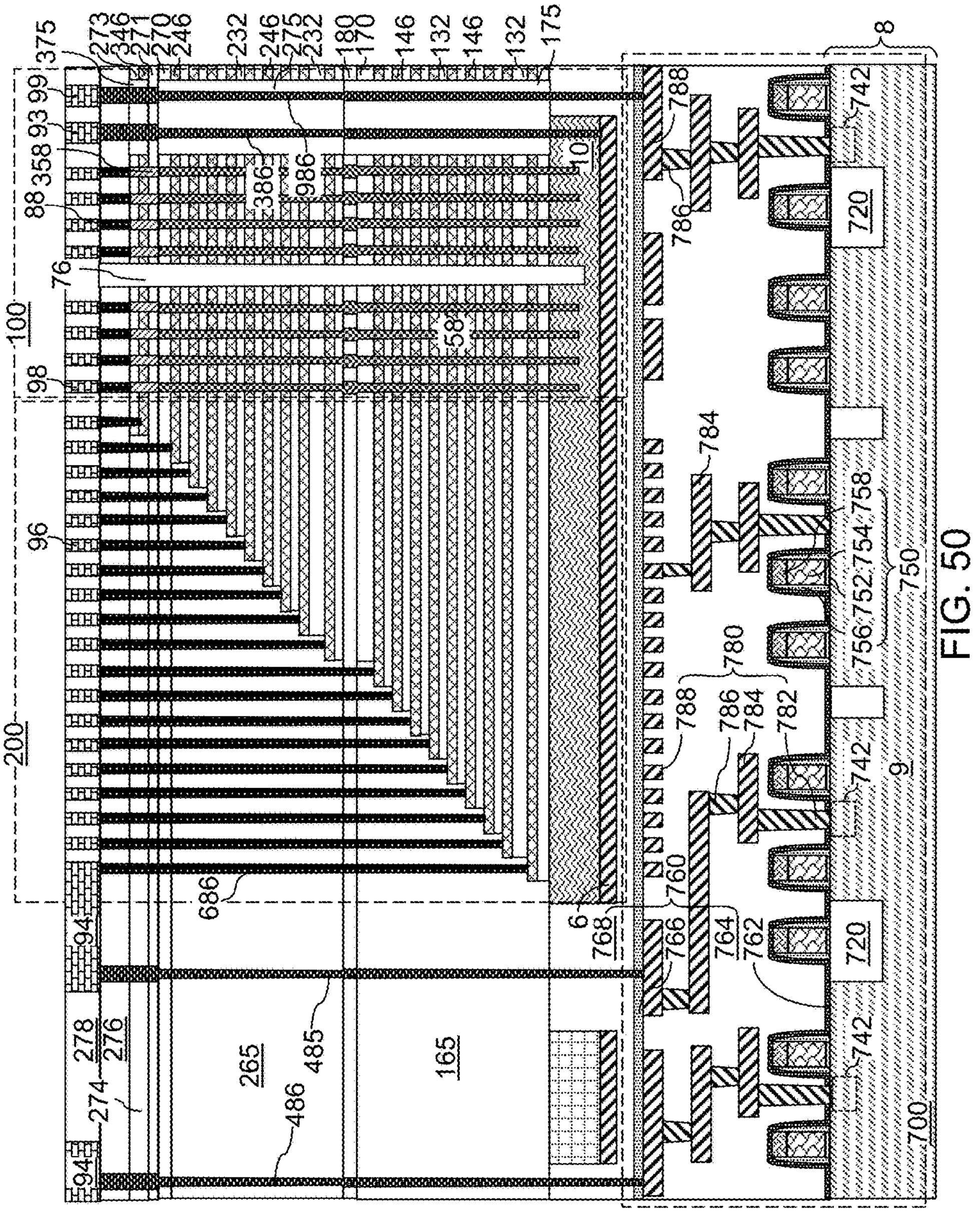
FIG. 50 is a vertical cross-sectional view of the second exemplary structure after formation of various upper-level metal lines according to the second embodiment of the present disclosure.

Referring to FIG. 50, at least one upper-level dielectric material layer 278 can be formed over the contact level dielectric layer 276. Various upper-level metal interconnect structures (93, 94, 96, 98, 99) can be formed in the at least one upper interconnect level dielectric layer 278. For example, the various upper-level metal interconnect structures (93, 94, 96, 98, 99) can include line level metal interconnect structures (94, 96, 98). The upper-level metal interconnect structures (93, 94, 96, 98, 99) can include first upper metal line structures 93 (e.g., source line interconnects) that are electrically shorted to a respective one of the plate contact via structures 386, second upper metal line structures 99 that are electrically shorted to a respective one of the array-region contact via structures 986, third upper metal line structures 94 that are electrically shorted to a respective one of the peripheral-region contact via structures 486, bit lines 98 that are electrically shorted to a respective subset of the drain contact via structures 88, and upper interconnection lines 96 that are electrically shorted to a respective one of the staircase-region contact via structures 686.

The staircase-region contact via structures 686 can include a staircase-region metallic liner continuously extending from a respective one of the first and second electrically conductive layers (146, 246) to the top surface of the respective staircase-region contact via structure, and a staircase-region metal fill material portion filling a volume laterally surrounded by the staircase-region metallic liner. The staircase-region metallic liner can be different in composition and/or in thickness from the metallic liner 86A of the through-memory-level contact via structures (386, 486, 986) because different deposition processes are employed to form the staircase-region metallic liners and the metallic liners 86A.

The various embodiments of the second exemplary structure include a three-dimensional memory device. The three-dimensional memory device includes a stack of a conductive plate layer 6 and source-level material layers 10 overlying a substrate 8; a first-tier structure (132, 146, 170, 165, 175) overlying the source-level material layers 10, the first-tier structure (132, 146, 170, 165, 175) including a first alternating stack (132, 146) of first insulating layers 132 and first electrically conductive layers 146, a first retro-stepped dielectric material portion 165 overlying first stepped surfaces of the first alternating stack (132, 146), and a first dielectric pillar structure 175 overlying a portion of the source-level material layers 10; a second-tier structure (232, 246, 270, 265, 275) overlying the first-tier structure (132, 146, 170, 165, 175), the second-tier structure (232, 246, 270, 265, 275) including a second alternating stack (232, 246) of second insulating layers 232 and second electrically conductive layers 246, a second retro-stepped dielectric material portion 265 overlying second stepped surfaces of the second alternating stack (232, 246), and a second dielectric pillar structure 275 overlying the first dielectric pillar structure 175 (and including only straight or tapered sidewalls between the top surface and the bottom surface); memory stack structures 55 extending through each electrically conductive layer (146, 246) in the first and second alternating stacks and comprising a respective memory film 50 and a vertical semiconductor channel 60; and a plate contact via structure 386 extending through the first and second dielectric pillar structures (175, 275), contacting a top surface of the conductive plate layer 6, and having a horizontal step between the first and second pillar structures.

In one embodiment, the first and second electrically conductive layers (146, 246) comprise word lines of the memory device, the conductive plate 6 comprises a buried source line layer and the plate contact via structure 386 comprises a source line contact via. In one embodiment, the plate contact via structure 386 includes a lower sidewall contacting the first dielectric pillar structure 175 and an upper sidewall contacting the second dielectric pillar structure 275. The horizontal step comprises an interconnecting horizontal surface adjoining the lower sidewall and the upper sidewall and located within a horizontal plane including an interface between the first dielectric pillar structure 175 and the second dielectric pillar structure 275 (which may coincide with the plane including the bottom surface of the second-tier structure).

In one embodiment, the device further comprises first staircase-region contact via structures 686 contacting a respective first electrically conductive layer 146 and having a respective straight sidewall extending from a top surface to a bottom surface of a respective first staircase-region contact via structure 686. In one embodiment, each straight sidewall of the first staircase-region contact via structure 686 contacts the first retro-stepped dielectric material portion 165 and the second retro-stepped dielectric material portion 265. The first staircase-region contact via structures 686 and the plate contact via structures 386 can comprise metallic liners that differ in at least in one of composition and thickness.

In one embodiment, the plate contact via structure 386 comprises a metallic liner 86A having a uniform thickness and continuously extending from a top surface of the conductive plate layer 6 to, and above, the top surface of the second dielectric pillar structure 275 and including a first horizontal jog region contacting the bottom surface of the second dielectric pillar structure 275, and a metal fill material portion 86B filling a volume laterally surrounded by the metallic liner 86A.

In one embodiment, the first dielectric pillar structure 175 contacts a top surface of the source-level material layers 10 and is laterally spaced from the first retro-stepped dielectric material portion 165 by the first alternating stack (132, 146); the first dielectric pillar structure 175 comprises first straight dielectric sidewalls that extend from a bottommost layer of the first alternating stack (132, 146) to a topmost layer of the first alternating stack (132, 146); and the second dielectric pillar structure 275 comprises second straight dielectric sidewalls that extend from a bottommost layer of the second alternating stack (232, 246) to a topmost layer of the second alternating stack (232, 246).

In one embodiment, the three-dimensional memory device can further comprise: lower-level metal interconnect structures 780 embedded in lower-level dielectric material layers 760 overlying the substrate 8 and underlying the conductive plate layer 6; and a peripheral-region contact via structure 486 vertically extending through the second retro-stepped dielectric material portion 265 and the first retro-stepped dielectric material portion 165 and contacting one of the lower-level metal interconnect structures 760.

In one embodiment, the peripheral-region contact via structure 486 includes: a lower peripheral via sidewall contacting the first retro-stepped dielectric material portion 165 (and extending to the bottommost surface of the at least one second insulating layer 768); an upper peripheral via sidewall contacting the second retro-stepped dielectric material portion 265 (which may extend to the top surface of the second insulating cap layer 270); and an interconnecting peripheral via horizontal surface adjoining the lower peripheral via sidewall and the upper peripheral via sidewall and located within the horizontal plane including the bottom surface of the second-tier structure, which may be within the same horizontal plane as the interface between the first dielectric pillar structure 175 and the second dielectric pillar structure 275.

In one embodiment, the three-dimensional memory device further comprises an array-region contact via structure 986 vertically extending through the second dielectric pillar structure 275 and the first dielectric pillar structure 175 and contacting another one of the lower-level metal interconnect structures 780.

In one embodiment, the array-region contact via structure 986 includes: a lower array via sidewall contacting the first dielectric pillar structure 175; an upper array via sidewall contacting the second dielectric pillar structure 275; and an interconnecting array via horizontal surface adjoining the lower array via sidewall and the upper array via sidewall and located within the horizontal plane including the interface between the first dielectric pillar structure 175 and the second dielectric pillar structure 275.

In one embodiment, the three-dimensional memory device further comprises upper-level metal interconnect structures (93, 94, 96, 98, 99) embedded in upper-level dielectric material layers 978 and overlying the second-tier structure. The plate contact via structure 386 is electrically shorted to one 93 of the upper-level metal interconnect structures (93, 94, 96, 98, 99); and each of the first staircase-region contact via structures 386 is electrically shorted to a respective one 96 of the upper-level metal interconnect structures (93, 94, 96, 98, 99).

The various embodiments of the present disclosure provide concurrent formation of different types of openings employing a common anisotropic etch process instead of employing multiple anisotropic etch processes. Depth control of the different types of openings during the common anisotropic etch processes can be provided by employing at least one selective etch step that etches one type of material faster than other types of materials. The process integration schemes of the various embodiments of the present disclosure can reduce the processing cost and processing time through use of common anisotropic etch processes for multiple types of openings having different depths, different functions and/or different embedding matrix materials.

Figure 51:
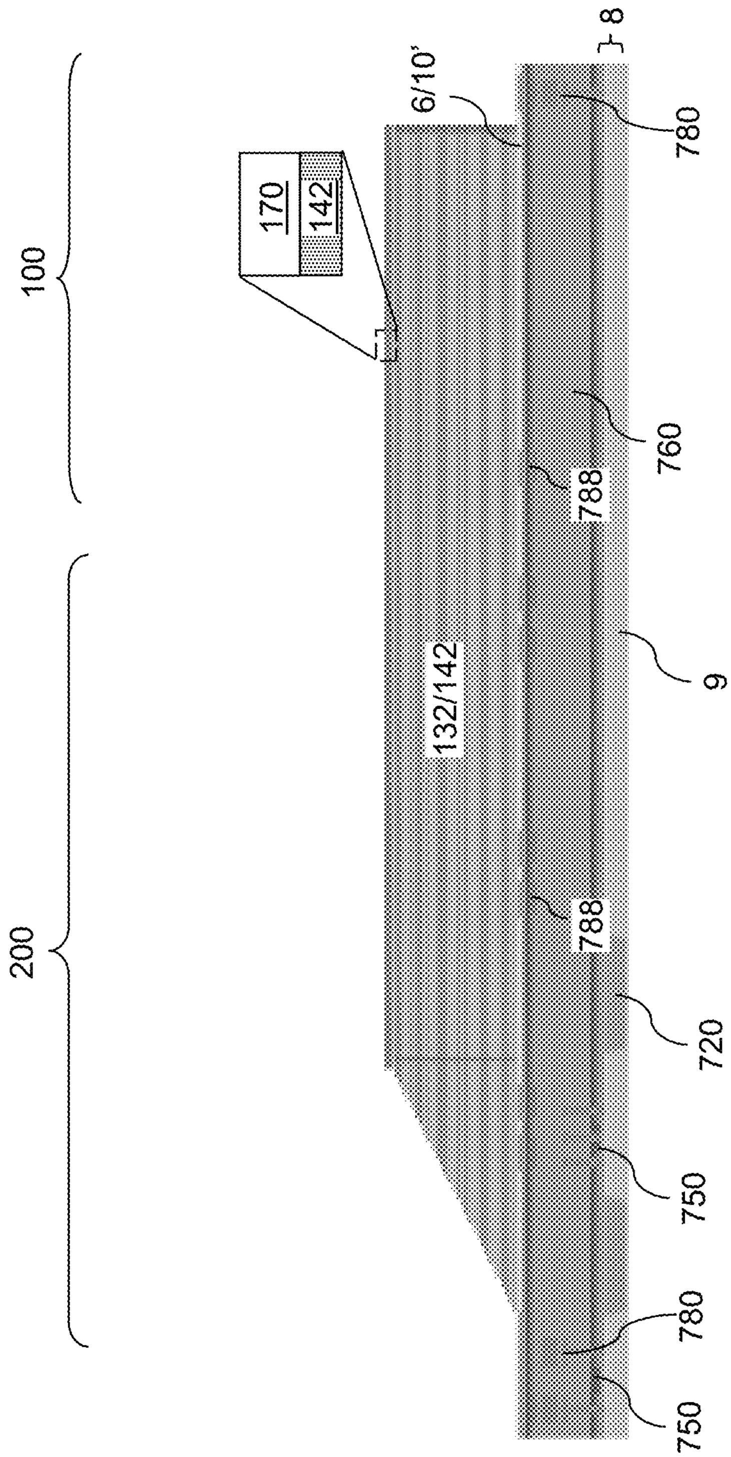
FIG. 51 is a vertical cross-sectional view of a third exemplary structure after formation and patterning a first alternating stack of first insulating layers and first sacrificial material layers according to a third embodiment of the present disclosure.

Referring to FIG. 51, a third exemplary structure according to a third embodiment of the present disclosure is illustrated. The third exemplary structure can be derived from the first exemplary structure of FIG. 2. As in the first embodiment, lower-level metal interconnect structures 780 embedded in lower-level dielectric material layers 760 are formed over the substrate 8. A stack of a conductive plate layer 6 and in-process source-level material layers 10' can be formed over the lower-level dielectric material layers 760 as in the first embodiment. The conductive plate layer 6 can comprise at least one metallic material that functions as an etch stop layer during subsequent formation of first-tier plate contact openings. The in-process source-level material layers comprise a source-level sacrificial layer 104 (illustrated in FIG. 1C).

A first alternating stack of first insulating layers 132 and first sacrificial material layers 142 can be formed as in the first embodiment. A first insulating cap layer 170 can be formed over the first alternating stack (132, 142). A photoresist layer (not shown) can be applied over the first insulating cap layer, and can be lithographically patterned to form openings in the memory array region 100. An anisotropic etch process can be performed to etch through unmasked portions of the first insulating cap layer 170 and the first alternating stack (132, 142) employing the patterned photoresist layer as an etch mask. First pillar cavities having straight sidewalls extending through the first alternating stack (132, 142) and the first insulating cap layer 170 can be formed within the memory array region 100. Before or after patterning the first pillar cavities, the first insulating cap layer 170 and the first-tier alternating stack (132, 142) can be patterned to form first stepped surfaces in the staircase region 200. The staircase region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 can be physically exposed at the first stepped surfaces. The cavity overlying the first stepped surfaces is herein referred to as a first stepped cavity.

Figure 52:
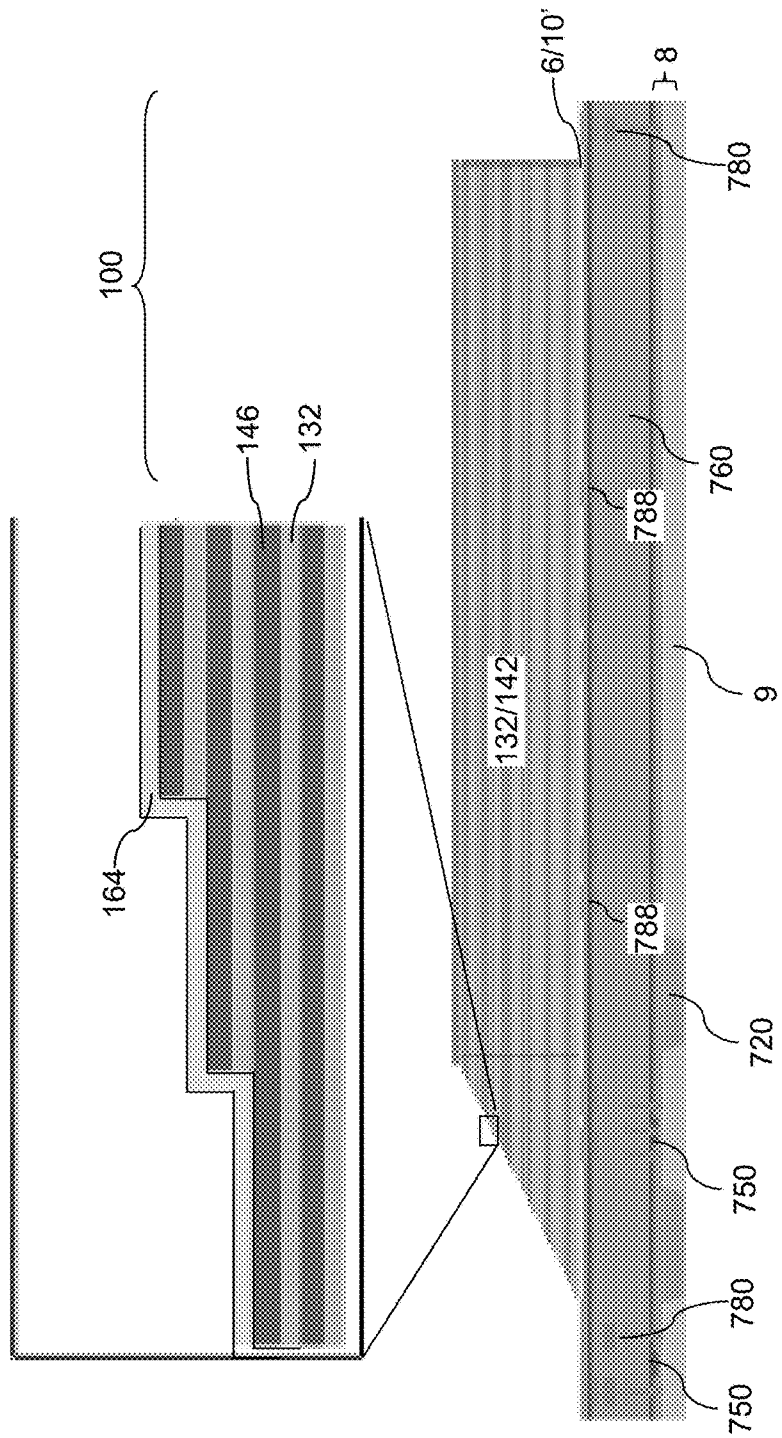
FIG. 52 is a vertical cross-sectional view of the third exemplary structure after formation of a first silicate glass liner on first stepped surfaces according to the third embodiment of the present disclosure.

Referring to FIG. 52, a first silicate glass liner 164 can be deposited by a conformal deposition process. The first silicate glass liner 164 includes a silicate glass material that provides a higher etch rate than undoped silicate glass. In one embodiment, the first insulating layers 132 can include a first silicon oxide material, and the first silicate glass liner 164 can include a second silicon oxide material. The etch rate of the second silicon oxide material in a 100:1 dilute HF solution is greater than the etch rate of the first silicon oxide material in the 100:1 dilute HF solution by a factor of at least 3. As used herein, all etch rates are measured at room temperature (20 degrees Celsius). In one embodiment, the first silicate glass liner 164 comprises a material selected from borosilicate glass, porous organosilicate glass, and non-porous organosilicate glass.

For example, the first silicate glass liner 164 can include a borosilicate glass (BSG) including boron at an atomic concentration in a range from 1% to 10%, or an organosilicate glass including carbon at an atomic concentration in a range from 1% to 10% and hydrogen at an atomic concentration in a range from 0.5% to 10%. The etch rate of the material of the first silicate glass liner 164 in a 100:1 dilute hydrofluoric acid at room temperature can be at least 5 times, and preferably at least 10 times and/or at least 20 times, the etch rate of thermal silicon oxide in a 100:1 dilute hydrofluoric acid at room temperature. The first silicate glass liner 164 can be deposited by a conformal deposition process such as low pressure chemical vapor deposition or a non-conformal deposition process such as plasma enhanced chemical vapor deposition. The thickness of the horizontal portions of the first silicate glass liner 164 can be in a range from 10 nm to 100 nm, such as from 20 nm to 50 nm, although lesser and greater thicknesses can also be employed.

Figure 53A:
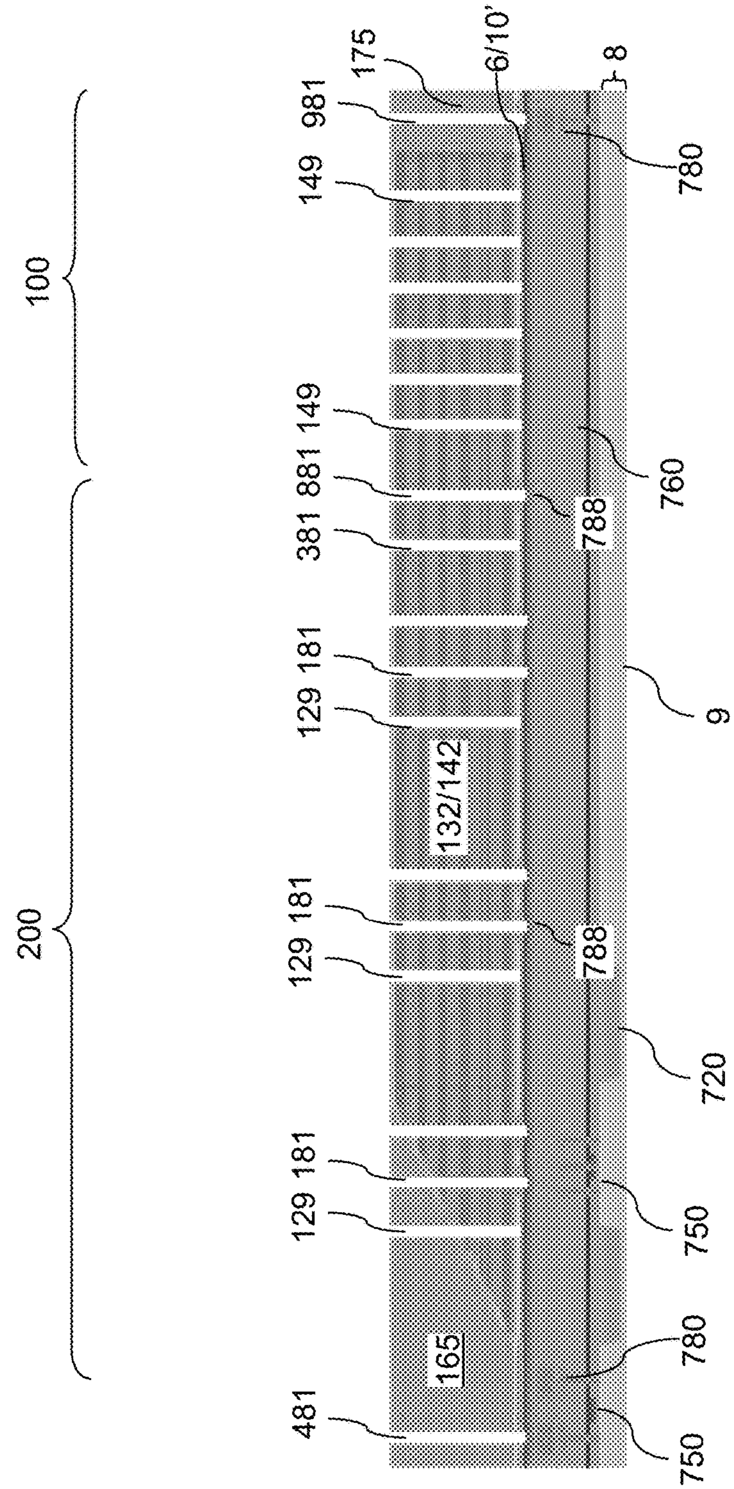
FIG. 53A is a vertical cross-sectional view of the third exemplary structure after formation of a first retro-stepped dielectric material portion and various first-tier openings according to the third embodiment of the present disclosure.
Figure 53B:
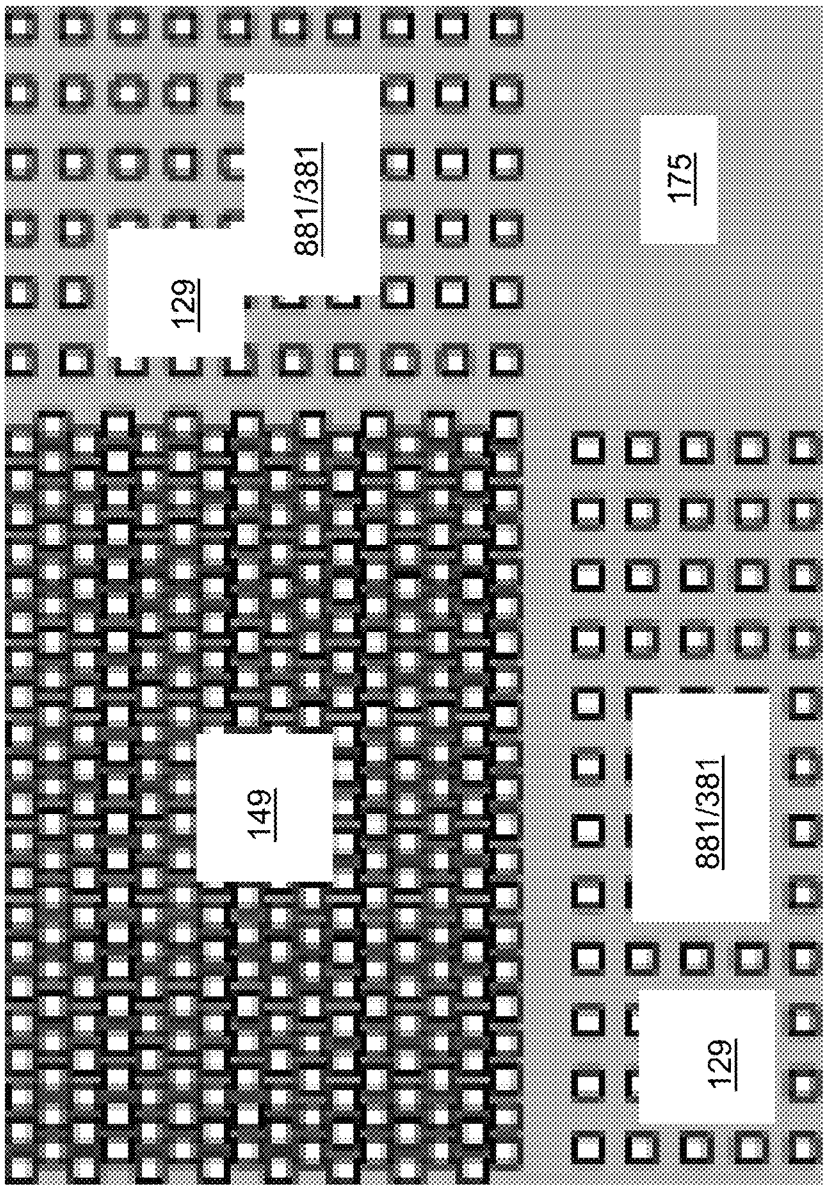
FIG. 53B is a first exemplary layout that can be employed to form the various first-tier openings according to the third embodiment of the present disclosure at the processing steps of FIG. 53A.
Figure 53C:
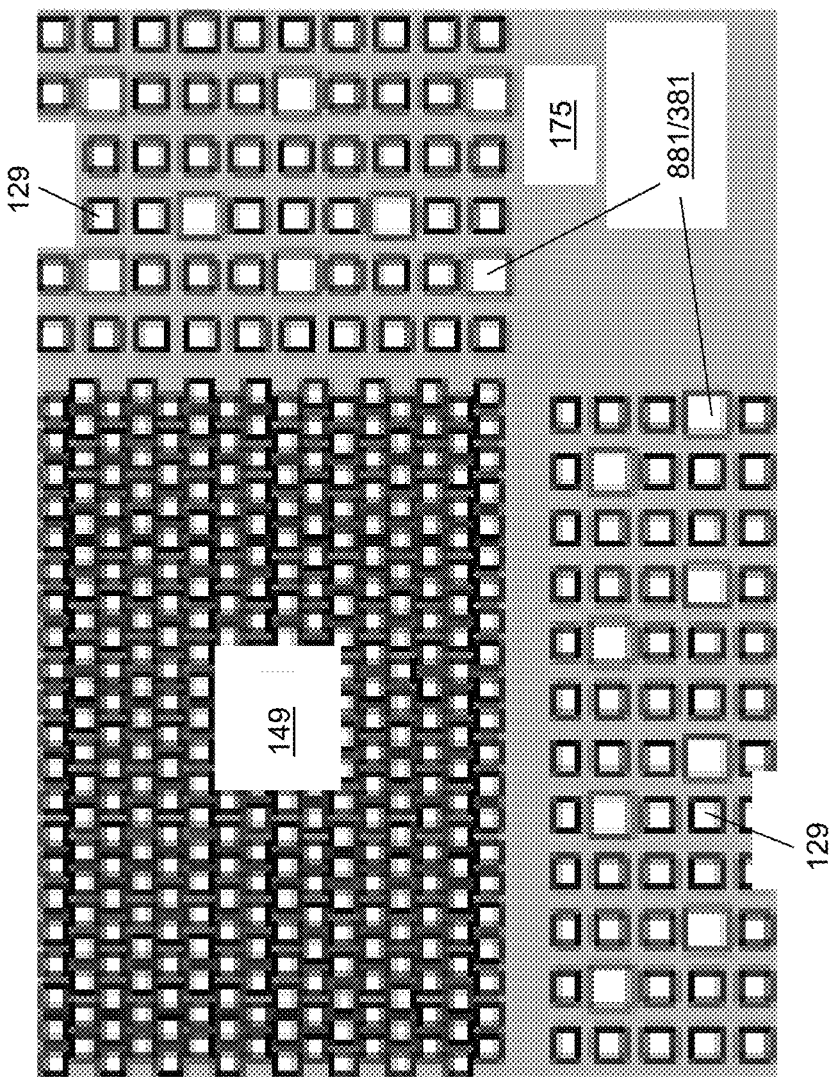
FIG. 53C is a second exemplary layout that can be employed to form the various first-tier openings according to the third embodiment of the present disclosure at the processing steps of FIG. 53A.

Referring to FIGS. 53A-53C, a first retro-stepped dielectric material portion 165, first dielectric pillar structures 175, and various first-tier openings (149, 129, 181, 381, 481, 881, 981) can be subsequently formed. FIG. 53A is a vertical cross-sectional view of the third exemplary structure after formation of the various first-tier openings (149, 129, 181, 381, 481, 881, 981). FIG. 53B is a plan view of a first configuration of the third exemplary structure of FIG. 53A in which all first-tier openings (149, 129, 181, 381, 481, 881, 981) have the same width (e.g., same diameter). FIG. 53C is a plan view of a second configuration of the third exemplary structure of FIG. 53A in which some first-tier openings (149, 129) have a smaller width (e.g., diameter) than one first-tier openings (381, 481, 881, 981).

For example, a dielectric fill material (such as undoped silicate glass material having a lower etch range than the material of the liner 164) can be deposited to fill the first stepped cavity and the first pillar cavities. Excess portions of the dielectric fill material can be removed from above the horizontal plane including the top surface of the first insulating cap layer 170. A remaining portion of the dielectric fill material that fills the region overlying the first stepped surfaces constitute a first retro-stepped dielectric material portion 165. Each remaining portion of the dielectric fill material that fills the first pillar cavities constitutes a first dielectric pillar structure 175. Each first dielectric pillar structure 175 includes a first straight sidewall extending from a topmost layer of the first alternating stack (132, 142) to a bottommost layer of the first alternating stack (132, 142) within the memory array region 100. The first silicate glass liner 164 is formed on the first stepped surfaces, and the first retro-stepped dielectric material portion 165 is formed over the first silicate glass liner 164.

The first-tier alternating stack (132, 142), the first retro-stepped dielectric material portion 165, and the first dielectric pillar structures 175 collectively constitute a first-tier structure, which is an in-process structure that is subsequently modified. The first-tier structure (132, 142, 170, 165, 164, 175) includes a first alternating stack of first insulating layers and first spacer material layers (such as the first sacrificial material layers 142), a first retro-stepped dielectric material portion 165 overlying the first stepped surfaces of the first alternating stack (132, 142), and the first dielectric pillar structures 175. The first stepped surfaces are present in the staircase region 200. Each of the first spacer material layers can be formed as, or can be subsequently replaced with, a respective first electrically conductive layer.

The various first-tier openings (149, 129, 181, 381, 481, 881, 981) can be formed through the first-tier structure (132, 142, 170, 165, 164, 175) and into the in-process source-level material layers 10' and into the at least one second dielectric layer 768. A photoresist layer (not shown) can be applied over the first-tier structure, and can be lithographically patterned to form various openings therethrough. The pattern of openings in the photoresist layer can be transferred through the first-tier structure (132, 142, 170, 165, 164, 175) and into the in-process source-level material layers 10' and the at least one second dielectric layer 768 by a first anisotropic etch process to form the various first-tier openings (149, 129, 181, 381, 481, 881, 981) concurrently, i.e., during the first anisotropic etch process. The various first-tier openings (149, 129, 181, 381, 481, 881, 981) can include first-tier memory openings 149, first-tier support openings 129, first-tier staircase-region openings 181, first-tier plate contact openings 381, first-tier peripheral-region openings 481, first-tier interconnect-via openings 881, and first-tier array region openings 981. The first-tier peripheral-region openings 481, the first-tier interconnect-via openings 881, and the first-tier array-region openings 981 are collectively referred to as first-tier contact openings (481, 881, 981).

The first-tier memory openings 149 are openings that are formed in the memory array region 100 through each layer within the first alternating stack (132, 142) and are subsequently employed to form memory stack structures therein. The first-tier memory openings 149 can be formed in clusters of first-tier memory openings 149 that are laterally spaced apart. Each cluster of first-tier memory openings 149 can be formed as a two-dimensional array of first-tier memory openings 149.

The first-tier support openings 129 are openings that are formed in the staircase region 200 and are subsequently employed to form support structures that are subsequently employed to provide structural support to the second exemplary structure during replacement of sacrificial material layers with electrically conductive layers. In case the first spacer materials are formed as first electrically conductive layers, the first-tier support openings 129 can be omitted. A subset of the first-tier support openings 129 can be formed through horizontal surfaces of the first stepped surfaces of the first alternating stack (132, 142).

The first-tier staircase-region openings 181 are openings that are formed in the staircase region 200 and are subsequently employed to form staircase-region contact via structures that interconnect a respective pair of an underlying lower-level metal interconnect structure 780 (such as a topmost lower-level metal line structure 788) and an electrically conductive layer (such as a word line or select gate electrode which can be formed as one of the spacer material layers or can be formed by replacement of a sacrificial material layer within the electrically conductive layer). A subset of the first-tier staircase-region openings 181 that is formed through the first retro-stepped dielectric material portion 165 can be formed through a respective horizontal surface of the first stepped surfaces. Further, each of the first-tier staircase-region openings 181 can be formed directly above (i.e., above, and with an areal overlap with) a respective one of the lower-level metal interconnect structure 780.

The first-tier plate contact openings 381 may be formed in the staircase region 200, or may be formed through a respective one of the first dielectric pillar structures 175 in the memory array region 100. The first-tier plate contact openings 381 can be formed in an area in which the in-process source-level material layers 10' and the conductive plate layer 6 are present. The first-tier plate contact openings 381 can be formed to expose the conductive plate layer 6.

The first-tier interconnect-via openings 881 can be formed within a respective area of the staircase region 200 that contains an opening in the optional conductive plate layer 6 and in-process source-level material layers 10'. Each first-tier interconnect-via opening 881 can be formed directly on a respective one of the lower-level metal interconnect structure 780.

The first-tier array-region openings 981 can be formed through a respective one of the first dielectric pillar structures 175 and the at least one second dielectric layer 768. Each first-tier array-region opening 981 can be formed directly on a top surface of a respective one of the lower-level metal interconnect structure 780. The first-tier peripheral-region openings 481 can be formed within a respective area of the peripheral region 400 that contains an opening in the conductive plate layer 6 and in-process source-level material layers 10'. Thus, the in-process source-level material layers 10' and the conductive plate layer 6 do not function as an etch stop layer during the anisotropic etch process of openings 181, 481, 881 and 981, but do function as an etch stop during the concurrent anisotropic etch process of openings 129, 149 and 381.

In one embodiment, the first anisotropic etch process can include an initial etch step in which the materials of the first-tier alternating stack (132, 142) are etched concurrently with the material of the first retro-stepped dielectric material portion 165 and the first-tier dielectric pillar structures 175. The chemistry of the initial etch step can alternate to optimize etching of the first and second materials in the first-tier alternating stack (132, 142) while providing a comparable average etch rate to the material of the first retro-stepped dielectric material portion 165 and the first-tier dielectric pillar structures 175. The first anisotropic etch process can employ, for example, a series of reactive ion etch processes or a single reaction etch process (e.g., $CF_4$/$O_2$/Ar etch). The sidewalls of the various first-tier openings (149, 129, 181, 381, 481, 881, 981) can be substantially vertical, or can be tapered.

After etching through the alternating stack (132, 142) and the first retro-stepped dielectric material portion 165 and the first-tier dielectric pillar structures 175, the chemistry of a terminal portion of the first anisotropic etch process can be selected to etch through the dielectric material(s) of the at least one second dielectric layer 768 with a higher etch rate than an average etch rate for the in-process source-level material layers 10'. For example, a terminal portion of the anisotropic etch process may include a step that etches the dielectric material(s) of the at least one second dielectric layer 768 selective to a semiconductor material within a component layer in the in-process source-level material layers 10'.

In one embodiment, the terminal portion of the first anisotropic etch process can etch through the optional source-select-level conductive layer 118, the source-level insulating layer 117, the upper source-level material layer 116, the upper sacrificial liner 105, the source-level sacrificial layer 104, and the lower sacrificial liner 103, and the lower source-level material layer 112. The terminal portion of the first anisotropic etch process can include at least one etch chemistry for etching the various semiconductor materials of the in-process source-level material layers 10'.

In one embodiment, a top surface of the conductive plate layer 6 may be physically exposed at the bottom of each of the first-tier memory openings 149, first-tier support openings 129, and first-tier plate contact openings 381. Alternatively, a recessed surface of the lower source layer 112 may be physically exposed at the bottom of each of the first-tier memory openings 149, first-tier support openings 129, and first-tier plate contact openings 381. In one embodiment, a top surface of a lower-level metal interconnect structures 780 can be physically exposed at the bottom of each of the first-tier staircase-region openings 181, the first-tier peripheral-region openings 481, the first-tier interconnect-via openings 881, and the first-tier array region openings 981.

Generally, at least two types of first-tier openings (149, 129, 181, 381, 481, 881, 981) can be formed through the first-tier structure (132, 142, 170, 165, 164, 175). The at least two types of first-tier openings (149, 129, 181, 381, 481, 881, 981) can be selected from first type first-tier openings comprising first-tier memory openings 149 located in a memory array region 100, second type first-tier openings comprising first-tier support openings 129 located in the staircase region 200, and third type first-tier openings comprising first-tier staircase-region openings 181.

Any subset of the various types of the first-tier openings (149, 129, 181, 381, 481, 881, 981) may be formed concurrently employing the first anisotropic etch process and the first lithographically patterned etch mask while the complementary subset of the various types of the first-tier openings (149, 129, 181, 381, 481, 881, 981) is omitted. Alternatively, a first subset of the various types of the first-tier openings (149, 129, 181, 381, 481, 881, 981) may be formed concurrently employing the first anisotropic etch process and the first lithographically patterned etch mask, and a second subset of the various types of the first-tier openings (149, 129, 181, 381, 481, 881, 981) may be subsequently formed employing an additional anisotropic etch process and an additional lithographically patterned etch mask. Generally, formation of as many types of the first-tier openings (149, 129, 181, 381, 481, 881, 981) as possible employing the first anisotropic etch process and the first lithographically patterned etch mask can reduce the processing time and processing cost.

In one embodiment, all of the first-tier openings (149, 129, 181, 381, 481, 881, 981) are formed concurrently employing a first anisotropic etch process and a first lithographically patterned etch mask. In one embodiment, the first-tier openings (149, 129, 181, 381, 481, 881, 981) comprise first-tier peripheral-region openings 481 that extend through the first retro-stepped dielectric material portion 165 and do not extend through any layer within the first alternating stack (132, 142). In one embodiment, the first-tier openings (149, 129, 181, 381, 481, 881, 981) comprise first-tier array-region openings 981 that extend through the first dielectric pillar structure 175 and do not contact any layer within the first alternating stack (132, 142). In one embodiment, the first-tier openings (149, 129, 181, 381, 481, 881, 981) comprise first-tier plate contact openings 381 that extend through the first alternating stack (132, 142) and the in-process source-level material layers 10' and extend to a top surface of the conductive plate layer 6.

Figure 54:
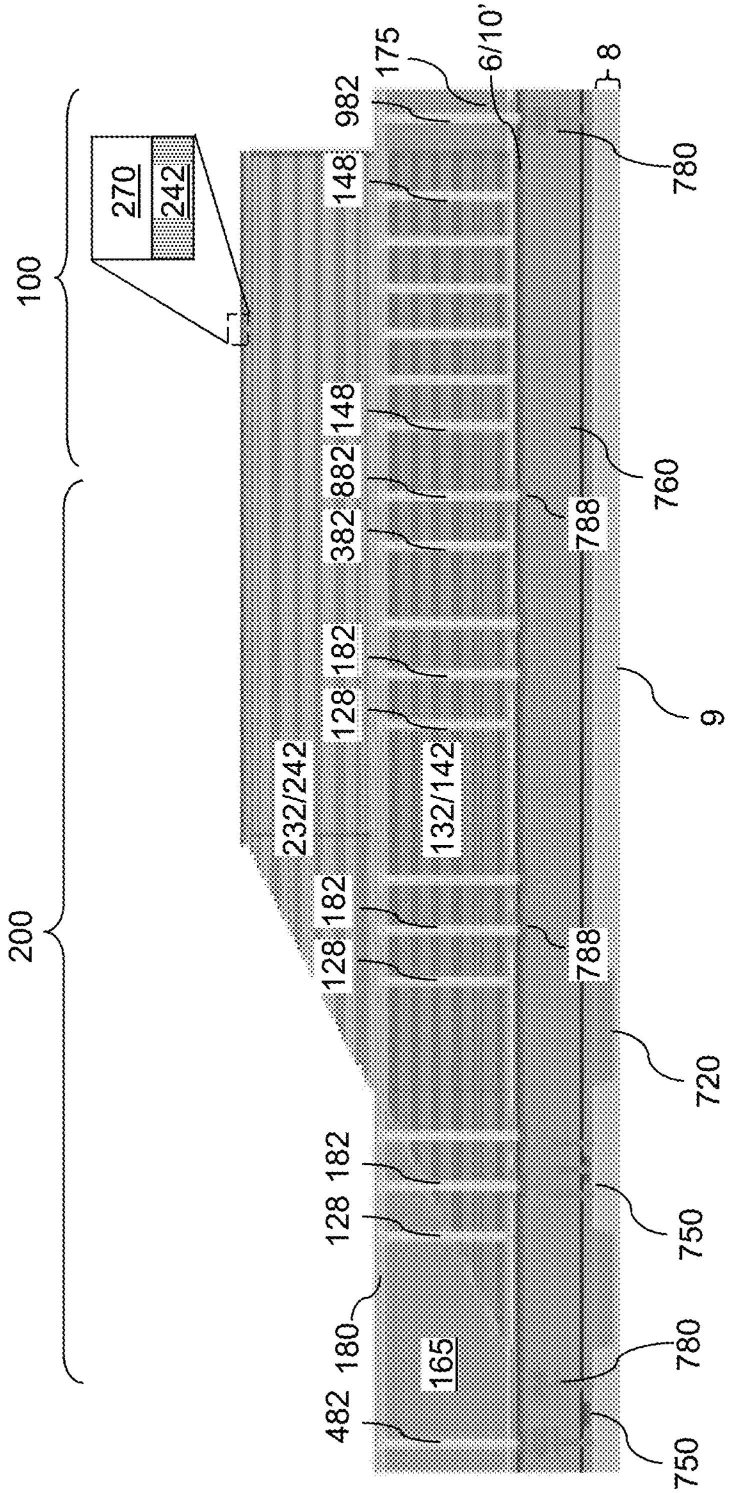
FIG. 54 is a vertical cross-sectional view of the third exemplary structure after formation of various first-tier sacrificial opening fill structures and formation and patterning a second alternating stack of second insulating layers and second sacrificial material layers according to the third embodiment of the present disclosure.

Referring to FIG. 54, various sacrificial first-tier opening fill portions (148, 128, 182, 382, 482, 882, 982) can be simultaneously formed in the various respective first-tier openings (149, 129, 181, 381, 481, 881, 981). For example, a sacrificial first-tier fill material is concurrently deposited at the same time in each of the first-tier openings (149, 129, 181, 381, 481, 881, 981). The sacrificial first-tier fill material includes a material that can be subsequently removed selective to the materials of the first insulating layers 132 and the first sacrificial material layers 142.

In one embodiment, the sacrificial first-tier fill material can include a semiconductor material such as silicon (e.g., amorphous silicon (a-Si) or polysilicon), a silicon-germanium alloy, germanium, a III-V compound semiconductor material, or a combination thereof. Optionally, a thin etch stop layer (such as a silicon oxide layer or a silicon nitride layer having a thickness in a range from 1 nm to 3 nm) may be employed prior to depositing the sacrificial first-tier fill material. The sacrificial first-tier fill material may be formed by a non-conformal deposition or a conformal deposition method.

In yet another embodiment, the sacrificial first-tier fill material can include a carbon-containing material (such as amorphous carbon or diamond-like carbon) that can be subsequently removed by ashing, or a silicon-based polymer that can be subsequently removed selective to the materials of the first alternating stack (132, 142).

Portions of the deposited sacrificial first-tier fill material can be removed from above the topmost layer of the first-tier alternating stack (132, 142). For example, the sacrificial first-tier fill material can be recessed to a top surface of the first insulating cap layer 170 employing a planarization process. The planarization process can include a recess etch, chemical mechanical planarization (CMP), or a combination thereof. The top surface of the first insulating cap layer 170 can be employed as an etch stop layer or a planarization stop layer.

Remaining portions of the sacrificial first-tier fill material comprise sacrificial first-tier opening fill portions (148, 128, 182, 382, 482, 882, 982). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. Each remaining portion of the sacrificial material in a first-tier staircase-region opening 181 constitutes a sacrificial first-tier staircase-region opening fill portion 182. Each remaining portion of the sacrificial material in a first-tier plate contact opening 381 constitutes a sacrificial first-tier plate contact opening fill portion 382.

Each remaining portion of the sacrificial material in a first-tier peripheral-region opening 481 constitutes a sacrificial first-tier peripheral-region opening fill portion 482. Each sacrificial first-tier peripheral-region opening fill portion 482 extends through the first retro-stepped dielectric material portion 165, and does not contact the first alternating stack (132, 142). Each remaining portion of the sacrificial material in a first-tier interconnect-via opening 881 constitutes a sacrificial first-tier interconnect-via opening fill portion 882. Each sacrificial first-tier interconnect-via opening fill portion 882 extends through each layer in the first alternating stack (132, 142). Each remaining portion of the sacrificial material in a first-tier array-region opening 981 constitutes a sacrificial first-tier array-region opening fill portion 982. Each sacrificial first-tier array-region opening fill portion 982 extends through each layer in the first alternating stack (132, 142).

The sacrificial first-tier interconnect-via opening fill portions 882, the sacrificial first-tier peripheral-region opening fill portions 482, and the sacrificial first-tier array-region opening fill portions 982 are collectively referred to as first-tier contact opening fill portions (382, 482, 982).

The various sacrificial first-tier opening fill portions (148, 128, 182, 382, 482, 882, 982) are concurrently formed, i.e., during a same set of processes including the deposition process that deposits the sacrificial first-tier fill material and the planarization process that removes this material from above the first alternating stack (132, 142) (such as from above the top surface of the first insulating cap layer 170). The top surfaces of the sacrificial first-tier opening fill portions (148, 128, 182, 382, 482, 882, 982) can be coplanar with the top surface of the first insulating cap layer 170. Each of the sacrificial first-tier opening fill portions (148, 128, 182, 382, 482, 882, 982) may, or may not, include cavities therein.

A first inter-tier dielectric layer 180 may be optionally deposited over the first-tier structure (132, 142, 170, 165, 164, 175) before or after forming the first-tier openings. The first inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the first inter-tier dielectric layer 180 can include phosphosilicate glass. The thickness of the first inter-tier dielectric layer 180 can be in a range from 30 nm to 300 nm, although lesser and greater thicknesses can also be employed. If the first inter-tier dielectric layer 180 is formed before forming the first-tier openings, then the first-tier openings can be expanded in the first inter-tier dielectric layer 180 for forming joint regions at the top of the first-tier opening fill portions, as shown in FIG. 5B and described above. If the first inter-tier dielectric layer 180 is formed after forming the first-tier opening fill portions (148, 128, 182, 382, 482, 882, 982), then relatively wider openings can be formed in layer 180 followed by refilling them with the fill material to form the joint regions.

A second alternating stack of second insulating layers 232 and second sacrificial material layers 242 can be formed as in the first embodiment. For example, the processing steps of FIG. 7 can be performed. Optionally, a second insulating cap layer 270 can be formed over the second alternating stack (232, 242) as in the first embodiment. A photoresist layer (not shown) can be applied over the second insulating cap layer, and can be lithographically patterned to form openings in the memory array region 100 in areas that overlie the first-tier dielectric pillar structures 175. An anisotropic etch process can be performed to etch through unmasked portions of the second insulating cap layer 270 and the second alternating stack (232, 242) employing the patterned photoresist layer as an etch mask. Second pillar cavities having straight sidewalls extending through the second alternating stack (232, 242) and the second insulating cap layer 270 can be formed within the memory array region 100 on top of a respective first-tier dielectric pillar structure 175. Before or after patterning the second pillar cavities, the second insulating cap layer 270 and the second-tier alternating stack (232, 242) can be patterned to form second stepped surfaces in the staircase region 200. The staircase region 200 can include a second stepped area in which the second stepped surfaces are formed. The second stepped surfaces can be laterally offset from the first stepped surfaces, and can be more proximal to the memory array region 100 than the first stepped surfaces are. The second stepped surfaces can be formed, for example, by forming a mask layer with an opening therein, etching a cavity within the levels of the second insulating cap layer 270, and iteratively expanding the etched area and vertically recessing the cavity by etching each pair of a second insulating layer 232 and a second sacrificial material layer 242 located directly underneath the bottom surface of the etched cavity within the etched area. In one embodiment, top surfaces of the second sacrificial material layers 242 can be physically exposed at the second stepped surfaces. The cavity overlying the second stepped surfaces is herein referred to as a second stepped cavity.

Figure 55:
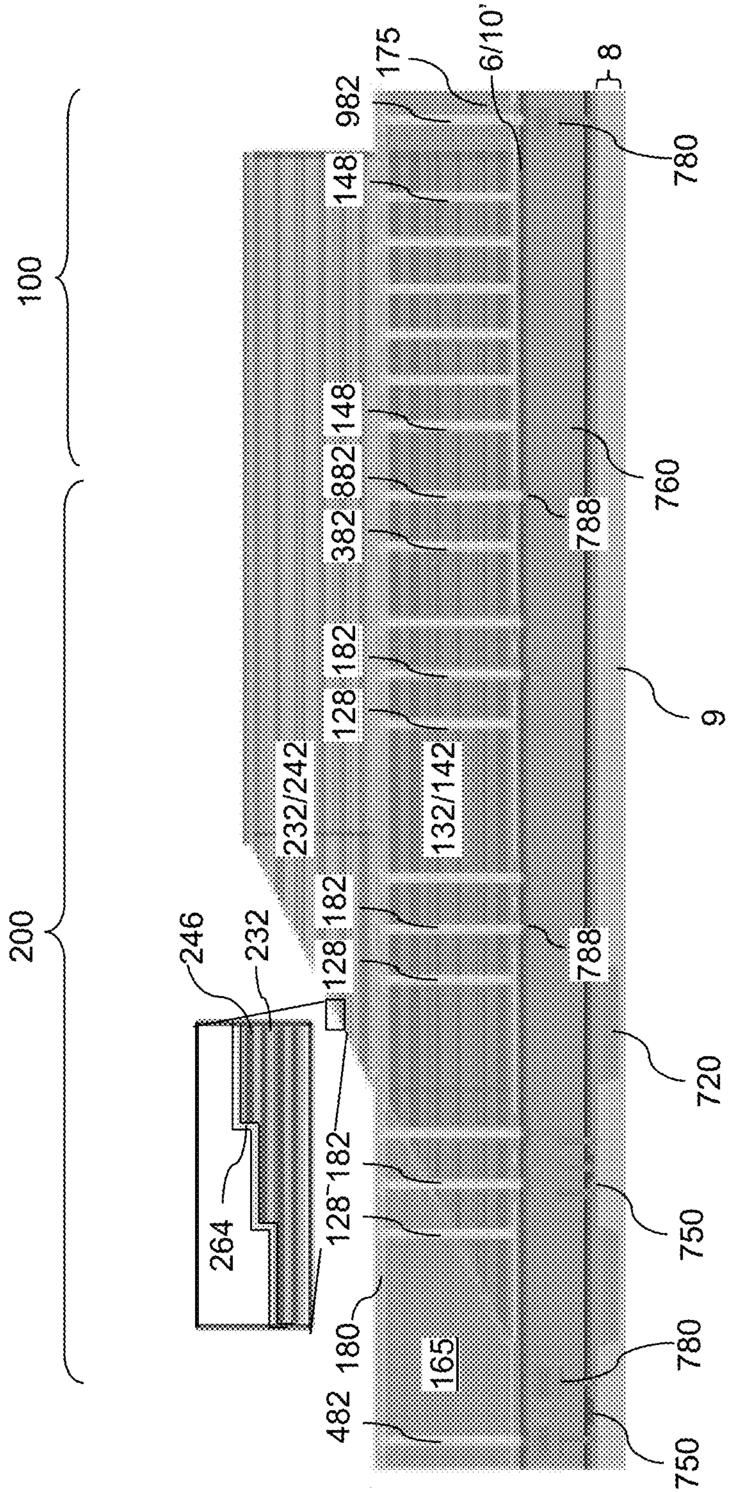
FIG. 55 is a vertical cross-sectional view of the third exemplary structure after formation of a second silicate glass liner on second stepped surfaces according to the third embodiment of the present disclosure.

Referring to FIG. 55, a second silicate glass liner 264 can be deposited by a conformal deposition process. The second silicate glass liner 264 includes a silicate glass material that provides a higher etch rate than undoped silicate glass. In one embodiment, the second insulating layers 232 can include the first silicon oxide material which is the material of the first insulating layers 132, and the second silicate glass liner 264 can include the second silicon oxide material which is the material of the first silicate glass liner 164.

For example, the second silicate glass liner 264 can include a borosilicate glass (BSG) including boron at an atomic concentration in a range from 1% to 10%, or an organosilicate glass including carbon at an atomic concentration in a range from 1% to 10% and hydrogen at an atomic concentration in a range from 0.5% to 10%. The etch rate of the material of the second silicate glass liner 264 in a 100:1 dilute hydrofluoric acid at room temperature can be at least 5 times, and preferably at least 10 times and/or at least 20 times, the etch rate of thermal silicon oxide in a 100:1 dilute hydrofluoric acid at room temperature. The second silicate glass liner 264 can be deposited by a conformal deposition process such as low pressure chemical vapor deposition or a non-conformal deposition process such as plasma enhanced chemical vapor deposition. The thickness of the horizontal portions of the second silicate glass liner 264 can be in a range from 10 nm to 100 nm, such as from 20 nm to 50 nm, although lesser and greater thicknesses can also be employed.

Figure 56:
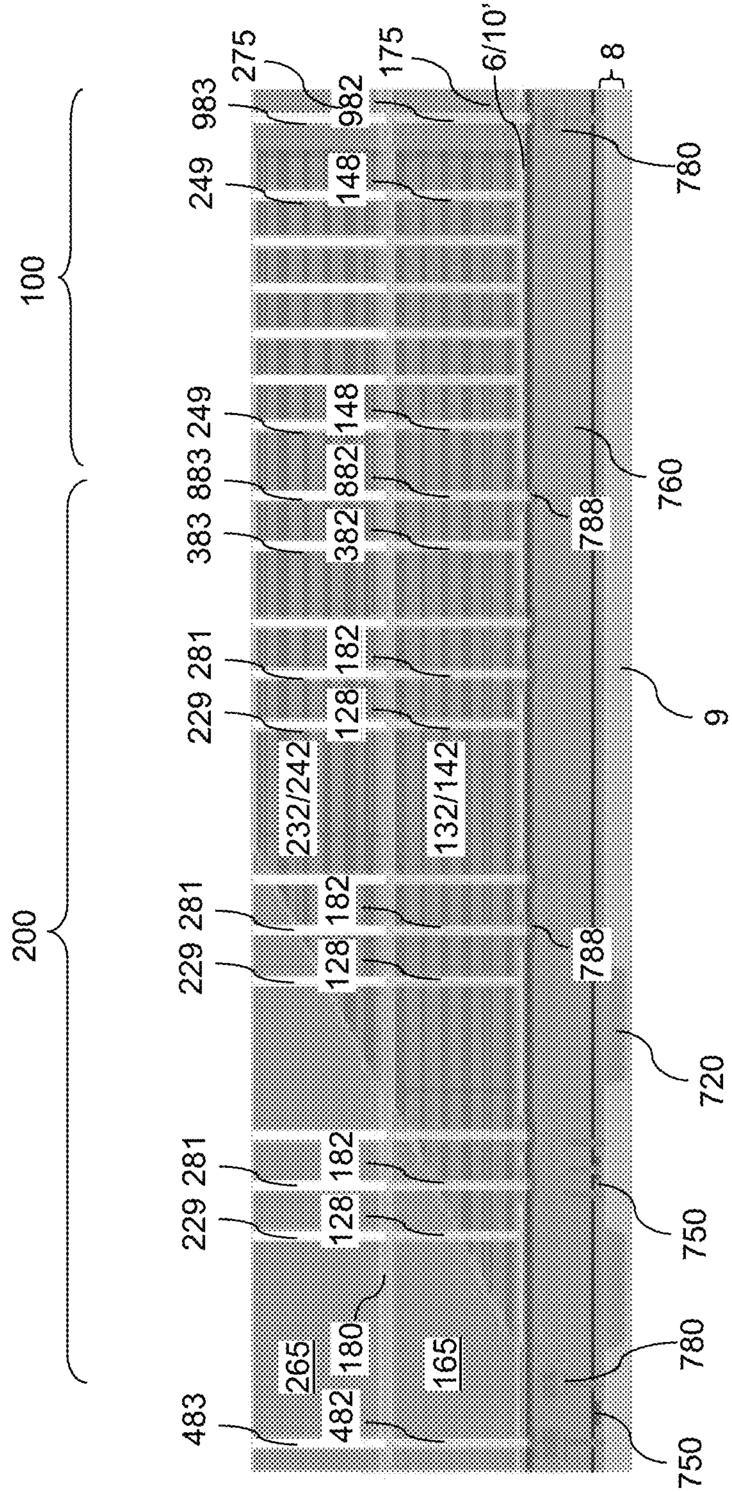
FIG. 56 is a vertical cross-sectional view of the third exemplary structure after formation of a second retro-stepped dielectric material portion and various second-tier openings according to the third embodiment of the present disclosure.

Referring to FIG. 56, a second retro-stepped dielectric material portion 265, second dielectric pillar structures 275, and various second-tier openings (249, 229, 281, 383, 483, 883, 983) can be subsequently formed. For example, a dielectric fill material (such as undoped silicate glass or doped silicate glass) can be deposited to fill the second stepped cavity and the second pillar cavities. Excess portions of the dielectric fill material can be removed from above the horizontal plane including the top surface of the second insulating cap layer 270. A remaining portion of the dielectric fill material that fills the region overlying the second stepped surfaces constitute a second retro-stepped dielectric material portion 265. Each remaining portion of the dielectric fill material that fills the second pillar cavities constitutes a second dielectric pillar structure 275. Each second dielectric pillar structure 275 includes a second straight sidewall extending from a topmost layer of the second alternating stack (232, 242) to a bottommost layer of the second alternating stack (232, 242) within the memory array region 100. The second dielectric pillar structures 275 can be formed on the top surfaces of the first dielectric pillar structures 175. The second silicate glass liner 264 is located on the second stepped surfaces, and the second retro-stepped dielectric material portion 265 is formed over the second silicate glass liner 264.

The second-tier alternating stack (232, 242), the second retro-stepped dielectric material portion 265, and the second dielectric pillar structures 275 collectively constitute a second-tier structure, which is an in-process structure that is subsequently modified. The second-tier structure (232, 242, 270, 265, 264, 275) includes a second alternating stack of second insulating layers and second spacer material layers (such as the second sacrificial material layers 242), a second retro-stepped dielectric material portion 265 overlying the second stepped surfaces of the second alternating stack (232, 242), and the second dielectric pillar structures 275. The second stepped surfaces are present in the staircase region 200. Each of the second spacer material layers can be formed as, or can be subsequently replaced with, a respective second electrically conductive layer.

The various second-tier openings (249, 229, 281, 383, 483, 883, 983) can be formed through the second-tier structure (232, 242, 270, 265, 264, 275) and on the top surfaces of the various sacrificial first-tier opening fill portions (148, 128, 182, 382, 482, 882, 982). A photoresist layer (not shown) can be applied over the second-tier structure, and can be lithographically patterned to form various openings therethrough. The pattern of openings in the photoresist layer can be transferred through the second-tier structure (232, 242, 270, 265, 264, 275) by a second anisotropic etch process to form the various second-tier openings (249, 229, 281, 383, 483, 883, 983) concurrently, i.e., during the second anisotropic etch process. The various second-tier openings (249, 229, 281, 383, 483, 883, 983) can include second-tier memory openings 249, second-tier support openings 229, second-tier staircase-region openings 281, second-tier plate contact openings 383, second-tier peripheral-region openings 483, second-tier interconnect-via openings 883, and second-tier array region openings 983. The second-tier peripheral-region openings 483, the second-tier interconnect-via openings 883, and the second-tier array-region openings 983 are collectively referred to as second-tier contact openings (483, 883, 983).

The second-tier memory openings 249 are openings that are formed in the memory array region 100 through each layer within the second alternating stack (232, 242) and are subsequently employed to form memory stack structures therein. The second-tier memory openings 249 can be formed in clusters of second-tier memory openings 249 that are laterally spaced apart. Each cluster of second-tier memory openings 249 can be formed as a two-dimensional array of second-tier memory openings 249. Each second-tier memory opening 249 can be formed on a top surface of a respective sacrificial first-tier memory opening fill portion 148.

The second-tier support openings 229 are openings that are formed in the staircase region 200 and are subsequently employed to form support structures that are subsequently employed to provide structural support to the second exemplary structure during replacement of sacrificial material layers with electrically conductive layers. In case the second spacer materials are formed as second electrically conductive layers, the second-tier support openings 229 can be omitted. A subset of the second-tier support openings 229 can be formed through horizontal surfaces of the second stepped surfaces of the second alternating stack (232, 242). Each second-tier support opening 229 can be formed on a top surface of a respective sacrificial first-tier support opening fill portion 128.

The second-tier staircase-region openings 281 are openings that are formed in the staircase region 200 and are subsequently employed to form staircase-region contact via structures that interconnect a respective pair of an underlying lower-level metal interconnect structure 780 (such as a topmost lower-level metal line structure 788) and an electrically conductive layer (which can be formed as one of the spacer material layers or can be formed by replacement of a sacrificial material layer within the electrically conductive layer). A subset of the second-tier staircase-region openings 281 that is formed through the second retro-stepped dielectric material portion 265 can be formed through a respective horizontal surface of the second stepped surfaces. Further, each of the second-tier staircase-region openings 281 can be formed directly on a top surface of a respective sacrificial first-tier staircase-region opening fill portion 182.

The second-tier plate contact openings 383 may be formed in the staircase region 200, or may be formed through a respective one of the second dielectric pillar structures 275 in the memory array region 100. The second-tier plate contact openings 383 can be formed on a top surface of a sacrificial first-tier plate contact opening fill portion 382.

The second-tier interconnect-via openings 883 can be formed within a respective area of the staircase region 200 on a top surface of a respective sacrificial first-tier interconnect-via opening fill portion 882. The second-tier array-region openings 983 can be formed through a respective one of the second dielectric pillar structures 275 on a top surface of a respective sacrificial first-tier array-region opening fill portion 982. The second-tier peripheral-region openings 483 can be formed within a respective area of the peripheral region 400 through the second retro-stepped dielectric material portion 265 on a top surface of a respective sacrificial first-tier peripheral-region opening fill portion 482.

In one embodiment, the second anisotropic etch process can include an initial etch step in which the materials of the second-tier alternating stack (232, 242) are etched concurrently with the material of the second retro-stepped dielectric material portion 265 and the second-tier dielectric pillar structures 275. The chemistry of the initial etch step can alternate to optimize etching of the second and second materials in the second-tier alternating stack (232, 242) while providing a comparable average etch rate to the material of the second retro-stepped dielectric material portion 265 and the second-tier dielectric pillar structures 275. The second anisotropic etch process can employ, for example, a series of reactive ion etch processes or a single reaction etch process (e.g., $CF_4/O_2/Ar$ etch). The sidewalls of the various second-tier openings (249, 229, 281, 383, 483, 883, 983) can be substantially vertical, or can be tapered.

Generally, at least two types of second-tier openings (249, 229, 281, 383, 483, 883, 983) can be formed through the second-tier structure (232, 242, 270, 265, 264, 275). The at least two types of second-tier openings (249, 229, 281, 383, 483, 883, 983) can be selected from first type second-tier openings comprising second-tier memory openings 249 located in a memory array region 100, second type second-tier openings comprising second-tier support openings 229 located in the staircase region 200, and third type second-tier openings comprising second-tier staircase-region openings 281.

Any subset of the various types of the second-tier openings (249, 229, 281, 383, 483, 883, 983) may be formed concurrently employing the second anisotropic etch process and the second lithographically patterned etch mask while the complementary subset of the various types of the second-tier openings (249, 229, 281, 383, 483, 883, 983) is omitted. Alternatively, a second subset of the various types of the second-tier openings (249, 229, 281, 383, 483, 883, 983) may be formed concurrently employing the second anisotropic etch process and the second lithographically patterned etch mask, and a second subset of the various types of the second-tier openings (249, 229, 281, 383, 483, 883, 983) may be subsequently formed employing an additional anisotropic etch process and an additional lithographically patterned etch mask. Generally, formation of as many types of the second-tier openings (249, 229, 281, 383, 483, 883, 983) as possible employing the second anisotropic etch process and the second lithographically patterned etch mask can reduce the processing time and processing cost.

In one embodiment, all of the second-tier openings (249, 229, 281, 383, 483, 883, 983) are formed concurrently employing a second anisotropic etch process and a second lithographically patterned etch mask. In one embodiment, the second-tier openings (249, 229, 281, 383, 483, 883, 983) comprise second-tier peripheral-region openings 483 that extend through the second retro-stepped dielectric material portion 265 and does not extend through any layer within the second alternating stack (232, 242). In one embodiment, the second-tier openings (249, 229, 281, 383, 483, 883, 983) comprise second-tier array-region openings 983 that extend through the second dielectric pillar structure 275 and does not contact any layer within the second alternating stack (232, 242).

Figure 57:
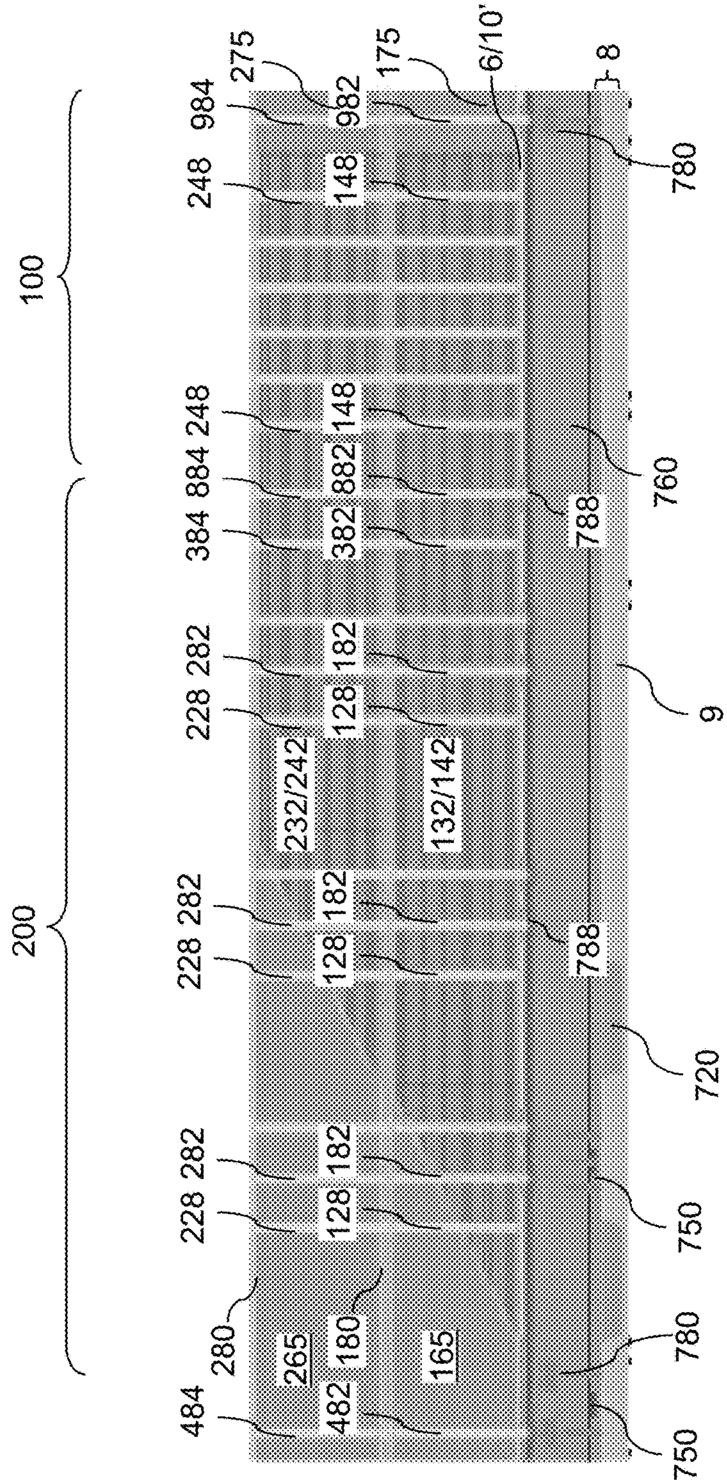
FIG. 57 is a vertical cross-sectional view of the third exemplary structure after formation of various second-tier sacrificial opening fill structures according to the third embodiment of the present disclosure.

Referring to FIG. 57, various sacrificial second-tier opening fill portions (248, 228, 282, 384, 484, 884, 984) can be simultaneously formed in the various second-tier openings (249, 229, 281, 383, 483, 883, 983). For example, a sacrificial second-tier fill material is concurrently deposited at the same time in each of the second-tier openings (249, 229, 281, 383, 483, 883, 983). The sacrificial second-tier fill material includes a material that can be subsequently removed selective to the materials of the second insulating layers 232 and the second sacrificial material layers 242. The sacrificial second-tier fill material can be selected from any material that can be selected for the sacrificial first-tier fill material. The sacrificial second-tier fill material may be the same as, or may be different from, the sacrificial first-tier fill material.

Portions of the deposited sacrificial second-tier fill material can be removed from above the topmost layer of the second-tier alternating stack (232, 242), such as from above the second insulating cap layer 270. For example, the sacrificial second-tier fill material can be recessed to a top surface of the second insulating cap layer 270 employing a planarization process. The planarization process can include a recess etch, chemical mechanical planarization (CMP), or a combination thereof. The top surface of the second insulating cap layer 270 can be employed as an etch stop layer or a planarization stop layer.

Remaining portions of the sacrificial second-tier fill material comprise sacrificial second-tier opening fill portions (249, 229, 281, 383, 483, 883, 983). Specifically, each remaining portion of the sacrificial material in a second-tier memory opening 249 constitutes a sacrificial second-tier memory opening fill portion 248. Each remaining portion of the sacrificial material in a second-tier support opening 229 constitutes a sacrificial second-tier support opening fill portion 228. Each remaining portion of the sacrificial material in a second-tier staircase-region opening 281 constitutes a sacrificial second-tier staircase-region opening fill portion 282. Each remaining portion of the sacrificial material in a second-tier plate contact opening 383 constitutes a sacrificial second-tier plate contact opening fill portion 384.

Each remaining portion of the sacrificial material in a second-tier peripheral-region opening 483 constitutes a sacrificial second-tier peripheral-region opening fill portion 484. Each sacrificial second-tier peripheral-region opening fill portion 484 extends through the second retro-stepped dielectric material portion 265, and does not contact the second alternating stack (232, 242). Each remaining portion of the sacrificial material in a second-tier interconnect-via opening 883 constitutes a sacrificial second-tier interconnect-via opening fill portion 884. Each sacrificial second-tier interconnect-via opening fill portion 884 extends through each layer in the second alternating stack (232, 242). Each remaining portion of the sacrificial material in a second-tier array-region opening 983 constitutes a sacrificial second-tier array-region opening fill portion 984. Each sacrificial second-tier array-region opening fill portion 984 extends through each layer in the second alternating stack (232, 242).

The sacrificial second-tier interconnect-via opening fill portions 884, the sacrificial second-tier peripheral-region opening fill portions 484, and the sacrificial second-tier array-region opening fill portions 984 are collectively referred to as second-tier contact opening fill portions (384, 484, 984).

The various sacrificial second-tier opening fill portions (248, 228, 282, 384, 484, 884, 984) are concurrently formed, i.e., during a same set of processes including the deposition process that deposits the sacrificial second-tier fill material and the planarization process that removes this material from above the second alternating stack (232, 242) (such as from above the top surface of the second insulating cap layer 270). The top surfaces of the sacrificial second-tier opening fill portions (248, 228, 282, 384, 484, 884, 984) can be coplanar with the top surface of the second insulating cap layer 270. Each of the sacrificial second-tier opening fill portions (248, 228, 282, 384, 484, 884, 984) may, or may not, include cavities therein.

A second inter-tier dielectric layer 280 may be optionally deposited over the second-tier structure (232, 242, 270, 265, 264, 275) before or after forming the second-tier openings. The second inter-tier dielectric layer 280 includes a dielectric material such as silicon oxide. In one embodiment, the second inter-tier dielectric layer 280 can include a doped silicate glass having a greater etch rate than the material of the second insulating layers 232 (which can include an undoped silicate glass). For example, the second inter-tier dielectric layer 280 can include phosphosilicate glass. The thickness of the second inter-tier dielectric layer 280 can be in a range from 30 nm to 300 nm, although lesser and greater thicknesses can also be employed. If the second inter-tier dielectric layer 280 is formed before forming the second-tier openings, then the first-tier openings can be expanded in the second inter-tier dielectric layer 280 for forming joint regions at the top of the second-tier opening fill portions, as shown in FIG. 5B and described above. If the second inter-tier dielectric layer 280 is formed after forming the second-tier opening fill portions, then relatively wide openings can be formed in layer 280 followed by refilling them with the fill material to form the joint regions.

Figure 58:
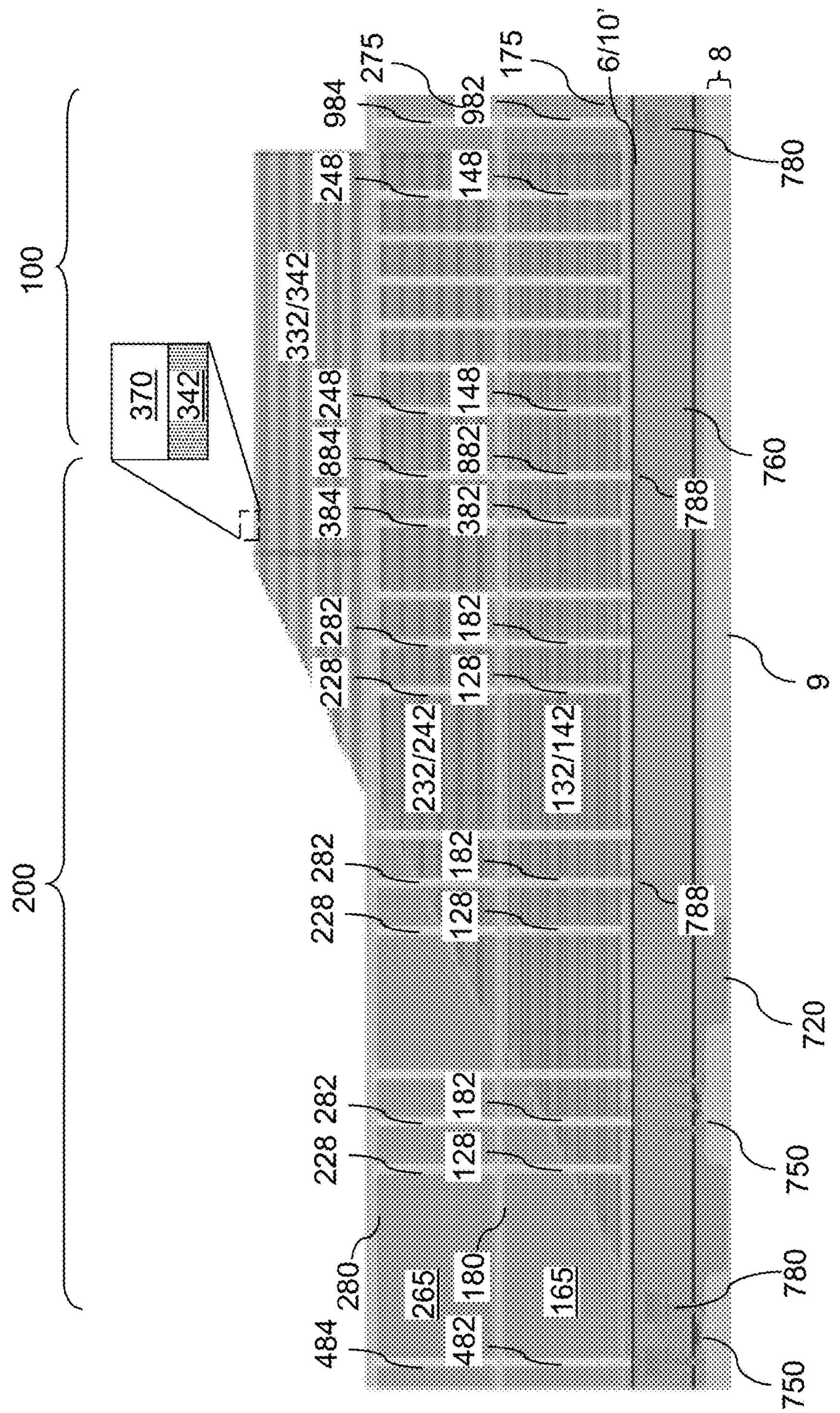
FIG. 58 is a vertical cross-sectional view of the third exemplary structure after formation and patterning a third alternating stack of third insulating layers and third sacrificial material layers according to the third embodiment of the present disclosure.

Referring to FIG. 58, a third alternating stack of third insulating layers 332 and third sacrificial material layers 342 can be formed. The third insulating layers 332 can have the same composition and thickness as the first insulating layers 132. The third sacrificial material layers 342 can have the same composition and thickness as the first sacrificial material layers 142. Optionally, a third insulating cap layer 370 can be formed over the third alternating stack (232, 242).

A photoresist layer (not shown) can be applied over the third insulating cap layer 370, and can be lithographically patterned to form openings in the memory array region 100 in areas that overlie the second-tier dielectric pillar structures 275. An anisotropic etch process can be performed to etch through unmasked portions of the third insulating cap layer 370 and the third alternating stack (332, 342) employing the patterned photoresist layer as an etch mask. Third pillar cavities having straight sidewalls extending through the second alternating stack (232, 242) and the third insulating cap layer 370 can be formed within the memory array region 100 on top of a respective second-tier dielectric pillar structure 275. Before or after patterning the third pillar cavities, the third insulating cap layer 370 and the third-tier alternating stack (332, 342) can be patterned to form third stepped surfaces in the staircase region 200. The staircase region 200 can include a third stepped area in which the third stepped surfaces are formed. The third stepped surfaces can be laterally offset from the second stepped surfaces, and can be more proximal to the memory array region 100 than the second stepped surfaces are. The third stepped surfaces can be formed, for example, by forming a mask layer with an opening therein, etching a cavity within the levels of the third insulating cap layer 370, and iteratively expanding the etched area and vertically recessing the cavity by etching each pair of a third insulating layer 332 and a third sacrificial material layer 342 located directly underneath the bottom surface of the etched cavity within the etched area. In one embodiment, top surfaces of the third sacrificial material layers 342 can be physically exposed at the third stepped surfaces. The cavity overlying the third stepped surfaces is herein referred to as a third stepped cavity.

Figure 59:
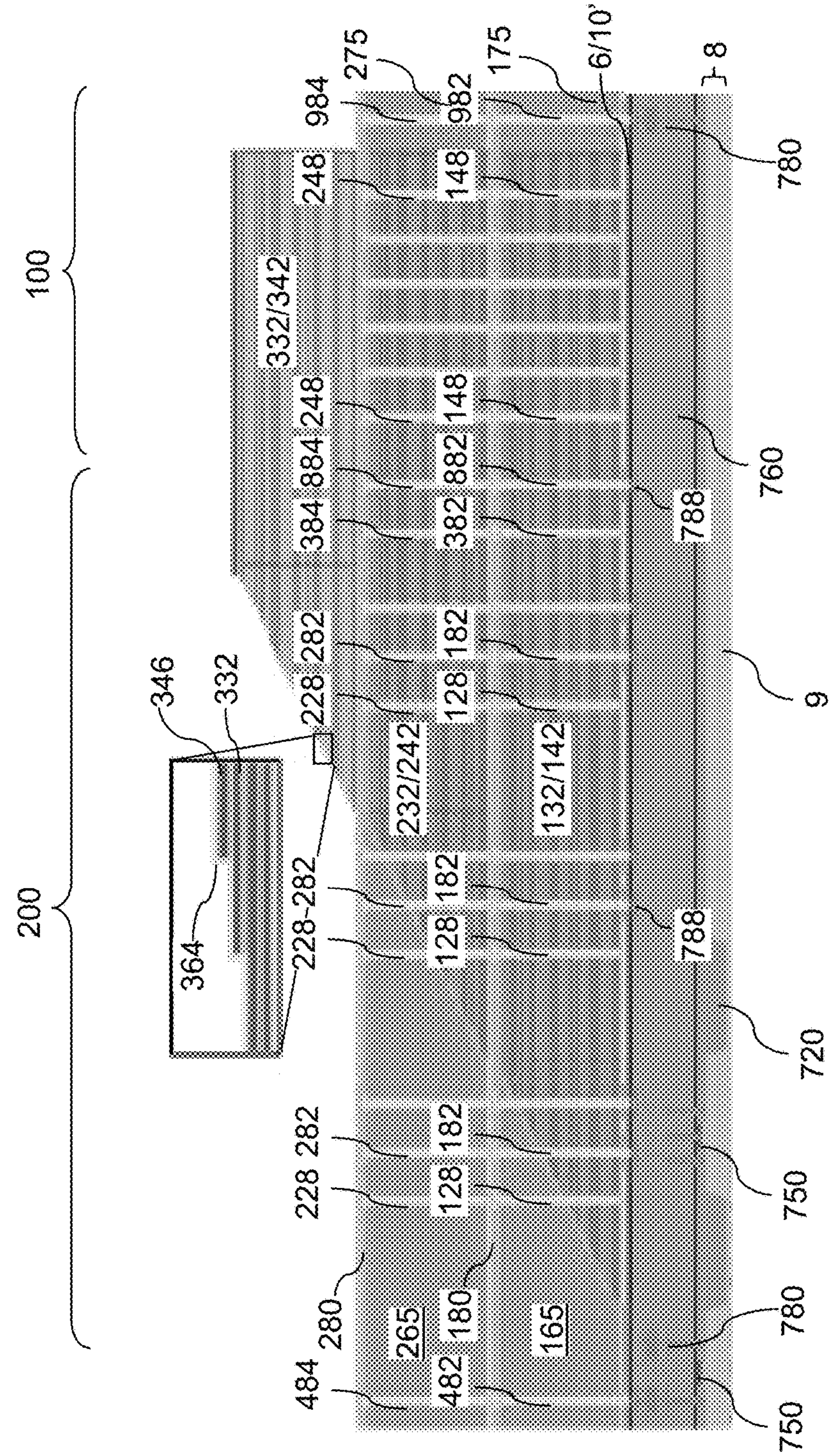
FIG. 59 is a vertical cross-sectional view of the third exemplary structure after formation of a third silicate glass liner on third stepped surfaces according to the third embodiment of the present disclosure.

Referring to FIG. 59, a third silicate glass liner 364 can be deposited by a conformal deposition process. The third silicate glass liner 364 includes a silicate glass material that provides a higher etch rate than undoped silicate glass. In one embodiment, the third insulating layers 332 can include the first silicon oxide material which is the material of the first and second insulating layers (132, 232), and the third silicate glass liner 364 can include the second silicon oxide material which is the material of the first and second silicate glass liners (164, 264).

For example, the third silicate glass liner 364 can include a borosilicate glass (BSG) including boron at an atomic concentration in a range from 1% to 10%, or an organosilicate glass including carbon at an atomic concentration in a range from 1% to 10% and hydrogen at an atomic concentration in a range from 0.5% to 10%. The etch rate of the material of the third silicate glass liner 364 in a 100:1 dilute hydrofluoric acid at room temperature can be at least 5 times, and preferably at least 10 times and/or at least 30 times, the etch rate of thermal silicon oxide in a 100:1 dilute hydrofluoric acid at room temperature. The third silicate glass liner 364 can be deposited by a conformal deposition process such as low pressure chemical vapor deposition or a non-conformal deposition process such as plasma enhanced chemical vapor deposition. The thickness of the horizontal portions of the third silicate glass liner 364 can be in a range from 10 nm to 100 nm, such as from 30 nm to 50 nm, although lesser and greater thicknesses can also be employed.

Figure 60:
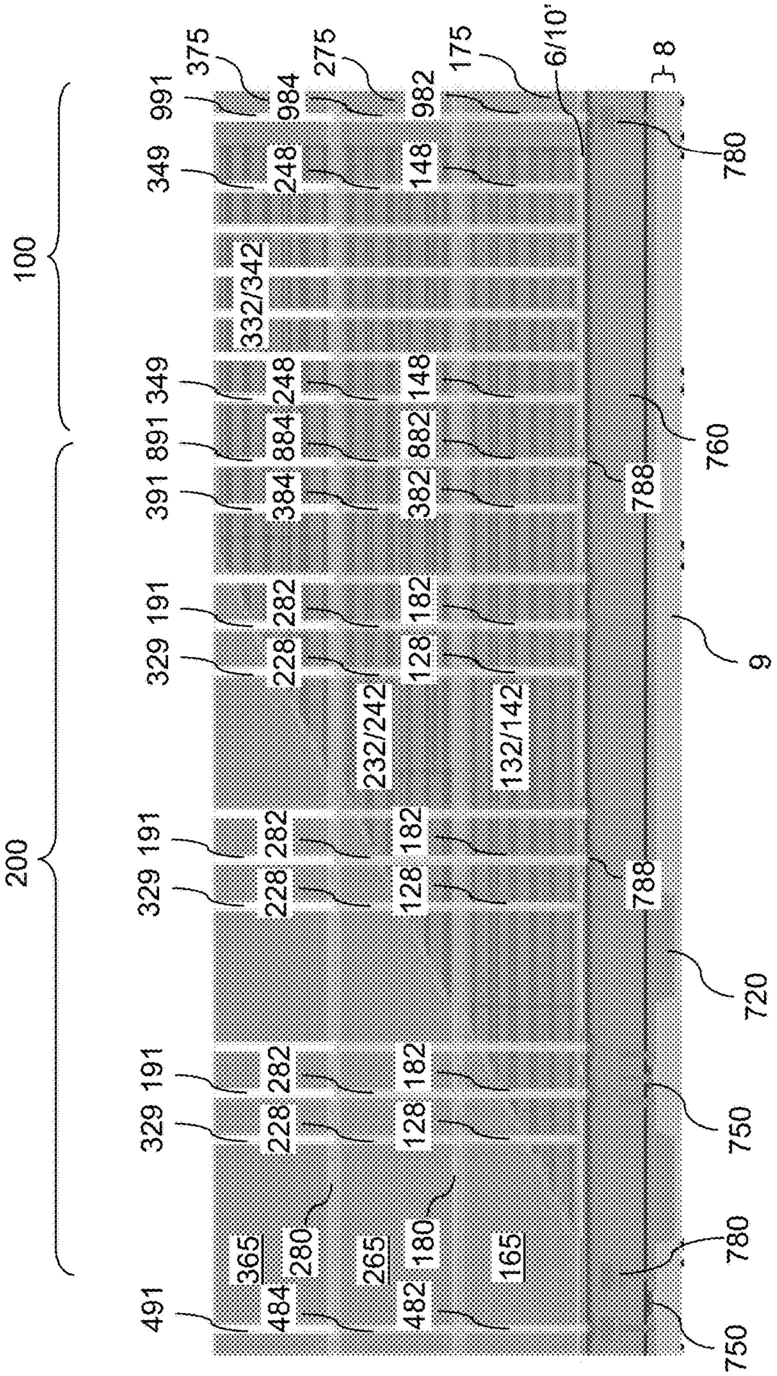
FIG. 60 is a vertical cross-sectional view of the third exemplary structure after formation of a third retro-stepped dielectric material portion and various third-tier openings according to the third embodiment of the present disclosure.

Referring to FIG. 60, a third retro-stepped dielectric material portion 365, third dielectric pillar structures 375, and various third-tier openings (349, 329, 191, 391, 491, 891, 991) can be subsequently formed. For example, a dielectric fill material (such as undoped silicate glass or doped silicate glass) can be deposited to fill the third stepped cavity and the third pillar cavities. Excess portions of the dielectric fill material can be removed from above the horizontal plane including the top surface of the third insulating cap layer 370. A remaining portion of the dielectric fill material that fills the region overlying the third stepped surfaces constitute a third retro-stepped dielectric material portion 365. Each remaining portion of the dielectric fill material that fills the third pillar cavities constitutes a third dielectric pillar structure 375. Each third dielectric pillar structure 375 includes a third straight sidewall extending from a topmost layer of the third alternating stack (332, 342) to a bottommost layer of the third alternating stack (332, 342) within the memory array region 100. The third dielectric pillar structures 375 can be formed on the top surfaces of the second dielectric pillar structures 275. The third silicate glass liner 364 is located on the third stepped surfaces, and the third retro-stepped dielectric material portion 365 is formed over the third silicate glass liner 364.

The third-tier alternating stack (332, 342), the third retro-stepped dielectric material portion 365, and the third dielectric pillar structures 375 collectively constitute a third-tier structure, which is an in-process structure that is subsequently modified. The third-tier structure (332, 342, 370, 365, 364, 375) includes a third alternating stack of third insulating layers and third spacer material layers (such as the third sacrificial material layers 342), a third retro-stepped dielectric material portion 365 overlying the third stepped surfaces of the third alternating stack (332, 342), and the third dielectric pillar structures 375. The third stepped surfaces are present in the staircase region 200. Each of the third spacer material layers can be formed as, or can be subsequently replaced with, a respective third electrically conductive layer.

The various third-tier openings (349, 329, 191, 391, 491, 891, 991) can be formed through the third-tier structure (332, 342, 370, 365, 364, 375) and on the top surfaces of the various sacrificial second-tier opening fill portions (248, 228, 282, 384, 484, 884, 984). A photoresist layer (not shown) can be applied over the third-tier structure, and can be lithographically patterned to form various openings therethrough. The pattern of openings in the photoresist layer can be transferred through the third-tier structure (332, 342, 370, 365, 364, 375) by a third anisotropic etch process to form the various third-tier openings (349, 329, 191, 391, 491, 891, 991) concurrently, i.e., during the third anisotropic etch process. The various third-tier openings (349, 329, 191, 391, 491, 891, 991) can include third-tier memory openings 349, third-tier support openings 329, third-tier staircase-region openings 191, third-tier plate contact openings 391, third-tier peripheral-region openings 491, third-tier interconnect-via openings 891, and third-tier array region openings 991. The third-tier peripheral-region openings 491, the third-tier interconnect-via openings 891, and the third-tier array-region openings 991 are collectively referred to as third-tier contact openings (491, 891, 991).

The third-tier memory openings 349 are openings that are formed in the memory array region 100 through each layer within the third alternating stack (332, 342) and are subsequently employed to form memory stack structures therein. The third-tier memory openings 349 can be formed in clusters of third-tier memory openings 349 that are laterally spaced apart. Each cluster of third-tier memory openings 349 can be formed as a two-dimensional array of third-tier memory openings 349. Each third-tier memory opening 349 can be formed on a top surface of a respective sacrificial second-tier memory opening fill portion 248.

The third-tier support openings 329 are openings that are formed in the staircase region 200 and are subsequently employed to form support structures that are subsequently employed to provide structural support to the third exemplary structure during replacement of sacrificial material layers with electrically conductive layers. In case the third spacer materials are formed as third electrically conductive layers, the third-tier support openings 329 can be omitted. A subset of the third-tier support openings 329 can be formed through horizontal surfaces of the third stepped surfaces of the third alternating stack (332, 342). Each third-tier support opening 329 can be formed on a top surface of a respective sacrificial second-tier support opening fill portion 228.

The third-tier staircase-region openings 191 are openings that are formed in the staircase region 200 and are subsequently employed to form staircase-region contact via structures that interconnect a respective pair of an underlying lower-level metal interconnect structure 780 (such as a topmost lower-level metal line structure 788) and an electrically conductive layer (which can be formed as one of the spacer material layers or can be formed by replacement of a sacrificial material layer within the electrically conductive layer). A subset of the third-tier staircase-region openings 191 that is formed through the third retro-stepped dielectric material portion 365 can be formed through a respective horizontal surface of the third stepped surfaces. Further, each of the third-tier staircase-region openings 191 can be formed directly on a top surface of a respective sacrificial second-tier staircase-region opening fill portion 282.

The third-tier plate contact openings 391 may be formed in the staircase region 200, or may be formed through a respective one of the third dielectric pillar structures 375 in the memory array region 100. The third-tier plate contact openings 391 can be formed on a top surface of a sacrificial second-tier plate contact opening fill portion 384.

The third-tier interconnect-via openings 891 can be formed within a respective area of the staircase region 200 on a top surface of a respective sacrificial second-tier interconnect-via opening fill portion 884. The third-tier array-region openings 991 can be formed through a respective one of the third dielectric pillar structures 375 on a top surface of a respective sacrificial second-tier array-region opening fill portion 984. The third-tier peripheral-region openings 491 can be formed within a respective area of the peripheral region 400 through the third retro-stepped dielectric material portion 365 on a top surface of a respective sacrificial second-tier peripheral-region opening fill portion 484.

In one embodiment, the third anisotropic etch process can include an initial etch step in which the materials of the third-tier alternating stack (332, 342) are etched concurrently with the material of the third retro-stepped dielectric material portion 365 and the third-tier dielectric pillar structures 375. The chemistry of the initial etch step can alternate to optimize etching of the third and third materials in the third-tier alternating stack (332, 342) while providing a comparable average etch rate to the material of the third retro-stepped dielectric material portion 365 and the third-tier dielectric pillar structures 375. The third anisotropic etch process can employ, for example, a series of reactive ion etch processes or a single reaction etch process (e.g., $CF_4/O_2/Ar$ etch). The sidewalls of the various third-tier openings (349, 329, 191, 391, 491, 891, 991) can be substantially vertical, or can be tapered.

Generally, at least two types of third-tier openings (349, 329, 191, 391, 491, 891, 991) can be formed through the third-tier structure (332, 342, 370, 365, 364, 375). The at least two types of third-tier openings (349, 329, 191, 391, 491, 891, 991) can be selected from first type third-tier openings comprising third-tier memory openings 349 located in a memory array region 100, second type third-tier openings comprising third-tier support openings 329 located in the staircase region 200, and third type third-tier openings comprising third-tier staircase-region openings 191.

Any subset of the various types of the third-tier openings (349, 329, 191, 391, 491, 891, 991) may be formed concurrently employing the third anisotropic etch process and the third lithographically patterned etch mask while the complementary subset of the various types of the third-tier openings (349, 329, 191, 391, 491, 891, 991) is omitted. Alternatively, a third subset of the various types of the third-tier openings (349, 329, 191, 391, 491, 891, 991) may be formed concurrently employing the third anisotropic etch process and the third lithographically patterned etch mask, and a third subset of the various types of the third-tier openings (349, 329, 191, 391, 491, 891, 991) may be subsequently formed employing an additional anisotropic etch process and an additional lithographically patterned etch mask. Generally, formation of as many types of the third-tier openings (349, 329, 191, 391, 491, 891, 991) as possible employing the third anisotropic etch process and the third lithographically patterned etch mask can reduce the processing time and processing cost.

In one embodiment, all of the third-tier openings (349, 329, 191, 391, 491, 891, 991) are formed concurrently employing a third anisotropic etch process and a third lithographically patterned etch mask. In one embodiment, the third-tier openings (349, 329, 191, 391, 491, 891, 991) comprise third-tier peripheral-region openings 491 that extend through the third retro-stepped dielectric material portion 365 and does not extend through any layer within the third alternating stack (332, 342). In one embodiment, the third-tier openings (349, 329, 191, 391, 491, 891, 991) comprise third-tier array-region openings 991 that extend through the third dielectric pillar structure 375 and does not contact any layer within the third alternating stack (332, 342).

Figure 61:
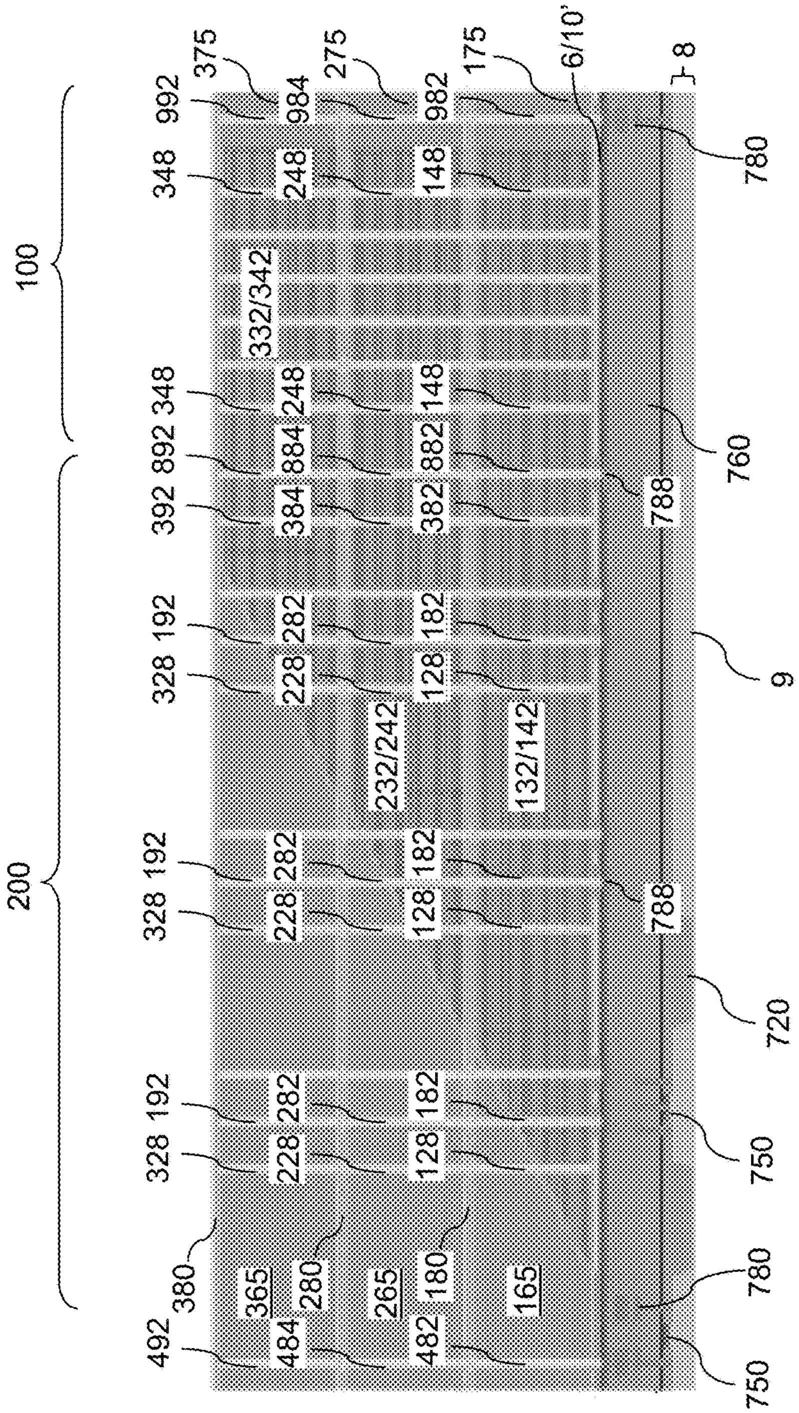
FIG. 61 is a vertical cross-sectional view of the third exemplary structure after formation of various third-tier sacrificial opening fill structures according to the third embodiment of the present disclosure.

Referring to FIG. 61, various sacrificial third-tier opening fill portions (348, 328, 192, 392, 492, 892, 992) can be simultaneously formed in the various third-tier openings (349, 329, 191, 391, 491, 891, 991). For example, a sacrificial third-tier fill material is concurrently deposited at the same time in each of the third-tier openings (349, 329, 191, 391, 491, 891, 991). The sacrificial third-tier fill material includes a material that can be subsequently removed selective to the materials of the third insulating layers 332 and the third sacrificial material layers 342. The sacrificial third-tier fill material can be selected from any material that can be selected for the sacrificial second-tier fill material. The sacrificial third-tier fill material may be the same as, or may be different from, the sacrificial second-tier fill material.

Portions of the deposited sacrificial third-tier fill material can be removed from above the topmost layer of the third-tier alternating stack (332, 342), such as from above the third insulating cap layer 370. For example, the sacrificial third-tier fill material can be recessed to a top surface of the third insulating cap layer 370 employing a planarization process. The planarization process can include a recess etch, chemical mechanical planarization (CMP), or a combination thereof. The top surface of the third insulating cap layer 370 can be employed as an etch stop layer or a planarization stop layer.

Remaining portions of the sacrificial third-tier fill material comprise sacrificial third-tier opening fill portions (348, 328, 192, 392, 492, 892, 992). Specifically, each remaining portion of the sacrificial material in a third-tier memory opening 349 constitutes a sacrificial third-tier memory opening fill portion 348. Each remaining portion of the sacrificial material in a third-tier support opening 329 constitutes a sacrificial third-tier support opening fill portion 328. Each remaining portion of the sacrificial material in a third-tier staircase-region opening 191 constitutes a sacrificial third-tier staircase-region opening fill portion 192. Each remaining portion of the sacrificial material in a third-tier plate contact opening 391 constitutes a sacrificial third-tier plate contact opening fill portion 392.

Each remaining portion of the sacrificial material in a third-tier peripheral-region opening 491 constitutes a sacrificial third-tier peripheral-region opening fill portion 492. Each sacrificial third-tier peripheral-region opening fill portion 492 extends through the third retro-stepped dielectric material portion 365, and does not contact the third alternating stack (332, 342). Each remaining portion of the sacrificial material in a third-tier interconnect-via opening 891 constitutes a sacrificial third-tier interconnect-via opening fill portion 892. Each sacrificial third-tier interconnect-via opening fill portion 892 extends through each layer in the third alternating stack (332, 342). Each remaining portion of the sacrificial material in a third-tier array-region opening 991 constitutes a sacrificial third-tier array-region opening fill portion 992. Each sacrificial third-tier array-region opening fill portion 992 extends through each layer in the third alternating stack (332, 342).

The sacrificial third-tier interconnect-via opening fill portions 892, the sacrificial third-tier peripheral-region opening fill portions 492, and the sacrificial third-tier array-region opening fill portions 992 are collectively referred to as third-tier contact opening fill portions (392, 492, 992).

The various sacrificial third-tier opening fill portions (348, 328, 192, 392, 492, 892, 992) are concurrently formed, i.e., during a same set of processes including the deposition process that deposits the sacrificial third-tier fill material and the planarization process that removes this material from above the third alternating stack (332, 342) (such as from above the top surface of the third insulating cap layer 370). The top surfaces of the sacrificial third-tier opening fill portions (348, 328, 192, 392, 492, 892, 992) can be coplanar with the top surface of the third insulating cap layer 370. Each of the sacrificial third-tier opening fill portions (348, 328, 192, 392, 492, 892, 992) may, or may not, include cavities therein. A dielectric cap layer 380 including a dielectric material such as silicon oxide is then formed over the third-tier structure.

Figure 62:
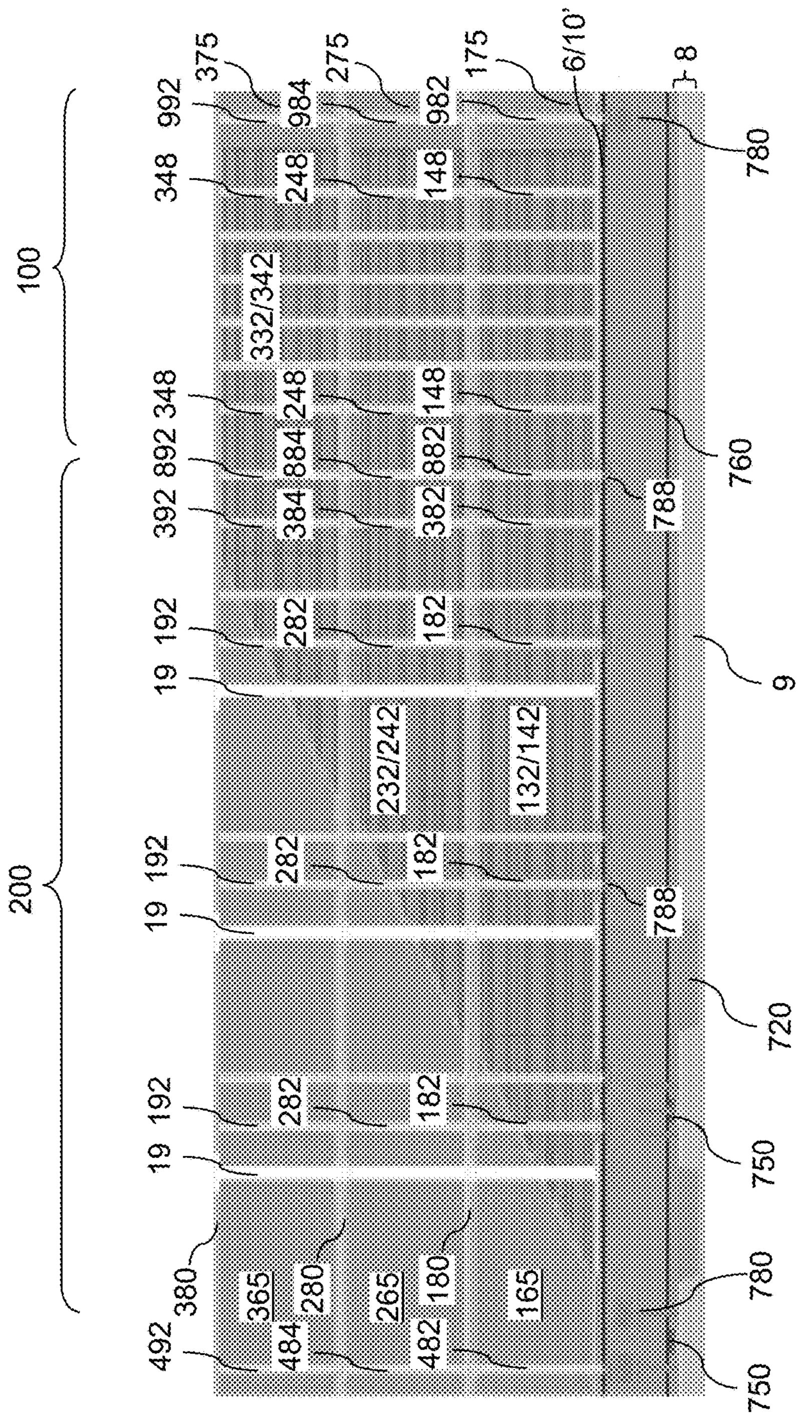
FIG. 62 is a vertical cross-sectional view of the third exemplary structure after removal of sacrificial support opening fill structures and formation of inter-tier support openings according to the third embodiment of the present disclosure.

Referring to FIG. 62, a photoresist layer (not shown) can be applied over the third-tier structure (e.g., over the dielectric cap layer 380), and can be lithographically patterned to form openings in the areas of the sacrificial third-tier support opening fill portions 328, followed by extending the openings through the dielectric cap layer 380 by etching. Top surfaces of the sacrificial third-tier support opening fill portions 328 are physically exposed while all other types of the sacrificial third-tier opening fill portions (348, 328, 192,

392, 492, 892, 992) are covered by the photoresist layer and the dielectric cap layer 380. An etch process is performed to remove the materials of the sacrificial third-tier support opening fill portions 328, the sacrificial second-tier support opening fill portions 228, and the sacrificial first-tier support opening fill portions 128. For example, if the materials of the sacrificial third-tier support opening fill portions 328, the sacrificial second-tier support opening fill portions 228, and the sacrificial first-tier support opening fill portions 128 include amorphous silicon, a wet etch process employing hot trimethyl-2 hydroxyethyl ammonium hydroxide ("hot TMY") or tetramethyl ammonium hydroxide (TMAH) can be employed to remove the materials of the sacrificial third-tier support opening fill portions 328, the sacrificial second-tier support opening fill portions 228, and the sacrificial first-tier support opening fill portions 128. Support openings 19 are formed in volumes from which the sacrificial third-tier support opening fill portions 328, the sacrificial second-tier support opening fill portions 228, and the sacrificial first-tier support opening fill portions 128 are removed. A support opening 19 is formed within each continuous volume from which the sacrificial third-tier support opening fill portions 328, the sacrificial second-tier support opening fill portions 228, and the sacrificial first-tier support opening fill portions 128 are removed.

Optionally, the support openings 19 can be expanded, for example, by performing an isotropic etch process. The isotropic etch process can laterally recess the sidewalls of the support openings 19 by isotropically etching the dielectric materials of the insulating layers (132, 232, 332) and the sacrificial material layers (141, 242, 342). The photoresist layer can be subsequently removed.

Figure 63:
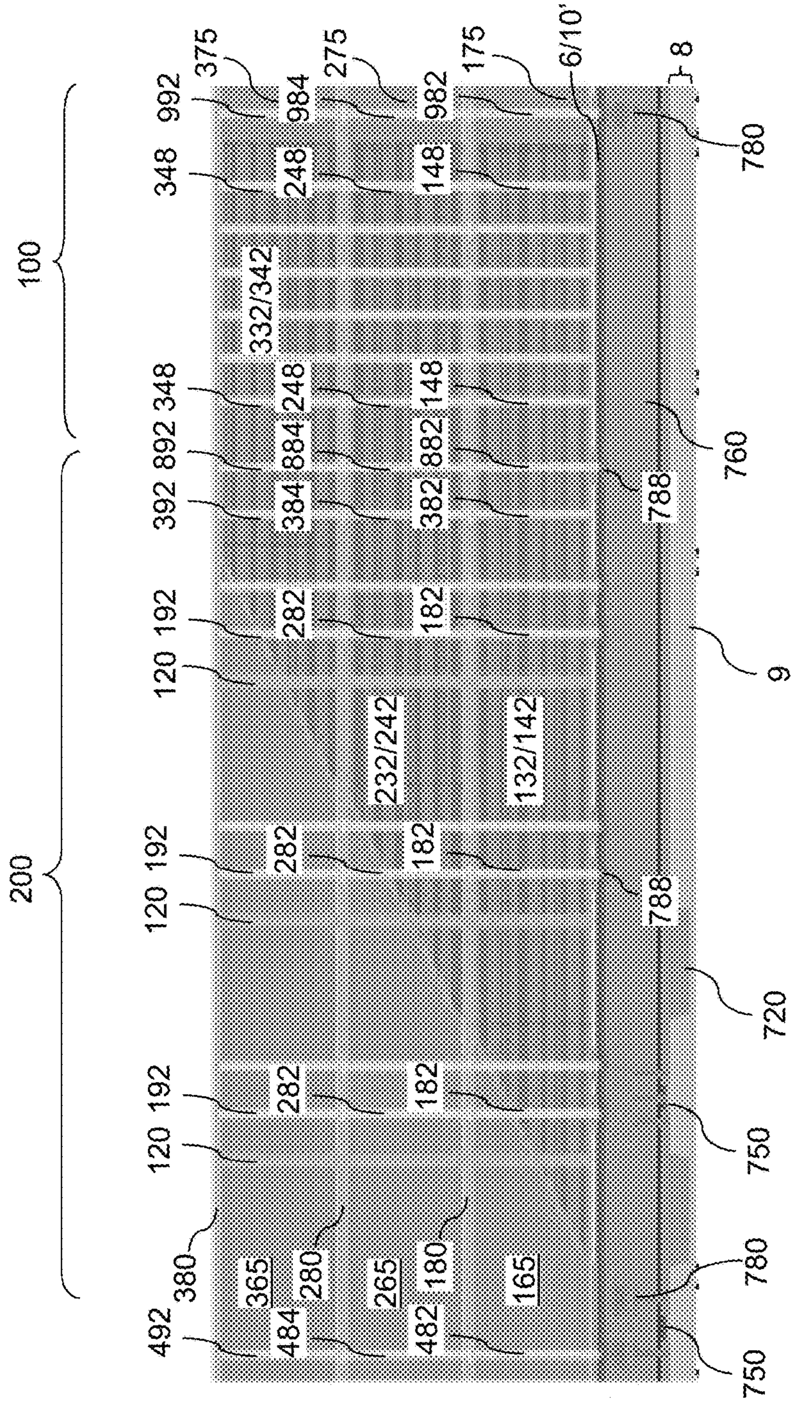
FIG. 63 is a vertical cross-sectional view of the third exemplary structure after formation of support pillar structures according to the third embodiment of the present disclosure.

Referring to FIG. 63, a dielectric material such as undoped silicate glass can be deposited in the support openings 19. The dielectric material can be deposited by a conformal deposition process. A reflow process may be optionally performed to reduce the size any void within the deposited dielectric material in the support openings 19. Each portion of the deposited dielectric material filling the support openings constitutes a support pillar structure 120, which is a support pillar structure that can provide structural support in case the various spacer material layers are formed as sacrificial material layers (142, 242, 342) which are subsequently replaced with electrically conductive layers. The support pillar structures 120 are formed within volumes of each vertical stack of a first-tier support opening 129, a second-tier support opening 229, and a third-tier support opening 329. The dielectric cap layer 380 can be reformed to fill in any openings through the dielectric cap layer 380 by depositing an additional silicon oxide layer followed by planarization by CMP.

Figure 64:
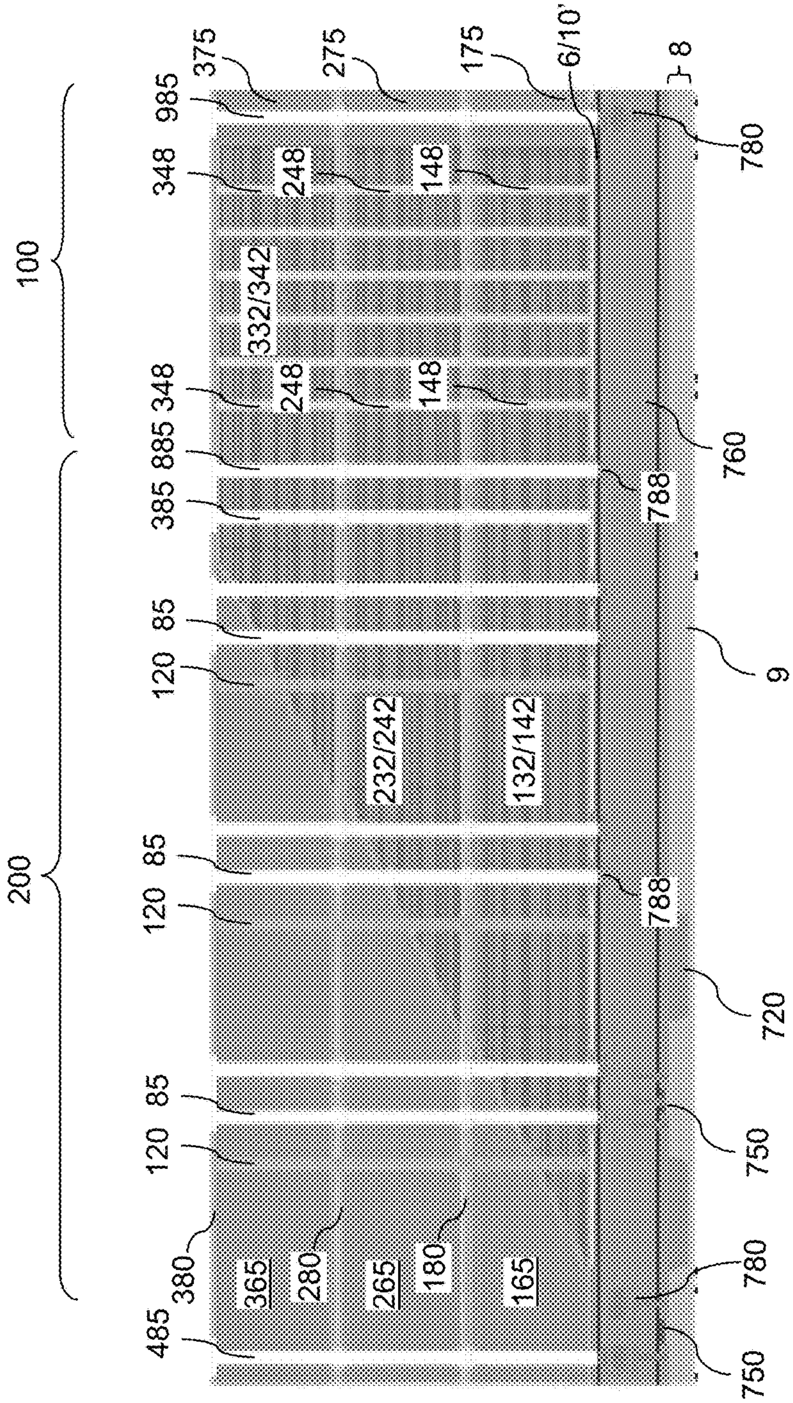
FIG. 64 is a vertical cross-sectional view of the third exemplary structure after removal of sacrificial staircase-region opening fill structures, sacrificial peripheral-region opening fill structures, sacrificial array-region opening fill structures, and sacrificial plate contact opening fill structures and formation of inter-tier openings according to the third embodiment of the present disclosure.

Referring to FIG. 64, a photoresist layer (not shown) can be applied over the third-tier structure, and can be lithographically patterned to form openings in the areas of the sacrificial third-tier staircase-region opening fill portions 192, the sacrificial third-tier plate contact opening fill portions 392, the sacrificial third-tier peripheral-region opening fill portions 492, the sacrificial third-tier interconnect-via opening fill portions 892, and the sacrificial third-tier array-region opening fill portions 992, followed by extending the openings through the dielectric cap layer 380 by etching. Top surfaces of the sacrificial third-tier staircase-region opening fill portions 192, the sacrificial third-tier plate contact opening fill portions 392, the sacrificial third-tier peripheral-region opening fill portions 492, the sacrificial third-tier interconnect-via opening fill portions 892, and the sacrificial third-tier array-region opening fill portions 992 are physically exposed while top surfaces of the sacrificial third-tier memory opening fill portions 348 and the support pillar structures 120 are covered by the photoresist layer and the dielectric cap layer 380.

An etch process is performed to remove the materials of the sacrificial staircase-region opening fill portions (192, 282, 182), the sacrificial plate contact opening fill portions (392, 384, 382), the sacrificial third-tier peripheral-region opening fill portions (492, 484, 482), the sacrificial third-tier interconnect-via opening fill portions (892, 884, 882), and the sacrificial third-tier array-region opening fill portions (992, 984, 982). For example, if the materials of the sacrificial staircase-region opening fill portions (192, 282, 182), the sacrificial plate contact opening fill portions (392, 384, 382), the sacrificial third-tier peripheral-region opening fill portions (492, 484, 482), the sacrificial third-tier interconnect-via opening fill portions (892, 884, 882), and the sacrificial third-tier array-region opening fill portions (992, 984, 982) include amorphous silicon, a wet etch process employing hot trimethyl-2 hydroxyethyl ammonium hydroxide ("hot TMY") or tetramethyl ammonium hydroxide (TMAH) can be employed to remove the materials of the sacrificial staircase-region opening fill portions (192, 282, 182), the sacrificial plate contact opening fill portions (392, 384, 382), the sacrificial third-tier peripheral-region opening fill portions (492, 484, 482), the sacrificial third-tier interconnect-via opening fill portions (892, 884, 882), and the sacrificial third-tier array-region opening fill portions (992, 984, 982).

Inter-tier staircase-region openings 85 are formed in each continuous volume from which a vertically stacked set of sacrificial staircase-region opening fill portions (192, 282, 182) is removed. Inter-tier plate contact openings 385 are formed in each continuous volume from which a vertically stacked set of sacrificial plate contact opening fill portions (392, 384, 382) is removed. Inter-tier peripheral-region openings 485 are formed in each continuous volume from which a vertically stacked set of sacrificial third-tier peripheral-region opening fill portions (492, 484, 482) is removed. Inter-tier interconnect-via openings 885 are formed in each continuous volume from which a vertically stacked set of sacrificial third-tier interconnect-via opening fill portions (892, 884, 882) is removed. Inter-tier array-region openings 985 are formed in each continuous volume from which a vertically stacked set of sacrificial third-tier array-region opening fill portions (992, 984, 982) is removed. The inter-tier staircase-region openings 85, the inter-tier plate contact openings 385, the inter-tier peripheral-region openings 485, the inter-tier interconnect-via openings 885, and the inter-tier array-region openings 985 are herein collectively referred to inter-tier openings (85, 385, 485, 885, 985). Generally, any subset of the inter-tier openings (85, 385, 485, 885, 985) described above can be formed by removing a corresponding subset of vertical stacks of a first-tier sacrificial opening fill structure, a second-tier sacrificial opening fill structure, and a third-tier sacrificial opening fill structure.

Optionally, the inter-tier openings (85, 385, 485, 885, 985) can be expanded, for example, by performing an isotropic etch process. The isotropic etch process can laterally recess the sidewalls of the support openings 19 by isotropically etching the dielectric materials of the insulating layers (132, 232, 332) and the sacrificial material layers (141, 242, 342). The photoresist layer can be subsequently removed.

Figure 65:
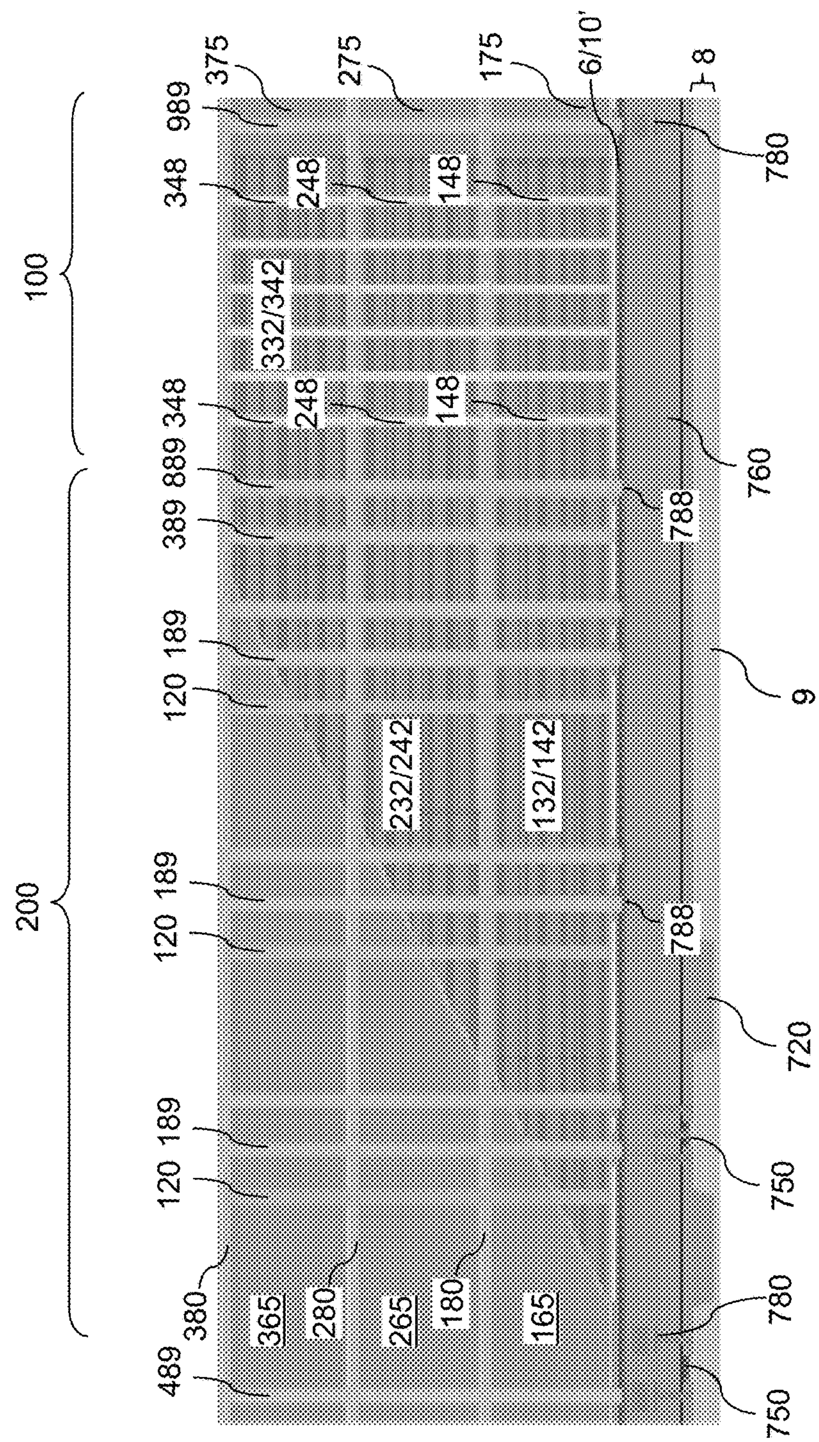
FIG. 65 is a vertical cross-sectional view of the third exemplary structure after formation of sacrificial inter-tier fill structures according to the third embodiment of the present disclosure.

Referring to FIG. 65, dielectric liners can be optionally formed, and a sacrificial fill material can be deposited in the inter-tier openings (85, 385, 485, 885, 985). The sacrificial material that fills the inter-tier openings (85, 385, 485, 885, 985) is herein referred to as a sacrificial inter-tier fill material. For example, the sacrificial inter-tier fill material can include a semiconductor material such as amorphous silicon. Various inter-tier opening fill structures are formed in the inter-tier openings (85, 385, 485, 885, 985). For example, sacrificial inter-tier staircase-region fill structures 189 can be formed in the inter-tier staircase-region openings 85; sacrificial inter-tier plate contact fill structures 389 can be formed in the inter-tier plate contact openings 385; sacrificial inter-tier peripheral-region fill structures 489 can be formed in the inter-tier peripheral-region openings 485; sacrificial inter-tier interconnect-via fill structures 889 can be formed in the inter-tier interconnect-via openings 885; and sacrificial inter-tier array-region fill structures 989 can be formed in the inter-tier array-region openings 985. The dielectric cap layer 380 can be reformed to fill in any openings therein as described above.

Figure 66A:
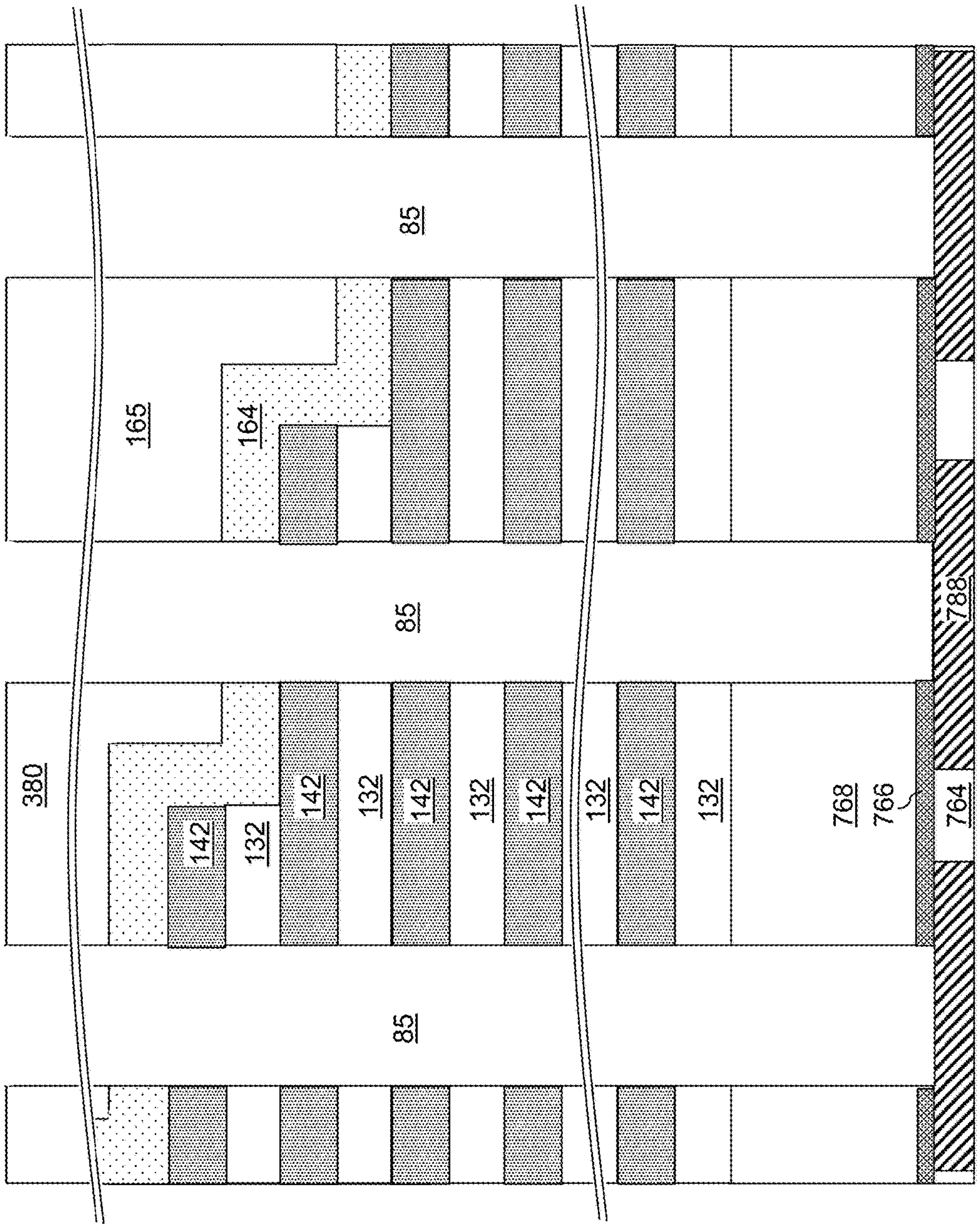
FIGS. 66A-66D illustrate a region of the third exemplary structure including the inter-tier staircase-region openings during processing steps employed to form the sacrificial inter-tier staircase-region fill structures according to the third embodiment of the present disclosure.

FIGS. 66A-66D illustrate a region of the third exemplary structure including the inter-tier staircase-region openings 85 during processing steps employed to form the sacrificial inter-tier fill structures (189, 389, 489, 889, 989) illustrated in FIG. 65. In other words, the processing steps of FIGS. 66A-66D can be performed on the third exemplary structure of FIG. 64 to provide the third exemplary structure of FIG. 65. FIG. 66A illustrates the region of the third exemplary structure immediately after formation of the inter-tier openings (85, 385, 485, 885, 985).

Figure 66B:
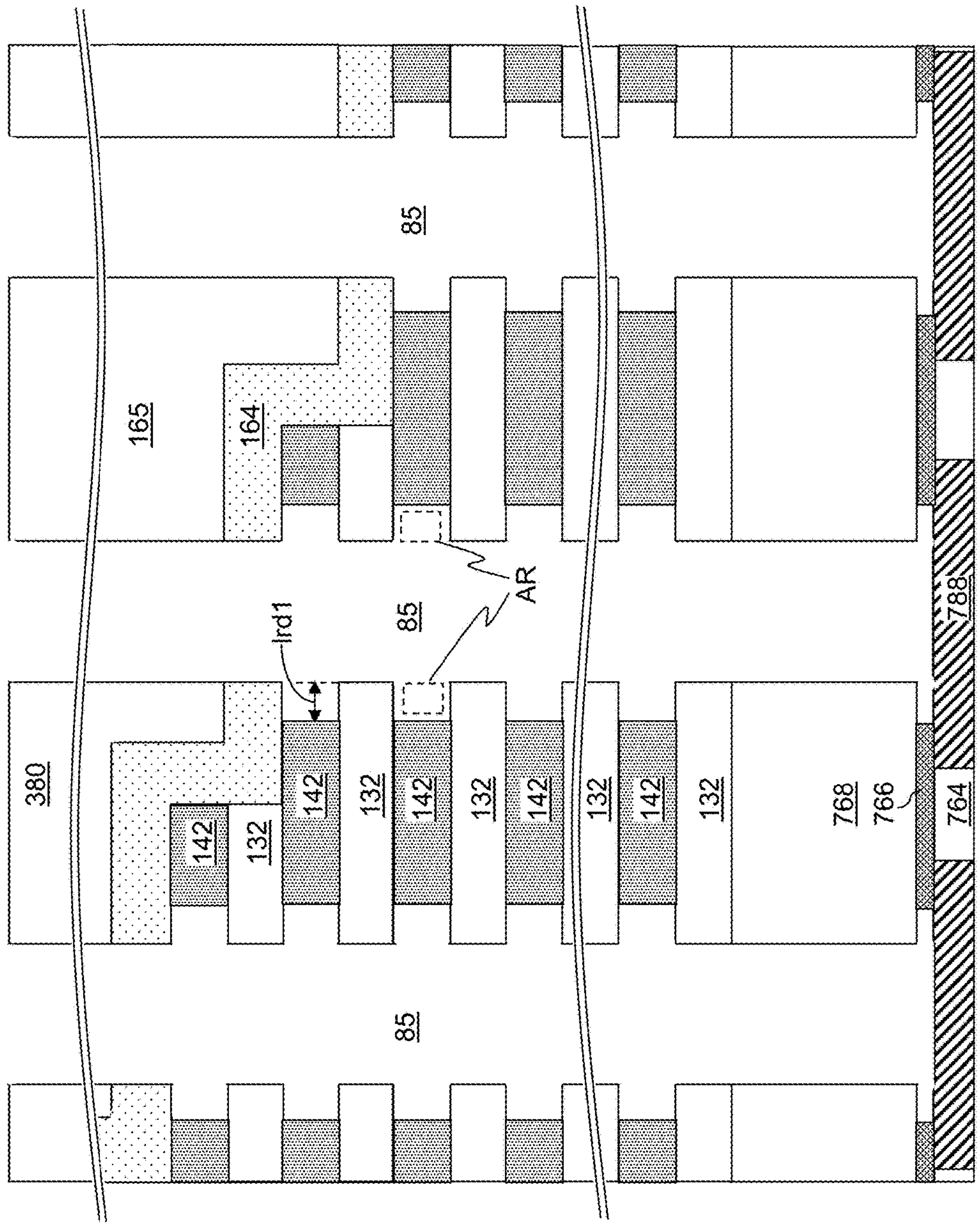

Referring to FIG. 66B, an isotropic etch process can be performed to laterally recess the sacrificial material layers (142, 242, 342) with respect to the insulating layers (132, 232, 332). For example, if the sacrificial material layers (142, 242, 342) include silicon nitride, a wet etch process employing hot phosphoric acid or hot ammonium hydroxide can be employed to laterally recess the sacrificial material layers (142, 242, 342) selective to the insulating layers (132, 232, 332) the first, second, and third silicate glass liners (164, 264, 364), and the first, second, and third retro-stepped dielectric material portions (165, 265, 365). The lateral recess distance by which the sidewalls of the sacrificial material layers (141, 242, 342) are recessed is herein referred to as a first lateral recess distance lrd1. The first lateral recess distance lrd1 may be in a range from 10 nm to 100 nm, although lesser and greater lateral recess distances can also be employed. An annular recess AR can be formed at each level of the sacrificial material layers (142, 242, 342) around each inter-tier staircase-region openings 85.

Figure 66C:
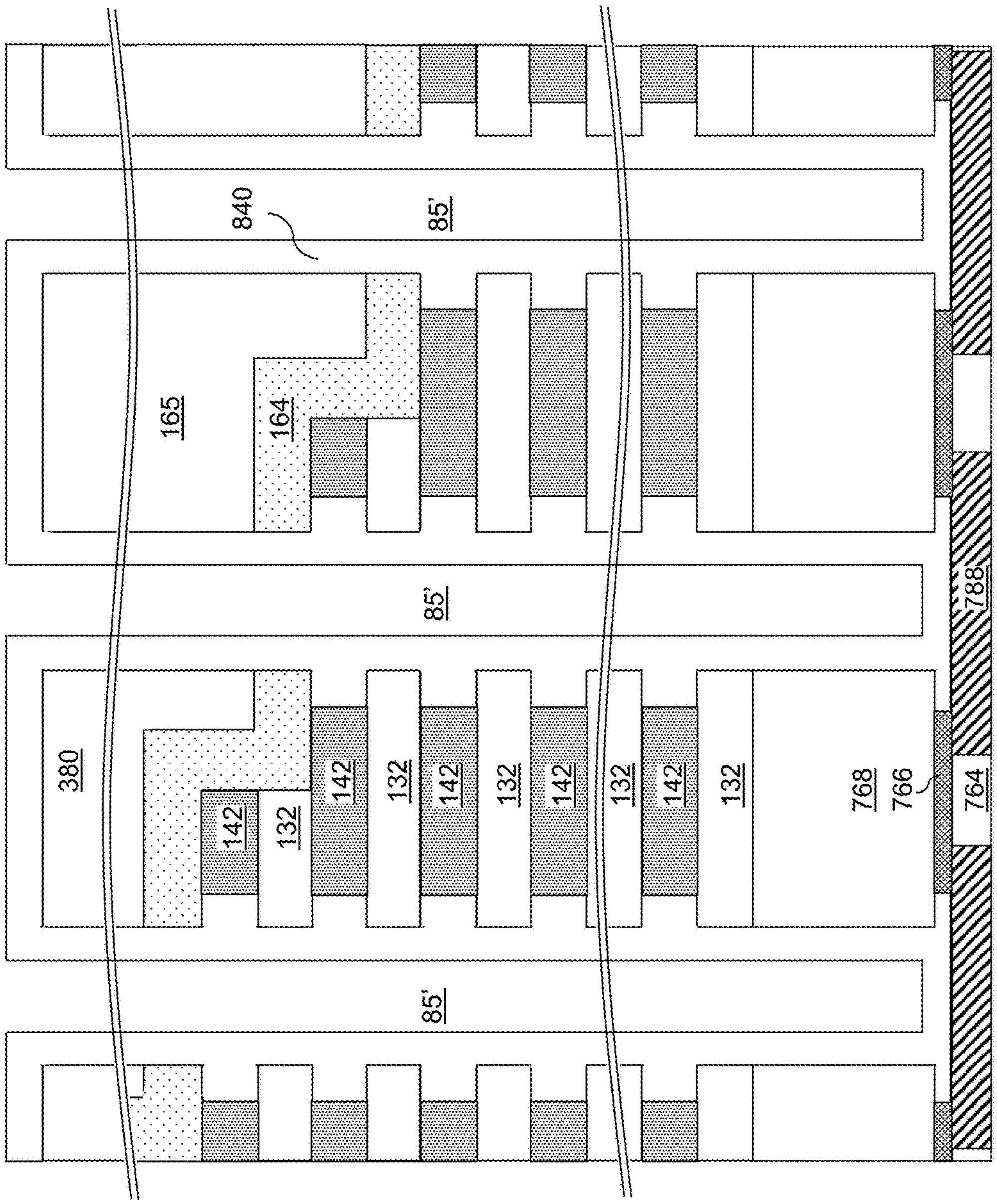

Referring to FIG. 66C, a conformal dielectric via liner 840 can be deposited at the periphery of each of the inter-tier openings (85, 385, 485, 885, 985) by a conformal deposition process. The conformal dielectric via liner 840 includes a dielectric material that is different from the material of the sacrificial material layers (142, 242, 342). Further, the dielectric material of the conformal dielectric via liner 840 has a lower etch rate in 100:1 dilute hydrofluoric acid than the materials of the first, second, and third silicate glass liners (164, 264, 364). For example, the conformal dielectric via liner 840 can include undoped silicate glass or a dielectric metal oxide (such as aluminum oxide). In one embodiment, the conformal dielectric via liner 840 can include undoped silicate glass formed by thermal decomposition of tetraethylorthosilicate (TEOS). The thickness of the conformal dielectric via liner 840 can be greater than one half of the maximum thickness of the sacrificial material layers (142, 242, 342). Portions of the conformal dielectric via liner 840 deposited at peripheries of the inter-tier openings (85, 385, 485, 885, 985) fill the annular recesses AR to form rib region of the ribbed liner 840.

The conformal dielectric via liner 840 can be formed directly on each physically exposed top surface of the lower-level metal interconnect structures 780 (such as the physically exposed top surfaces of the topmost lower-level metal line structures 788). An unfilled void 85' can be present within each of the inter-tier openings (85, 385, 485, 885, 985) after deposition of the conformal dielectric via liner 840.

Figure 66D:
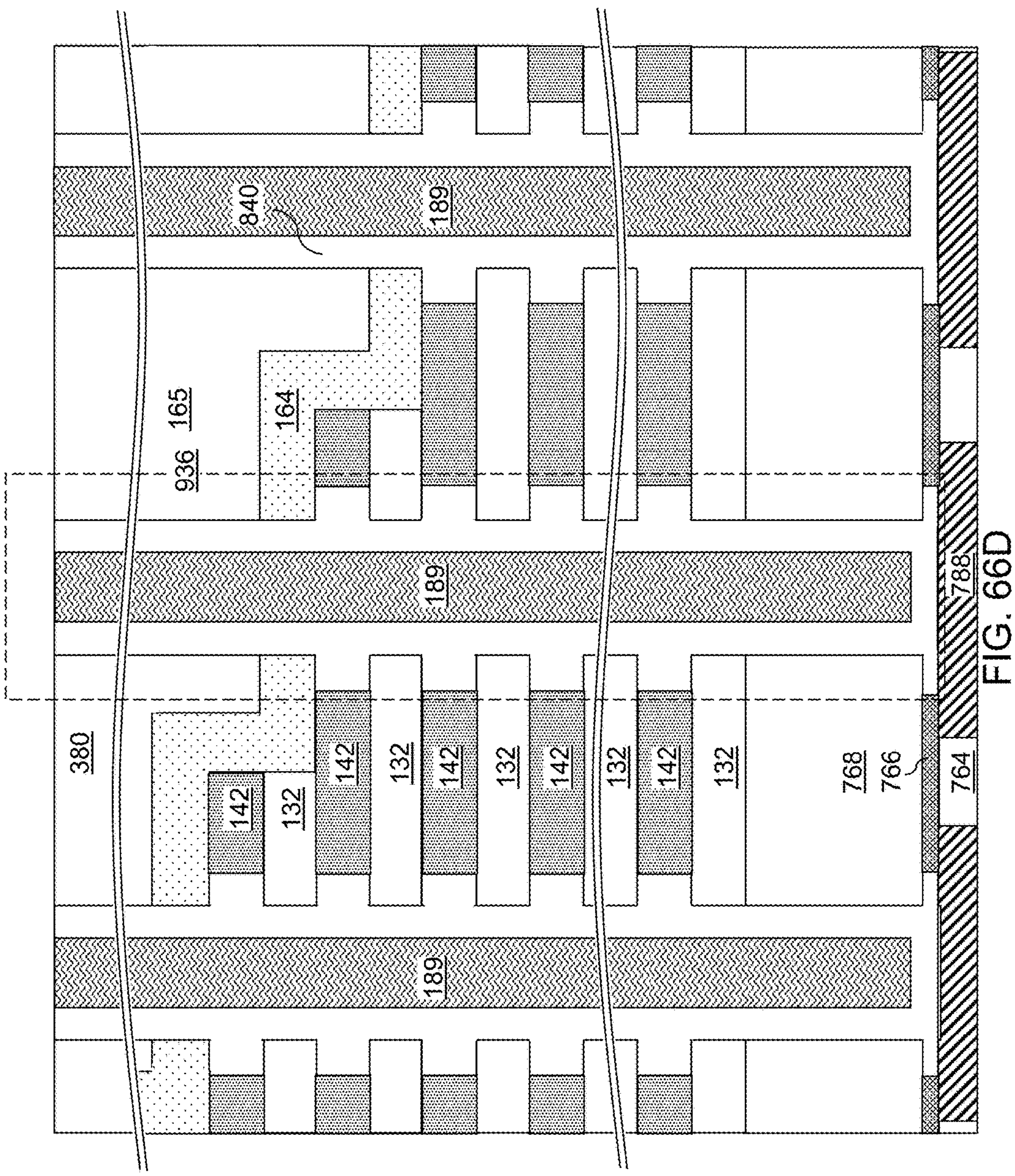

Referring to FIG. 66D, a sacrificial via fill material can be deposited in each of the unfilled voids 85' in the inter-tier openings (85, 385, 485, 885, 985) by a conformal deposition process. The sacrificial inter-tier fill material can be deposited in the inter-tier openings (85, 385, 485, 885, 985) to form the various sacrificial inter-tier fill structures (189, 389, 489, 889, 989) that include the sacrificial inter-tier staircase-region fill structures 189. Each adjoining set of the ribbed liner 840 and fill structure 189 constitutes a staircase region sacrificial via structure 936. Layer 380 can be reformed to fill any openings therein as described above.

Figure 67:
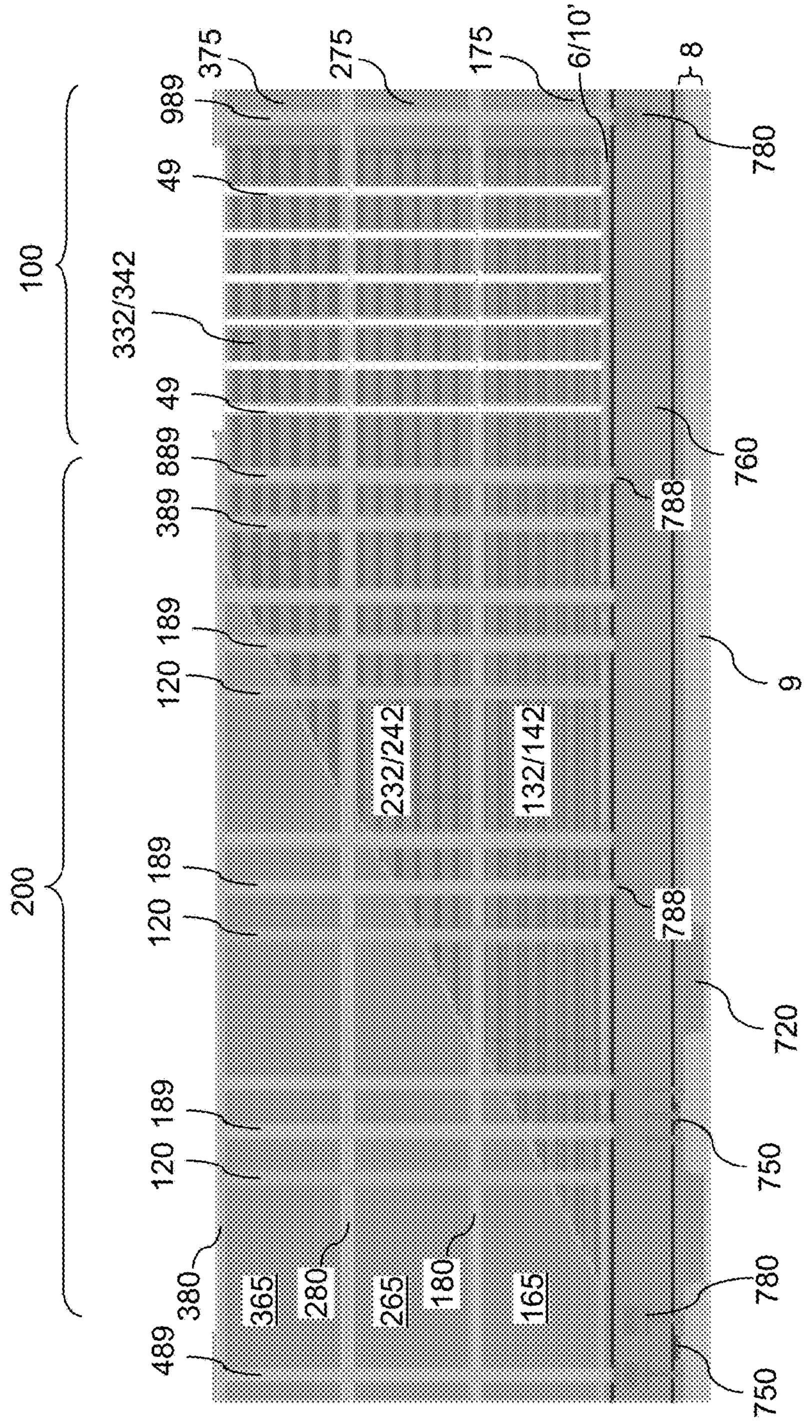
FIG. 67 is a vertical cross-sectional view of the third exemplary structure after removal of a portion of the insulating cap layer and formation of inter-tier memory openings according to the third embodiment of the present disclosure.

Referring to FIG. 67, a photoresist layer can be applied over the third exemplary structure, and can be lithographically patterned to form openings within the areas of the sacrificial third-tier memory opening fill portions 348 followed by extending the openings through layer 380 by etching. The sacrificial memory opening fill portions (348, 248, 148) can be removed from the memory array region 100 to form inter-tier memory openings 49. The third insulating cap layer 370 may be collaterally etched within the unmasked areas of the memory array region 100. The photoresist layer can be subsequently removed, for example, by ashing.

Figure 68:
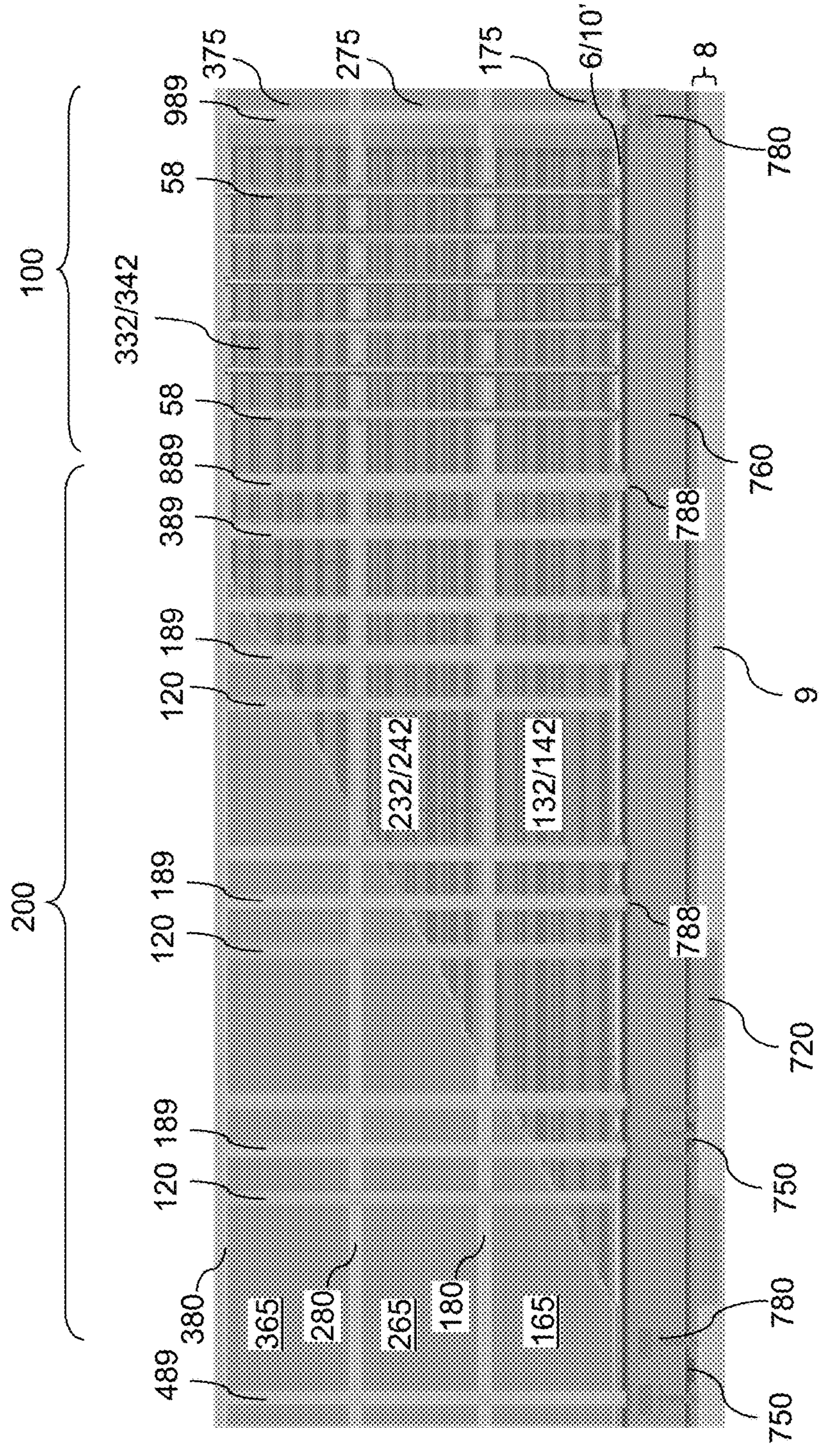
FIG. 68 is a vertical cross-sectional view of the third exemplary structure after formation of memory opening fill structures and an insulating cap portion according to the third embodiment of the present disclosure.

Referring to FIG. 68, memory opening fill structures 58 can be formed within each inter-tier memory opening 49. For example, the processing steps of FIGS. 11A-11D can be performed to form the memory opening fill structures 58 taking into account the additional tier structure, i.e., the third-tier structure. Each memory opening fill structure 58 can include a respective memory stack structure 55 (see FIG. 11D) that extend within volumes of each vertical stack of a first-tier memory opening 149, a second-tier memory opening 249, and a third-tier memory opening 349. A dielectric material can be deposited and planarized to fill the recessed area formed by removal of a portion of the third insulating cap layer 370 to fill in the openings in layer 380. After addition of an insulating material to the third insulating cap layer 370 over the memory opening fill structures 58, the third insulating cap layer 370 can cover the memory opening fill structures 58.

Figure 69:
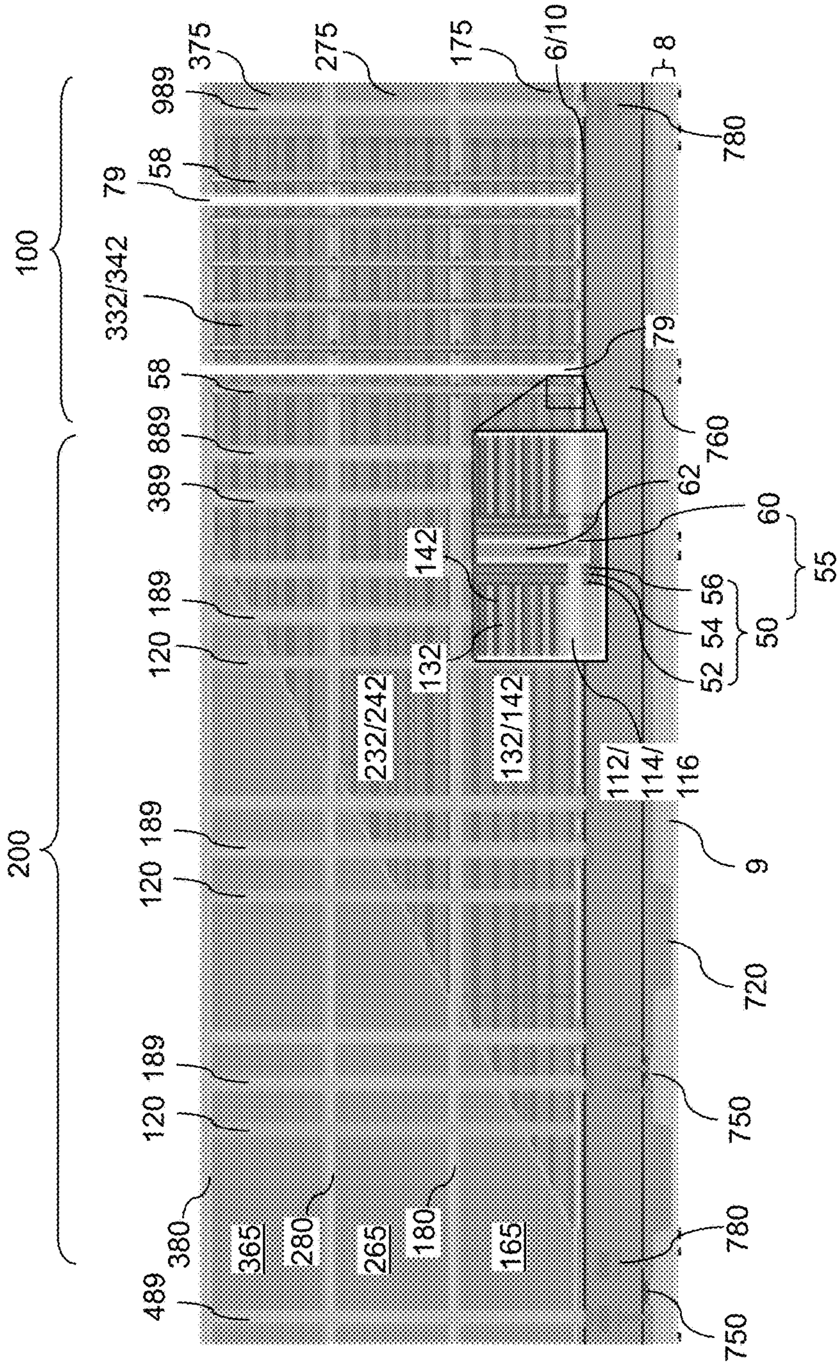
FIG. 69 is a vertical cross-sectional view of the third exemplary structure after formation of backside trenches according to the third embodiment of the present disclosure.

Referring to FIG. 69, backside trenches 79 can be formed through the third-tier structure, the second-tier structure, and the first-tier structure. For example, a photoresist layer (not shown) can be applied over the third exemplary structure and can be lithographically patterned to form elongated openings. The pattern in the photoresist layer can be transferred through the third-tier structure, the second-tier structure, and the first-tier structure by an anisotropic etch process. For example, the processing steps of FIGS. 16A and 16B can be employed to form the backside trenches 79. The photoresist layer can be subsequently removed, for example, by ashing.

Figure 70A:
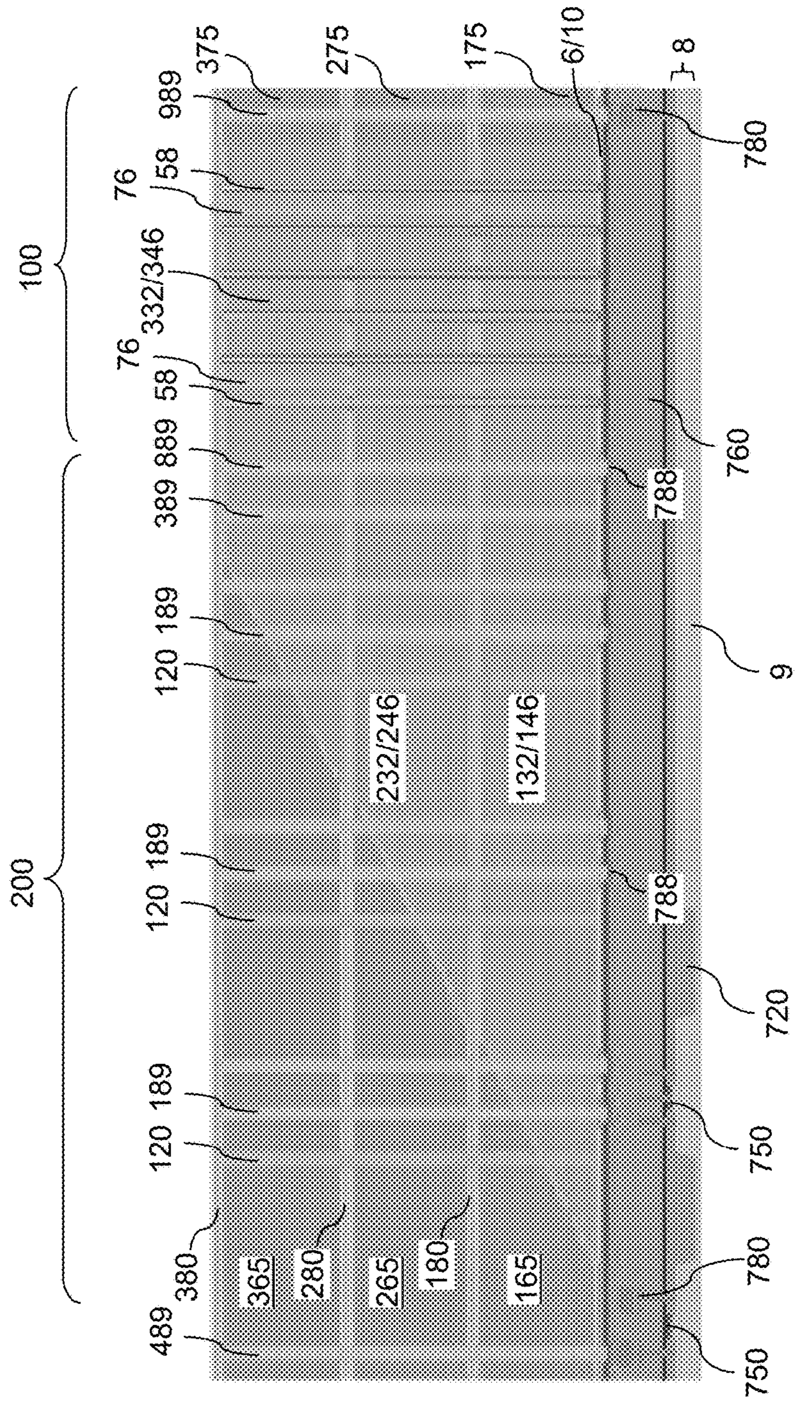
FIG. 70A is a vertical cross-sectional view of the third exemplary structure after replacement of the in-process source-level material layers with source-level material layers, replacement of the sacrificial material layers with electrically conductive layers, and formation of a dielectric wall structure within each backside trench according to the third embodiment of the present disclosure.

Referring to FIG. 70A, the processing steps of FIGS. 17A-17E can be performed to replace the in-process source-level material layers 10' with source-level material layers 10 and to provide electrical contact to the vertical semiconductor channels 60 through a source contact layer 114. The backside trenches 79 can extend through the third alternating stack (332, 342), the second alternating stack (232, 242), the first alternating stack (131, 142), and down to the source-level sacrificial layer 104 as illustrated in FIG. 17A. A source cavity 109 can be formed by removing the source-level sacrificial layer 104 and portions of the memory films 50 located at a level of the source-level sacrificial layer 104 as illustrated in FIG. 17C. A sidewall of each vertical semiconductor channel 60 can be physically exposed to the source cavity 109. A source contact layer 114 comprising a doped semiconductor material can be formed in the source cavity as illustrated in FIG. 17D.

Subsequently, the processing steps of FIGS. 18-21 can be performed to replace the various sacrificial material layers (142, 242, 342) with electrically conductive layers (146, 246, 346), and to fill the backside trenches 79 with the dielectric wall structures 76. The first, second, and third sacrificial material layers (142, 242, 342) can be replaced with first, second, and third electrically conductive layers (146, 246, 346), respectively.

Figure 70B:
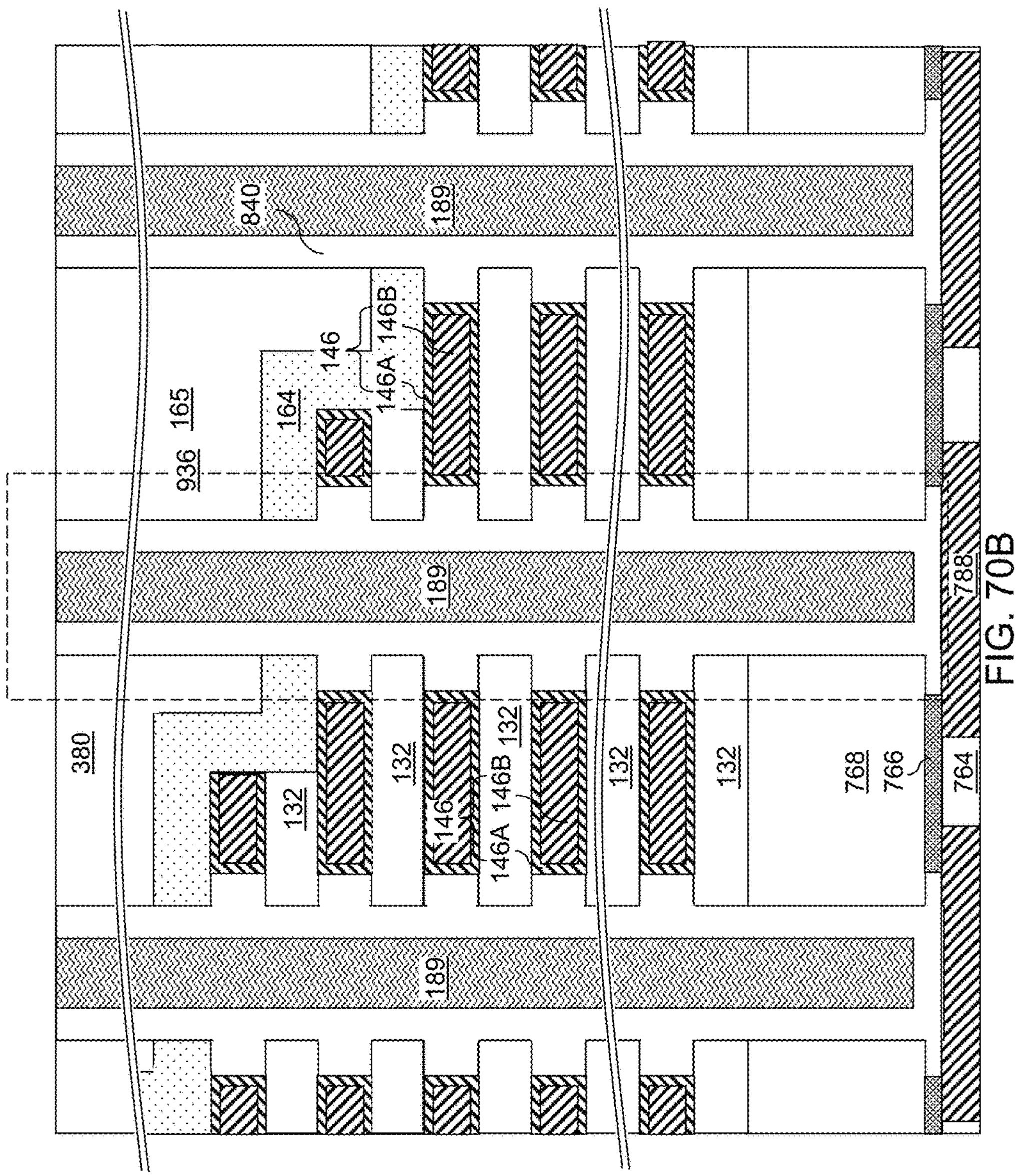
FIG. 70B is a vertical cross-sectional view of a region of the third exemplary structure including the sacrificial inter-tier staircase-region fill structures at the processing steps of FIG. 70A.

FIG. 70B shows a region of the staircase region sacrificial via structure 936 of third exemplary structure including the sacrificial inter-tier staircase-region fill structures 189 at the processing steps of FIG. 70A. Each of the first, second, and third electrically conductive layers (146, 246, 346) can have a respective conducive metallic liner 146A including a metallic nitride material (such as TiN, TaN, or WN) and a conductive fill material portion 146B including a metal or an intermetallic alloy (such as W, Co, Mo, Ru, and alloys thereof).

Figure 71:
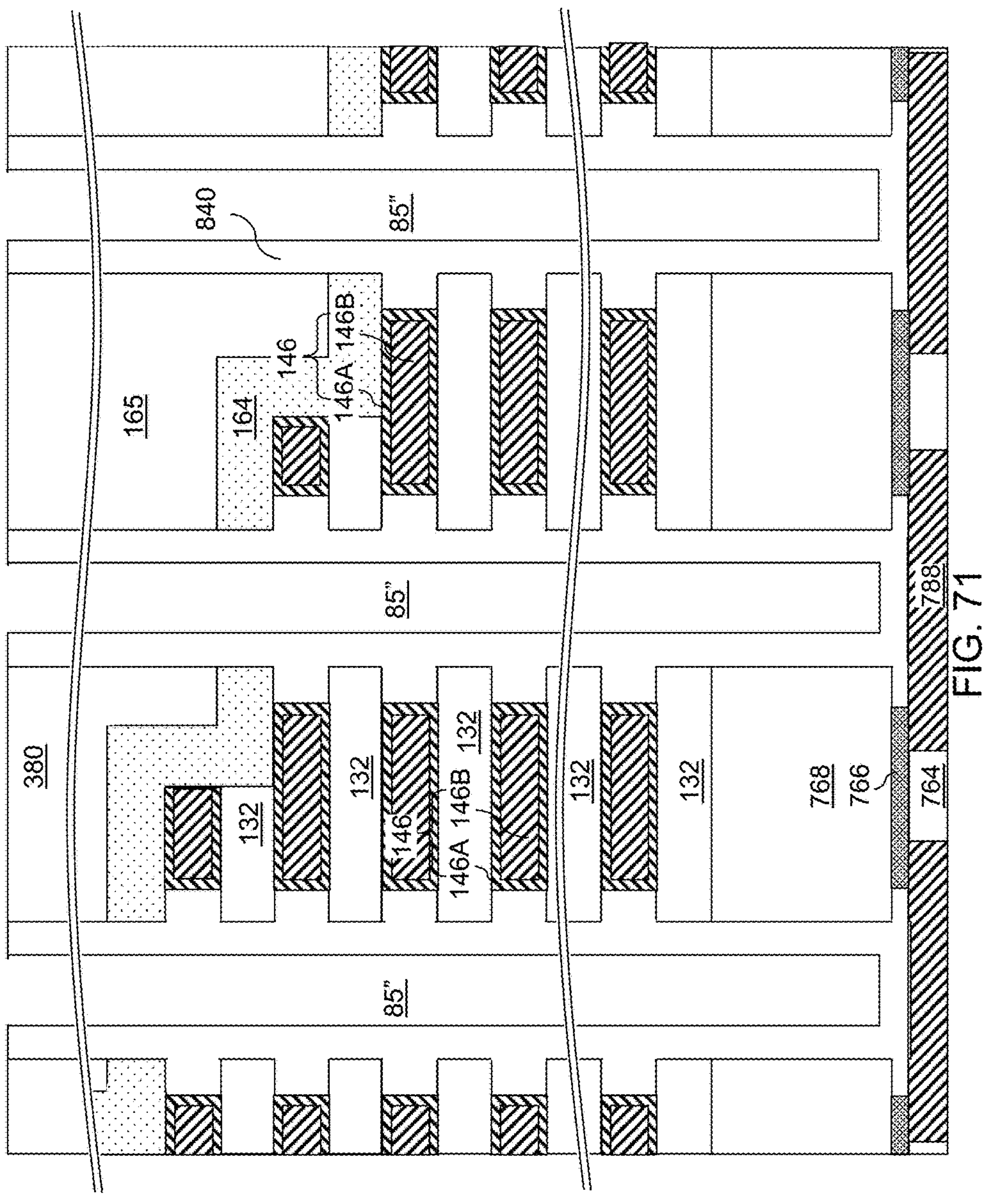
FIG. 71 is a vertical cross-sectional view of a region of the third exemplary structure including the inter-tier staircase-region openings after removal of the staircase region sacrificial via fill material portions according to the third embodiment of the present disclosure.

Referring to FIG. 71, the sacrificial inter-tier fill material can be removed selective to the dielectric liners in the inter-tier openings (85, 385, 485, 885, 985). A cavity 85" can be formed within each volume from which the sacrificial inter-tier fill structures (189, 389, 489, 889, 989) are removed.

Figure 72A:
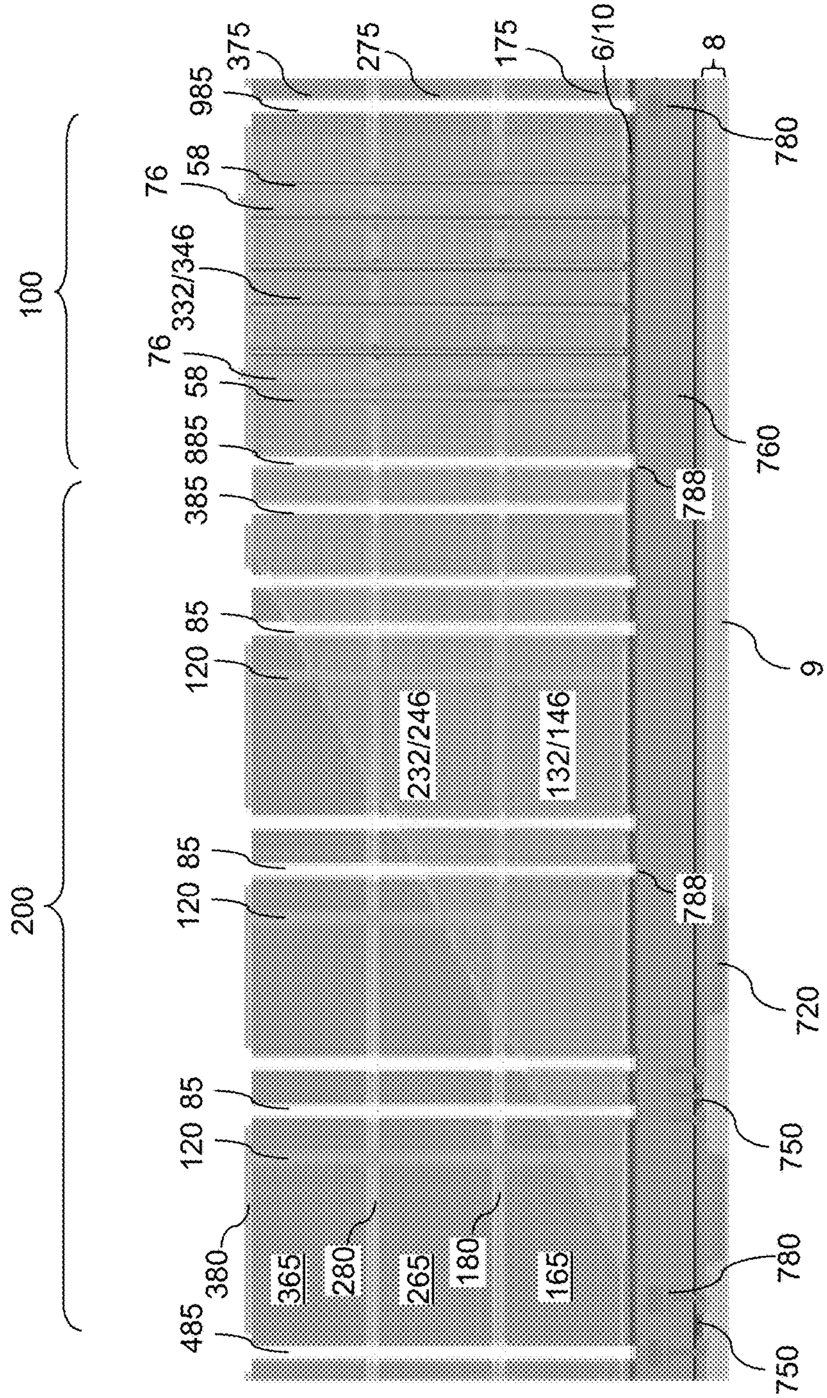
FIG. 72A is a vertical cross-sectional view of the third exemplary structure after removal of sacrificial inter-tier fill structures according to the third embodiment of the present disclosure.
Figure 72B:
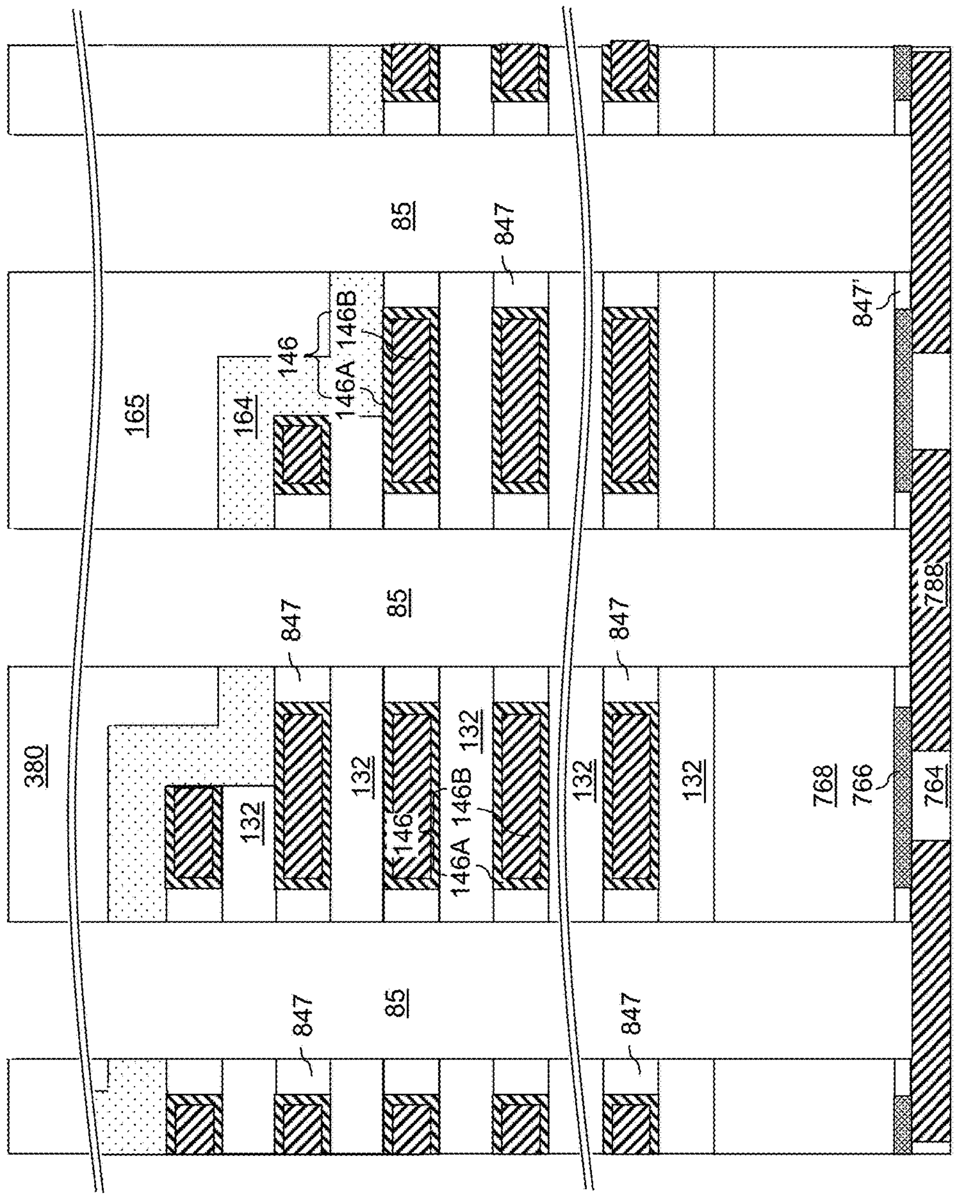
FIG. 72B is a vertical cross-sectional view of a region of the third exemplary structure including the inter-tier staircase-region openings at the processing steps of FIG. 72A.

Referring to FIGS. 72A and 72B, the various dielectric liners such as the conformal dielectric via liners 840 can be recessed, for example, by an anisotropic etch process to remove vertical portions of the conformal dielectric via liners 840. Sidewalls of the first, second, and third insulating layers (132, 232, 342) can be physically exposed after the etch process. Remaining annular portion of the conformal dielectric via liners 840 include annular insulating spacers (847, 847'), which include word-line-level annular insulating spacers 847 formed at the levels of the electrically conductive layers (146, 246, 346) and interconnect-level annular insulating spacers 847' formed below the levels of the electrically conductive layers (146, 246, 346).

Figure 73A:
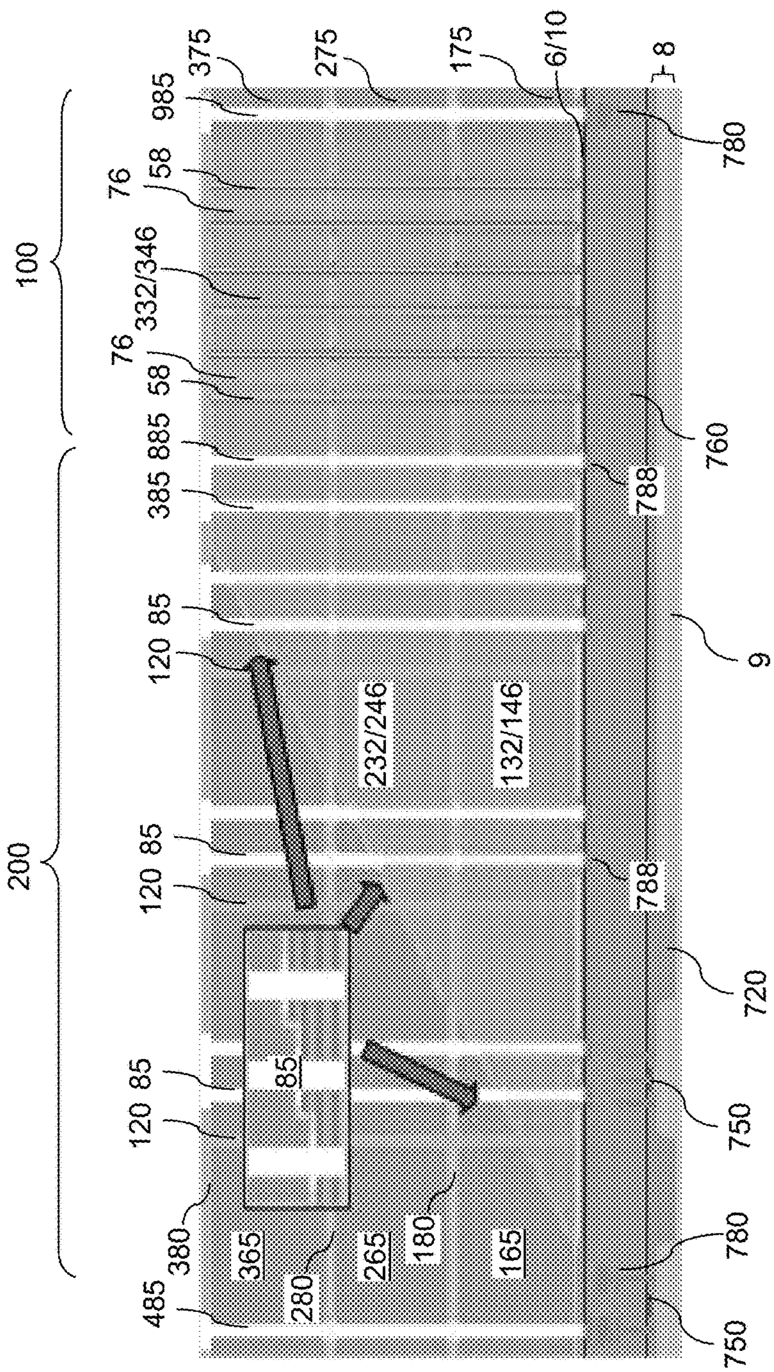
FIG. 73A is a vertical cross-sectional view of the third exemplary structure after lateral recessing of the silicate glass liners according to the third embodiment of the present disclosure.
Figure 73B:
FIG. 73B is a vertical cross-sectional view of a region of the third exemplary structure including the inter-tier staircase-region openings at the processing steps of FIG. 73A.

Referring to FIGS. 73A and 73B, an isotropic etch process is performed through the staircase-region openings 85 to laterally recess the silicate glass liners (164, 264, 364) relative to the insulating layers (132, 232, 332) and the annular insulating spacers (847, 847'). The silicate glass liners (164, 264, 364) can include a silicon oxide material having a greater etch rate in 100:1 dilute HF than the silicon oxide materials of the insulating layers (132, 232, 332) and the annular insulating spacers (847, 847') at least by a factor of 3. The silicate glass liners (164, 264, 364) can be laterally recessed relative to the inner sidewalls (i.e., the sidewalls that are vertically coincident with sidewalls of the insulating layers (132, 232, 332)) of the annular insulating spacers (847, 847') by a second lateral recess distance lrd2. The second lateral recess distance lrd2 can be greater than the first lateral recess distance lrd1, and may be in a range from 15 nm to 200 nm, although lesser and greater lateral recess distances can also be employed. An annular lateral recess cavity 853 can be formed at each level at which a silicate glass liner (164, 264, 364) is laterally recessed. An annular top surface of an underlying electrically conductive layer (146, 246, 346) is physically exposed at the bottom of each annular lateral recess cavity 853.

Figure 74A:
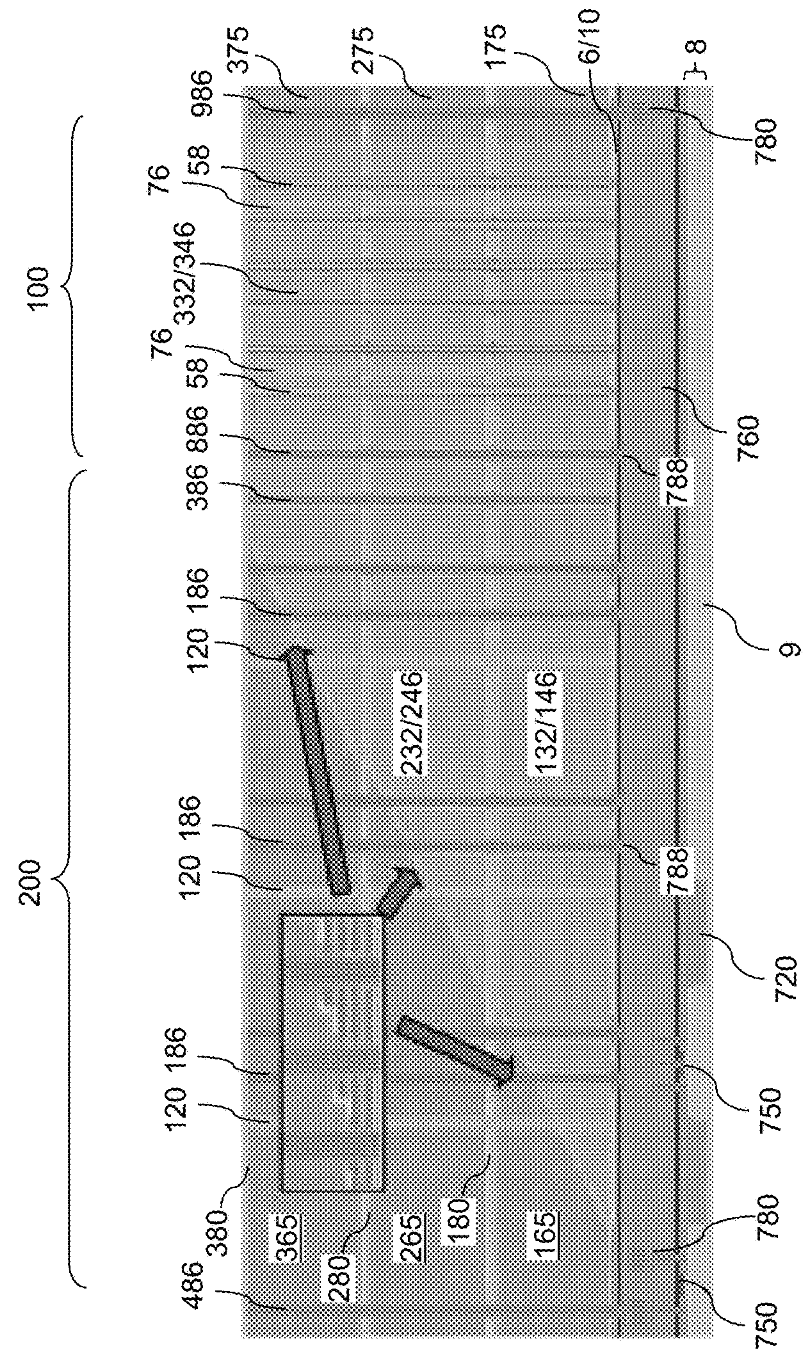
FIG. 74A is a vertical cross-sectional view of the third exemplary structure after formation of various contact via structures according to the third embodiment of the present disclosure.
Figure 74B:
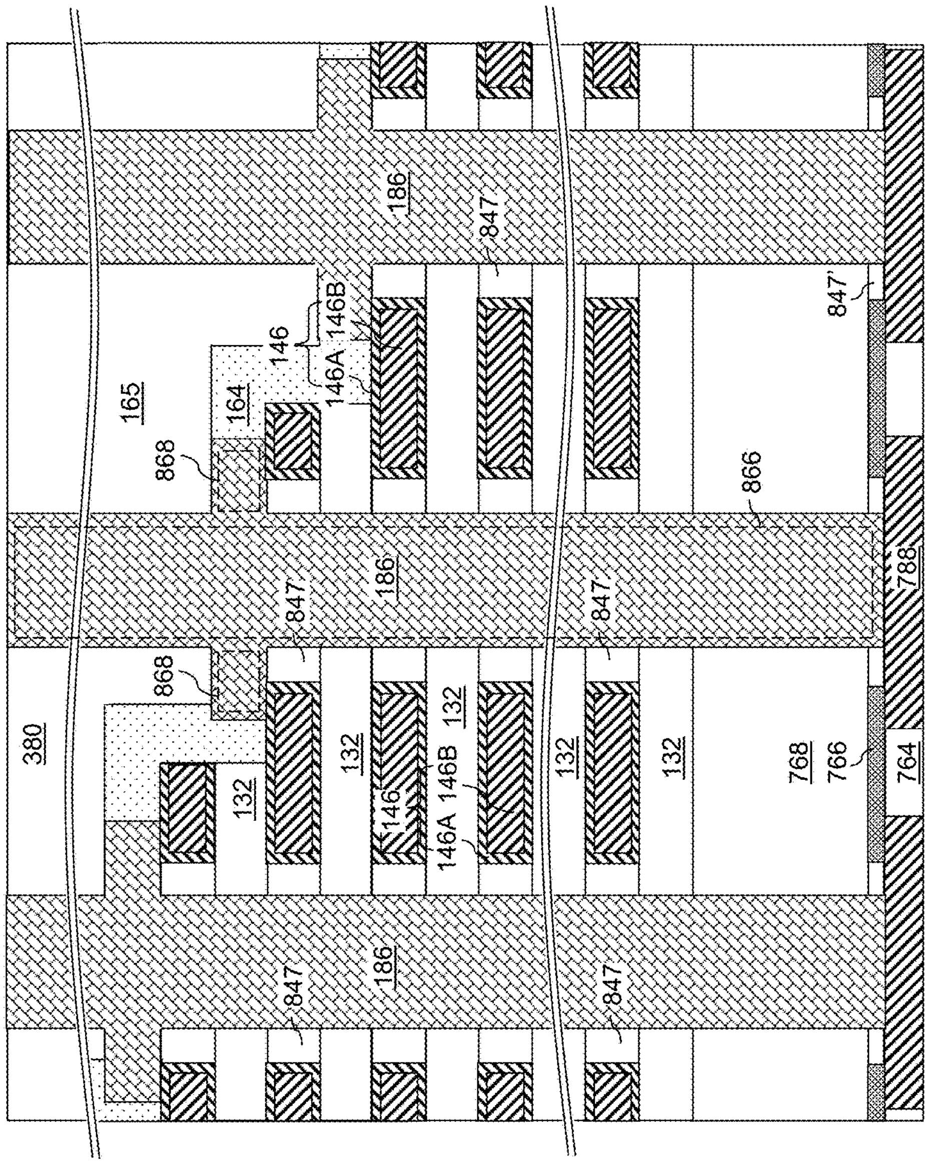
FIG. 74B is a vertical cross-sectional view of a region of the third exemplary structure including the inter-tier staircase-region openings at the processing steps of FIG. 74A.

Referring to FIGS. 74A and 74B, at least one conductive material is deposited within each unfilled volume of the inter-tier openings (85, 385, 485, 885, 985). Excess portions of the at least one conductive material can be removed from above the dielectric cap layer 380 by a planarization process such as chemical mechanical planarization. Remaining portions of the at least one conductive material in the inter-tier openings (85, 385, 485, 885, 985) form various contact via structures (186, 386, 486, 886, 986), which include staircase-region contact via structures 186 formed in the inter-tier staircase-region openings 85, plate contact via structures 386 formed in the inter-tier plate contact openings 385, peripheral-region contact via structures 486 formed in the inter-tier peripheral-region openings 485, through-memory-level contact via structures 886 formed in the inter-tier interconnect-via openings 885, and array-region contact via structures 986 formed in the inter-tier array-region openings 985.

The staircase-region contact via structures 186 are formed within volumes of the first-tier staircase-region openings 181, the second-tier staircase-region openings 281, and the third-tier staircase-region openings 191. Thus, each of the staircase-region openings (181, 281, 181) is filled within a respective staircase-region contact via structure 186. In one embodiment, each of the staircase-region contact via structures 186 is formed directly on only a respective one of the first, second, and third electrically conductive layers (146, 246, 346), and does not contact any other of the first, second, and third electrically conductive layers (146, 246, 346). In one embodiment, each of the staircase-region contact via structures 186 is formed directly on a respective one of the lower-level metal interconnect structures 780. Each staircase-region contact via structure 186 can be a flanged conductive via structure including a conductive pillar portion 866 having a cylindrical shape and a conductive flange portion 868 projecting from the conductive pillar portion 866 and having an annular shape and contacting a top surface of a respective one of the electrically conductive layers (146, 246, 346) (e.g., word lines and/or select gate electrodes).

The peripheral-region contact via structures 486 can be formed within volumes of each vertically neighboring set of a first-tier peripheral-region opening 481, a second-tier peripheral-region opening 483, and a third-tier peripheral-region opening 491 and directly on a respective one of the lower-level metal interconnect structures 780. The through-memory-level contact via structures 886 can be formed within volumes of each vertically neighboring set of a first-tier interconnect-via opening 881, a second-tier interconnect-via opening 883, and a third-tier interconnect-via opening 891, and directly on a respective one of the lower-level metal interconnect structures 780. The array-region contact via structures 986 can be formed within volumes of each vertically neighboring set of a first-tier array-region opening 981, a second-tier array-region opening 983, and a third-tier array-region opening 991, and directly on a respective one of the lower-level metal interconnect structures 780. The plate contact via structures 386 can be formed within volumes of each vertically neighboring set of a first-tier plate contact opening 381, a second-tier plate contact opening 383, and a third-tier plate contact opening 391 and directly on the conductive plate layer 6 and/or directly on the lower source-level material layer 112.

Referring to all drawings and various embodiments of the present disclosure, a three-dimensional memory device is provided, which comprises: a stack of a conductive plate layer 6 and source-level material layers 10 located over a substrate 8; a first-tier structure (132, 146, 170, 165, 164, 175) overlying the source-level material layers 10 and including a first alternating stack of first insulating layers 132 and first electrically conductive layers 146, a first retro-stepped dielectric material portion 165 overlying first stepped surfaces of the first alternating stack in a staircase region, and a first silicate glass liner 164 located between the first stepped surfaces and the first retro-stepped dielectric material portion 165; a second-tier structure (232, 246, 270, 265, 264, 275) overlying the first-tier structure (132, 146, 170, 165, 164, 175) and including a second alternating stack of second insulating layers 232 and second electrically conductive layers 246, a second retro-stepped dielectric material portion 265 overlying second stepped surfaces of the second alternating stack in the staircase region, and a second silicate glass liner 264 located between the second stepped surfaces and the second retro-stepped dielectric material portion 265; memory stack structures 58 comprising a respective pair of a vertical semiconductor channel 60 and a memory film 50 and extending through the first alternating stack, the second alternating stack, and an upper portion of the source-level material layers 10 and located in the memory array region 100; support pillar structures (120 or 20) located in the staircase region; and staircase-region contact via structures 186 extending through the third retro-stepped dielectric material portion 365, optionally through the second retro-stepped dielectric material portion 265, and optionally through the first retro-stepped dielectric material portion 165, and contacting an annular top surface of a respective one of the first, second, and third electrically conductive layers (146, 246, 346).

In one embodiment, each of the staircase-region contact via structures 186 is laterally surrounded by at least one annular insulating spacer 847 underlying the third retro-stepped dielectric material portion 365, optionally underlying the second retro-stepped dielectric material portion 265, and optionally underlying the first retro-stepped dielectric material portion 165, and located at a level of a respective one of the first, second, and third electrically conductive layers (146, 246, 346).

In one embodiment, each of the first, second, and third silicate glass liners (164, 264, 364) can comprise a silicon oxide material having an etch rate in 100:1 dilute hydrofluoric acid that is at least three times a maximum among etch rates of the first, second, and third insulating layers (132, 232, 332) and the first, second, and third retro-stepped dielectric material portions (165, 265, 365) in 100:1 dilute hydrofluoric acid.

In one embodiment, a third-tier structure (332, 346, 370, 365, 364, 375) can be located over the second-tier structure (232, 246, 270, 265, 264, 275). The third-tier structure (332, 346, 370, 365, 364, 375) includes a third alternating stack of third insulating layers 332 and third electrically conductive layers 346, a third retro-stepped dielectric material portion 365 overlying third stepped surfaces of the third alternating stack in the staircase region, and a third silicate glass liner 364 located between the third stepped surfaces and the third retro-stepped dielectric material portion 365. Each of the memory opening fill structures 58 extends through the third-tier structure (332, 346, 370, 365, 364, 375), each of the support pillar structures (120 or 20) extends through the third-tier structure (332, 346, 370, 365, 364, 375), and each of the staircase-region contact via structures 186 extends through the third-tier structure (332, 346, 370, 365, 364, 375).

Concurrent formation of the various contact via structures reduces processing cost and time during manufacture of the three-dimensional memory device. Various types of the contact via structures may be omitted as needed.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:

forming a first-tier structure including a first alternating stack of first insulating layers and first sacrificial material layers and a first retro-stepped dielectric material portion overlying first stepped surfaces of the first alternating stack in a staircase region over the substrate;

concurrently forming at least two types of first-tier openings through the first-tier structure, wherein the at least two types of first-tier openings are selected from first type first-tier openings comprising first-tier memory openings located in a memory array region, second type first-tier openings comprising first-tier support openings located in the staircase region, and third type first-tier openings comprising first-tier staircase-region openings;

filling each first-tier opening with a respective first-tier sacrificial opening fill structure;

forming a second-tier structure including a second alternating stack of second insulating layers and second sacrificial material layers and a second retro-stepped dielectric material portion overlying second stepped surfaces of the second alternating stack;

concurrently forming at least two types of second-tier openings through the second-tier structure, the at least two types of second-tier openings are selected from first type second-tier openings comprising second-tier memory openings located in the memory array region, second type second-tier openings comprising second-tier support openings located in the staircase region, and third type second-tier openings comprising second-tier staircase-region openings;

forming memory opening fill structures including a respective memory stack structure within volumes of each vertically neighboring pair of a first-tier memory opening and a second-tier memory opening;

forming support pillar structures within volumes of each vertically neighboring pair of a first-tier support opening and a second-tier support opening;

replacing the first and second sacrificial material layers with first and second electrically conductive layers, respectively; and forming staircase-region contact via structures within volumes of the first-tier staircase-region openings and the second-tier staircase-region openings.

2. The method of claim 1, wherein each of the staircase-region contact via structures is formed directly on only a respective one of the first and second electrically conductive layers, and does not contact any other of the first and second electrically conductive layers.

3. The method of claim 2, further comprising:

forming lower-level metal interconnect structures embedded in lower-level dielectric material layers over the substrate; and forming a stack of a conductive plate layer and in-process source-level material layers over the lower-level dielectric material layers, wherein each of the staircase-region contact via structures is formed directly on a respective one of the lower-level metal interconnect structures.

4. The method of claim 3, wherein:

the first-tier openings comprise first-tier plate contact openings that extend through the first alternating stack and the in-process source-level material layers, and extend to a top surface of the conductive plate layer; and the second-tier openings comprise second-tier plate contact openings that extend through the second alternating stack and overlying a respective one of the first-tier plate contact openings.

5. The method of claim 4, further comprising forming plate contact via structures within volumes of each vertically neighboring pair of a first-tier plate contact opening and a second-tier plate contact opening and directly on the conductive plate layer.

6. The method of claim 5, wherein the conductive plate layer comprises at least one metallic material that functions as an etch stop layer during formation of the first-tier plate contact openings.

7. The method of claim 4, wherein:

the in-process source-level material layers comprise a source-level sacrificial layer;

each of the memory opening fill structures comprises a respective vertical semiconductor channel and a respective memory film; and the method further comprises:

forming backside trenches that extend through the second alternating stack, the first alternating stack, and down to the source-level sacrificial layer;

forming a source cavity by removing the source-level sacrificial layer and portions of the memory films located at a level of the source-level sacrificial layer, wherein a sidewall of each vertical semiconductor channel is physically exposed to the source cavity; and forming a source contact layer comprising a doped semiconductor material in the source cavity.

8. The method of claim 3, further comprising:

forming a first silicate glass liner on the first stepped surfaces, wherein the first retro-stepped dielectric material portion is formed over the first silicate glass liner; and forming a second silicate glass liner on the second stepped surfaces, wherein the second retro-stepped dielectric material portion is formed over the second silicate glass liner, wherein the first and second silicate glass liners comprise a silicon oxide material having an etch rate in 100:1 dilute hydrofluoric acid that is at least three times a maximum among etch rates of the first and second insulating layers and the first and second retro-stepped dielectric material portion in 100:1 dilute hydrofluoric acid.

9. The method of claim 8, wherein the first and second silicate glass liners comprise a material selected from borosilicate glass, porous organosilicate glass, and non-porous organosilicate glass.

10. The method of claim 1, wherein:

all of the first-tier openings are formed concurrently employing a first anisotropic etch process and a first lithographically patterned etch mask; and all of the second-tier openings are formed concurrently employing a second anisotropic etch process and a second lithographically patterned etch mask.

11. The method of claim 10, wherein:

the first-tier openings comprise first-tier peripheral-region openings that extend through the first retro-stepped dielectric material portion and do not extend through any layer within the first alternating stack; and the second-tier openings comprise second-tier peripheral-region openings that extend through the second retro-stepped dielectric material portion and do not extend through any layer within the second alternating stack.

12. The method of claim 11, further comprising:

forming lower-level metal interconnect structures embedded in lower-level dielectric material layers over the substrate; and forming peripheral-region contact via structures within volumes of each vertically neighboring pair of a first-tier peripheral-region opening and a second-tier peripheral-region opening and directly on a respective one of the lower-level metal interconnect structures.

13. The method of claim 10, further comprising:

forming a first dielectric pillar structure including a first straight sidewall extending from a topmost layer of the first alternating stack to a bottommost layer of the first alternating stack within the memory array region; and forming a second dielectric pillar structure including a second straight sidewall extending from a topmost layer of the second alternating stack to a bottommost layer of the second alternating stack on a top surface of the first dielectric pillar structure.

14. The method of claim 13, wherein:

the first-tier openings comprise first-tier array-region openings that extend through the first dielectric pillar structure and do not contact any layer within the first alternating stack; and the second-tier openings comprise second-tier array-region openings that extend through the second dielectric pillar structure and do not contact any layer within the second alternating stack.

15. The method of claim 14, further comprising:

forming lower-level metal interconnect structures embedded in lower-level dielectric material layers over the substrate; and forming array-region contact via structures within volumes of each vertically neighboring pair of a first-tier array-region opening and a second-tier array-region opening and directly on a respective one of the lower-level metal interconnect structures.

16. The method of claim 1, further comprising:

forming inter-tier openings by removing a subset of vertically neighboring pairs of a first-tier sacrificial opening fill structure and a second-tier sacrificial opening fill structure;

laterally expanding the inter-tier openings employing an isotropic etch process; and forming sacrificial inter-tier fill material portions in the laterally expanded inter-tier openings, wherein the sacrificial inter-tier fill material portions are subsequently removed to form respective contact via structures therein.

17. The method of claim 1, further comprising:

forming a third-tier structure including a third alternating stack of third insulating layers and third sacrificial material layers and a third retro-stepped dielectric material portion overlying third stepped surfaces of the third alternating stack; and concurrently forming at least two types of third-tier openings through the third-tier structure, the at least two types of third-tier openings are selected from first type third-tier openings comprising third-tier memory openings located in the memory array region, second type third-tier openings comprising third-tier support openings located in the staircase region, and third type third-tier openings comprising third-tier staircase-region openings, wherein:

the memory opening fill structures are formed within volumes of each vertical stack of a first-tier memory opening, a second-tier memory opening, and a third-tier memory opening;

the support pillar structures are formed within volumes of each vertical stack of a first-tier support opening, a second-tier support opening, and a third-tier support opening; and each of the third-tier staircase-region openings is filled within a respective staircase-region contact via structure.

* * * * *